(12) United States Patent
Tanaka et al.

(10) Patent No.: US 12,191,399 B2
(45) Date of Patent: Jan. 7, 2025

(54) SEMICONDUCTOR DEVICE AND MANUFACTURING METHOD THEREOF

(71) Applicant: Semiconductor Energy Laboratory Co., Ltd., Atsugi (JP)

(72) Inventors: Tetsuhiro Tanaka, Tokyo (JP); Mitsuhiro Ichijo, Kanagawa (JP); Toshiya Endo, Kanagawa (JP); Akihisa Shimomura, Kanagawa (JP); Yuji Egi, Kanagawa (JP); Sachiaki Tezuka, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/136,431

(22) Filed: Apr. 19, 2023

(65) Prior Publication Data

US 2023/0361219 A1 Nov. 9, 2023

Related U.S. Application Data

(63) Continuation of application No. 17/167,286, filed on Feb. 4, 2021, now Pat. No. 11,646,378, which is a (Continued)

(30) Foreign Application Priority Data

Apr. 15, 2015 (JP) .................. 2015-083163
May 29, 2015 (JP) .................. 2015-110541

(51) Int. Cl.
*H01L 29/49* (2006.01)
*H01L 29/423* (2006.01)
*H01L 29/786* (2006.01)

(52) U.S. Cl.
CPC .... *H01L 29/7869* (2013.01); *H01L 29/42384* (2013.01); *H01L 29/4908* (2013.01); *H01L 29/78606* (2013.01); *H01L 29/78648* (2013.01)

(58) Field of Classification Search
CPC .................................................. H01L 29/7869
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Moazzam Hossain
*Assistant Examiner* — Hajar Kolahdouzan
(74) *Attorney, Agent, or Firm* — Fish & Richardson P.C.

(57) ABSTRACT

A transistor with stable electrical characteristics. A semiconductor device includes a first insulator over a substrate, a second insulator over the first insulator, an oxide semiconductor in contact with at least part of a top surface of the second insulator, a third insulator in contact with at least part of a top surface of the oxide semiconductor, a first conductor and a second conductor electrically connected to the oxide semiconductor, a fourth insulator over the third insulator, a third conductor which is over the fourth insulator and at least
(Continued)

part of which is between the first conductor and the second conductor, and a fifth insulator over the third conductor. The first insulator contains a halogen element.

4 Claims, 85 Drawing Sheets

Related U.S. Application Data continuation of application No. 16/044,600, filed on Jul. 25, 2018, now Pat. No. 10,923,600, which is a continuation of application No. 15/092,956, filed on Apr. 7, 2016, now Pat. No. 10,056,497.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,849,872 | B1 | 2/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,855,106 | B2 | 12/2010 | Yamazaki et al. |
| 7,863,611 | B2 | 1/2011 | Abe et al. |
| 8,203,146 | B2 | 6/2012 | Abe et al. |
| 8,269,218 | B2 | 9/2012 | Yamazaki |
| 8,410,002 | B2 | 4/2013 | Yamazaki et al. |
| 8,440,510 | B2 | 5/2013 | Yamazaki |
| 8,637,863 | B2 | 1/2014 | Yamazaki |
| 8,642,412 | B2 | 2/2014 | Yamazaki et al. |
| 8,742,544 | B2 | 6/2014 | Yamazaki et al. |
| 8,809,850 | B2 | 8/2014 | Yamazaki |
| 8,901,559 | B2 | 12/2014 | Yamazaki |
| 8,987,731 | B2 | 3/2015 | Yamazaki |
| 9,059,219 | B2 | 6/2015 | Sasagawa et al. |
| 9,070,596 | B2 | 6/2015 | Yamazaki |
| 9,093,988 | B2 | 7/2015 | Yamazaki et al. |
| 9,153,699 | B2 | 10/2015 | Yamazaki |
| 9,190,525 | B2 | 11/2015 | Yamazaki |
| 9,209,206 | B2 | 12/2015 | Saito |
| 9,209,251 | B2 | 12/2015 | Yamazaki |
| 9,219,162 | B2 | 12/2015 | Yamazaki et al. |
| 9,293,589 | B2 | 3/2016 | Yamazaki et al. |
| 9,312,390 | B2 | 4/2016 | Yamazaki |
| 9,337,344 | B2 | 5/2016 | Hanaoka |
| 9,411,208 | B2 | 8/2016 | Yamazaki |
| 9,437,747 | B2 | 9/2016 | Yamazaki |
| 9,443,984 | B2 | 9/2016 | Yamazaki |
| 9,472,681 | B2 | 10/2016 | Yamazaki |
| 9,508,742 | B2 | 11/2016 | Yamazaki |
| 9,536,422 | B2 | 1/2017 | Yamazaki |
| 9,634,149 | B2 | 4/2017 | Endo et al. |
| 9,679,768 | B2 | 6/2017 | Yamazaki et al. |
| 9,787,294 | B2 | 10/2017 | Saito |
| 9,837,551 | B2 | 12/2017 | Hondo et al. |
| 9,893,204 | B2 | 2/2018 | Yamazaki |
| 9,905,695 | B2 | 2/2018 | Hanaoka |
| 9,922,551 | B2 | 3/2018 | Yamazaki |
| 9,954,114 | B2 | 4/2018 | Yamazaki |
| 10,032,926 | B2 | 7/2018 | Yamazaki |
| 10,056,494 | B2 | 8/2018 | Yamazaki et al. |
| 10,134,909 | B2 | 11/2018 | Yamazaki |
| 10,243,081 | B2 | 3/2019 | Yamazaki et al. |
| 10,483,404 | B2 | 11/2019 | Yamazaki |
| 10,516,055 | B2 | 12/2019 | Yamazaki et al. |
| 10,741,695 | B2 | 8/2020 | Yamazaki |
| 10,944,010 | B2 | 3/2021 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |

(56) References Cited

U.S. PATENT DOCUMENTS

| | | |
|---|---|---|
| 2009/0280600 A1 | 11/2009 | Hosono et al. |
| 2010/0025675 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0086472 A1 | 4/2011 | Yamazaki et al. |
| 2011/0193079 A1 | 8/2011 | Endo et al. |
| 2013/0187152 A1 | 7/2013 | Yamazaki et al. |
| 2013/0334533 A1 | 12/2013 | Yamazaki |
| 2014/0004656 A1* | 1/2014 | Sasagawa ......... H01L 29/66772 438/104 |
| 2014/0138683 A1 | 5/2014 | Yamazaki et al. |
| 2014/0319514 A1 | 10/2014 | Noda et al. |
| 2015/0008428 A1 | 1/2015 | Yamamoto et al. |
| 2015/0034942 A1 | 2/2015 | Kim et al. |
| 2016/0380107 A1 | 12/2016 | Yamazaki |
| 2017/0221707 A1 | 8/2017 | Endo et al. |
| 2018/0233597 A1 | 8/2018 | Yamamoto et al. |
| 2021/0050452 A1 | 2/2021 | Yamazaki |
| 2021/0184048 A1 | 6/2021 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-055581 A | 3/1993 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2009-135350 A | 6/2009 |
| JP | 2010-003910 A | 1/2010 |
| JP | 2010-251591 A | 11/2010 |
| JP | 2011-109078 A | 6/2011 |
| JP | 2011-139047 A | 7/2011 |
| JP | 2011-142314 A | 7/2011 |
| JP | 2011-258939 A | 12/2011 |
| JP | 2012-009832 A | 1/2012 |
| JP | 2012-151460 A | 8/2012 |
| JP | 2014-007394 A | 1/2014 |
| JP | 2014-027263 A | 2/2014 |
| JP | 2014-029994 A | 2/2014 |
| JP | 2014-030012 A | 2/2014 |
| JP | 2014-030192 A | 2/2014 |
| JP | 2014-057053 A | 3/2014 |
| JP | 2014-239213 A | 12/2014 |
| JP | 2015-035597 A | 2/2015 |
| JP | 2015-053478 A | 3/2015 |
| TW | 201133850 | 10/2011 |
| TW | 201207532 | 2/2012 |
| TW | 201324783 | 6/2013 |
| TW | 201349501 | 12/2013 |
| TW | 201411811 | 3/2014 |
| TW | 201501311 | 1/2015 |
| TW | 201501313 | 1/2015 |
| WO | WO-2004/114391 | 12/2004 |
| WO | WO-2011/048959 | 4/2011 |
| WO | WO-2011/058866 | 5/2011 |
| WO | WO-2011/068032 | 6/2011 |
| WO | WO-2011/070928 | 6/2011 |
| WO | WO-2011/142467 | 11/2011 |
| WO | WO-2013/111756 | 8/2013 |
| WO | WO-2013/179922 | 12/2013 |
| WO | WO-2014/181785 | 11/2014 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status Of, Challenges To, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

(56) References Cited

OTHER PUBLICATIONS

Park.S et al., "Challenge to Future Displays: Transparent AMOLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98. pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al.. "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 109112842) Dated Aug. 6, 2021.

Taiwanese Office Action (Application No. 109112842), dated Jan. 30, 2024.

\* cited by examiner

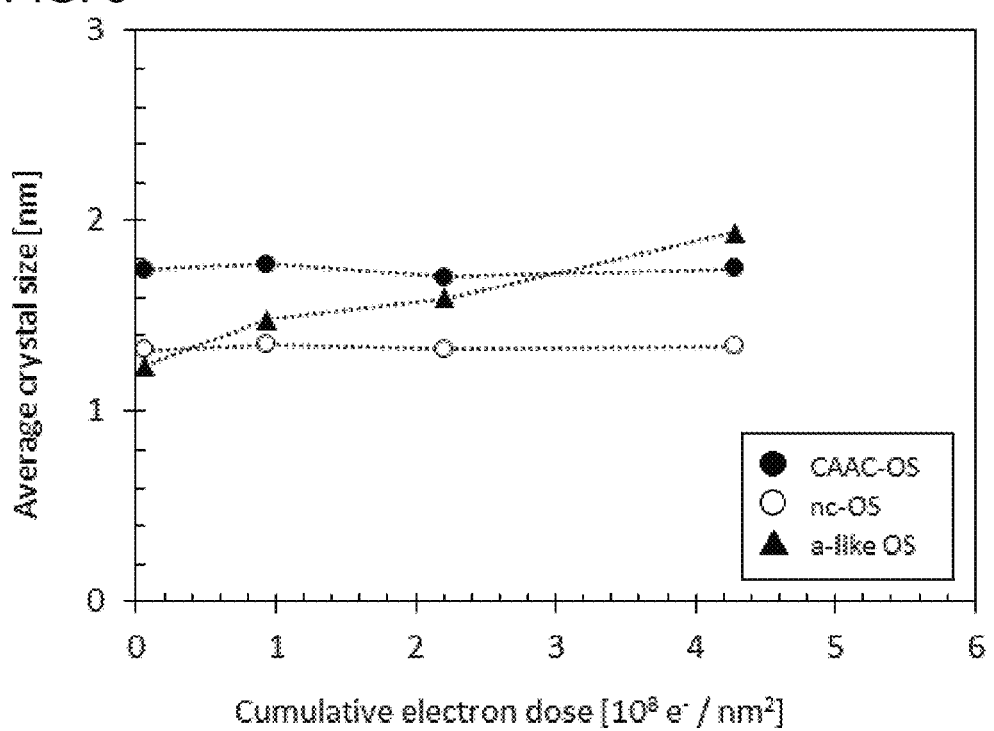

2200    2100

2200    2100

FIG. 39A1
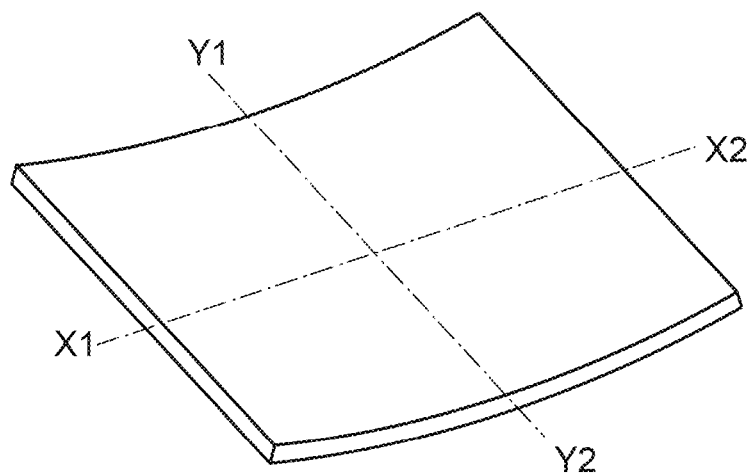
FIG. 39A2
FIG. 39A3
FIG. 39B1
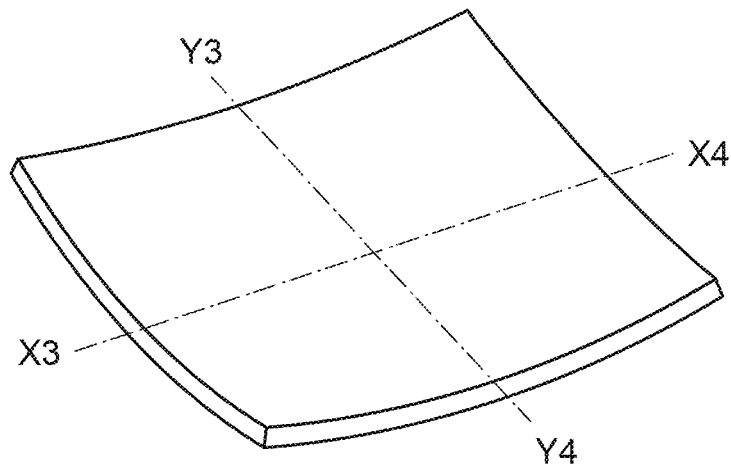
FIG. 39B2
FIG. 39B3

SEMICONDUCTOR DEVICE AND MANUFACTURING METHOD THEREOF

CROSS-REFERENCE TO RELATED APPLICATIONS

This application is a continuation of U.S. application Ser. No. 17/167,286, filed Feb. 4, 2021, now allowed, which is a continuation of U.S. Application Ser. No. 16/044,600, filed Jul. 25, 2018, now U.S. Pat. No. 10,923,600, which is a continuation of U.S. application Ser. No. 15/092,956, filed Apr. 7, 2016, now U.S. Pat. No. 10,056,497, which claims the benefit of foreign priority applications filed in Japan as Serial No. 2015-083163 on Apr. 15, 2015, and Serial No. 2015-110541 on May 29, 2015, all of which are incorporated by reference.

BACKGROUND OF THE INVENTION

1. Field of the Invention

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, or an electronic device. The present invention relates to a method for manufacturing a display device, a liquid crystal display device, a light-emitting device, a memory device, or an electronic device. The present invention relates to a method for driving a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. Oxide semiconductors have been researched since early times. In 1988, it was disclosed to use a crystal In—Ga—Zn oxide for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have low power consumption. An oxide semiconductor can be formed by a sputtering method or the like, and thus can be used in a transistor included in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

REFERENCE

Patent Document

[Patent Document 1] Japanese Published Patent Application No. S63-239117

[Patent Document 2] Japanese translation of PCT international application No. H11-505377

SUMMARY OF THE INVENTION

An object is to provide a transistor with stable electrical characteristics. Another object is to provide a transistor having a low leakage current in an off state. Another object is to provide a transistor with high frequency characteristics. Another object is to provide a transistor with normally-off electrical characteristics. Another object is to provide a transistor with a small subthreshold swing value. Another object is to provide a highly reliable transistor.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator over a substrate, a second insulator over the first insulator, an oxide semiconductor in contact with at least part of a top surface of the second insulator, a third insulator in contact with at least part of a top surface of the oxide semiconductor, a first conductor and a second conductor electrically connected to the oxide semiconductor, a fourth insulator over the third insulator, a third conductor which is over the fourth insulator and at least part of which is between the first conductor and the second conductor, and a fifth insulator over the third conductor. The first insulator contains a halogen element.

Another embodiment of the present invention is a semiconductor device with the above structure, further including a sixth insulator under the first insulator. The sixth insulator is less permeable to hydrogen and water than the first insulator.

Another embodiment of the present invention is a semiconductor device with the above structure, further including a fourth conductor between the sixth insulator and the first insulator. At least part of the fourth conductor overlaps with the oxide semiconductor.

Another embodiment of the present invention is a semiconductor device with any of the above structures, in which the number of water molecules released from the first insulator measured by thermal desorption spectroscopy is greater than or equal to $1.0 \times 10^{13}$ molecules/cm$^2$ and less than or equal to $1.4 \times 10^{16}$ molecules/cm$^2$.

Another embodiment of the present invention is a semiconductor device with the above structure, further including a seventh insulator between the fourth conductor and the first insulator. The seventh insulator contains hafnium.

Another embodiment of the present invention is a semiconductor device with the above structure, in which the number of water molecules released from a stacked film of the first insulator and the seventh insulator measured by thermal desorption spectroscopy is greater than or equal to $1.0 \times 10^{13}$ molecules/cm$^2$ and less than or equal to $1.4 \times 10^{16}$ molecules/cm$^2$.

Another embodiment of the present invention is a semiconductor device with any of the above structures, in which the number of hydrogen molecules released from the stacked film of the first insulator and the seventh insulator measured by thermal desorption spectroscopy is greater than or equal to $1.0 \times 10^{13}$ molecules/cm$^2$ and less than or equal to $1.2 \times 10^{15}$ molecules/cm$^2$.

Another embodiment of the present invention is a semiconductor device with any of the above structures, in which the halogen element is fluorine, chlorine, or bromine.

A transistor with stable electrical characteristics can be provided. A transistor having a low leakage current in an off state can be provided. A transistor with high frequency characteristics can be provided. A transistor with normally-off electrical characteristics can be provided. A transistor with a small subthreshold swing value can be provided. A highly reliable transistor can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 6 shows a change of crystal parts of an In—Ga—Zn oxide due to electron irradiation.

FIGS. 39A1, 39A2, 39A3, 39B1, 39B2, and 39B3 are perspective views and cross-sectional views of a semiconductor device of one embodiment of the present invention.

DETAILED DESCRIPTION OF THE INVENTION

Figure 1A:
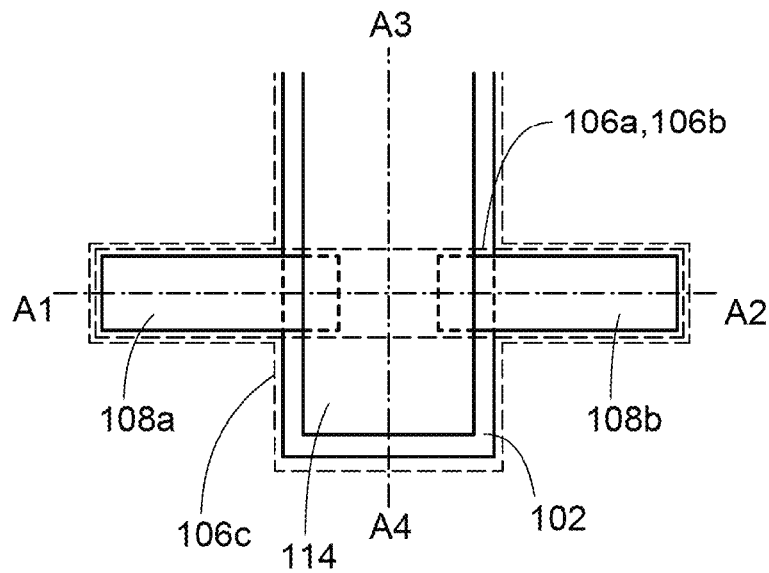
FIGS. 1A to 1D are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Furthermore, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of semiconductor devices of embodiments of the present invention are described with reference to FIGS. 1A to 1D to FIGS. 12A to 12D.
<Structure of Transistor>

The structure of a transistor is described below as an example of the semiconductor device of one embodiment of the present invention.

Figure 1B:
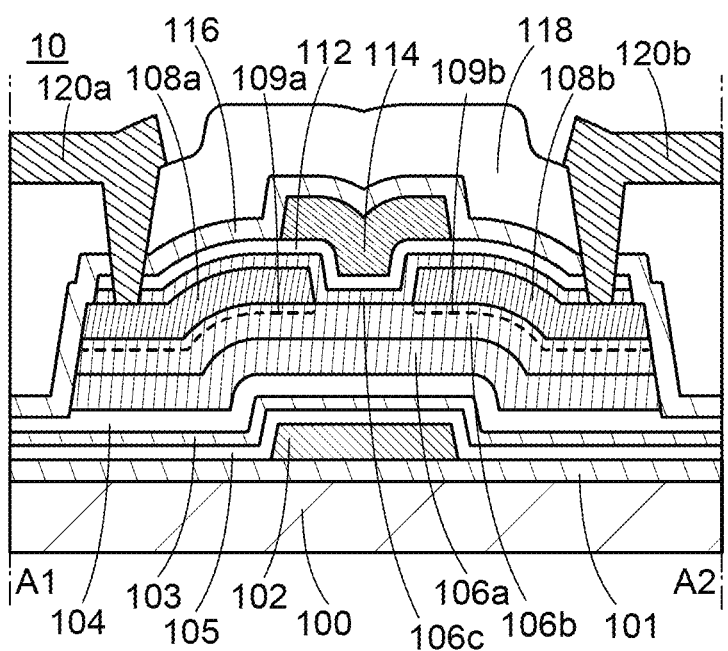
Figure 1C:
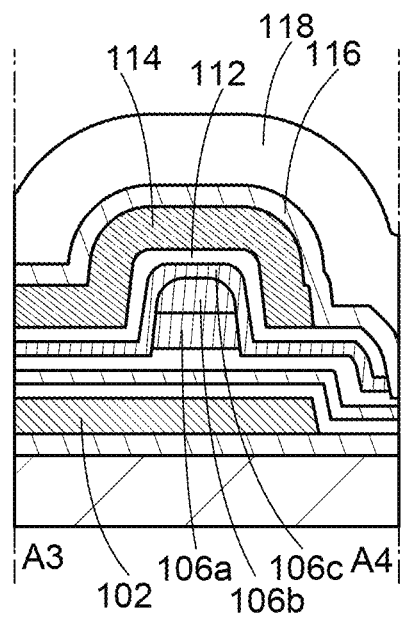

The structure of a transistor 10 is described with reference to FIGS. 1A to 1C. FIG. 1A is a top view of the transistor 10. FIG. 1B is a cross-sectional view taken along a dashed-dotted line A1-A2 in FIG. 1A, and FIG. 1C is a cross-sectional view taken along a dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. The channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate. An insulator 106a, a semiconductor 106b, and an insulator 106c can be provided to substantially overlap with conductors 108a and 108b and the like; however, for clarity of the top view, the insulator 106a, the semiconductor 106b, and the insulator 106c are denoted with a thin dashed line in FIG. 1A as being misaligned.

The transistor 10 includes an insulator 104 over a substrate 100, the insulator 106a over the insulator 104, the semiconductor 106b in contact with at least part of a top surface of the insulator 106a, the insulator 106c in contact with at least part of a top surface of the semiconductor 106b, the conductor 108a and the conductor 108b electrically connected to the semiconductor 106b, an insulator 112 over the insulator 106c, a conductor 114 which is over the insulator 112 and at least part of which is between the conductor 108a and the conductor 108b, and an insulator 116 over the conductor 114.

For example, as illustrated in FIGS. 1A to 1C, the transistor 10 includes an insulator 101, a conductor 102, an insulator 105, an insulator 103, and an insulator 104 that are formed over a substrate 100; the insulator 106a, the semiconductor 106b, and the insulator 106c that are formed over the insulator 104; the conductor 108a, the conductor 108b, a conductor 110a, and a conductor 110b that are formed over the semiconductor 106b; an insulator 112 formed over the insulator 106c; a conductor 114 formed over the insulator 112; and an insulator 116, an insulator 118, a conductor 120a, and a conductor 120b that are formed over the conductor 114.

Here, the insulator 101, the insulator 103, the insulator 104, the insulator 105, the insulator 106a, the insulator 106c, the insulator 112, the insulator 116, and the insulator 118 can also be referred to as insulating films or insulating layers. The conductor 102, the conductor 108a, the conductor 108b, the conductor 110a, the conductor 110b, the conductor 114, the conductor 120a, and the conductor 120b can also be referred to as conductive films or conductive layers. The semiconductor 106b can also be referred to as a semiconductor film or a semiconductor layer.

Note that as the details will be described later, the insulator 106a and the insulator 106c are sometimes formed using a substance that can function as a conductor, a semiconductor, or an insulator when they are used alone. However, when the transistor is formed by stacking the semiconductor 106b, electrons flow in the semiconductor 106b, in the vicinity of an interface between the semiconductor 106b and the insulator 106a, and in the vicinity of an interface between the semiconductor 106b and the insulator 106c, and some regions of the insulators 106a and 106c do not serve as a channel of the transistor. For that reason, in the present specification and the like, the insulators 106a and 106c are not referred to as conductors or semiconductors but referred to as insulators.

The conductor 102 is formed over the insulator 101 formed over the substrate 100. At least part of the conductor 102 overlaps with the insulator 106a, the semiconductor 106b, and the insulator 106c. The insulator 105 is formed over and in contact with the conductor 102 to cover the conductor 102. The insulator 103 is formed over the insulator 105, and the insulator 104 is formed over the insulator 103.

The insulator 106a is formed over the insulator 104, and the semiconductor 106b is formed in contact with at least part of a top surface of the insulator 106a. Although end portions of the insulator 106a and the semiconductor 106b are substantially aligned in FIG. 1B, the structure of the semiconductor device described in this embodiment is not limited to this example.

The conductor 108a and the conductor 108b are formed in contact with at least part of a top surface of the semiconductor 106b. The conductor 108a and the conductor 108b are spaced and are preferably formed to face each other with the conductor 114 provided therebetween as illustrated in FIG. 1A.

The insulator 106c is formed in contact with at least part of the top surface of the semiconductor 106b. The insulator 106c is preferably in contact with the semiconductor 106b in a region sandwiched between the conductor 108a and the conductor 108b. Although the insulator 106c is formed to cover top surfaces of the conductor 108a and the conductor 108b in FIG. 1B, the structure of the semiconductor device described in this embodiment is not limited to this example.

The insulator 112 is formed over the insulator 106c. The conductor 114 is formed over the insulator 112 to overlap with a region between the conductor 108a and the conductor 108b. Although the insulator 112 and the insulator 106c are formed such that end portions of the insulator 112 and the insulator 106c are substantially aligned to each other in FIG. 1B, the structure of the semiconductor device described in this embodiment is not limited to this example.

The insulator 116 is formed over the conductor 114 and the insulator 112, and the insulator 118 is formed over the insulator 116. The conductor 120a and the conductor 120b are formed over the insulator 118. The conductor 120a and the conductor 120b are connected to the conductor 108a and the conductor 108b through openings formed in the insulator 106c, the insulator 112, the insulator 116, and the insulator 118.

Note that the conductor 114 may be connected to the conductor 102 through an opening formed in the insulator 112, the insulator 106c, the insulator 104, the insulator 103, the insulator 105, and the like.

<Semiconductor>

The structure of the semiconductor 106b is described in detail below.

In this section, the structures of the insulator 106a and the insulator 106c are described in addition to the structure of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high binding energy with oxygen, for example. The element M is an element whose binding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 106a and the insulator 106c are oxide semiconductors including one or more elements, or two or more elements other than oxygen included in the semiconductor 106b. Since the insulator 106a and the insulator 106c each include one or more elements, or two or more elements other than oxygen included in the semiconductor 106b, a defect state is less likely to be formed at the interface between the insulator 106a and the semiconductor 106b and the interface between the semiconductor 106b and the insulator 106c.

The insulator 106a, the semiconductor 106b, and the insulator 106c preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than atomic % and less than 75 atomic %, respectively, further preferably greater than 34 atomic % and less than 66 atomic %, respectively. In the case of using an In-M-Zn oxide as the insulator 106c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 106c may be an oxide that is of the same type as the oxide of the insulator 106a. Note that the insulator 106a and/or the insulator 106c do/does not necessarily contain indium in some cases. For example, the insulator 106a and/or the insulator 106c may be gallium oxide or a Ga—Zn oxide. Note that the atomic ratio between the elements included in the insulator 106a, the semiconductor 106b, and the insulator 106c is not necessarily a simple integer ratio.

In the case of deposition using a sputtering method, typical examples of the atomic ratio between the metal elements of a target that is used for the insulator 106a or the insulator 106c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106a or the insulator 106c may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3.

An indium gallium oxide has small electron affinity and a high oxygen-blocking property. Therefore, the insulator 106c preferably includes an indium gallium oxide. The gallium atomic ratio [Ga/(In+Ga)] is, for example, higher than or equal to 70%, preferably higher than or equal to 80%, further preferably higher than or equal to 90%.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b. The energy gap of the insulator 106c is larger than that of the semiconductor 106b.

As the semiconductor 106b, an oxide having an electron affinity larger than those of the insulators 106a and 106c is used. For example, as the semiconductor 106b, an oxide having an electron affinity larger than those of the insulators 106a and 106c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum. In other words, the energy level of the conduction band minimum of the insulator 106a or the insulator 106c is closer to the vacuum level than the energy level of the conduction band minimum of the semiconductor 106b is.

By applying gate voltage at this time, a channel is formed in the semiconductor 106b having the largest electron affinity among the insulator 106a, the semiconductor 106b, and the insulator 106c. Note that when a high gate voltage is applied, current also flows in the insulator 106a near the interface with the semiconductor 106b and in the insulator 106c near the interface with the semiconductor 106b in some cases.

The insulator 106a and the insulator 106c are formed using a substance that can function as a conductor, a semiconductor, or an insulator when they are used alone. However, when the transistor is formed using a stack including the insulator 106a, the semiconductor 106b, and the insulator 106c, electrons flow in the semiconductor 106b, at and in the vicinity of the interface between the semiconductor 106b and the insulator 106a, and at and in the vicinity of the interface between the semiconductor 106b and the insulator 106c; thus, the insulator 106a and the insulator 106c have a region not functioning as a channel of the transistor. For that reason, in this specification and the like, the insulator 106a and the insulator 106c are not referred to as a semiconductor but an insulator. Note that the reason why the insulator 106a and the insulator 106c are referred to as an insulator is because they are closer to an insulator than the semiconductor 106b is in terms of their functions in the transistor; thus, a substance that can be used for the semiconductor 106b is used for the insulator 106a and the insulator 106c in some cases.

Here, in some cases, there is a mixed region of the insulator 106a and the semiconductor 106b between the insulator 106a and the semiconductor 106b. Furthermore, in some cases, there is a mixed region of the semiconductor 106b and the insulator 106c between the semiconductor 106b and the insulator 106c. The mixed region has a low density of defect states. For that reason, the stacked film of the insulator 106a, the semiconductor 106b, and the insulator 106c has a band structure where energy is changed continuously at each interface and in the vicinity of the interface (continuous junction). Note that the boundary between the insulator 106a and the semiconductor 106b and the boundary between the insulator 106c and the semiconductor 106b are not clear in some cases.

At this time, electrons move mainly in the semiconductor 106b, not in the insulator 106a and the insulator 106c. As described above, when the density of defect states at the interface between the insulator 106a and the semiconductor 106b and the density of defect states at the interface between the semiconductor 106b and the insulator 106c are decreased, electron movement in the semiconductor 106b is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top or bottom surface of the semiconductor 106b (a formation surface; here, the top surface of the insulator 106a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P—V) with the measurement area of 1 μm×1 μm is less than 10 nm, preferably less than 9 nm, further preferably less than 8 nm, still further preferably less than 7 nm. RMS roughness, Ra, and P—V can be measured using a scanning probe microscope SPA-500 manufactured by SII Nano Technology Inc.

Moreover, the thickness of the insulator 106c is preferably as small as possible to increase the on-state current of the transistor. It is preferable that the thickness of the insulator 106c is smaller than that of the insulator 106a and smaller than that of the semiconductor 106b. For example, the insulator 106c is formed to include a region having a thickness of less than 10 nm, preferably less than or equal to 5 nm, further preferably less than or equal to 3 nm. Meanwhile, the insulator 106c has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, further preferably greater than or equal to 2 nm.

To improve reliability, the insulator 106a is preferably thick. For example, the insulator 106a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106a is made large, a distance from the interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, further preferably less than or equal to 80 nm.

Silicon in the oxide semiconductor might serve as a carrier trap or a carrier generation source, for example Thus, the silicon concentration in the semiconductor 106b is preferably as low as possible. For example, between the semiconductor 106b and the insulator 106a, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, and further preferably higher than or equal to $1\times10^{16}$ atoms/cm$^3$ and lower than or equal to $2\times10^{18}$ atoms/cm$^3$ is provided. Furthermore, between the semiconductor 106b and the insulator 106c, a region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided.

It is preferable to reduce the hydrogen concentration in the insulator 106a and the insulator 106c in order to reduce the hydrogen concentration in the semiconductor 106b. The insulator 106a and the insulator 106c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the nitrogen concentration in the insulator 106a and the insulator 106c in order to reduce the nitrogen concentration in the semiconductor 106b. The insulator 106a and the insulator 106c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

Each of the insulator 106a, the semiconductor 106b, and the insulator 106c described in this embodiment, especially the semiconductor 106b, is an oxide semiconductor with a low impurity concentration and a low density of defect states (a small number of oxygen vacancies) and thus can be referred to as a highly purified intrinsic or substantially highly purified intrinsic oxide semiconductor. Since a highly purified intrinsic or substantially highly purified intrinsic oxide semiconductor has few carrier generation sources, the carrier density can be low. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V even when an element has a channel width (W) of $1\times10^6$ μm and a channel length (L) of 10 μm.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. Examples of impurities are hydrogen, nitrogen, alkali metal, and alkaline earth metal.

Hydrogen contained in the insulator 106a, the semiconductor 106b, and the insulator 106c reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a, the semiconductor 106b, and the insulator 106c. Specifically, the hydrogen concentration in the insulator 106a, the semiconductor 106b, and the insulator 106c, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$, yet further preferably lower than or equal to $1\times10^{18}$ atoms/cm$^3$, even further preferably lower than or equal to $5\times10^{17}$ atoms/cm$^3$, and further preferably lower than or equal to $1\times10^{16}$ atoms/cm$^3$.

When the insulator 106a, the semiconductor 106b, and the insulator 106c contain silicon or carbon, which is one of elements belonging to Group 14, oxygen vacancies in the insulator 106a, the semiconductor 106b, and the insulator 106c are increased, which makes the insulator 106a, the semiconductor 106b, and the insulator 106c n-type. Thus, the concentration of silicon or carbon (measured by SIMS) in the insulator 106a, the semiconductor 106b, and the insulator 106c or the concentration of silicon or carbon (measured by SIMS) at and in the vicinity of the interface with the insulator 106a, the semiconductor 106b, and the insulator 106c is set to be lower than or equal to $2\times10^{18}$ atoms/cm$^3$, preferably lower than or equal to $2\times10^{17}$ atoms/cm$^3$.

In addition, the concentration of an alkali metal or alkaline earth metal in the insulator 106a, the semiconductor 106b, and the insulator 106c, which is measured by SIMS, is set to be lower than or equal to $1\times10^{18}$ atoms/cm$^3$, preferably lower than or equal to $2\times10^{16}$ atoms/cm$^3$. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a, the semiconductor 106b, and the insulator 106c.

Furthermore, when containing nitrogen, the insulator 106a, the semiconductor 106b, and the insulator 106c easily become n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

Figure 1D:
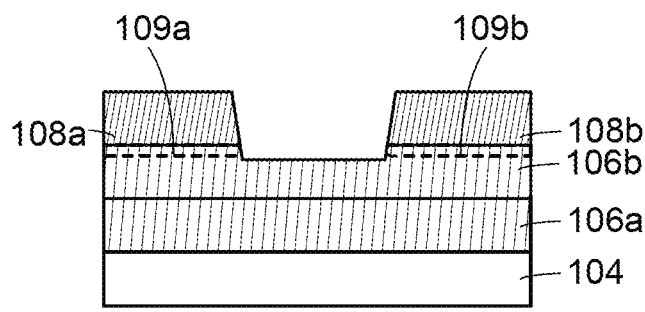

FIG. 1D is an enlarged cross-sectional view illustrating the middle portion of the insulator 106a and the semiconductor 106b and the vicinity of the middle portion. As illustrated in FIGS. 1B and 1D, regions of the semiconductor 106b and the insulator 106c that are in contact with the conductor 108a and the conductor 108b (which are denoted with dotted lines in FIGS. 1B and 1D) include a low-resistance region 109a and a low-resistance region 109b in some cases. The low-resistance region 109a and the low-resistance region 109b are mainly formed when oxygen is extracted by the conductor 108a and the conductor 108b that are in contact with the semiconductor 106b, or when a conductive material in the conductor 108a or the conductor 108b is bonded to an element in the semiconductor 106b. The formation of the low-resistance region 109a and the low-resistance region 109b leads to a reduction in contact resistance between the conductor 108a or 108b and the semiconductor 106b, whereby the transistor 10 can have high on-state current.

Although not illustrated, a low-resistance region is sometimes formed in regions of the insulator 106a that are in contact with the conductor 108a or the conductor 108b. In the following drawings, a dotted line denotes a low-resistance region.

As illustrated in FIG. 1D, the semiconductor 106b might have a smaller thickness in a region between the conductor 108a and the conductor 108b than in regions overlapping with the conductor 108a and the conductor 108b. This is because part of the top surface of the semiconductor 106b is removed at the time of formation of the conductor 108a and the conductor 108b. In formation of the conductor to be the conductor 108a and the conductor 108b, a region with low resistance like the low-resistance regions 109a and 109b is formed on the top surface of the semiconductor 106b in some cases. By removal of a region of the top surface of the semiconductor 106b that is positioned between the conductor 108a and the conductor 108b, the channel can be prevented from being formed in the low-resistance region on the top surface of the semiconductor 106b. In the drawings, even when a thin region is not drawn in an enlarged view or the like, such a thin region might be formed.

Note that the above-described three-layer structure of the insulator 106a, the semiconductor 106b, and the insulator 106c is an example. For example, a two-layer structure without the insulator 106a or the insulator 106c may be employed. Alternatively, a single-layer structure including neither the insulator 106a nor the insulator 106c may be employed. Alternatively, an n-layer structure (n is an integer of 4 or more) including one or more layers in addition to the insulator 106a, the semiconductor 106b, and the insulator 106c may be employed. The added layer may be formed with any of materials used for the insulator 106a, the semiconductor 106b, and the insulator 106c.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example In other words, a stable oxide semiconductor cannot be regarded as a completely amorphous oxide semiconductor.

Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 2A:
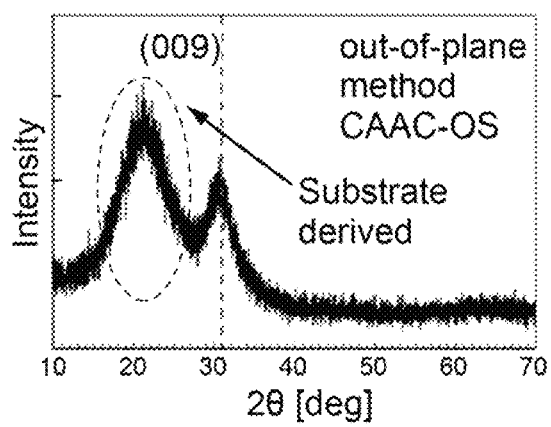
FIGS. 2A to 2E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 2A. This peak is derived from the (009) plane of the InGaZnO$_4$ crystal, which indicates that crystals in the CAAC-OS have c-axis alignment, and that the c-axes are aligned in a direction substantially perpendicular to a surface over which a CAAC-OS film is formed (also referred to as a formation surface) or a top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferable that the CAAC-OS do not show the peak.

Figure 2B:
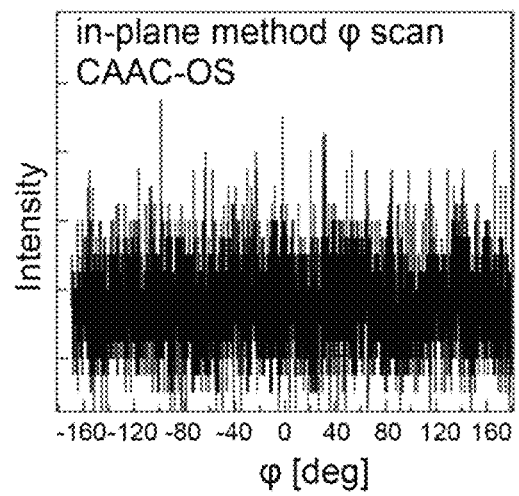
Figure 2C:
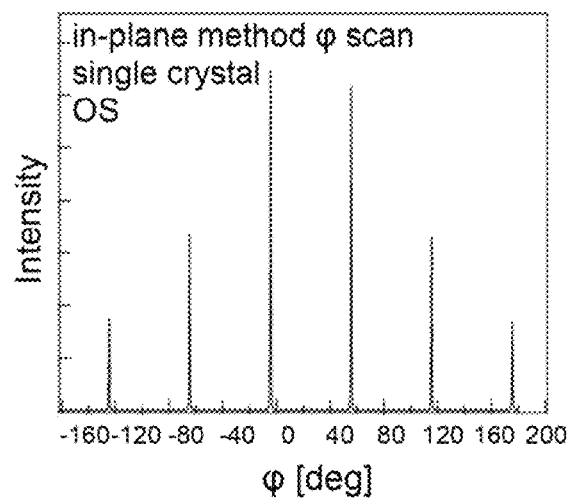

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 2B, a peak is not clearly observed. In contrast, in the case where single crystal InGaZnO$_4$ is subjected to φ scan with 2θ fixed at around 56°, as shown in FIG. 2C, six peaks which are derived from crystal planes equivalent to the (110) plane are observed. Accordingly, the structural analysis using XRD shows that the directions of a-axes and b-axes are irregularly oriented in the CAAC-OS.

Figure 2D:
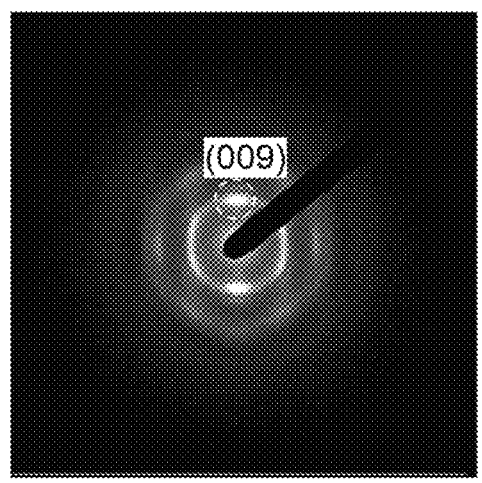
Figure 2E:
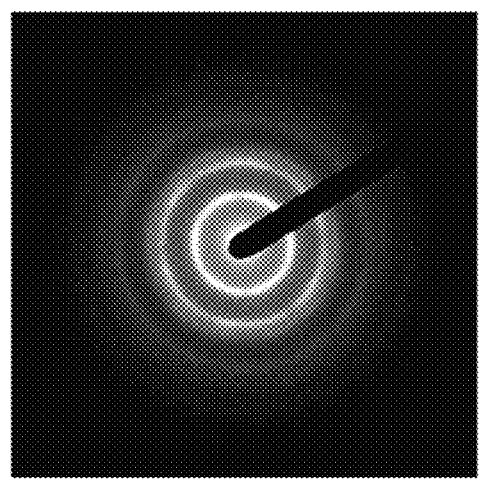

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 2D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 2E shows a diffraction pattern obtained in such a manner that an electron beam with a probe diameter of 300 nm is incident on the same sample in a direction perpendicular to the sample surface. As shown in FIG. 2E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 2E is considered to be derived from the (010) plane, the (100) plane, and the like of the InGaZnO$_4$ crystal. The second ring in FIG. 2E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 3A:
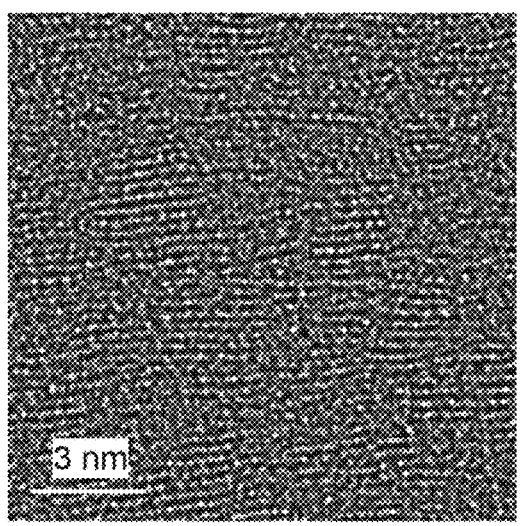
FIGS. 3A to 3E show a cross-sectional TEM image and plan-view TEM images of a CAAC-OS and images obtained through analysis thereof.

FIG. 3A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 3A shows pellets in which metal atoms are arranged in a layered manner. FIG. 3A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 3B:
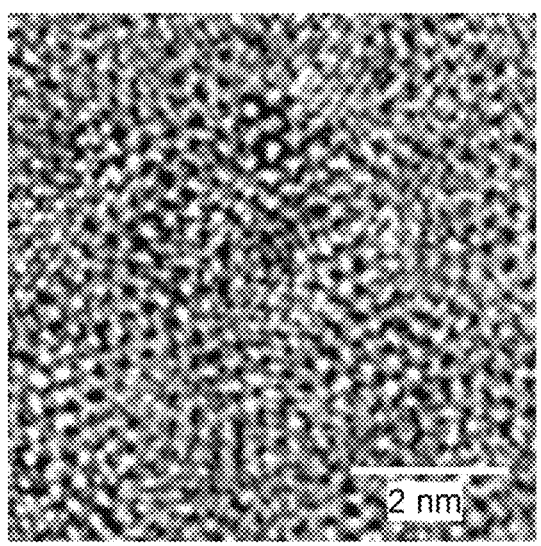
Figure 3C:
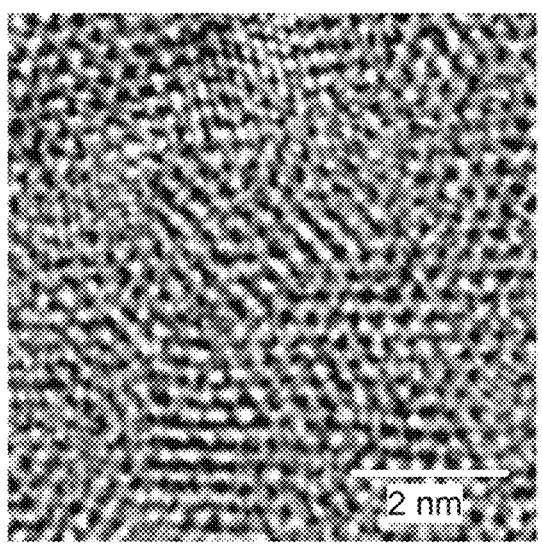
Figure 3D:
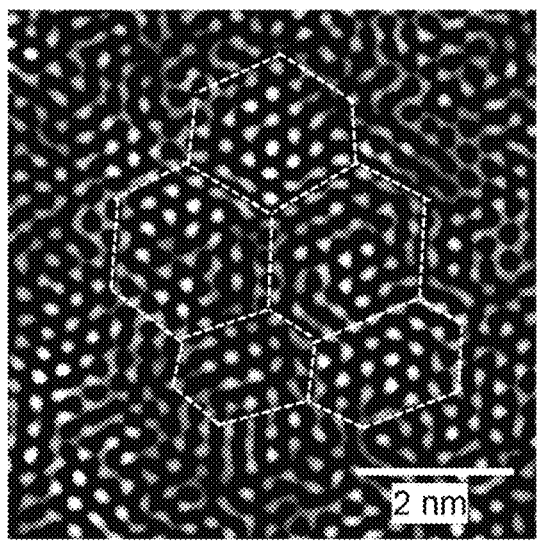
Figure 3E:
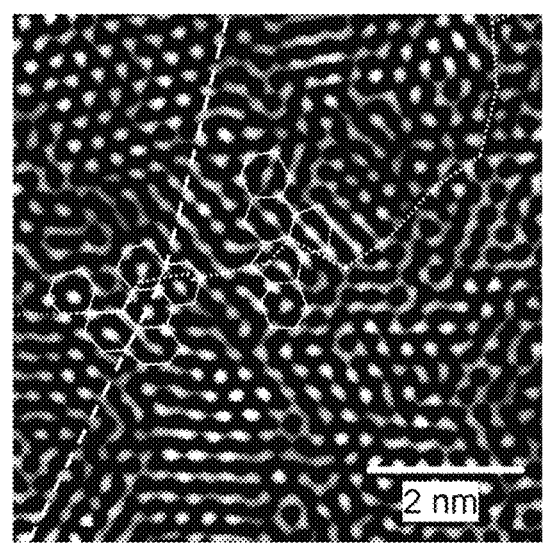

FIGS. 3B and 3C show Cs-corrected high-resolution TEM images of a plane of the CAAC-OS observed from a direction substantially perpendicular to the sample surface. FIGS. 3D and 3E are images obtained through image processing of FIGS. 3B and 3C. The method of image processing is as follows. The image in FIG. 3B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 3D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 3E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}$/cm$^3$, preferably lower than $1 \times 10^{11}$/cm$^3$, further preferably lower than $1 \times 10^{10}$/cm$^3$, and is higher than or equal to $1 \times 10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 4A:
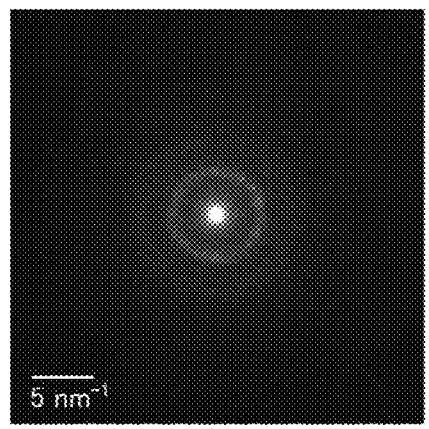
FIGS. 4A to 4D show electron diffraction patterns and a cross-sectional TEM image of an nc-OS.
Figure 4B:
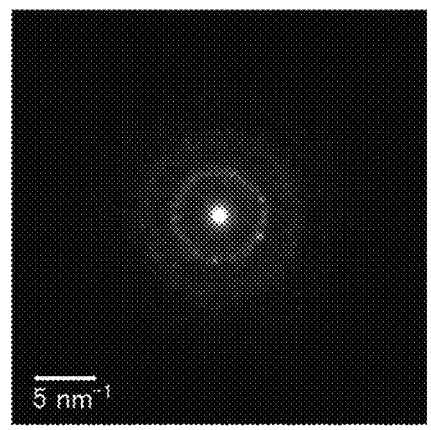

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 4A is observed. FIG. 4B shows a diffraction pattern obtained when an electron beam with a probe diameter of 1 nm is incident on the same sample. As shown in FIG. 4B, a plurality of spots are observed in a ring-like region. In other words, ordering in an nc-OS is not observed with an electron beam with a probe diameter of 50 nm but is observed with an electron beam with a probe diameter of 1 nm.

Figure 4C:
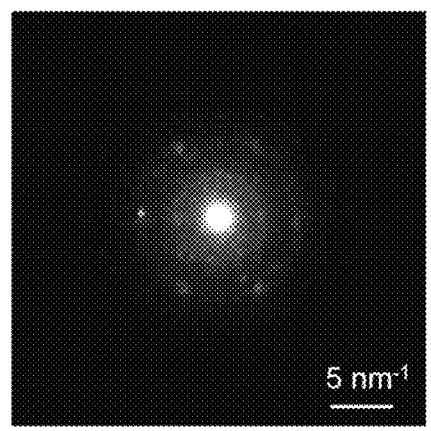

Furthermore, an electron diffraction pattern in which spots are arranged in an approximately hexagonal shape is observed in some cases as shown in FIG. 4C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 4D:
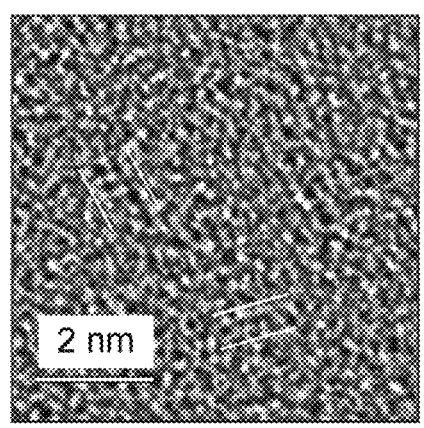

FIG. 4D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 4D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

Figure 5A:
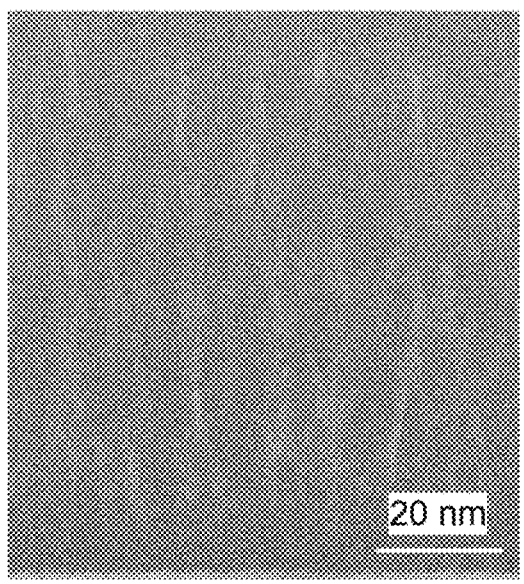
FIGS. 5A and 5B show cross-sectional TEM images of an a-like OS.
Figure 5B:
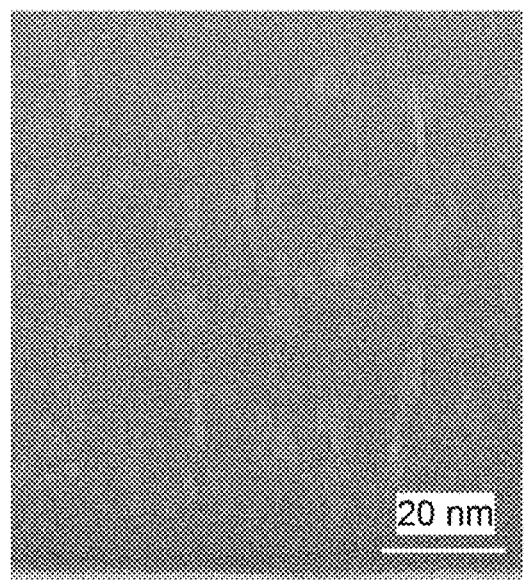

FIGS. 5A and 5B are high-resolution cross-sectional TEM images of an a-like OS. FIG. 5A is the high-resolution cross-sectional TEM image of the a-like OS at the start of the electron irradiation. FIG. 5B is the high-resolution cross-sectional TEM image of a-like OS after the electron ($e^-$) irradiation at $4.3 \times 10^8$ $e^-/nm^2$. FIGS. 5A and 5B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

FIG. 6 shows change in the average size of crystal parts (at 22 points to 30 points) in each sample. Note that the crystal part size corresponds to the length of a lattice fringe. FIG. 6 indicates that the crystal part size in the a-like OS increases with an increase in the cumulative electron dose in obtaining TEM images, for example. As shown in FIG. 6, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 6, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

<Substrate, Insulator, Conductor>

Components other than the semiconductor of the transistor 10 are described in detail below.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate formed using silicon, germanium, or the like or a semiconductor substrate formed using silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As the insulator 101, an insulator having a function of blocking hydrogen or water is used. Hydrogen or water in the insulator provided near the insulator 106a, the semiconductor 106b, and the insulator 106c is one of the factors of carrier generation in the insulator 106a, the semiconductor 106b, and the insulator 106c which also function as oxide semiconductors. Because of this, the reliability of the transistor 10 might be decreased. When a substrate provided with a silicon-based semiconductor element such as a switching element is used as the substrate 100, hydrogen might be used to terminate a dangling bond in the semiconductor element and then be diffused into the transistor 10. However, if such a structure includes the insulator 101 having a function of blocking hydrogen or water, diffusion of hydrogen or water from below the transistor 10 can be inhibited, leading to an improvement in the reliability of the transistor 10. It is preferable that the insulator 101 be less permeable to hydrogen or water than the insulator 105 and the insulator 104.

The insulator 101 preferably has a function of blocking oxygen. If oxygen diffused from the insulator 104 can be blocked by the insulator 101, oxygen can be effectively supplied from the insulator 104 to the insulator 106a, the semiconductor 106b, and the insulator 106c.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film blocking diffusion of oxygen, hydrogen, or water. The insulator 101 can be formed using, for example, silicon nitride or silicon nitride oxide. The use of such a material enables the insulator 101 to function as an insulating film blocking diffusion of hydrogen or water. Note that silicon nitride oxide means a substance that contains more nitrogen than oxygen and silicon oxynitride means a substance that contains more oxygen than nitrogen in this specification and the like. Note that silicon nitride oxide means a substance that contains more nitrogen than oxygen and silicon oxynitride means a substance that contains more oxygen than nitrogen in this specification and the like.

At least part of the conductor 102 preferably overlaps with the semiconductor 106b in a region positioned between the conductor 108a and the conductor 108b. The conductor 102 functions as a back gate of the transistor 10. The conductor 102 can control the threshold voltage of the transistor 10. Control of the threshold voltage can prevent the transistor 10 from being turned on when voltage applied to the gate (conductor 114) of the transistor 10 is low, e.g., 0 V or lower. Thus, the electrical characteristics of the transistor 10 can be easily made normally-off characteristics.

The conductor 102 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 105 is provided to cover the conductor 102. An insulator similar to the insulator 104 or the insulator 112 to be described later can be used as the insulator 105.

The insulator 103 is provided to cover the insulator 105. The insulator 103 preferably has a function of blocking oxygen. Providing the insulator 103 can prevent extraction of oxygen from the insulator 104 by the conductor 102. Accordingly, oxygen can be effectively supplied from the insulator 104 to the insulator 106a, the semiconductor 106b, and the insulator 106c. By improving the coverage with the insulator 103, extraction of oxygen from the insulator 104 can be further reduced and oxygen can be more effectively supplied from the insulator 104 to the insulator 106a, the semiconductor 106b, and the insulator 106c.

As the insulator 103, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide.

Of the insulators 105, 103, and 104, the insulator 103 preferably includes an electron trap region. When the insulators 105 and 104 have a function of inhibiting release of electrons, the electrons trapped in the insulator 103 behave as if they are negative fixed charges. Therefore, the threshold voltage of the transistor 10 can be changed by injection of electrons into the insulator 103. The injection of electrons into the insulator 103 can be performed by applying a positive or negative potential to the conductor 102.

Since the amount of electron injection can be controlled by the time during which potential is applied to the conductor 102 and/or the value of applied potential, a desirable threshold voltage of the transistor can be obtained. The potential applied to the conductor 102 is set such that a tunneling current flows through the insulator 105. For example, the applied potential is higher than or equal to 20 V and lower than or equal to 60 V, preferably higher than or equal to 24 V and lower than or equal to 50 V, more preferably higher than or equal to 30 V and lower than or equal to 45 V. The time during which potential is applied is, for example, longer than or equal to 0.1 seconds and shorter than or equal to 20 seconds, preferably longer than or equal to 0.2 seconds and shorter than or equal to 10 seconds.

The amounts of hydrogen and water contained in the insulator 103 are preferably small. For example, the number of water molecules released from the insulator 103 is preferably greater than or equal to $1.0 \times 10^{13}$ molecules/cm$^2$ and less than or equal to $1.0 \times 10^{16}$ molecules/cm$^2$, more preferably greater than or equal to $1.0 \times 10^{13}$ molecules/cm$^2$ and less than or equal to $3.0 \times 10^{15}$ molecules/cm$^2$ in thermal desorption spectroscopy (TDS) analysis in the range of surface temperatures from 100° C. to 700° C. or from 100° C. to 500° C. The details of the method for measuring the number of released molecules using TDS analysis will be described later.

The amounts of hydrogen and water contained in the insulator 104 are preferably small. The insulator 104 preferably contains excess oxygen. For example, the insulator 104 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used for the insulator 104. Preferably, silicon oxide or silicon oxynitride is used.

The amounts of hydrogen and water contained in the insulator 104 are preferably small. For example, the number of water molecules released from the insulator 104 is preferably greater than or equal to $1.0 \times 10^{13}$ molecules/cm$^2$ and less than or equal to $1.4 \times 10^{16}$ molecules/cm$^2$, more preferably greater than or equal to $1.0 \times 10^{13}$ molecules/cm$^2$ and less than or equal to $4.0 \times 10^{15}$ molecules/cm$^2$, further more preferably greater than or equal to $1.0 \times 10^{13}$ molecules/cm$^2$ and less than or equal to $2.0 \times 10^{15}$ molecules/cm$^2$ in TDS analysis in the range of surface temperatures from 100° C. to 700° C. or from 100° C. to 500° C. The number of hydrogen molecules released from the insulator 104 is preferably greater than or equal to $1.0 \times 10^{13}$ molecules/cm$^2$ and less than or equal to $1.2 \times 10^{15}$ molecules/cm$^2$, more preferably greater than or equal to $1.0 \times 10^{13}$ molecules/cm$^2$ and less than or equal to $9.0 \times 10^{14}$ molecules/cm$^2$ in TDS analysis in the range of surface temperatures from 100° C. to 700° C. or from 100° C. to 500° C. The details of the method for measuring the number of released molecules using TDS analysis will be described later.

As described above, impurities such as water and hydrogen form defect states in the insulator 106a and the insulator 106c, and particularly in the semiconductor 106b, which causes a change in electrical characteristics of the transistor. Accordingly, by reducing the amounts of water and hydrogen contained in the insulator 104 under the insulator 106a, the semiconductor 106b, and the insulator 106c, formation of defect states formed by supply of water, hydrogen, and the like from the insulator 104 to the semiconductor 106b can be suppressed. The use of such an oxide semiconductor with a reduced density of defect states makes it possible to provide a transistor with stable electrical characteristics.

Although the details will be described later, heat treatment needs to be performed for dehydration, dehydrogenation, or oxygen vacancy reduction in the insulator 104, the insulator 106a, the semiconductor 106b, the insulator 106c, and the like. However, high-temperature heat treatment might degrade layers under the insulator 104. Specifically, in the case where the transistor 10 in this embodiment is stacked over a semiconductor element layer in which a semiconductor (e.g., silicon) different from the semiconductor 106b is an active layer, the heat treatment might damage or degrade elements, wirings, and the like included in the semiconductor element layer.

For example, in the case where the semiconductor element layer is formed over a silicon substrate, elements need to be reduced in resistance for miniaturization of the elements. To reduce the resistance, for example, a Cu wiring with low resistivity may be used for a wiring material, or nickel silicide may be provided in a source region and a drain region of the transistor to form the regions. On the other hand, a Cu wiring and nickel silicide have low heat resistance. For example, high-temperature heat treatment on a Cu wiring causes formation of a void or hillock or Cu diffusion. High-temperature heat treatment on nickel silicide expands the silicide region so that the source region and the drain region of the transistor are short-circuited.

Thus, the above-described heat treatment needs to be performed in a temperature range that does not degrade the semiconductor element layer in a lower layer. However, in the case where the insulator 104 contains much water and hydrogen at the time of being formed, such heat treatment in a temperature range that does not degrade the semiconductor element layer in the lower layer cannot remove the water, hydrogen, and the like sufficiently from the insulator 104 in some cases. Moreover, if heat treatment in such a temperature range is performed after formation of the insulator 106a, the semiconductor 106b, and the insulator 106c, water, hydrogen, and the like are supplied from the insulator 104 to the semiconductor 106b and the like, forming defect states.

In contrast, water, hydrogen, and the like can be sufficiently eliminated from the insulator 104 of this embodiment by heating at a relatively low temperature (e.g., in the range higher than or equal to 350° C. and lower than or equal to 445° C.) because the amounts of water and hydrogen contained in the insulator 104 of this embodiment are small as described above. Moreover, even in the case where heat treatment within the similar temperature range is performed after the formation of the insulator 106a, the semiconductor 106b, and the insulator 106c, formation of defect states in the semiconductor 106b and the like can be suppressed because of the sufficiently small amounts of water and hydrogen in the insulator 104.

The insulator 104 is preferably formed by a PECVD method because a high-quality film can be obtained at a relatively low temperature. However, in the case where a silicon oxide film, for example, is formed by a PECVD method, silicon hydride or the like is often used as a source gas, and as a result, hydrogen, water, or the like enters the insulator 104 during the formation of the insulator 104. For this reason, a silicon halide is preferably used as the source gas for the formation of the insulator 104 of this embodiment. As the silicon halide, for example, silicon tetrafluoride ($SiF_4$), silicon tetrachloride ($SiCl_4$), silicon trichloride ($SiHCl_3$), dichlorosilane ($SiH_2Cl_2$), or silicon tetrabromide ($SiBr_4$) can be used.

When a silicon halide is used as the source gas for the formation of the insulator 104, halogen is sometimes contained in the insulator 104. In addition, a constituent of the insulator 104 and halogen might form a covalent bond. For example, in the case where the insulator 104 is formed using $SiF_4$ as the source gas, fluorine is sometimes contained in the insulator 104 and a Si—F covalent bond might be formed. The insulator 104 having a Si—F covalent bond exhibits a spectrum peak in the range from 685.4 eV to 687.5 eV when analyzed by X-ray photoelectron spectroscopy (XPS) in some cases.

When a silicon halide is used as the source gas for the formation of the insulator 104, a silicon hydride may be used in addition to the silicon halide. In that case, the amounts of hydrogen and water in the insulator 104 can be reduced as compared with the case where only a silicon hydride is used as the source gas, and the deposition rate can be improved as compared with the case where only a silicon halide is used as the source gas. For example, $SiF_4$ and $SiH_4$ may be used as the source gas for the formation of the insulator 104. Note that the flow ratio of $SiF_4$ to $SiH_4$ may be determined as appropriate in view of the amounts of water and hydrogen in the insulator 104 and the deposition rate. The details of the method for forming the insulator 104 will be described later.

Not only the amounts of water and hydrogen contained in the insulator 104, but also the amounts of water and hydrogen contained in a stacked film of insulators (in this embodiment, a stacked film of the insulator 105, the insulator 103, and the insulator 104) provided between the insulator 101 and the insulator 106a are preferably small. When the insulator 101 has a function of blocking water and hydrogen as described above, water and hydrogen supplied to an oxide to be the insulator 106a or the semiconductor 106b while the oxide is being deposited are those contained in the insulator 105, the insulator 103, and the insulator 104. Accordingly, when the amounts of water and hydrogen contained in the stacked film of the insulator 105, the insulator 103, and the insulator 104 are sufficiently small at the time of deposition for the oxide to be the insulator 106a or the semiconductor 106b, the amounts of water and hydrogen supplied to the insulator 106a and the semiconductor 106b can be small.

The amounts of hydrogen and water contained in the stacked film of the insulator 105, the insulator 103, and the insulator 104 are preferably small. For example, the number of water molecules released from the insulator 104 is preferably greater than or equal to $1.0 \times 10^{13}$ molecules/cm$^2$ and less than or equal to $1.4 \times 10^{16}$ molecules/cm$^2$, more preferably greater than or equal to $1.0 \times 10^{13}$ molecules/cm$^2$ and less than or equal to $4.0 \times 10^{15}$ molecules/cm$^2$, further more preferably greater than or equal to $1.0 \times 10^{13}$ molecules/cm$^2$ and less than or equal to $2.0 \times 10^{15}$ molecules/cm$^2$ in TDS analysis in the range of surface temperatures from 100° C. to 700° C. or from 100° C. to 500° C. The number of hydrogen molecules released from the insulator 104 is preferably greater than or equal to $1.0 \times 10^{13}$ molecules/cm$^2$ and less than or equal to $1.2 \times 10^{15}$ molecules/cm$^2$, more preferably greater than or equal to $1.0 \times 10^{13}$ molecules/cm$^2$ and less than or equal to $9.0 \times 10^{14}$ molecules/cm$^2$ in TDS analysis in the range of surface temperatures from 100° C. to 700° C. or from 100° C. to 500° C. The details of the method for measuring the number of released molecules using TDS analysis will be described later.

Such an insulator in which water and hydrogen are small may be used as an insulator other than the insulator 104, such as the insulator 105, or the insulator 112 or an insulator 118 to be described later. Furthermore, such an insulator may be used as the insulator 101, the insulator 116, or the like as long as the insulator has an adequate blocking property against hydrogen or water. In the case where a semiconductor element layer, a wiring layer, or the like is provided under the insulator 101, the insulator may be used for an interlayer insulating film between the insulator 101 and the semiconductor element layer or the wiring layer. In the case where a semiconductor element layer, a wiring layer, or the like is provided over the insulator 118, the insulator may be used for an interlayer insulating film between the insulator 118 and the semiconductor element layer or the wiring layer.

The insulator 104 is preferably an insulator containing excess oxygen. Such insulator 104 makes it possible to supply oxygen from the insulator 104 to the insulator 106a, the semiconductor 106b, and the insulator 106c. The supplied oxygen can reduce oxygen vacancies which are to be defects in the insulator 106a, the semiconductor 106b, and the insulator 106c which are oxide semiconductors. As a result, the insulator 106a, the semiconductor 106b, and the insulator 106c can be oxide semiconductors with a low density of defect states and stable characteristics.

In this specification and the like, excess oxygen refers to oxygen in excess of the stoichiometric composition, for example. Alternatively, excess oxygen refers to oxygen released from a film or layer containing excess oxygen by heating, for example Excess oxygen can move inside a film or a layer. Excess oxygen moves between atoms in a film or a layer, or replaces oxygen that is a constituent of a film or a layer and moves like a billiard ball, for example.

The insulator 104 containing excess oxygen releases oxygen molecules, the number of which is greater than or equal to $1.0 \times 10^{14}$ molecules/cm$^2$ and less than or equal to $1.0 \times 10^{16}$ molecules/cm$^2$ and preferably greater than or equal to $1.0 \times 10^{15}$ molecules/cm$^2$ and less than or equal to $5.0 \times 10^{15}$ molecules/cm$^2$ in TDS analysis in the range of a surface temperature from 100° C. to 700° C. or from 100° C. to 500° C.

A method for measuring the amount of released molecules using TDS analysis is described below by taking the amount of released oxygen as an example.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2} / S_{H2} \times S_{O2} \times \alpha$$

The value $N_{H2}$ is obtained by conversion of the number of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio of oxygen molecules to oxygen atoms can be calculated from the ionization rate of the oxygen molecules. Note that since the above a includes the ionization rate of the oxygen molecules, the number of the released oxygen atoms can also be estimated through the measurement of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator 104 may have a function of preventing diffusion of impurities from the substrate 100.

As described above, the top surface or the bottom surface of the semiconductor 106b preferably has high planarity. Thus, to improve the planarity, the top surface of the insulator 104 may be subjected to planarization treatment performed by a chemical mechanical polishing (CMP) method or the like.

The conductors 108a and 108b serve as a source electrode and a drain electrode of the transistor 10.

The conductors 108a and 108b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Here, it is preferable that the bottom surfaces of the conductors 108a and 108b not be in contact with the top surface of the insulator 104. For example, as in FIG. 1B, bottom surfaces of the conductors 108a and 108b may be in contact with only a top surface of the semiconductor 106b. This structure can inhibit extraction of oxygen from the insulator 104 at the bottom surfaces of the conductors 108a and 108b. Accordingly, the conductors 108a and 108b can be prevented from being partly oxidized to have increased resistivity, and oxygen can be effectively supplied from the insulator 104 to the insulator 106a, the semiconductor 106b, and the insulator 106c.

At least part of the conductors 108a and 108b preferably overlaps with the insulator 112 with the insulator 106c provided therebetween in a region not overlapping with the conductor 114. For example, the insulator 106c covers most of the top surfaces of the conductors 108a and 108b as illustrated in FIG. 1B. This structure can inhibit extraction of oxygen from the insulator 112 at the top surfaces of the conductors 108a and 108b. Accordingly, the conductors 108a and 108b can be prevented from being partly oxidized to have increased resistivity, and oxygen can be effectively supplied from the insulator 112 to the insulator 106a, the semiconductor 106b, and the insulator 106c.

The insulator 112 functions as a gate insulating film of the transistor 10. Like the insulator 104, the insulator 112 may be an insulator containing excess oxygen. Such insulator 112 makes it possible to supply oxygen from the insulator 112 to the insulator 106a, the semiconductor 106b, and the insulator 106c.

The insulator 112 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114 functions as a gate electrode of the transistor 10. The conductor 114 can be formed using the conductor that can be used as the conductor 102.

Here, as illustrated in FIG. 1C, the semiconductor 106b can be electrically surrounded by an electric field of the conductor 102 and the conductor 114 (a structure in which a semiconductor is electrically surrounded by an electric field of a conductor is referred to as a surrounded channel (s-channel) structure). Therefore, a channel is formed in the entire semiconductor 106b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 30 nm, still further preferably greater than or equal to 50 nm. Since the productivity of the semiconductor device might be decreased, the semiconductor 106b has a region with a thickness of, for example, less than or equal to 300 nm, preferably less than or equal to 200 nm, further preferably less than or equal to 150 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

The insulator 116 functions as a protective insulating film of the transistor 10. Here, the thickness of the insulator 116 can be greater than or equal to 5 nm, or greater than or equal to 20 nm, for example. It is preferable that at least part of the insulator 116 be in contact with the top surface of the insulator 104 or a top surface of the insulator 112.

The insulator 116 may be formed to have a single-layer structure or a stacked-layer structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 116 preferably has a blocking effect against oxygen, hydrogen, water, alkali metal, alkaline earth metal, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Here, it is preferable that the insulator 116 be formed by a sputtering method and it is further preferable that the insulator 116 be formed by a sputtering method in an atmosphere containing oxygen. When the insulator 116 is formed by a sputtering method, oxygen is added to the vicinity of a surface of the insulator 104 or a surface of the insulator 112 (after the formation of the insulator 116, an interface between the insulator 116 and the insulator 104 or the insulator 112) at the same time as the formation.

It is preferable that the insulator 116 be less permeable to oxygen than the insulator 104 and the insulator 112 and have a function of blocking oxygen. Providing the insulator 116 can prevent oxygen from being externally released to above the insulator 116 at the time of supply of oxygen from the insulator 104 and the insulator 112 to the insulator 106a, the semiconductor 106b, and the insulator 106c.

Aluminum oxide is preferably used as the insulator 116 because it is highly effective in preventing transmission of both oxygen and impurities such as hydrogen and moisture.

An oxide that can be used for the insulator 106a or the insulator 106c can be used for the insulator 116. Such an oxide can be relatively easily formed by a sputtering method, and thus, oxygen can be effectively added to the insulator 104 and the insulator 112. The insulator 116 is preferably formed with an oxide insulator containing In, such as an In—Al oxide, an In—Ga oxide, or an In—Ga—Zn oxide. An oxide insulator containing In is favorably used for the insulator 116 because the number of particles generated at the time of the deposition by a sputtering method is small.

The insulator 118 functions as an interlayer insulating film. The insulator 118 may be formed using the insulator that can be used as the insulator 105.

The conductor 120a and the conductor 120b function as wirings electrically connected to the source electrode and the drain electrode of the transistor 10. As the conductor 120a and the conductor 120b, the conductor that can be used for the conductor 108a and the conductor 108b is used.

When the above-described structure is employed, a transistor with stable electrical characteristics, a transistor having a low leakage current in an off state, a transistor with high frequency characteristics, a transistor with normally-off electrical characteristics, a transistor with a small subthreshold swing value, or a highly reliable transistor can be provided.

<Modification Example of Transistor>

Modification examples of the transistor 10 are described below with reference to FIGS. 7A to 7D to FIGS. 12A to 12D. FIGS. 7A to 7D to FIGS. 12A to 12D are cross-sectional views in the channel length direction and those in the channel width direction like FIGS. 1B and 1C.

Figure 7A:
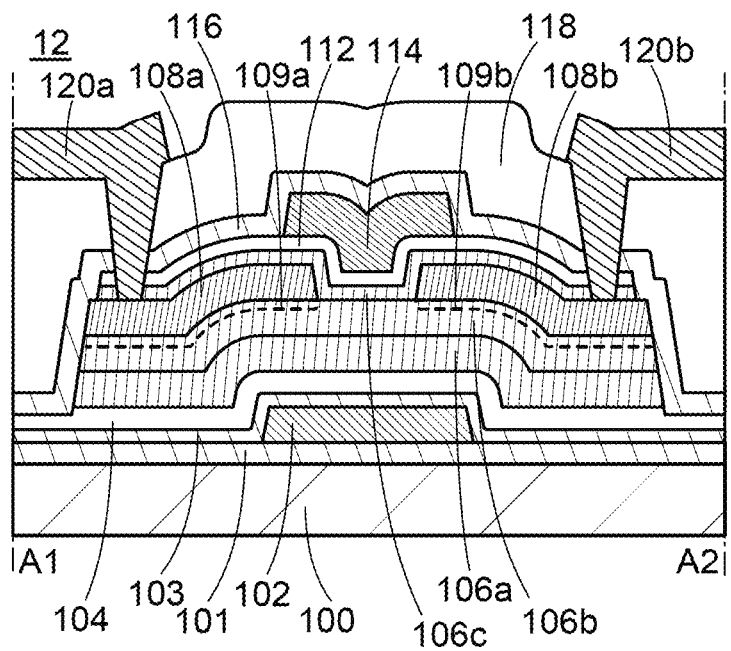
FIGS. 7A to 7D are cross-sectional views illustrating transistors of embodiments of the present invention.
Figure 7B:
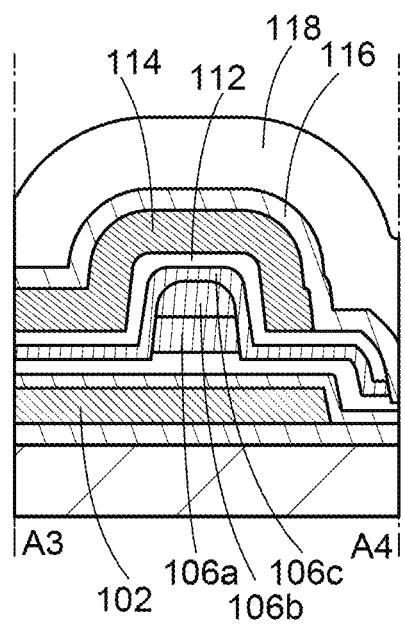

A transistor 12 illustrated in FIGS. 7A and 7B differs from the transistor 10 in that the insulator 105 is not provided. That is, the conductor 102 is surrounded by the insulator 101 and the insulator 103. Here, the insulator 101 and the insulator 103 preferably have an oxygen-blocking property. This structure can inhibit oxidation of the conductor 102 due to extraction of oxygen from the conductor 102 by the insulator 104 and the like. Accordingly, the conductor 102 can be prevented from being partly oxidized to have increased resistivity, and oxygen can be effectively supplied to the insulator 106a, the semiconductor 106b, and the insulator 106c.

Figure 7C:
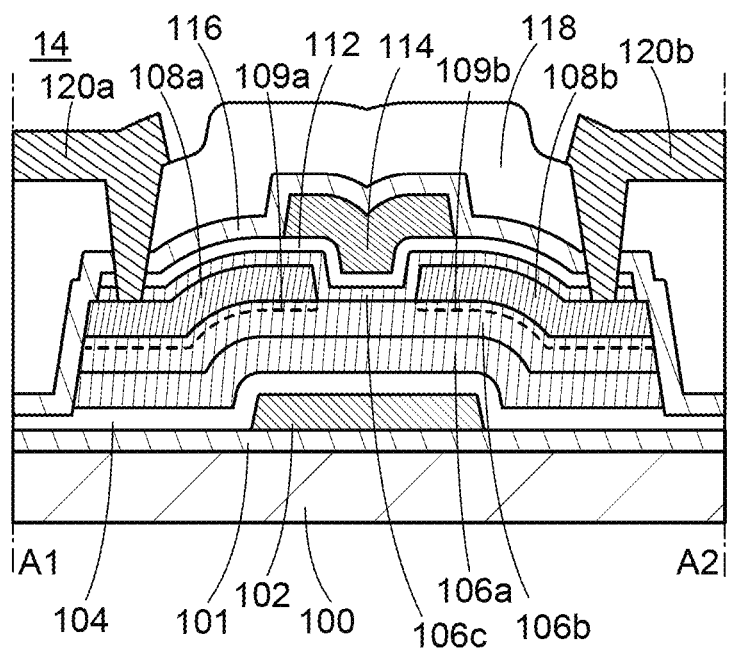
Figure 7D:
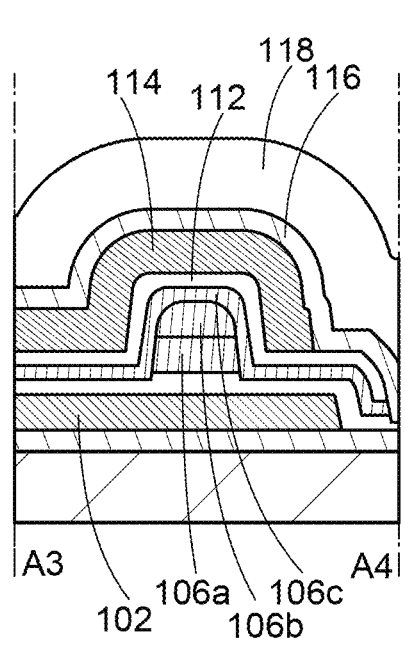

A transistor 14 illustrated in FIGS. 7C and 7D differs from the transistor 10 in that the insulator 103 and the insulator 105 are not provided. That is, the conductor 102 is covered with the insulator 104. Here, the insulator 101 preferably has an oxygen-blocking property. This structure can prevent oxygen diffused in the insulator 104 from being diffused into layers under the insulator 104 when oxygen is supplied from the insulator 104 to the insulator 106a, the semiconductor 106b, and the insulator 106c. Accordingly, oxygen can be effectively supplied to the insulator 106a, the semiconductor 106b, and the insulator 106c.

A highly oxidation-resistant conductor such as Ru, titanium nitride, tungsten silicide, platinum, iridium, ruthenium oxide, or iridium oxide may be used for the conductor 102 in the transistor 14. With this structure, the conductor 102 has resistance to oxidation by halogen such as fluorine contained in a deposition atmosphere for the insulator 104, so that oxidation of the conductor 102 can be prevented.

Figure 8A:
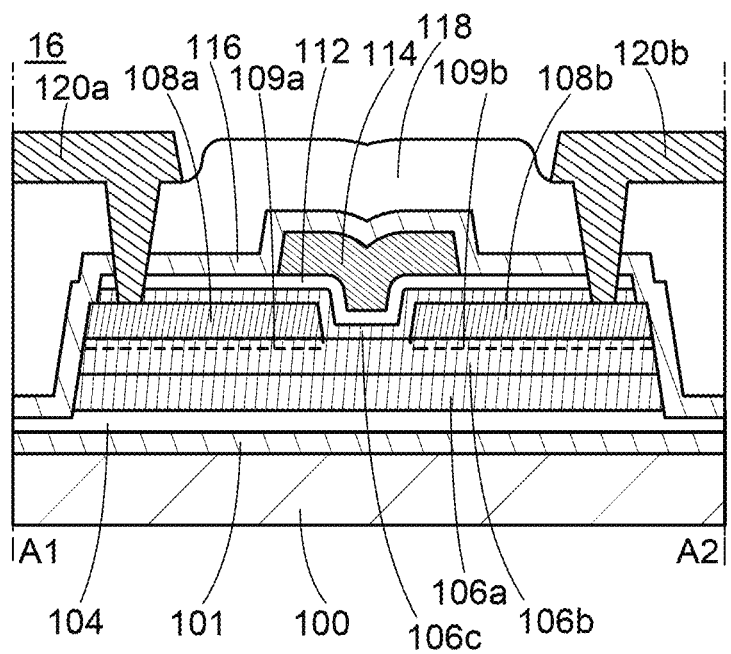
FIGS. 8A to 8D are cross-sectional views illustrating transistors of embodiments of the present invention.
Figure 8B:
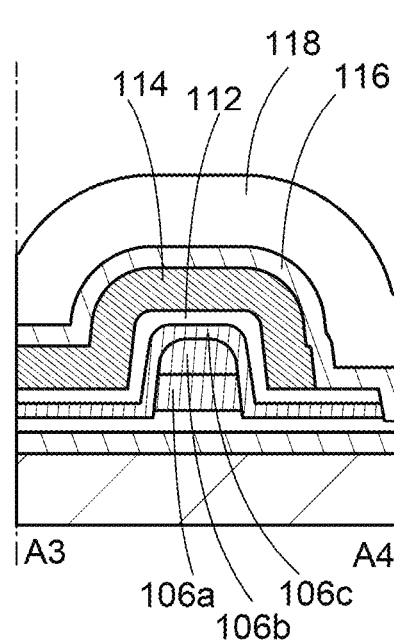

A transistor 16 illustrated in FIGS. 8A and 8B differs from the transistor 10 in that the conductor 102, the insulator 103, and the insulator 105 are not provided. Here, the insulator 101 preferably has an oxygen-blocking property. This structure can prevent oxygen diffused in the insulator 104 from being diffused into layers under the insulator 104 when oxygen is supplied from the insulator 104 to the insulator 106a, the semiconductor 106b, and the insulator 106c. Accordingly, oxygen can be effectively supplied to the insulator 106a, the semiconductor 106b, and the insulator 106c.

Figure 8C:
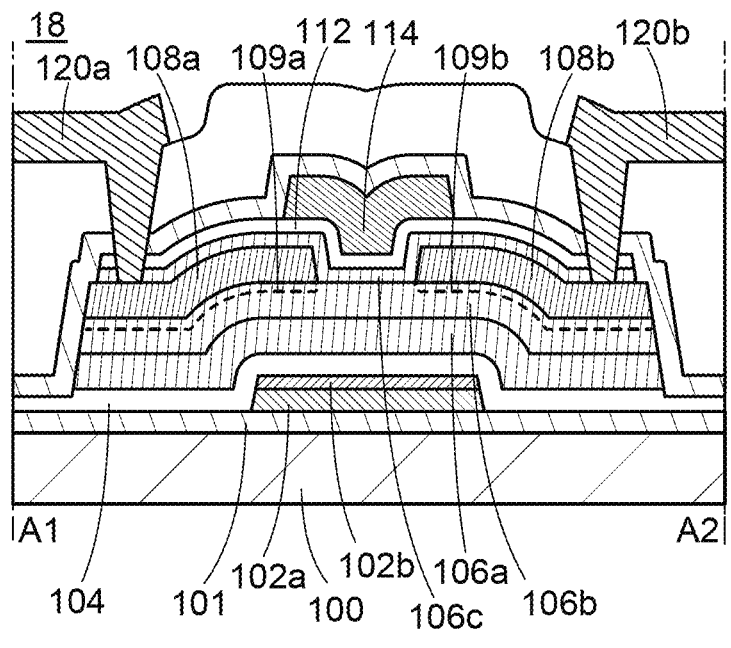
Figure 8D:
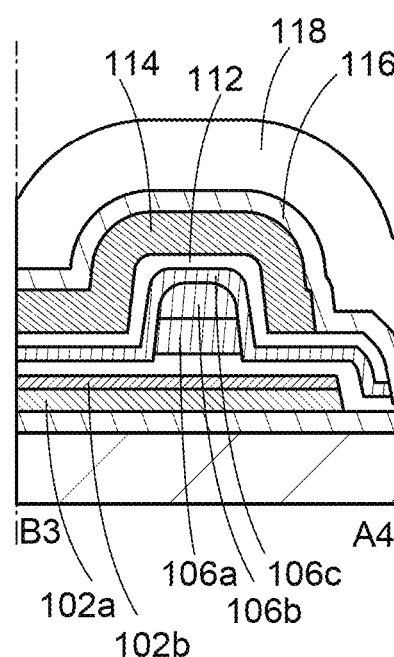

A transistor 18 illustrated in FIGS. 8C and 8D differs from the transistor 14 in that a stacked structure in which a conductor 102b is formed over a conductor 102a is employed instead of the conductor 102. The conductor 102a may be formed with the conductor that can be used as the conductor 102. The conductor 102b may be formed with a highly oxidation-resistant conductor such as Ru, titanium nitride, tungsten silicide, platinum, iridium, ruthenium oxide, or iridium oxide. With this structure, the conductor 102b has resistance to oxidation by halogen such as fluorine contained in a deposition atmosphere for the insulator 104, so that oxidation of the conductor 102a can be prevented.

Figure 9A:
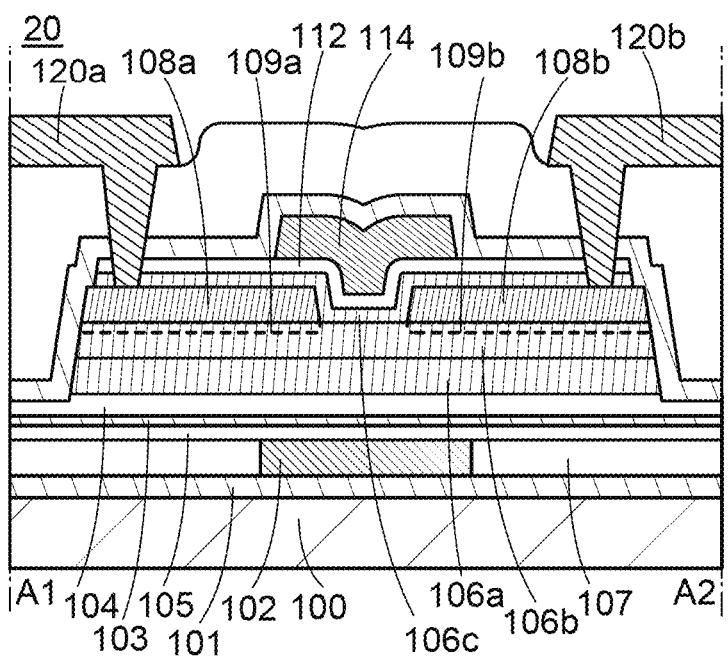
FIGS. 9A and 9B are cross-sectional views illustrating a transistor of one embodiment of the present invention.
Figure 9B:
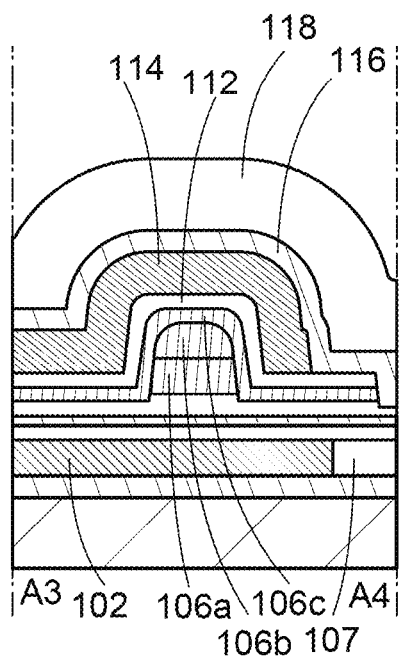

A transistor 20 illustrated in FIGS. 9A and 9B differs from the transistor 10 in that an insulator 107 is provided over the insulator 101 and the conductor 102 is embedded in an opening in the insulator 107. The insulator 107 may be formed with the insulator that can be used as the insulator 105. It is preferable that top surfaces of the insulator 107 and the conductor 102 be subjected to planarization treatment such as a CMP method in order to improve its planarity. With this structure, the planarity of a surface on which the semiconductor 106b is formed is not degraded even when the conductor 102 serving as a back gate is provided. Accordingly, the carrier mobility can be improved and the on-state current of the transistor 20 can be increased. Moreover, since there is no surface unevenness of the insulator 104 caused by the shape of the conductor 102, leakage current generated between the conductor 108a or 108b serving as a drain and the conductor 102 through an uneven portion of the insulator 104 can be reduced. Thus, the off-state current of the transistor 20 can be reduced.

Figure 10A:
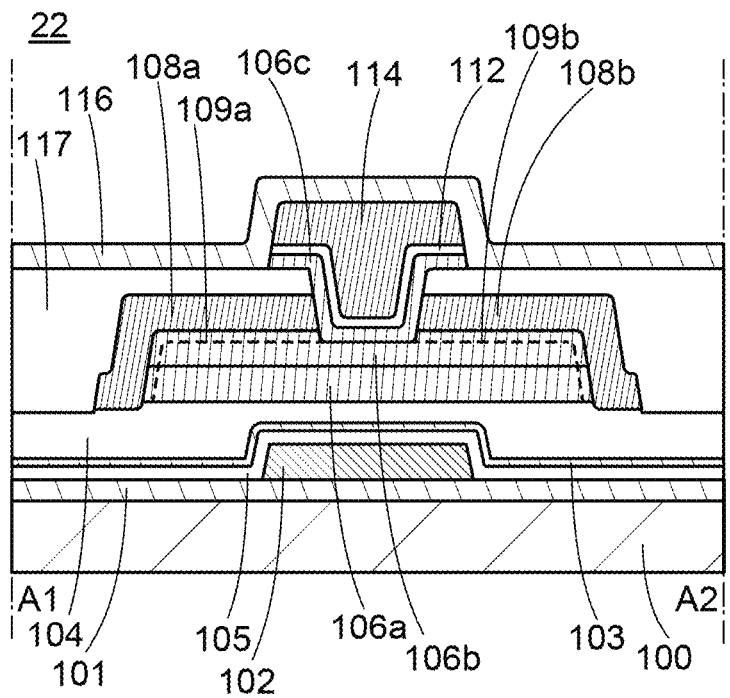
FIGS. 10A to 10D are cross-sectional views illustrating transistors of embodiments of the present invention.
Figure 10B:
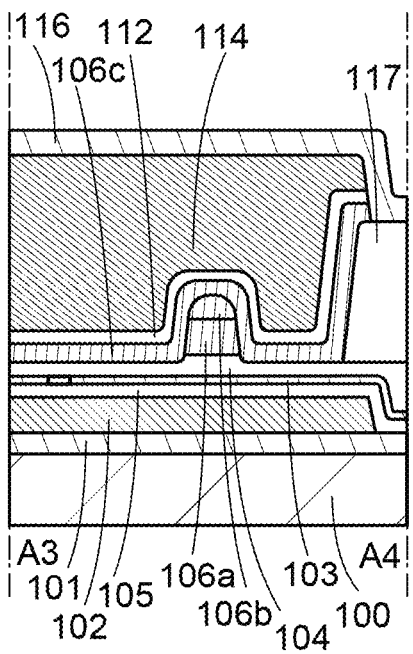

A transistor 22 illustrated in FIGS. 10A and 10B differs from the transistor 20 in that an insulator 117 is formed to cover top surfaces of the conductor 108a, the conductor 108b, and the insulator 104, an opening reaching the semiconductor 106b is formed in the insulator 117, and the insulator 106c, the insulator 112, and the conductor 114 are provided to fill the opening. The conductor 108a and the conductor 108b are separated by the opening. In the transistor 22, the conductor 114 serving as a gate electrode is formed in a self-aligned manner by filling the opening formed in the insulator 117 and the like; thus, the transistor 22 can be called a trench gate self-aligned (TGSA) s-channel FET.

The insulator 117 may be formed with the insulator that can be used as the insulator 104. A top surface of the insulator 117 is preferably planarized by a CMP method.

In the case where a silicon halide such as $SiF_4$ is used for the formation of the insulator 117 as in the formation of the insulator 104, halogen such as fluorine is contained in the insulator 117. Oxygen in the insulator 117 is replaced with fluorine by heat treatment, so that oxygen is released. A structure may be employed in which the released oxygen is supplied to the insulator 106a or the semiconductor 106b. It is preferable that halogen such as fluorine be contained in the insulator 117 and the insulator 117 function as a low-k film with a relative permittivity of lower than 3.5, preferably lower than 3. Such an insulator used as the insulator 117 can further reduce the parasitic capacitance.

In the transistor 22, the insulator 117, the insulator 106c, and the insulator 112 are provided between the conductor 108a and the conductor 114 and between the conductor 108b and the conductor 114. Accordingly, the distance between a top surface of the conductor 108a and a bottom surface of the conductor 114 and the distance between a top surface of the conductor 108b and the bottom surface of the conductor 114 can be increased by the thickness of the insulator 117. Therefore, parasitic capacitance generated in a region where the conductor 114 and the conductor 108a or the conductor 108b overlap each other can be reduced. The switching speed of the transistor can be improved by the reduction in parasitic capacitance, so that the transistor can have high frequency characteristics.

Figure 10C:
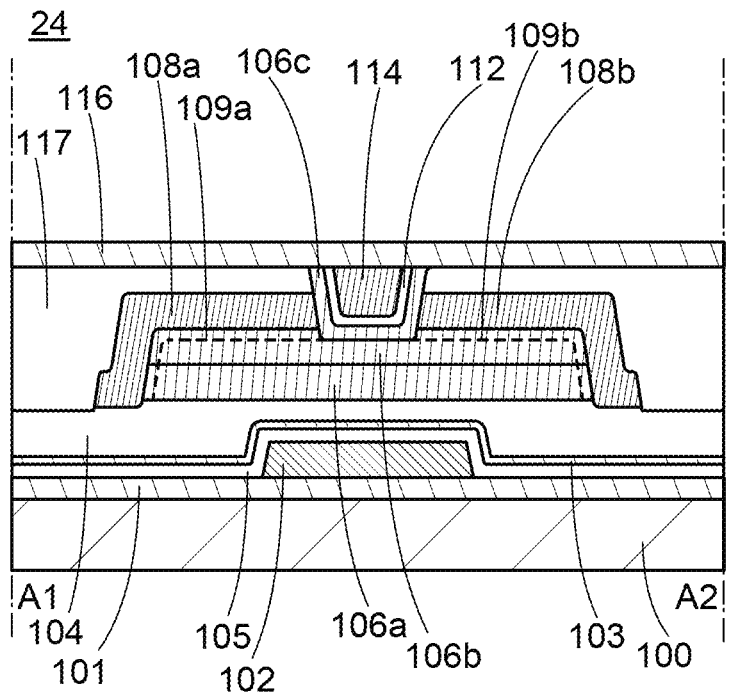
Figure 10D:
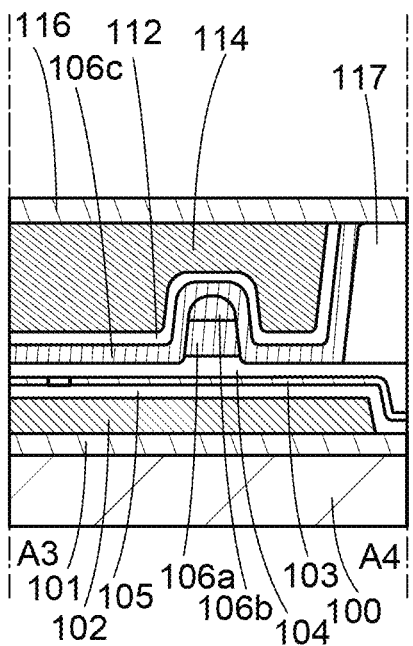

A transistor 24 illustrated in FIGS. 10C and 10D differs from the transistor 22 in that top surfaces of the insulator 117, the insulator 106c, the insulator 112, and the conductor 114 are substantially aligned with one another and flat. This can be achieved by planarizing the top surfaces of the insulator 117, the insulator 106c, the insulator 112, and the conductor 114 by a CMP method or the like.

In this structure, there is hardly any region where the conductor 114 and the conductor 108a or the conductor 108b overlap each other; as a result, parasitic capacitance in the transistor 24 between a gate and a source and between the gate and a drain can be reduced. The switching speed of the transistor can be improved by the reduction in parasitic capacitance, so that the transistor can have high frequency characteristics.

Figure 11A:
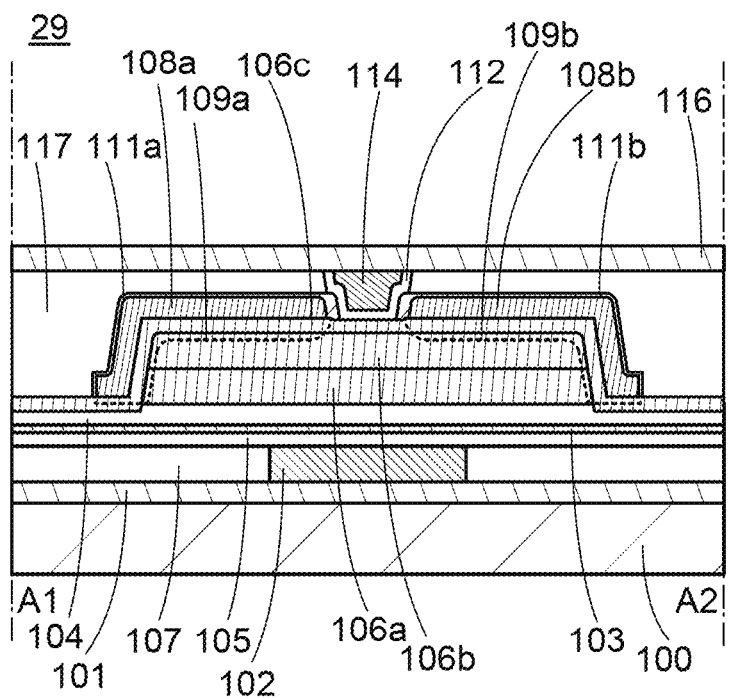
FIGS. 11A and 11B are cross-sectional views illustrating a transistor of one embodiment of the present invention.
Figure 11B:
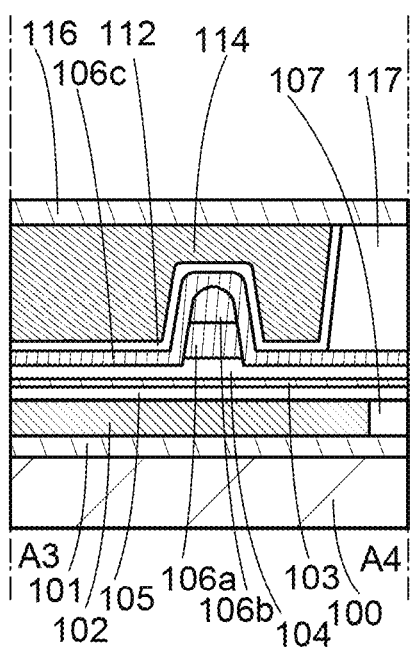

A transistor 29 illustrated in FIGS. 11A and 11B differs from the transistor 24 in that the insulator 107 is provided over the insulator 101 and the conductor 102 is embedded in an opening in the insulator 107. In addition, the transistor 29 differs from the transistor 24 also in that the insulator 106c covers the insulator 106a and the semiconductor 106b. In the transistor 29, the insulator 106c is not provided on a side surface of the opening formed in the insulator 117. With this structure, the conductor 114 in the opening in the insulator 117 can have a longer length in the channel length direction than the conductor 114 in the transistor 24 or the like.

In the transistor 29, a metal oxide 111a is provided on top and side surfaces of the conductor 108a and a metal oxide 111b is provided on top and side surfaces of the conductor 108b. The thicknesses of the metal oxides 111a and 111b on the side surfaces of the conductors 108a and 108b are larger than those on the top surfaces of the conductors 108a and 108b in some cases. This is because the metal oxides 111a and 111b on the top surfaces of the conductors 108a and 108b are formed in a different step from a step of forming the metal oxides 111a and 111b on the side surfaces of the conductors 108a and 108b.

The conductors 108a and 108b are oxidized in one or more steps of formation of the insulator 117, formation of the insulator 112, plasma treatment, and the like, whereby the metal oxides 111a and 111b are formed. In that case, the metal oxides 111a and 111b are oxides that include a constituent element of the conductors 108a and 108b.

The total volume of the conductor 108a and the metal oxide 111a is sometimes larger than the volume of the conductor 108a before the metal oxide 111a is formed. Similarly, the total volume of the conductor 108b and the metal oxide 111b is sometimes larger than the volume of the conductor 108b before the metal oxide 111b is formed.

In the transistor 29 including the metal oxides 111a and 111b provided on the top and side surfaces of the conductors 108a and 108b, the electric field concentration at an end portion of a drain electrode is relieved. Therefore, the transistor 29 can be highly reliable and have a small short-channel effect.

Note that formation of the metal oxides 111a and 111b is not limited to the transistor 29. For example, another transistor may include the metal oxides 111a and 111b.

Figure 12A:
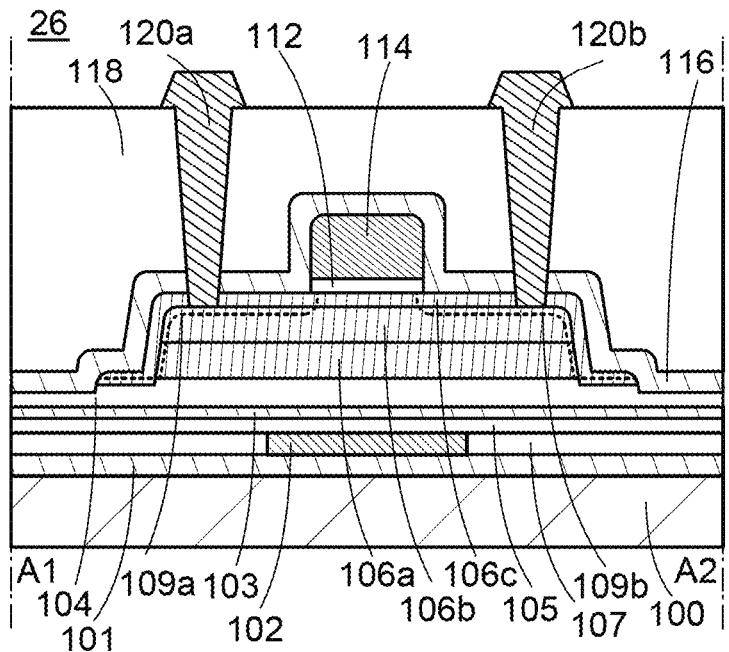
FIGS. 12A to 12D are cross-sectional views illustrating transistors of embodiments of the present invention.
Figure 12B:
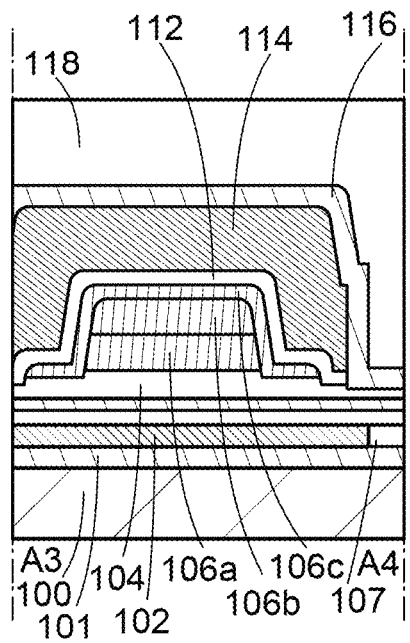

A transistor 26 illustrated in FIGS. 12A and 12B differs from the transistor 20 in that the conductors 108a and 108b are not provided and side surfaces of end portions of the conductor 114 and the insulator 112 are substantially aligned with each other. The above-described transistors such as the transistor 10 and the like are formed by a gate-last method by which the low-resistance regions 109a and 109b serving as a source region and a drain region are formed before the conductor 114 serving as a gate is formed in the process for fabricating a transistor. In contrast, the transistor 26 is formed by a gate-first method by which the low-resistance regions 109a and 109b serving as a source region and a drain region are formed after the conductor 114 serving as a gate is formed in the process for fabricating a transistor.

The low-resistance regions 109a and 109b in the transistor 26 include at least one of elements included in the insulator 116. It is preferable that part of the low-resistance regions 109a and 109b be substantially in contact with a region of the semiconductor 106b overlapping with the conductor 114 (a channel formation region) or overlap with part of the region.

Since an element included in the insulator 116 is added to the low-resistance regions 109a and 109b, the concentration of the element, which is measured by SIMS, in the low-resistance regions 109a and 109b is higher than that in a region of the semiconductor 106b other than the low-resistance regions 109a and 109b (for example, a region of the semiconductor 106b overlapping with the conductor 114).

Preferable examples of the element added to the low-resistance regions 109a and 109b are boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. These elements relatively easily form oxides and the oxides can serve as a semiconductor or an insulator; therefore, these elements are suitable as an element added to the insulator 106a, the semiconductor 106b, or the insulator 106c. For example, the concentration of the element in the low-resistance regions 109a and 109b is preferably higher than or equal to $1 \times 10^{14}$ molecules/cm$^2$ and lower than or equal to $2 \times 10^{16}$ molecules/cm$^2$. The concentration of the element in the low-resistance regions 109a and 109b in the insulator 106c is higher than that in the region of the semiconductor 106b other than the low-resistance regions 109a and 109b (for example, the region of the semiconductor 106b overlapping with the conductor 114).

Since the low-resistance regions 109a and 109b can become n-type by containing nitrogen, the concentration of nitrogen, which is measured by SIMS, in the low-resistance regions 109a and 109b is higher than that in a region of the semiconductor 106b other than the low-resistance regions 109a and 109b (for example, the region of the semiconductor 106b overlapping with the conductor 114).

The formation of the low-resistance region 109a and the low-resistance region 109b leads to a reduction in contact resistance between the conductor 108a or 108b and the insulator 106a, the semiconductor 106b, or the insulator 106c, whereby the transistor 10 can have high on-state current.

In the transistor 26, the semiconductor 106b is surrounded by the insulator 106a and the insulator 106c. Thus, the insulator 106a and the insulator 106c are in contact with a side surface of an end portion of the semiconductor 106b, in particular, the vicinity of the side surface of the end portion in the channel width direction. With this structure, near the end portion of the side surface of the semiconductor 106b, continuous junction is formed between the semiconductor 106b and the insulator 106a or the insulator 106c, and the density of defect states is reduced. Although on-state current flows more easily through the transistor including the low-resistance regions 109a and 109b, the side surface of the end portion of the semiconductor 106b in the channel width direction does not form parasitic channel; therefore, stable electrical characteristics can be obtained.

Figure 12C:
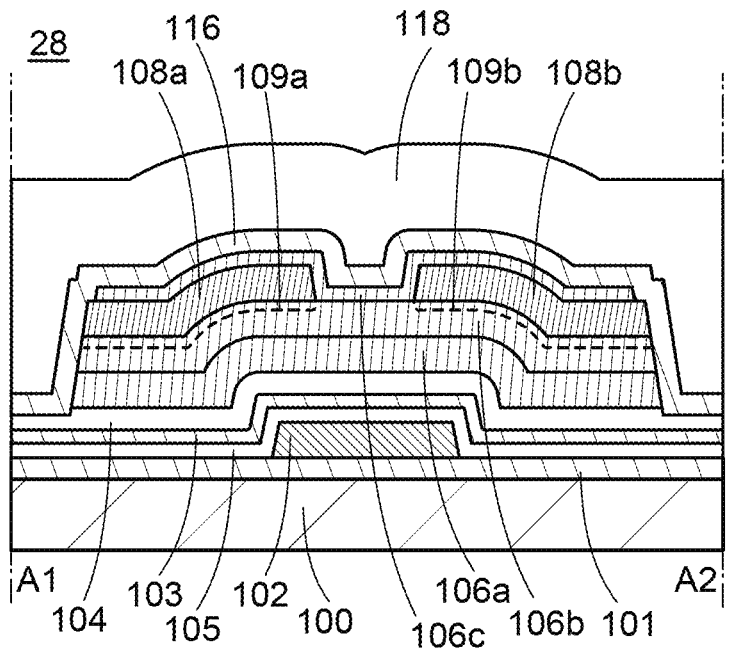
Figure 12D:
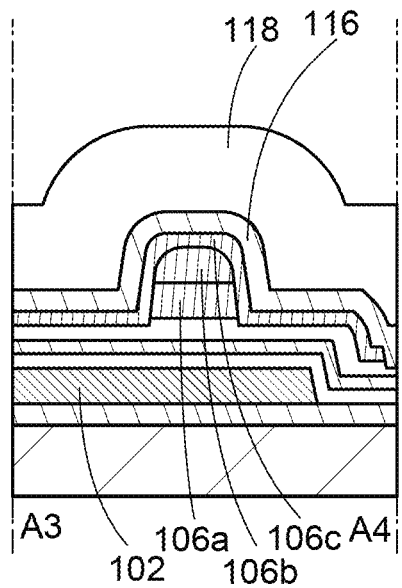

A transistor 28 illustrated in FIGS. 12C and 12D differs from the transistor 10 in that the insulator 112 and the conductor 114 are not provided. That is, the transistor 28 is what we call a bottom gate transistor.

The structure and method described in this embodiment can be implemented by being combined as appropriate with any of the other structures and methods described in the other embodiments.

Embodiment 2

In this embodiment, methods for manufacturing semiconductor devices of embodiments of the present invention are described with reference to FIGS. 13A to 13H to FIGS. 19A to 19F.

<Fabrication Method of Transistor>

A method for fabricating the transistor 10 is described below with reference to FIGS. 13A to 13H, FIGS. 14A to 14F, and FIGS. 15A to 15D.

First, the substrate 100 is prepared. Any of the above-mentioned substrates can be used for the substrate 100.

Next, the insulator 101 is formed. Any of the above-mentioned insulators can be used for the insulator 101.

The insulator 101 may be formed by a sputtering method, a chemical vapor deposition (CVD) method, a molecular beam epitaxy (MBE) method, a pulsed laser deposition (PLD) method, an atomic layer deposition (ALD) method, or the like.

Next, a conductor to be the conductor 102 is formed. Any of the above-described conductors can be used for the conductor to be the conductor 102. The conductor can be formed by a sputtering method, a CVD method, an MBE method, a PLD method, an ALD method, or the like.

Figure 13A:
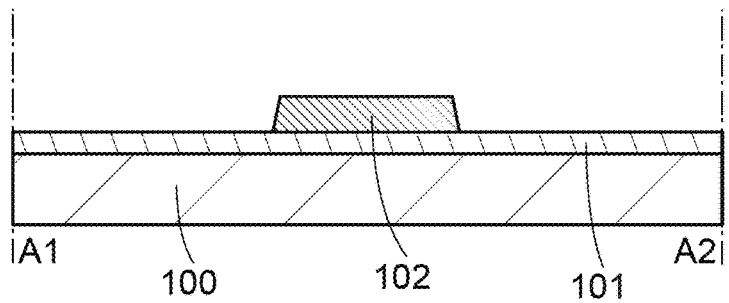
FIGS. 13A to 13H are cross-sectional views illustrating a method for fabricating a transistor of one embodiment of the present invention.
Figure 13B:
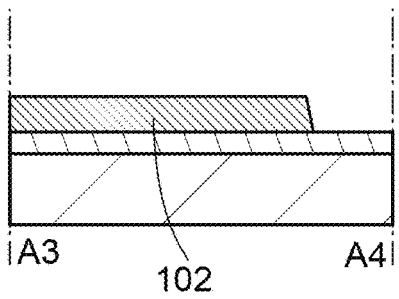

Next, a resist or the like is formed over the conductor and processing is performed using the resist or the like, whereby the conductor 102 is formed (see FIGS. 13A and 13B). Note that the case where the resist is simply formed also includes the case where a BARC is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Then, the insulator 105 is formed. Any of the above-described insulators can be used for the insulator 105. The insulator 105 can be formed by a sputtering method, a CVD method, an MBE method, a PLD method, an ALD method, or the like. In order to reduce water and hydrogen contained in the insulator 105, the insulator 105 may be formed while the substrate is being heated. For example, in the case where a semiconductor element layer is provided below the transistor 10, the heat treatment may be performed in a relatively low temperature range (e.g., higher than or equal to 350° C. and lower than or equal to 445° C.).

Alternatively, the insulator 105 may be formed by a PECVD method in a manner similar to that of the insulator 104 to be described later in order to reduce water and hydrogen contained in the insulator 105.

Then, the insulator 103 is formed. Any of the above-described insulators can be used for the insulator 103. The insulator 103 can be formed by a sputtering method, a CVD method, an MBE method, a PLD method, an ALD method, or the like. In order to reduce water and hydrogen contained in the insulator 103, the insulator 103 may be formed while the substrate is being heated. For example, in the case where a semiconductor element layer is provided under the transistor 10, the heat treatment may be performed in a relatively low temperature range (e.g., higher than or equal to 350° C. and lower than or equal to 445° C.).

CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

In a conventional deposition apparatus utilizing a CVD method, one or a plurality of source gases for reaction are supplied to a chamber at the same time at the time of deposition. In a deposition apparatus utilizing an ALD method, a source gas (also called a precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, a precursor is introduced into a chamber and adsorbed onto a substrate surface (first step). Here, the precursor is adsorbed onto the substrate surface, whereby a self-limiting mechanism of surface chemical reaction works and no more precursor is adsorbed onto a layer of the precursor over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that an excessive precursor, a reaction product, and the like are released from the chamber (second step). Instead of introduction of an inert gas, vacuum evacuation can be performed to release an excessive precursor, a reaction product, and the like from the chamber. Then, a reactant (e.g., an oxidizer such as $H_2O$ or $O_3$) is introduced into the chamber to react with the precursor adsorbed onto the substrate surface, whereby part of the precursor is removed while the molecules of the film are adsorbed onto the substrate (third step). After that, introduction of an inert gas or vacuum evacuation is performed, whereby excessive reactant, a reaction product, and the like are released from the chamber (fourth step).

Note that the introduction of a reactant at the third step and the introduction of an inert gas at the fourth step may be repeatedly performed. That is, after the first step and the second step are performed, the third step, the fourth step, the third step, and the fourth step may be performed, for example.

For example, it is possible to introduce $O_3$ as an oxidizer at the third step, to perform $N_2$ purging at the fourth step, and to repeat these steps.

In the case where the third and fourth steps are repeated, the same reactant is not necessarily used for the repeated introduction. For example, $H_2O$ may be used as an oxidizer at the third step (for the first time), and $O_3$ may be used as an oxidizer at the third steps (at the second and subsequent times).

As described above, the introduction of an oxidizer and the introduction of an inert gas (or vacuum evacuation) in the chamber are repeated multiple times in a short time, whereby excess hydrogen atoms and the like can be more certainly removed from the precursor adsorbed onto the substrate surface and eliminated from the chamber. In the case where two kinds of oxidizers are introduced, more excess hydrogen atoms and the like can be removed from the precursor adsorbed onto the substrate surface. In this manner, hydrogen atoms are prevented from entering the insulator 103 and the like during the deposition, so that the amounts of water, hydrogen, and the like in the insulator 103 and the like can be small.

By the above-described method, the insulator 103 releases water molecules, the number of which is greater than or equal to $1.0 \times 10^{13}$ molecules/cm$^2$ and less than or equal to $1.0 \times 10^{16}$ molecules/cm$^2$ and preferably greater than or equal to $1.0 \times 10^{13}$ molecules/cm$^2$ and less than or equal to $3.0 \times 10^{15}$ molecules/cm$^2$ in TDS analysis in the range of a surface temperature from 100° C. to 700° C. or from 100° C. to 500° C.

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for fabricating a minute transistor.

In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

By an ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

Figure 16A:
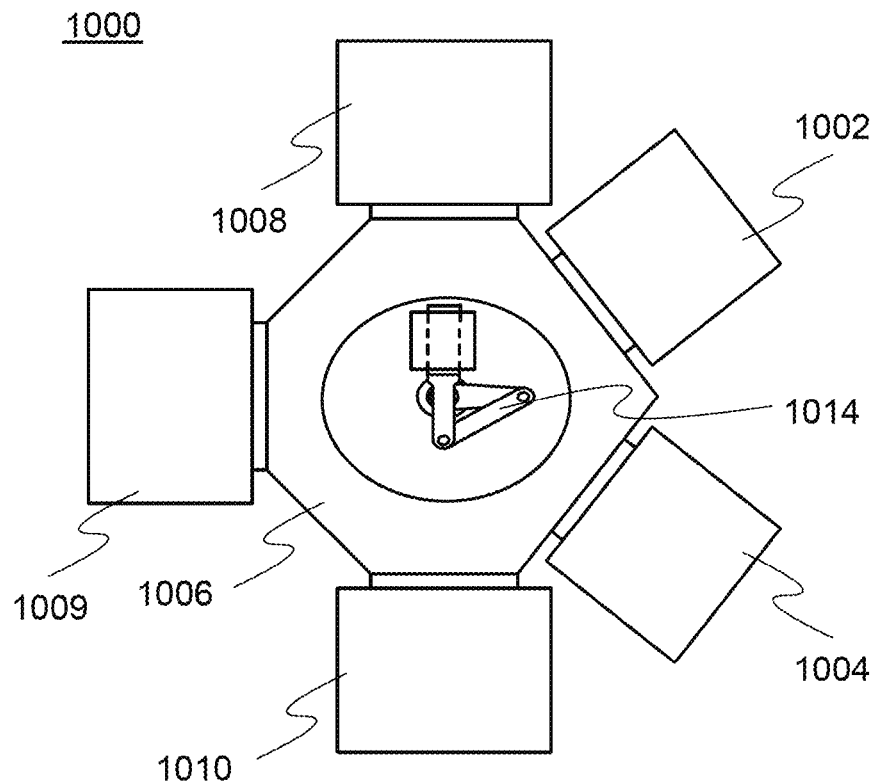
FIGS. 16A and 16B are a schematic diagram and a cross-sectional view illustrating a deposition apparatus.
Figure 16B:
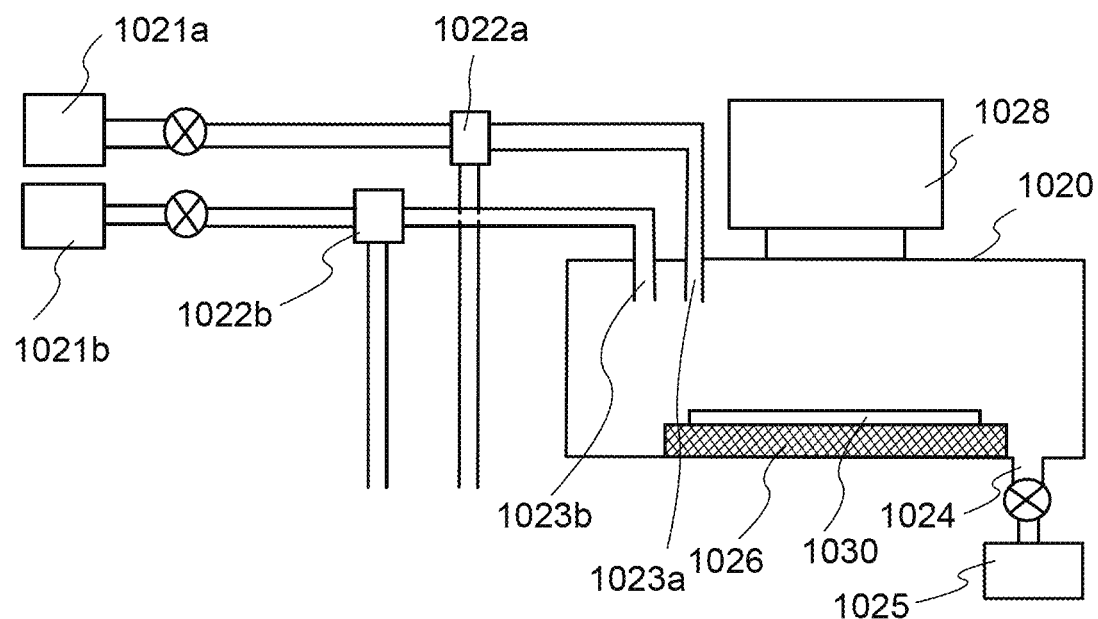

Here, a structure of a deposition apparatus 1000 is described with reference to FIGS. 16A and 16B as an example of an apparatus with which a film can be formed by an ALD method. FIG. 16A is a schematic diagram of a multi-chamber deposition apparatus 1000, and FIG. 16B is a cross-sectional view of an ALD apparatus that can be used for the deposition apparatus 1000.

<<Example of Structure of Deposition Apparatus>>

The deposition apparatus 1000 includes a carrying-in chamber 1002, a carrying-out chamber 1004, a transfer chamber 1006, a deposition chamber 1008, a deposition chamber 1009, a deposition chamber 1010, and a transfer arm 1014. Here, the carrying-in chamber 1002, the carrying-out chamber 1004, and the deposition chambers 1008 to 1010 are connected to the transfer chamber 1006. Thus, successive film formation can be performed in the deposition chambers 1008 to 1010 without exposure to the air, whereby entry of impurities into a film can be prevented.

Note that in order to prevent attachment of moisture, the carrying-in chamber 1002, the carrying-out chamber 1004, the transfer chamber 1006, and the deposition chambers 1008 to 1010 are preferably filled with an inert gas (such as a nitrogen gas) whose dew point is controlled, more preferably maintain reduced pressure.

An ALD apparatus can be used for the deposition chambers 1008 to 1010. A deposition apparatus other than an ALD apparatus may be used for any of the deposition chambers 1008 to 1010. Examples of the deposition apparatus used for the deposition chambers 1008 to 1010 include a sputtering apparatus, a PECVD apparatus, a TCVD apparatus, and an MOCVD apparatus.

For example, when an ALD apparatus and a PECVD apparatus are provided in the deposition chambers 1008 to 1010, the insulator 105 made of silicon oxide and included in the transistor 10 in FIGS. 1B and 1C can be formed by a PECVD method, the insulator 103 made of hafnium oxide can be formed by an ALD method, and the insulator 104 made of silicon oxide containing halogen can be formed by a PECVD method. Because the series of film formation is successively performed without exposure to the air, films can be formed without entry of impurities into the films.

Although the deposition apparatus 1000 includes the carrying-in chamber 1002, the carrying-out chamber 1004, and the deposition chambers 1008 to 1010, the present invention is not limited to this structure. The deposition apparatus 1000 may have four or more deposition chambers, or may additionally include a treatment chamber for heat treatment or plasma treatment. The deposition apparatus 1000 may be of a single-wafer type or may be of a batch type, in which case film formation is performed on a plurality of substrates at a time.

<<ALD Apparatus>>

Next, a structure of an ALD apparatus that can be used for the deposition apparatus 1000 is described. The ALD apparatus includes a deposition chamber (chamber 1020), source material supply portions 1021a and 1021b, high-speed valves 1022a and 1022b which are flow rate controllers, source material introduction ports 1023a and 1023b, a source material exhaust port 1024, and an evacuation unit 1025. The source material introduction ports 1023a and 1023b provided in the chamber 1020 are connected to the source material supply portions 1021a and 1021b, respectively, through supply tubes and valves. The source material exhaust port 1024 is connected to the evacuation unit 1025 through an exhaust tube, a valve, and a pressure controller.

A plasma generation apparatus 1028 is connected to the chamber 1020 as illustrated in FIG. 16B, whereby film formation can be performed by a plasma ALD method instead of a thermal ALD method. By a plasma ALD method, a film can be formed without decreasing the deposition rate even at low temperatures; thus, a plasma ALD method is preferably used for a single-wafer type deposition apparatus with low deposition efficiency.

A substrate holder 1026 with a heater is provided in the chamber, and a substrate 1030 over which a film is to be formed is provided over the substrate holder 1026.

In the source material supply portions 1021a and 1021b, a source gas is formed from a solid source material or a liquid source material by using a vaporizer, a heating unit, or the like. Alternatively, the source material supply portions 1021a and 1021b may supply a source gas.

Although two source material supply portions 1021a and 1021b are provided as an example, the number of source material supply portions is not limited thereto, and three or more source material supply portions may be provided. The high-speed valves 1022a and 1022b can be accurately controlled by time, and a source gas and an inert gas are supplied by the high-speed valves 1022a and 1022b. The high-speed valves 1022a and 1022b are flow rate controllers for a source gas, and can also be referred to as flow rate controllers for an inert gas.

In the deposition apparatus illustrated in FIG. 16B, a thin film is formed over a surface of the substrate 1030 in the following manner: the substrate 1030 is transferred to be put on the substrate holder 1026, the chamber 1020 is sealed, the substrate 1030 is heated to a desired temperature (e.g., higher than or equal to 80° C., higher than or equal to 100° C., or higher than or equal to 150° C.) by heating the substrate holder 1026 with a heater; and supply of a source gas, evacuation with the evacuation unit 1025, supply of an inert gas, and evacuation with the evacuation unit 1025 are repeated.

In the deposition apparatus illustrated in FIG. 16B, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1021a and 1021b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1021a and 1021b appropriately.

For example, in the case where a hafnium oxide layer is formed by an ALD apparatus, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamido)hafnium (TDMAH)) are used. In this case, the first source gas supplied from the source material supply portion 1021a is TDMAH, and the second source gas supplied from the source material supply portion 1021b is ozone. Note that the chemical formula of tetrakis (dimethylamido)hafnium is $Hf[N(CH_3)_2]_4$. Examples of another material liquid include tetrakis(ethylmethylamido) hafnium.

For example, in the case where an aluminum oxide layer is formed by an ALD apparatus, two kinds of gases, i.e., $H_2O$ as an oxidizer and a source gas which is obtained by vaporizing a liquid containing a solvent and an aluminum precursor compound (e.g., trimethylaluminum (TMA)) are used. In this case, the first source gas supplied from the source material supply portion 1021a is TMA, and the second source gas supplied from the source material supply portion 1021b is $H_2O$. Note that the chemical formula of trimethylaluminum is $Al(CH_3)_3$. Examples of another material liquid include tris(dimethylamido)aluminum, triisobutylaluminum, and aluminum tris(2,2,6,6-tetramethyl-3,5-heptanedionate).

In the case where a tungsten layer is formed using an ALD apparatus, a $WF_6$ gas and a $B_2H_6$ gas are sequentially introduced a plurality of times to form an initial tungsten layer, and then a $WF_6$ gas and an $H_2$ gas are sequentially introduced a plurality of times to form a tungsten layer. Note that an $SiH_4$ gas may be used instead of a $B_2H_6$ gas. These gases may be controlled by mass flow controllers.

Figure 13C:
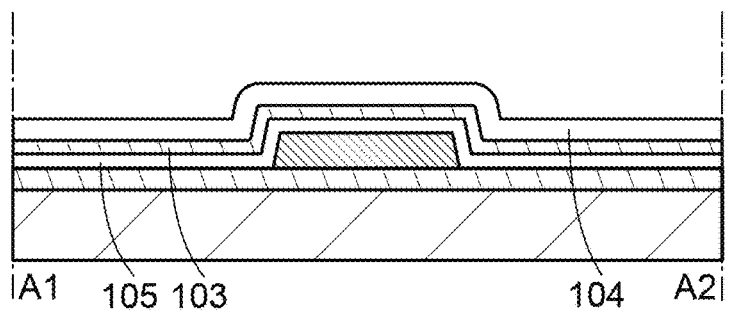
Figure 13D:
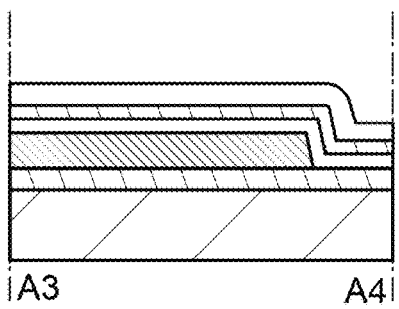

Then, the insulator 104 is formed (see FIGS. 13C and 13D). Any of the above-described insulators can be used for the insulator 104. The insulator 104 can be formed by a sputtering method, a CVD method, an MBE method, a PLD method, an ALD method, or the like.

A CVD method, in particular, a PECVD method is preferably used for the formation of the insulator 104.

In the case where the insulator 104 is formed by a PECVD method, a substance without containing hydrogen or a substance containing a small amount of hydrogen is preferably used as a source gas; for example, a halide is preferably used. For example, in the case where silicon oxide or silicon oxynitride is deposited as the insulator 104, silicon halide is preferably used as a source gas. As the silicon halide, for example, silicon tetrafluoride ($SiF_4$), silicon tetrachloride ($SiCl_4$), silicon trichloride ($SiHCl_3$), dichlorosilane ($SiH_2Cl_2$), or silicon tetrabromide ($SiBr_4$) can be used.

In the case where the insulator 104 is formed by a PECVD method, an oxidation gas (e.g., $N_2O$) is introduced. Since the above-described silicon halides are less reactive than $SiH_4$, the oxidation gas readily interacts with the insulator 103. Accordingly, there is a possibility that water and hydrogen in the insulator 103 can be released by the oxidation gas, and the amounts of water and hydrogen in the insulator 103 can be reduced.

When a silicon halide is used as the source gas for the formation of the insulator 104, a silicon hydride may be used in addition to the silicon halide. In that case, the amounts of hydrogen and water in the insulator 104 can be reduced as compared with the case where only a silicon hydride is used as the source gas, and the deposition rate can be improved as compared with the case where only a silicon halide is used as the source gas. For example, $SiF_4$ and $SiH_4$ may be used as the source gas for the formation of the insulator 104. For example, the flow rate of $SiH_4$ is set to greater than 1 sccm and less than 10 sccm, preferably, greater than or equal to 2 sccm and less than or equal to 4 sccm, in which case the amounts of water and hydrogen in the insulator 104 and the deposition rate can be relatively favorable values. Note that the flow ratio of $SiF_4$ to $SiH_4$ can be determined as appropriate in view of the amounts of water and hydrogen in the insulator 104 and the deposition rate.

In order to reduce water and hydrogen contained in the insulator 104, the insulator 104 may be formed while the substrate is being heated. For example, in the case where a semiconductor element layer is provided under the transistor 10 and the heat treatment is performed in a relatively low temperature range (e.g., higher than or equal to 350° C. and lower than or equal to 445° C.), water, hydrogen, and the like in the insulator 104 can be sufficiently removed by the method for forming the insulator 104 to be described later.

Furthermore, introduction of $SiH_4$ into the chamber before the formation of the insulator 104 over the substrate makes it relatively easy to form a silicon oxide film containing fluorine over a hafnium oxide film though the silicon oxide film containing fluorine is generally difficult to form over the hafnium oxide film.

By the above-described method, the insulator 104 releases water molecules, the number of which is greater than or equal to $1.0 \times 10^{13}$ molecules/cm$^2$ and less than or equal to $1.4 \times 10^{16}$ molecules/cm$^2$, preferably greater than or equal to $1.0 \times 10^{13}$ molecules/cm$^2$ and less than or equal to $4.0 \times 10^{15}$ molecules/cm$^2$, more preferably greater than or equal to $1.0 \times 10^{13}$ molecules/cm$^2$ and less than or equal to $2.0 \times 10^{15}$ molecules/cm$^2$ in TDS analysis in the range of a surface temperature from 100° C. to 700° C. or from 100° C. to 500° C. The insulator 104 releases hydrogen molecules, the number of which is greater than or equal to $1.0 \times 10^{13}$ molecules/cm$^2$ and less than or equal to $1.2 \times 10^{15}$ molecules/cm$^2$, preferably greater than or equal to $1.0 \times 10^{13}$ molecules/cm$^2$ and less than or equal to $9.0 \times 10^{14}$ molecules/cm$^2$ in TDS analysis in the range of a surface temperature from 100° C. to 700° C. or from 100° C. to 500° C.

The top surface or the bottom surface of the semiconductor 106b to be formed later preferably has high planarity. Thus, to improve the planarity, the top surface of the insulator 104 may be subjected to planarization treatment such as CMP treatment.

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 126a and the semiconductor 126b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Next, an insulator 126a is formed. Any of the above-described insulators and semiconductors that can be used for the insulator 106a can be used for the insulator 126a. The insulator 126a can be formed by a sputtering method, a CVD method, an MBE method, a PLD method, an ALD method, or the like.

Next, a semiconductor 126b is formed. Any of the above-described semiconductors that can be used for the semiconductor 106b can be used for the semiconductor 126b. The semiconductor 126b can be formed by a sputtering method, a CVD method, an MBE method, a PLD method, an ALD method, or the like. Note that successive film formation of the insulator 126a and the semiconductor 126b without exposure to the air can reduce entry of impurities into the films and their interface.

Next, heat treatment is preferably performed. The heat treatment can reduce the hydrogen concentration of the insulator 126a and the semiconductor 126b in some cases. The heat treatment can reduce oxygen vacancies in the insulator 126a and the semiconductor 126b in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at ppm or more, 1% or more, or 10% or more in order to compensate desorbed oxygen. The heat treatment can increase the crystallinity of the insulator to be the insulator 106a, the semiconductor to be the semiconductor 106b, and the insulator to be the insulator 106c and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS is used for the insulator 126a and the semiconductor 126b. In other words, the crystallinity of a CAAC-OS is increased by heat treatment.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104 and the temperature of the heat treatment after the formation of the insulator 104. Since water, hydrogen, and the like in the insulator 104 can be sufficiently small when the above-described method for forming the insulator 104 is employed, water and hydrogen supplied to the insulator 126a and the semiconductor 126b can be sufficiently reduced.

By the heat treatment, oxygen can be supplied from the insulator 104 to the insulator 126a and the semiconductor 126b. The heat treatment performed on the insulator 104 makes it very easy to supply oxygen to the insulator 126a and the semiconductor 126b.

Here, the insulator 103 serves as a barrier film that blocks oxygen. The insulator 103 provided under the insulator 104 can prevent oxygen diffused in the insulator 104 from being diffused into layers under the insulator 104.

Oxygen is supplied to the insulator 126a and the semiconductor 126b to reduce oxygen vacancies, whereby highly purified intrinsic or substantially highly purified intrinsic oxide semiconductor with a low density of defect states can be achieved.

High-density plasma treatment or the like may be performed. High-density plasma may be generated using microwaves. For the high-density plasma treatment, for example, an oxidation gas such as oxygen or nitrous oxide may be used. Alternatively, a mixed gas of an oxidation gas and a rare gas such as He, Ar, Kr, or Xe may be used. In the high-density plasma treatment, a bias may be applied to the substrate. Thus, oxygen ions and the like in the plasma can be extracted to the substrate side. The high-density plasma treatment may be performed while the substrate is being heated. For example, in the case where the high-density plasma treatment is performed instead of the heat treatment, the similar effect can be obtained at a temperature lower than the heat treatment temperature. The high-density plasma treatment may be performed before the formation of the insulator 126a, after the formation of the insulator 112, or after the formation of the insulator 116.

Figure 13E:
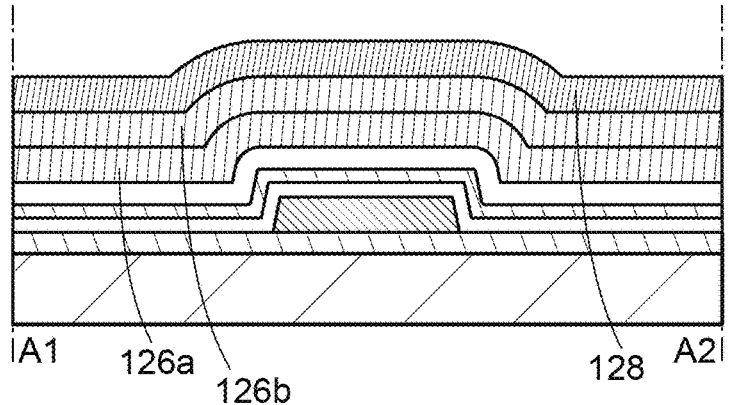
Figure 13F:
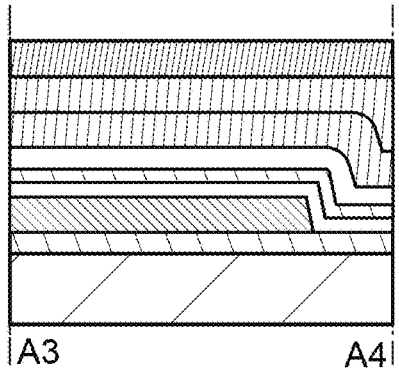

Next, a conductor 128 is formed (see FIGS. 13E and 13F). Any of the above-described conductors that can be used for the conductors 108a and 108b can be used for the conductor 128. The conductor 128 can be formed by a sputtering method, a CVD method, an MBE method, a PLD method, an ALD method, or the like.

Next, a resist or the like is formed over the conductor 128 and processing is performed using the resist or the like, whereby the conductors 108a and 108b are formed.

Figure 13G:
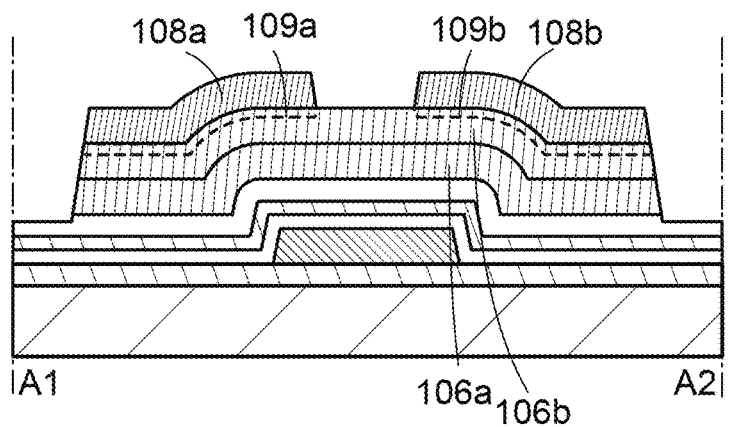
Figure 13H:
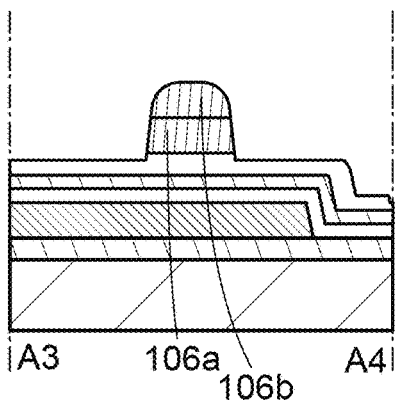

Next, a resist or the like is formed over the semiconductor 126b and processing is performed using the resist or the like and the conductors 108a and 108b, whereby the insulator 106a and the semiconductor 106b are formed (see FIGS. 13G and 13H).

Here, regions of the semiconductor 106b that are in contact with the conductor 108a and the conductor 108b include the low-resistance region 109a and the low-resistance region 109b in some cases. The semiconductor 106b might have a smaller thickness in a region between the conductor 108a and the conductor 108b than in regions overlapping with the conductor 108a and the conductor 108b. This is because part of the top surface of the semiconductor 106b is sometimes removed at the time of the formation of the conductor 108a and the conductor 108b.

Next, heat treatment is preferably performed. The heat treatment can further reduce water and hydrogen in the insulator 104, the insulator 103, the insulator 105, the insulator 106a, and the semiconductor 106b. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment may be performed in an inert gas atmosphere. The heat treatment may be performed in an atmosphere containing an oxidizing gas. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment is preferably performed in a relatively low temperature range (e.g., higher than or equal to 350° C. and lower than or equal to 445° C.) in order not to degrade the semiconductor element layer in a lower layer.

In the case where the insulator 104 contains much water and hydrogen at the time of being formed, such heat treatment in a temperature range that does not degrade the semiconductor element layer in the lower layer cannot remove the water, hydrogen, and the like sufficiently from the insulator 104 in some cases. Moreover, if heat treatment in such a temperature range is performed after formation of the insulator 106c, water, hydrogen, and the like might be supplied from the insulator 104 to the semiconductor 106b and the like, forming defect states.

In contrast, when the heat treatment is performed at the stage where the insulator 106a and the semiconductor 106b are formed and a surface of the insulator 104 is exposed, as described above, it is possible to inhibit supply of water and hydrogen to the insulator 106a and the semiconductor 106b and to further reduce water and hydrogen in the insulator 104, the insulator 103, and the insulator 105. When water and hydrogen in the insulator 104, the insulator 103, and the insulator 105 are further reduced, heating at a relatively low temperature (e.g., higher than or equal to 350° C. and lower than or equal to 445° C.) can sufficiently remove water, hydrogen, and the like so that defect states can be prevented from being formed in the semiconductor 106b and the like. In this manner, it is possible to provide a highly reliable transistor.

In the case where an etching gas containing impurities such as hydrogen and carbon are used for the formation of the insulator 106a and the semiconductor 106b, the impurities such as hydrogen and carbon sometimes enter the insulator 106a, the semiconductor 106b, and the like. The impurities such as hydrogen and carbon that enter the insulator 106a and the semiconductor 106b at the time of etching can be released by heat treatment performed after the formation of the insulator 106a and the semiconductor 106b.

The high-density plasma treatment may be performed instead of the heat treatment. Alternatively, the high-density plasma treatment may be performed after the heat treatment. In this manner, impurities such as hydrogen and carbon in the semiconductor 106b and the like can be released and oxygen vacancies can be filled with oxygen.

Note that after formation of the conductor 128, the insulator 126a, the semiconductor 126b, and the conductor 128 may be collectively processed to form the insulator 106a, the semiconductor 106b, and a conductor having a shape overlapping with the semiconductor 106b, and the conductor having the shape overlapping with the semiconductor 106b may be further processed to form the conductor 108a and the conductor 108b.

Then, the insulator 126c is formed. Any of the above-described insulators or semiconductors that can be used for the insulator 106c can be used for the insulator 126c, for example. The insulator 126c can be formed by a sputtering method, a CVD method, an MBE method, a PLD method, an ALD method, or the like. Before the formation of the insulator 126c, surfaces of the semiconductor 106b, the conductor 108a, and the conductor 108b may be etched. For example, plasma containing a rare gas can be used for the etching. After that, the insulator 126c is successively formed without being exposed to the air, whereby impurities can be prevented from entering interfaces between the insulator 106c and the semiconductor 106b, the conductor 108a, and the conductor 108b. In some cases, impurities at an interface between films are diffused more easily than impurities in a film. For this reason, a reduction in impurity at the interfaces leads to stable electrical characteristics of a transistor.

Then, the insulator 132 is formed. Any of the above-described insulators that can be used for the insulator 112 can be used for the insulator 132. The insulator 132 can be formed by a sputtering method, a CVD method, an MBE method, a PLD method, an ALD method, or the like. Note that successive film formation of the insulator 126c and the insulator 132 without exposure to the air can reduce entry of impurities into the films and their interface.

Figure 14A:
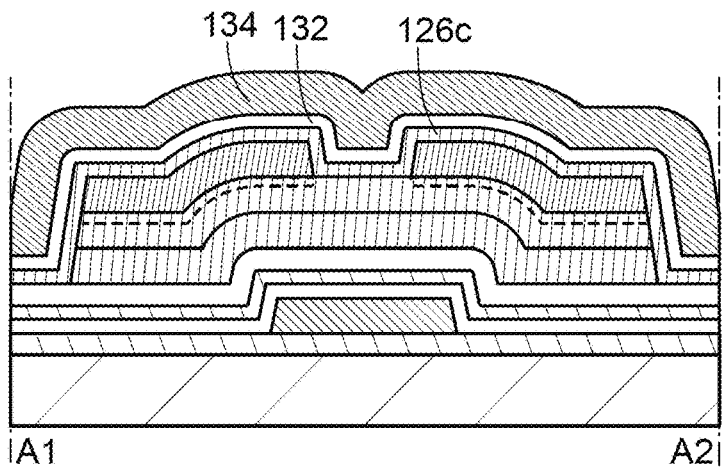
FIGS. 14A to 14F are cross-sectional views illustrating a method for fabricating a transistor of one embodiment of the present invention.
Figure 14B:
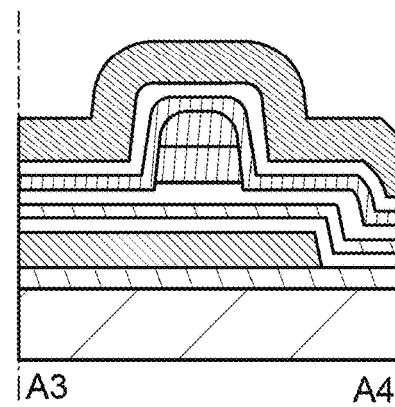

Next, the conductor 134 is formed (see FIGS. 14A and 14B). Any of the above-described conductors that can be used for the conductor 114 can be used for the conductor 134. The conductor 134 can be formed by a sputtering method, a CVD method, an MBE method, a PLD method, an ALD method, or the like. Note that successive film formation of the insulator 132 and the conductor 134 without exposure to the air can reduce entry of impurities into the films and their interface.

Next, a resist or the like is formed over the conductor 134 and processing is performed using the resist, whereby the conductor 114 is formed.

Figure 14C:
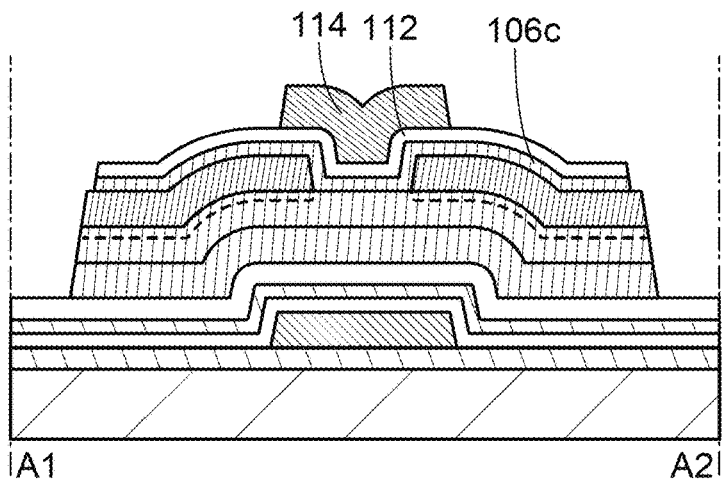
Figure 14D:
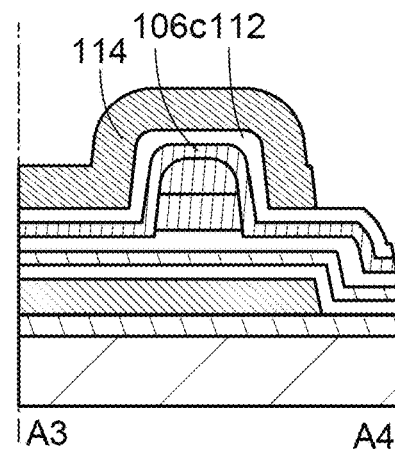

Then, a resist or the like is formed over the conductor 114 and the insulator 132 and processing is performed using the resist, whereby the insulator 106c and the insulator 112 are formed (see FIGS. 14C and 14D). Note that at this time, the insulator 106c and the insulator 112 may be formed to expose regions where the conductor 120a and the conductor 120b that are formed later are in contact with the conductor 108a and the conductor 108b.

Figure 14E:
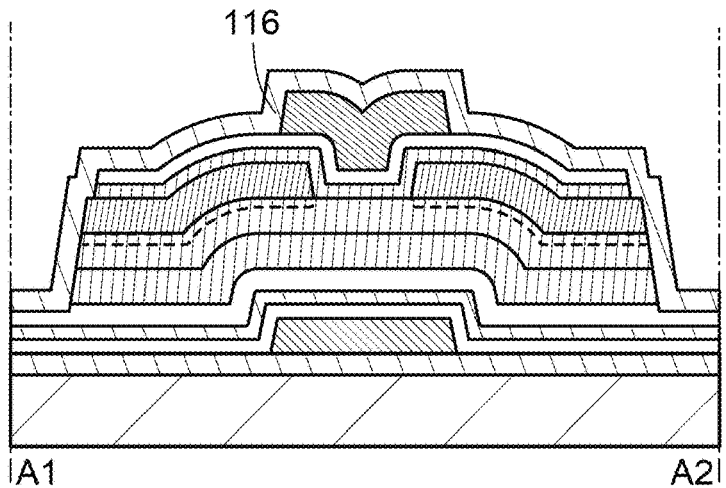
Figure 14F:
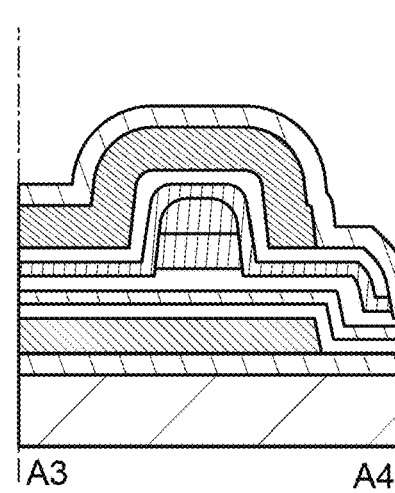

Then, the insulator 116 is formed (see FIGS. 14E and 14F). Any of the above-described insulators can be used for the insulator 116. The insulator 116 can be formed by a sputtering method, a CVD method, an MBE method, a PLD method, an ALD method, or the like.

Here, as the insulator 116, an oxide insulating film of aluminum oxide or the like having a blocking effect against oxygen, hydrogen, water, or the like is preferably provided.

The insulator 116 is preferably formed by utilizing plasma, further preferably a sputtering method, still further preferably a sputtering method in an atmosphere containing oxygen.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. Further alternatively, the above-described PESP or VDSP method may be used. The oxygen gas flow rate or deposition power for sputtering can be set as appropriate in accordance with the amount of oxygen to be added.

When the insulator 116 is formed by a sputtering method, oxygen is added to the vicinity of a surface of the insulator 104 or a surface of the insulator 112 (after the formation of the insulator 116, an interface between the insulator 116 and the insulator 104 or the insulator 112) at the same time as the formation. Although the oxygen is added to the insulator 104 or the insulator 104 as an oxygen radical, for example, the state of the oxygen at the time of being added is not limited thereto. The oxygen may be added to the insulator 104 or the insulator 112 as an oxygen atom, an oxygen ion, or the like. Note that by addition of oxygen, oxygen in excess of the stoichiometric composition is contained in the insulator 104 or the insulator 112 in some cases, and the oxygen in such a case can be called excess oxygen.

Figure 15A:
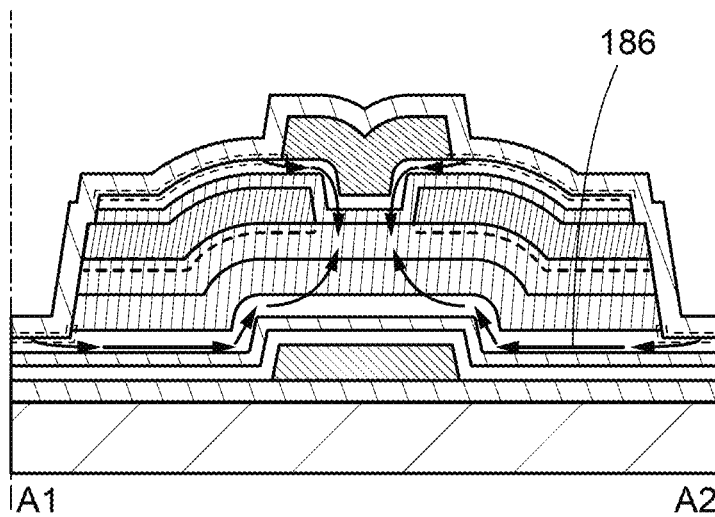
FIGS. 15A to 15D are cross-sectional views illustrating a method for fabricating a transistor of one embodiment of the present invention.
Figure 15B:
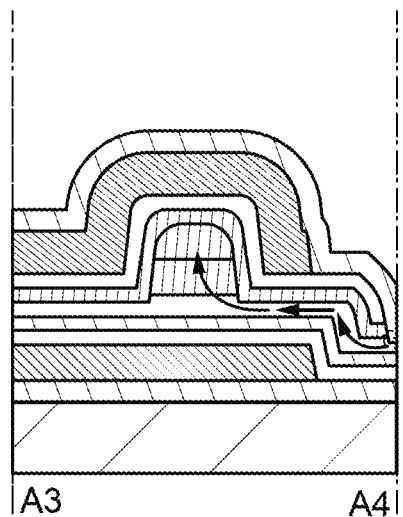

Next, heat treatment is preferably performed (see FIGS. 15A and 15B). By the heat treatment, oxygen added to the insulator 104 or the insulator 112 can be diffused to be supplied to the insulator 106a, the semiconductor 106b, and the insulator 106c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 126b. A temperature difference between the heat treatment and the heat treatment performed after formation of the semiconductor 126b is to be 20° C. or more and 150° C. or less, preferably 40° C. or more and 100° C. or less. Accordingly, superfluous release of excess oxygen (oxygen) from the insulator 104 and the like can be inhibited. Note that in the case where heating at the time of formation of the layers (e.g., heating at the time of formation of the insulator 118) doubles as the heat treatment after formation of the insulator 118, the heat treatment after formation of the insulator 118 is not necessarily performed.

Oxygen (hereinafter referred to as an oxygen 186) added to the insulator 104 and the insulator 112 by the deposition of the insulator 116 is diffused in the insulator 104 or the insulator 112 by the heat treatment (see FIGS. 15A and 15B). The insulator 116 is less permeable to oxygen than the insulator 104 or the insulator 112 and functions as a barrier film that blocks oxygen. Since the insulator 116 is provided over the insulator 104 or the insulator 112, the oxygen 186 diffused in the insulator 104 or the insulator 112 is prevented from being diffused in layers over the insulator 104 or the insulator 112, so that the oxygen 186 is diffused mainly laterally or downward in the insulator 104 or the insulator 112.

The oxygen 186 that is diffused in the insulator 104 or the insulator 112 is supplied to the insulator 106a, the insulator 106c, and the semiconductor 106b. Here, the insulator 103 serves as a barrier film that blocks. The insulator 103 having a function of blocking oxygen provided under the insulator 104 can prevent oxygen diffused in the insulator 104 from being diffused into layers under the insulator 104.

Thus, the oxygen 186 can be effectively supplied to the insulator 106a, the insulator 106c, and the semiconductor 106b, especially to a channel formation region in the semiconductor 106b. Oxygen is supplied to the insulator 106a, the insulator 106c, and the semiconductor 106b to reduce oxygen vacancies in this manner, whereby a highly purified intrinsic or substantially highly purified intrinsic oxide semiconductor with a low density of defect states can be achieved.

Note that heat treatment after the formation of the insulator 116 may be performed at any time after the insulator 116 is formed. For example, the heat treatment may be performed after the insulator 118 is formed or after the conductors 120a and 120b are formed.

Next, the insulator 118 is formed. Any of the above-described insulators can be used for the insulator 118. The insulator 118 can be formed by a sputtering method, a CVD method, an MBE method, a PLD method, an ALD method, or the like.

Next, a resist or the like is formed over the insulator 118, and openings are formed in the insulator 118, the insulator 116, the insulator 112, and the insulator 106c. Then, a conductor to be the conductor 120a and the conductor 120b is formed. Any of the above-described conductors can be used for the conductor to be the conductor 120a and the conductor 120b. The conductor can be formed by a sputtering method, a CVD method, an MBE method, a PLD method, an ALD method, or the like.

Figure 15C:
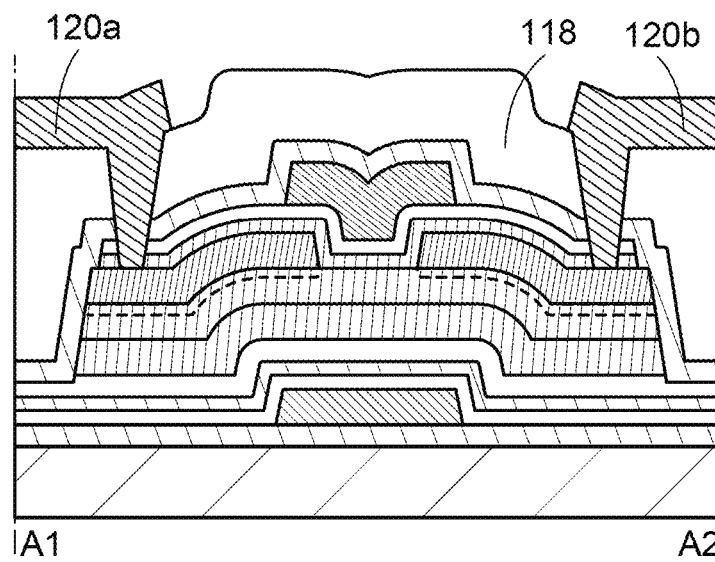
Figure 15D:
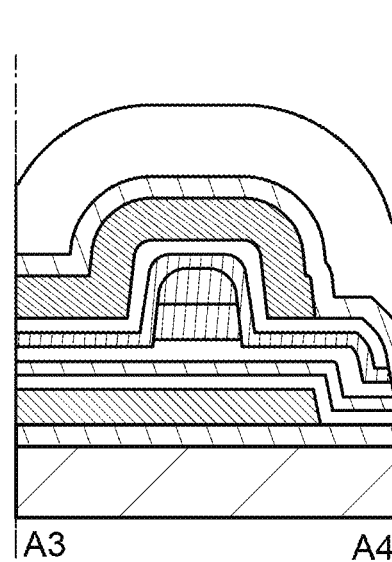

Next, a resist or the like is formed over the conductor and processing is performed using the resist or the like, whereby the conductors 120a and 120b are formed (see FIGS. 15C and 15D).

Through the above process, the transistor of one embodiment of the present invention can be fabricated.

A method for fabricating the transistor 29 is described below with reference to FIGS. 17A to 17H, FIGS. 18A to 18F, and FIGS. 19A to 19F. Note that for the method for fabricating the transistor 29, any of the above-mentioned methods for fabricating a transistor can be referred to, as appropriate.

First, the substrate 100 is prepared. Any of the above-mentioned substrates can be used for the substrate 100.

Next, the insulator 101 is formed. Any of the above-mentioned insulators can be used for the insulator 101.

Then, an insulator to be the insulator 107 is formed. Any of the above-described insulators can be used for the insulator. The insulator can be formed by a sputtering method, a CVD method, an MBE method, a PLD method, an ALD method, or the like.

Next, a resist or the like is formed over the insulator and processing is performed using the resist or the like, whereby the insulator 107 having an opening is formed.

Next, a conductor to be the conductor 102 is formed. Any of the above-described conductors can be used for the conductor to be the conductor 102. The conductor can be formed by a sputtering method, a CVD method, an MBE method, a PLD method, an ALD method, or the like.

Figure 17A:
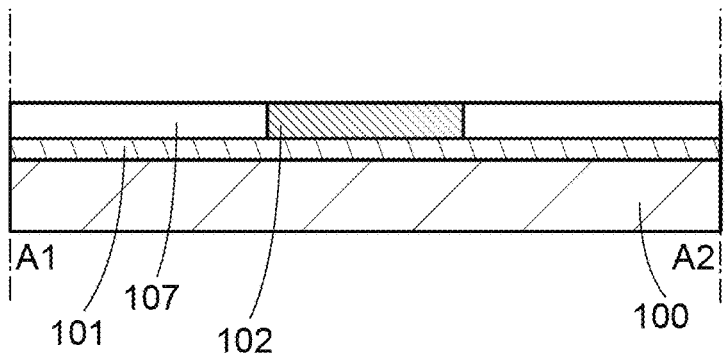
FIGS. 17A to 17H are cross-sectional views illustrating a method for fabricating a transistor of one embodiment of the invention.
Figure 17B:
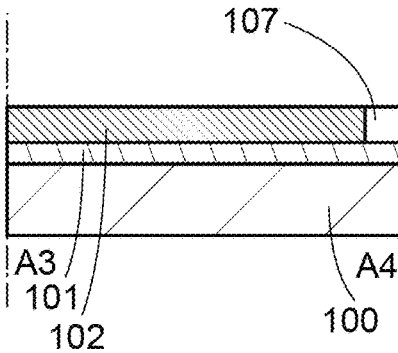

Next, the conductor is polished until the insulator 107 is exposed, whereby the conductor 102 is formed (see FIGS. 17A and 17B). For example, CMP treatment may be performed as the polishing.

Then, the insulator 105 is formed. Any of the above-described insulators can be used for the insulator 105. The insulator 105 can be formed by a sputtering method, a CVD method, an MBE method, a PLD method, an ALD method, or the like. In order to reduce water and hydrogen contained in the insulator 105, the insulator 105 may be formed while the substrate is being heated. For example, in the case where a semiconductor element layer is provided below the transistor 29, the heat treatment may be performed in a relatively low temperature range (e.g., higher than or equal to 350° C. and lower than or equal to 445° C.).

Alternatively, the insulator 105 may be formed by a PECVD method in a manner similar to that of the insulator 104 described above in order to reduce water and hydrogen contained in the insulator 105.

Then, the insulator 103 is formed. Any of the above-described insulators can be used for the insulator 103. The insulator 103 can be formed by a sputtering method, a CVD method, an MBE method, a PLD method, an ALD method, or the like. In order to reduce water and hydrogen contained in the insulator 103, the insulator 103 may be formed while the substrate is being heated. For example, in the case where a semiconductor element layer is provided under the transistor 10, the heat treatment may be performed in a relatively low temperature range (e.g., higher than or equal to 350° C. and lower than or equal to 445° C.).

Figure 17C:
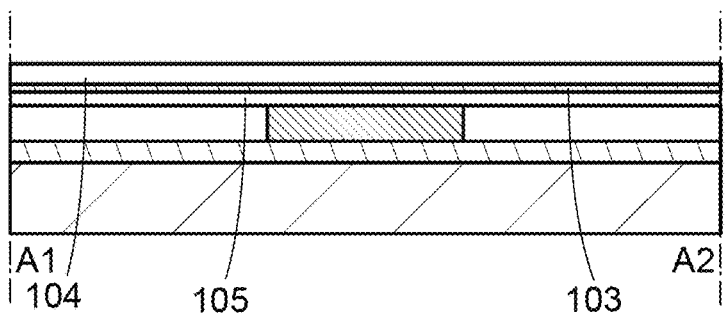
Figure 17D:
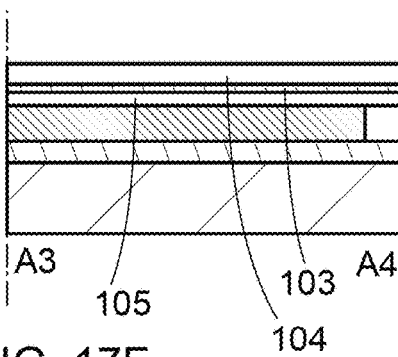

Then, the insulator 104 is formed (see FIGS. 17C and 17D). Any of the above-described insulators can be used for the insulator 104. The insulator 104 can be formed by a sputtering method, a CVD method, an MBE method, a PLD method, an ALD method, or the like.

The top surface or the bottom surface of the semiconductor 106b to be formed later preferably has high planarity. Thus, to improve the planarity, the top surface of the insulator 104 may be subjected to planarization treatment such as CMP treatment.

Next, heat treatment is preferably performed.

Next, an insulator to be the insulator 106a is formed. Any of the above-described insulators and semiconductors that can be used for the insulator 106a can be used for the insulator. The insulator can be formed by a sputtering method, a CVD method, an MBE method, a PLD method, an ALD method, or the like.

Next, a semiconductor to be the semiconductor 106b is formed. Any of the above-described semiconductors that can be used for the semiconductor 106b can be used for the semiconductor. The semiconductor can be formed by a sputtering method, a CVD method, an MBE method, a PLD method, an ALD method, or the like. Note that successive film formation of the insulator and the semiconductor without exposure to the air can reduce entry of impurities into the films and their interface.

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator to be the insulator 106a and the semiconductor to be the semiconductor 106b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Here, a silicon halide such as $SiF_4$ is used for the formation of the insulator 104, halogen such as fluorine is contained in the insulator 104. Oxygen in the insulator 104 is replaced with fluorine during the heat treatment, so that the oxygen is released ($SiO+F \rightarrow SiF+O$) and is supplied to an insulator to be the insulator 106a and a semiconductor to be the semiconductor 106b. The mechanism is described below.

<Silicon Oxide Including Fluorine>

Figure 74A:
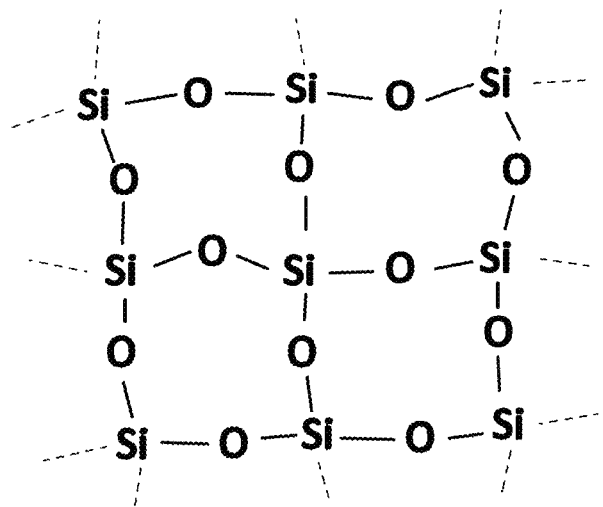
FIGS. 74A and 74B illustrate bonding states of a silicon oxide.
Figure 74B:
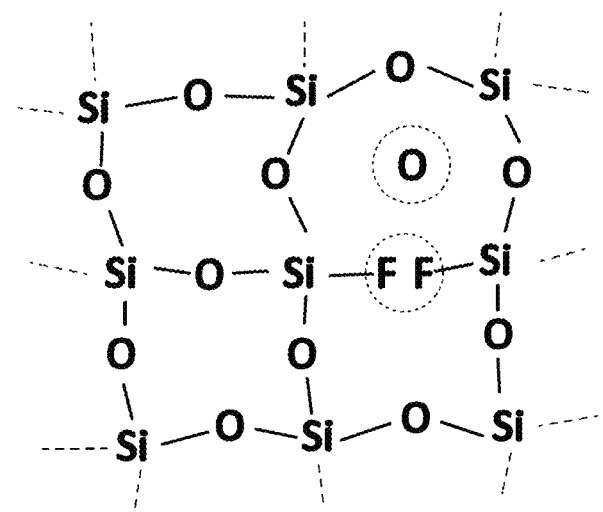

As an example of the insulator including excess oxygen, a silicon oxide including fluorine is described below with reference to FIGS. 74A and 74B.

A silicon oxide ($SiO_2$) includes two oxygen atoms with respect to one silicon atom. As illustrated in FIG. 74A, one silicon atom is bonded to four oxygen atoms, and one oxygen atom is bonded to two silicon atoms.

When two fluorine atoms enter the silicon oxide, bonds of one oxygen atom to two silicon atoms are cut ( . . . Si—O—Si . . . +2F→ . . . Si—O—Si . . . +2F). Then, the fluorine atoms are bonded to the silicon atoms whose bonds to the oxygen atom have been cut ( . . . Si—O—Si . . . +2F→Si—F F—Si . . . +O). At this time, the oxygen atom whose bonds have been cut becomes excess oxygen (see FIG. 74B).

The excess oxygen included in silicon oxide can reduce oxygen vacancies in the oxide semiconductor. Oxygen vacancies in the oxide semiconductor serve as hole traps or the like. Accordingly, excess oxygen included in silicon oxide can lead to stable electrical characteristics of the transistor.

As described above, when fluorine is included in silicon oxide, generation of excess oxygen occurs. Note that in the case where excess oxygen is consumed to reduce oxygen vacancies in the oxide semiconductor, the amount of oxygen in the silicon oxide becomes smaller than that before fluorine enters the silicon oxide.

In order for the transistor to have stable electrical characteristics which are close to normally-off characteristics, excess oxygen is set at adequate amounts.

<Heat Treatment>

Here, a method for controlling a furnace used for the heat treatment is described with reference to FIGS. 75A to 75C. Note that an atmosphere used for the heat treatment described here is an example and can be changed as appropriate.

Figure 75A:
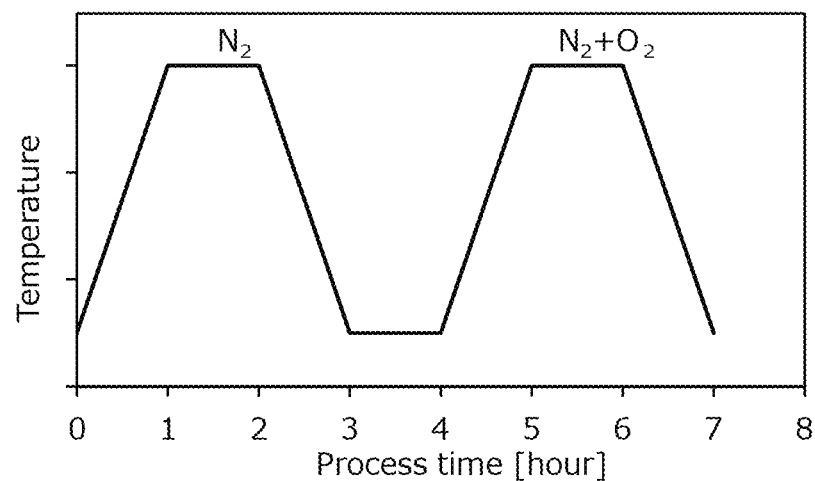
FIGS. 75A to 75C are graphs each explaining heat treatment.

FIG. 75A shows an example where heat treatment is performed twice in different atmospheres. First, an object is put in a furnace. Next, a nitrogen gas is added into the furnace, and the temperature in the furnace is set at a first temperature. The first temperature is increased to a second temperature in an hour. The second temperature is kept for an hour. The second temperature is decreased to a third temperature in an hour. Next, a nitrogen gas and an oxygen gas are added into the furnace. The third temperature is kept for an hour. The third temperature is increased to a fourth temperature in an hour. The fourth temperature is kept for an hour. The fourth temperature is decreased to a fifth temperature in an hour. Then, the object is taken out from the furnace.

The first temperature, the third temperature, and the fifth temperature are in a temperature range at which the object can be put in and taken out from the furnace (e.g., higher than or equal to 50° C. and lower than or equal to 200° C.). If the first temperature, the third temperature, and the fifth temperature are too low, it takes a long time to decrease the temperature, which might decline the productivity. If the first temperature and the fifth temperature are too high, the object might be damaged when being put in or taken out from the furnace. The second temperature and the fourth temperature are the maximum temperatures of the heat treatment in the respective atmospheres (e.g., higher than or equal to 250° C. and lower than or equal to 650° C.). In this specification, the time of heat treatment means the time during which the maximum temperature is maintained in each atmosphere.

By the method shown in FIG. 75A, the total time is seven hours in the case where two kinds of atmospheres are employed and each heat treatment is performed for an hour.

Figure 75B:
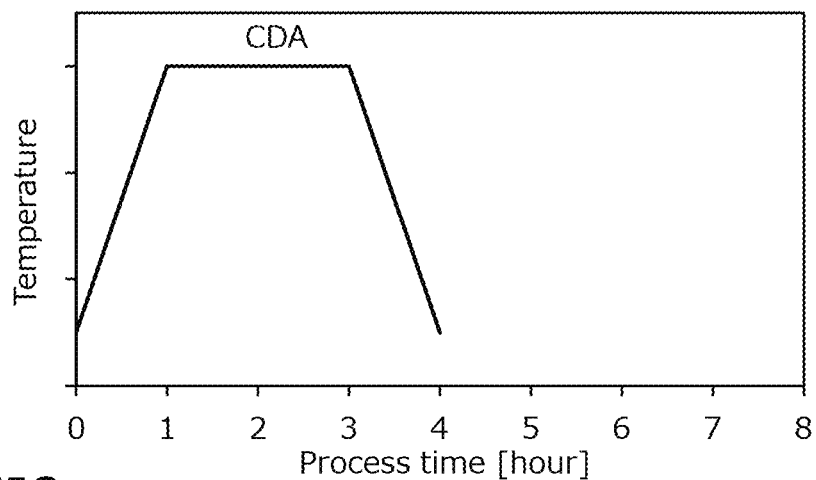

FIG. 75B shows an example where heat treatment is performed once without changing the atmosphere. First, an object is put in a furnace. Next, clean dry air (CDA) is added into the furnace, and the temperature in the furnace is set at a sixth temperature. CDA is an air having a water content of less than or equal to 20 ppm, less than or equal to 1 ppm, or less than or equal to 10 ppb. The sixth temperature is increased to a seventh temperature in an hour. The seventh temperature is kept for two hours. The seventh temperature is decreased to an eighth temperature in an hour. Then, the object is taken out from the furnace.

The sixth temperature and the eighth temperature are in a temperature range at which the object can be put in and taken out from the furnace. The seventh temperature is the maximum temperature of the heat treatment in the respective atmospheres.

By the method shown in FIG. 75B, the total time is four hours in the case where one kind of atmosphere is employed and heat treatment is performed for two hours.

Figure 75C:
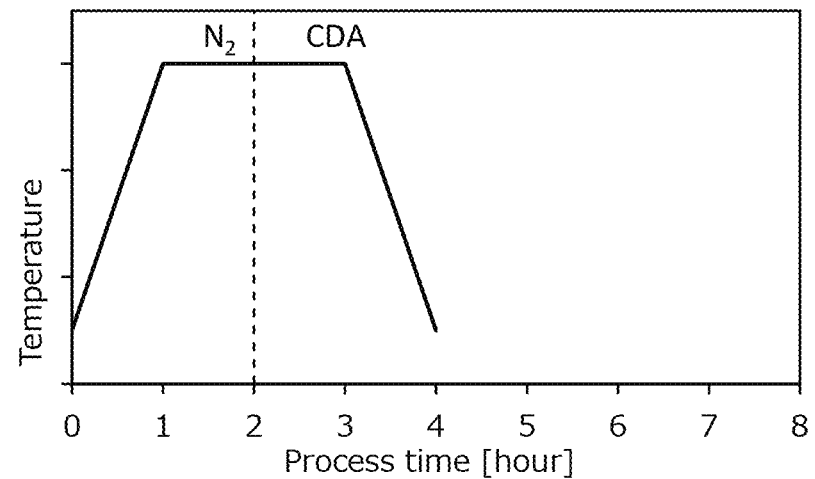

FIG. 75C shows an example where heat treatment is performed once in different atmospheres. First, an object is put in a furnace. Next, a nitrogen gas is added into the furnace, and the temperature in the furnace is set at a ninth temperature. The ninth temperature is increased to a tenth temperature in an hour. The tenth temperature is kept for an hour. Next, CDA is added into the furnace. The tenth temperature is kept for an hour. The tenth temperature is decreased to an eleventh temperature in an hour. Then, the object is taken out from the furnace.

The ninth temperature and the eleventh temperature are in a temperature range at which the object can be put in and taken out from the furnace. The tenth temperature is the maximum temperature of the heat treatment in the respective atmospheres.

By the method shown in FIG. 75C, the total time is four hours in the case where two kinds of atmospheres are employed and heat treatment is performed for two hours.

The time for the heat treatment by the methods shown in FIGS. 75B and 75C can be shorter than that by the method shown in FIG. 75A. Thus, semiconductor devices can be manufactured with high productivity.

Figure 17E:
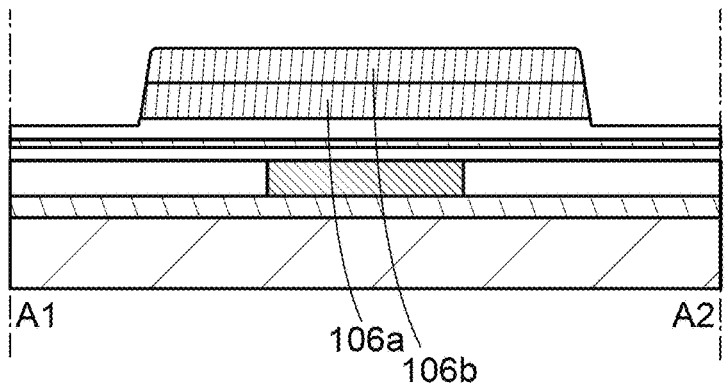
Figure 17F:
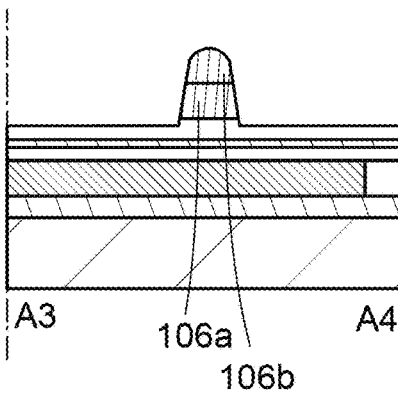

Next, a resist or the like is formed over the semiconductor and processing is performed using the resist or the like, whereby the insulator 106a and the semiconductor 106b are formed (see FIGS. 17E and 17F).

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator to be the insulator 106a and the semiconductor 106b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Figure 17G:
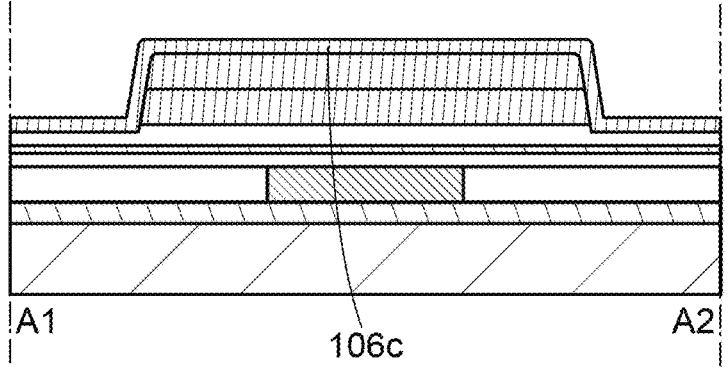
Figure 17H:
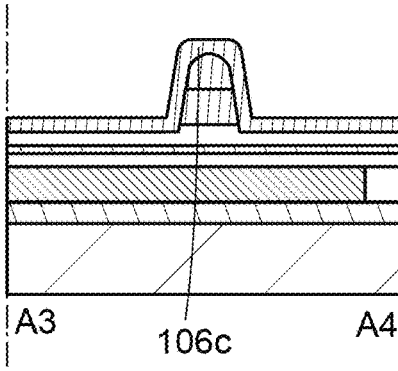

Next, the insulator 106c is formed (see FIGS. 17G and 17H). Any of the above-described insulators and semiconductors that can be used for the insulator 106c can be used for the insulator 106c. The insulator 106c can be formed by a sputtering method, a CVD method, an MBE method, a PLD method, an ALD method, or the like.

Next, a conductor to be the conductor 108a and the conductor 108b is formed Any of the above-described conductors that can be used for the conductors 108a and 108b can be used for the conductor. The conductor can be formed by a sputtering method, a CVD method, an MBE method, a PLD method, an ALD method, or the like.

Here, the low-resistance region 109 is formed in a region in the semiconductor 106b and the insulator 106c near the conductor to be the conductor 108 in some cases.

Next, a resist or the like is formed over the conductor and processing is performed using the resist or the like, whereby the conductor 108 is formed.

Next, an insulator 113 that is to be the insulator 110 is formed. Any of the above-described insulators that can be used for the insulator 110 can be used for the insulator 113, for example. The insulator 113 can be formed by a sputtering method, a CVD method, an MBE method, a PLD method, an ALD method, or the like.

Figure 18A:
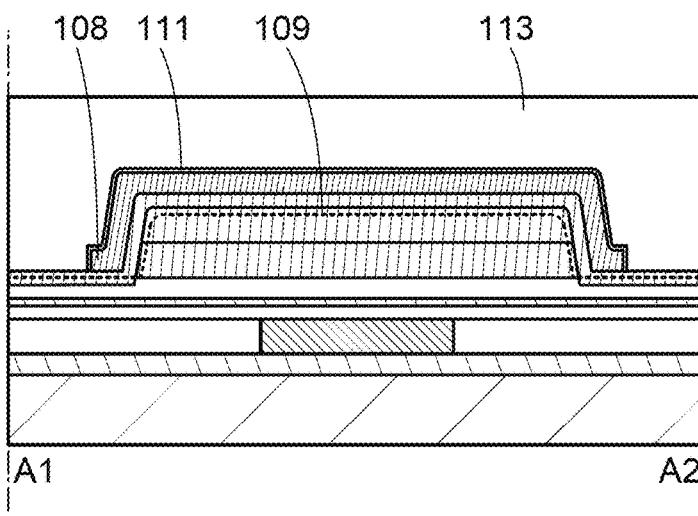
FIGS. 18A to 18F are cross-sectional views illustrating a method for fabricating a transistor of one embodiment of the present invention.
Figure 18B:
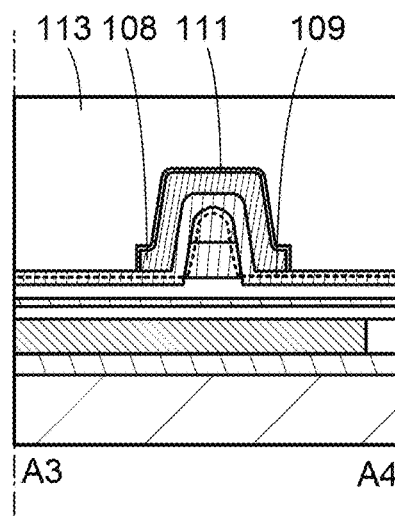

When the insulator 113 is formed, part of top and side surfaces of the conductor 108 is oxidized to form the metal oxide 111 in some cases (see FIGS. 18A and 18B).

Figure 18C:
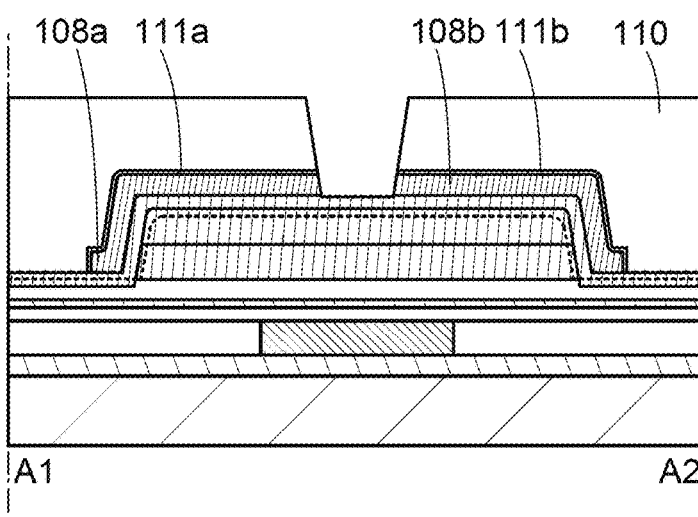
Figure 18D:
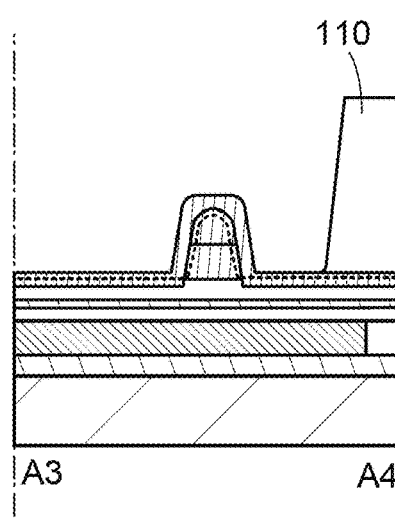
Figure 18E:
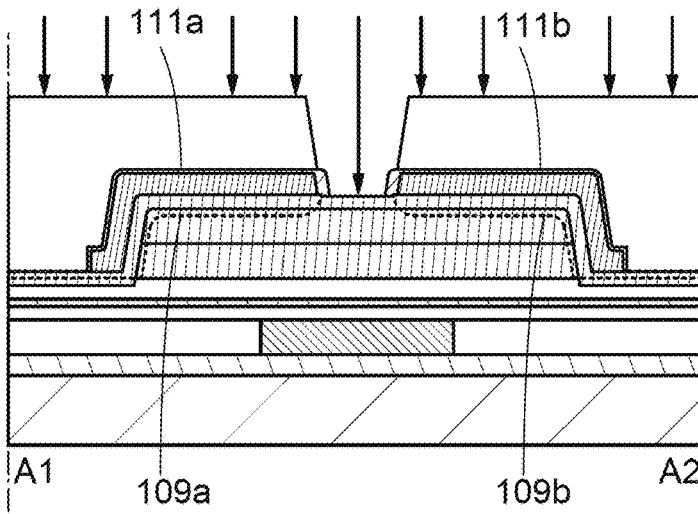
Figure 18F:
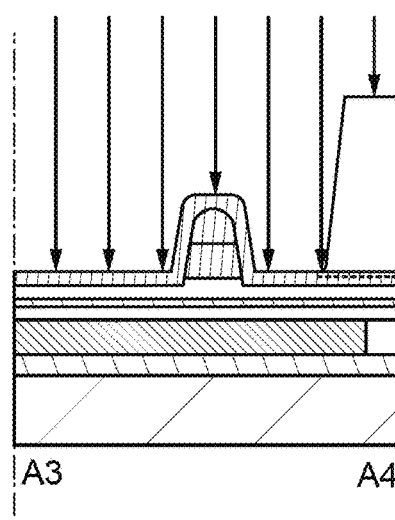

Next, a resist or the like is formed over the insulator 113 and processing is performed using the resist or the like, whereby the insulator 110, the metal oxide 111a, the metal oxide 111b, the conductor 108a, and the conductor 108b are formed (see FIGS. 18C and 18D).

Next, high-density plasma treatment may be performed. The high-density plasma treatment is preferably performed in an oxygen atmosphere. The oxygen atmosphere is a gas atmosphere containing an oxygen atom and refers to atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In an oxygen atmosphere, an inert gas such as nitrogen or a rare gas (e.g., helium or argon) may be contained. With this high-density plasma treatment performed in an oxygen atmosphere, carbon or hydrogen can be eliminated, for example. Furthermore, with the high-density plasma treatment in an oxygen atmosphere, an organic compound such as hydrocarbon is also easily eliminated from a treated object.

Annealing treatment may be performed before or after the high-density plasma treatment. Note that it is in some cases preferable to let an enough amount of gas flow in order to increase the plasma density. When the gas amount is not enough, the deactivation rate of radicals becomes higher than the generation rate of radicals in some cases. For example, it is preferable in some cases to let a gas flow at 100 sccm or more, 300 sccm or more, or 800 sccm or more.

The high-density plasma treatment is performed using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically 400° C.). Furthermore, a mixed gas of oxygen and argon can be used.

For example, the high density plasma is generated using a 2.45 GHz microwave and preferably has an electron density of higher than or equal to $1\times10^{11}/cm^3$ and lower than or equal to $1\times10^{13}/cm^3$, an electron temperature of 2 eV or lower, or an ion energy of 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Furthermore, oxygen ions can be efficiently introduced even into an opening with a high aspect ratio. Therefore, it is preferable to perform the high-density plasma treatment while a bias is applied to the substrate.

Following the high-density plasma treatment, annealing treatment may be successively performed without an exposure to the air. Following annealing treatment, the high-density plasma treatment may be successively performed without an exposure to the air. By performing high-density plasma treatment and annealing treatment in succession, entry of impurities during the treatment can be suppressed. Moreover, by performing annealing treatment after the high-density plasma treatment in an oxygen atmosphere, unnecessary oxygen that is added into the treated object but is not used to fill oxygen vacancies can be eliminated. The annealing treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the annealing treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

By the high-density plasma treatment and/or the annealing treatment, defect states in a region of the semiconductor 106b to be a channel formation region can be reduced. That is, the channel formation region can be a highly purified intrinsic region. At this time, the resistance of part of the low-resistance region 109 is increased, so that the low-resistance region 109 is divided into the low-resistance region 109a and the low-resistance region 109b. The metal oxides 111a and 111b are formed on the side surfaces of the conductors 108a and 108b (see FIGS. 18E and 18F).

Then, the insulator 132 is formed. Any of the above-described insulators that can be used for the insulator 112 can be used for the insulator 132. The insulator 132 can be formed by a sputtering method, a CVD method, an MBE method, a PLD method, an ALD method, or the like. Note that successive film formation of the insulator 126c and the insulator 132 without exposure to the air can reduce entry of impurities into the films and their interface.

Figure 19A:
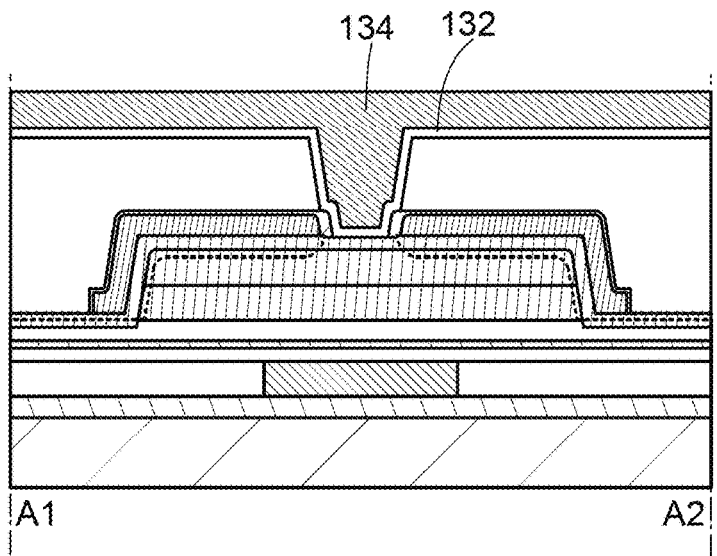
FIGS. 19A to 19F are cross-sectional views illustrating a method for fabricating a transistor of one embodiment of the present invention.
Figure 19B:
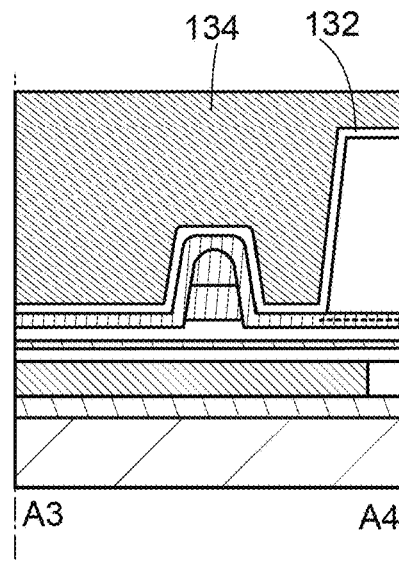

Next, the conductor 134 is formed (see FIGS. 19A and 19B). Any of the above-described conductors that can be used for the conductor 114 can be used for the conductor 134. The conductor 134 can be formed by a sputtering method, a CVD method, an MBE method, a PLD method, an ALD method, or the like. Note that successive film formation of the insulator 132 and the conductor 134 without exposure to the air can reduce entry of impurities into the films and their interface.

Figure 19C:
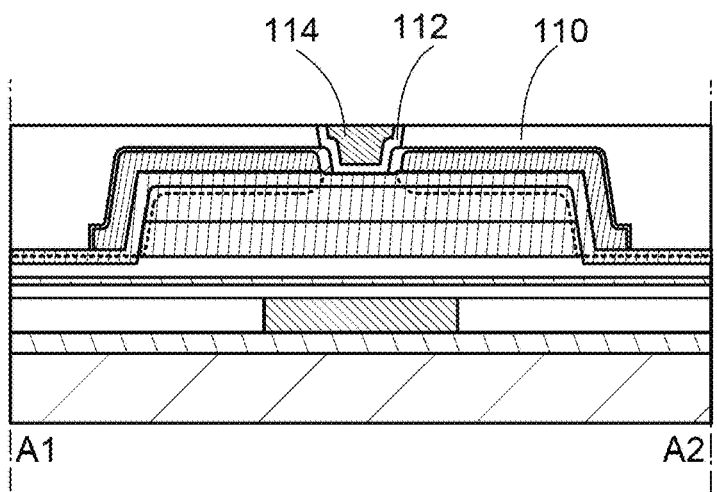
Figure 19D:
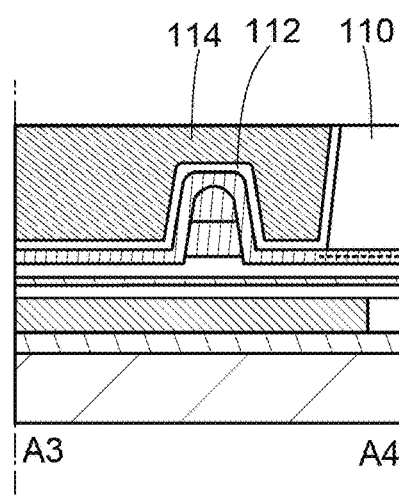

Next, the conductor 134, the insulator 132, and the insulator 113 are polished until the insulator 113 is exposed, whereby the conductor 114, the insulator 112, and the insulator 110 are formed (see FIGS. 19C and 19D). The conductor 114 serves as a gate electrode of the transistor 29 and the insulator 112 serves as a gate insulator of the transistor 29. As described above, the conductor 114 and the insulator 112 can be formed in a self-aligned manner.

Figure 19E:
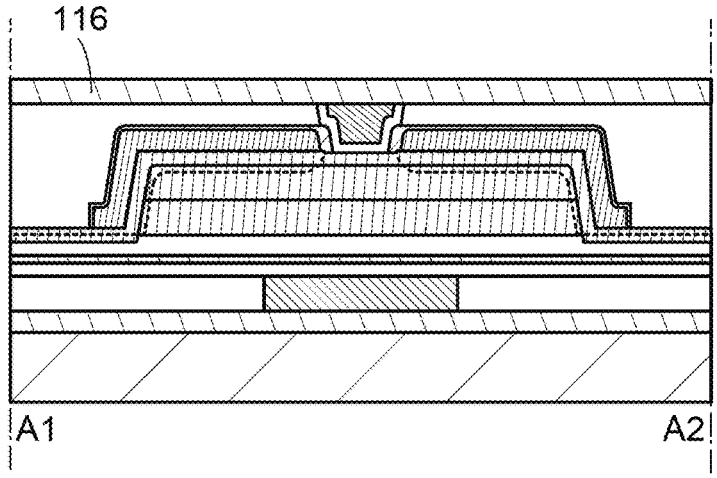
Figure 19F:
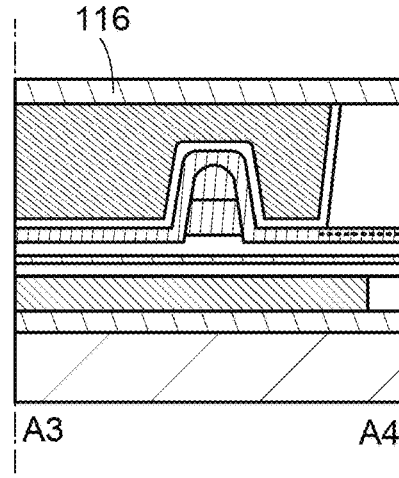

Then, the insulator 116 is formed (see FIGS. 19E and 19F). Any of the above-described insulators can be used for the insulator 116. The insulator 116 can be formed by a sputtering method, a CVD method, an MBE method, a PLD method, an ALD method, or the like.

Next, heat treatment is preferably performed.

Through the above process, the transistor of one embodiment of the present invention can be fabricated.

By the method for fabricating a transistor described in this embodiment, supply of water, hydrogen, and the like to the semiconductor 106b can be suppressed. As a result, a transistor with stable electrical characteristics can be provided. A transistor having a low leakage current in an off state can be provided. A transistor with normally-off electrical characteristics can be provided. A transistor with a small subthreshold swing value can be provided. A highly reliable transistor can be provided.

In the method for forming a transistor described in this embodiment, supply of water, hydrogen, and the like to the semiconductor 106b and the like can be prevented by heat treatment within a relatively low temperature range; accordingly, even when a semiconductor element layer, a wiring layer, or the like is formed below the transistor, the transistor can be formed without being degraded due to high temperature.

The structure and method described in this embodiment can be implemented by being combined as appropriate with any of the other structures and methods described in the other embodiments.

Embodiment 3

<Manufacturing Apparatus>

A manufacturing apparatus of one embodiment of the present invention in which high-density plasma treatment is performed is described below.

Figure 21:
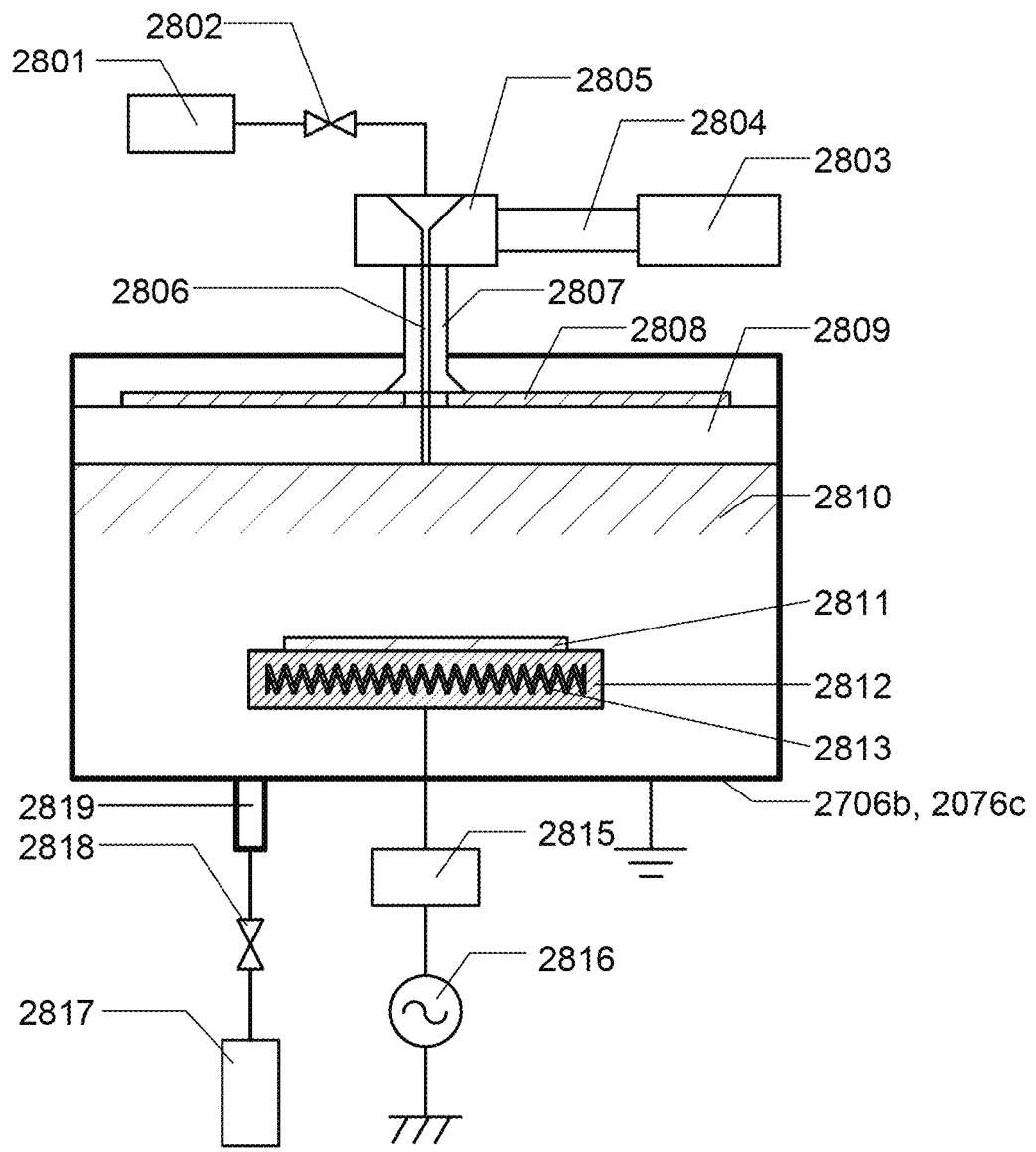
FIG. 21 is a top view illustrating a chamber of one embodiment of the present invention.
Figure 22:
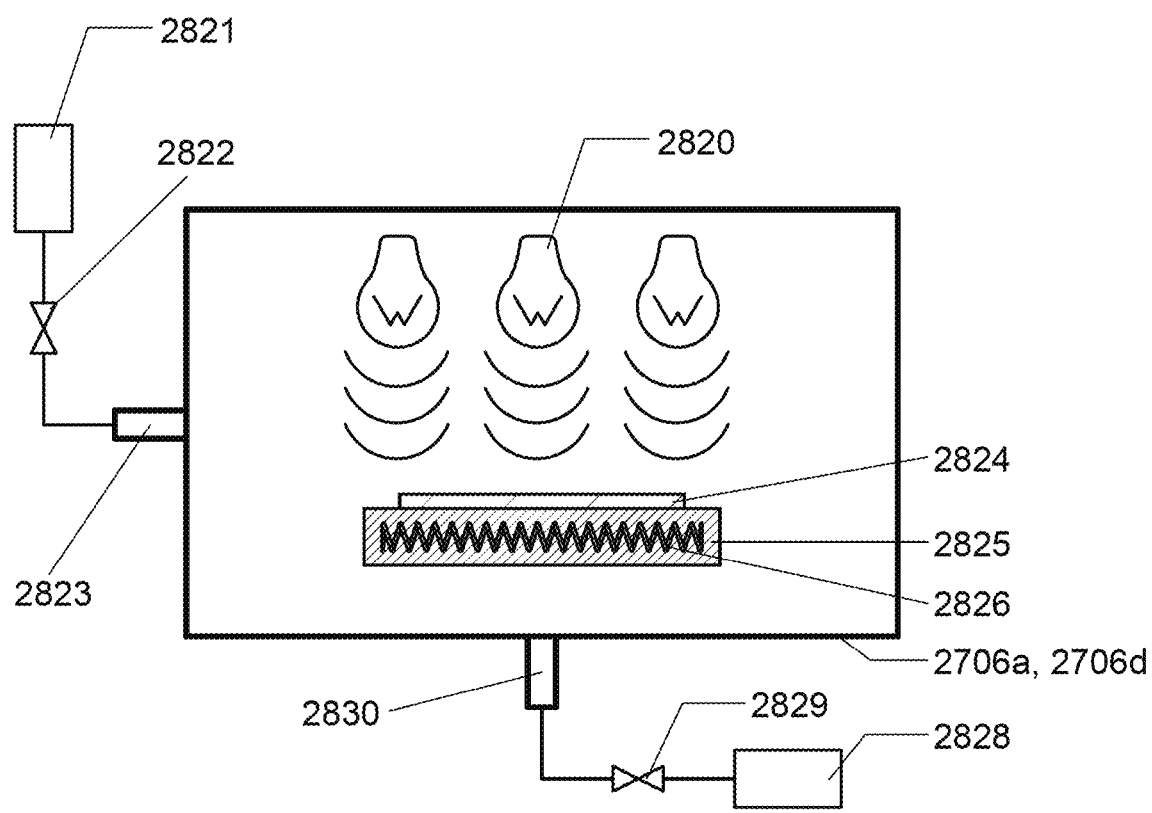
FIG. 22 is a top view illustrating a chamber of one embodiment of the present invention.

First, a structure of a manufacturing apparatus which allows the entry of few impurities into a film at the time of formation of a semiconductor device or the like is described with reference to FIG. 20, FIG. 21, and FIG. 22.

Figure 20:
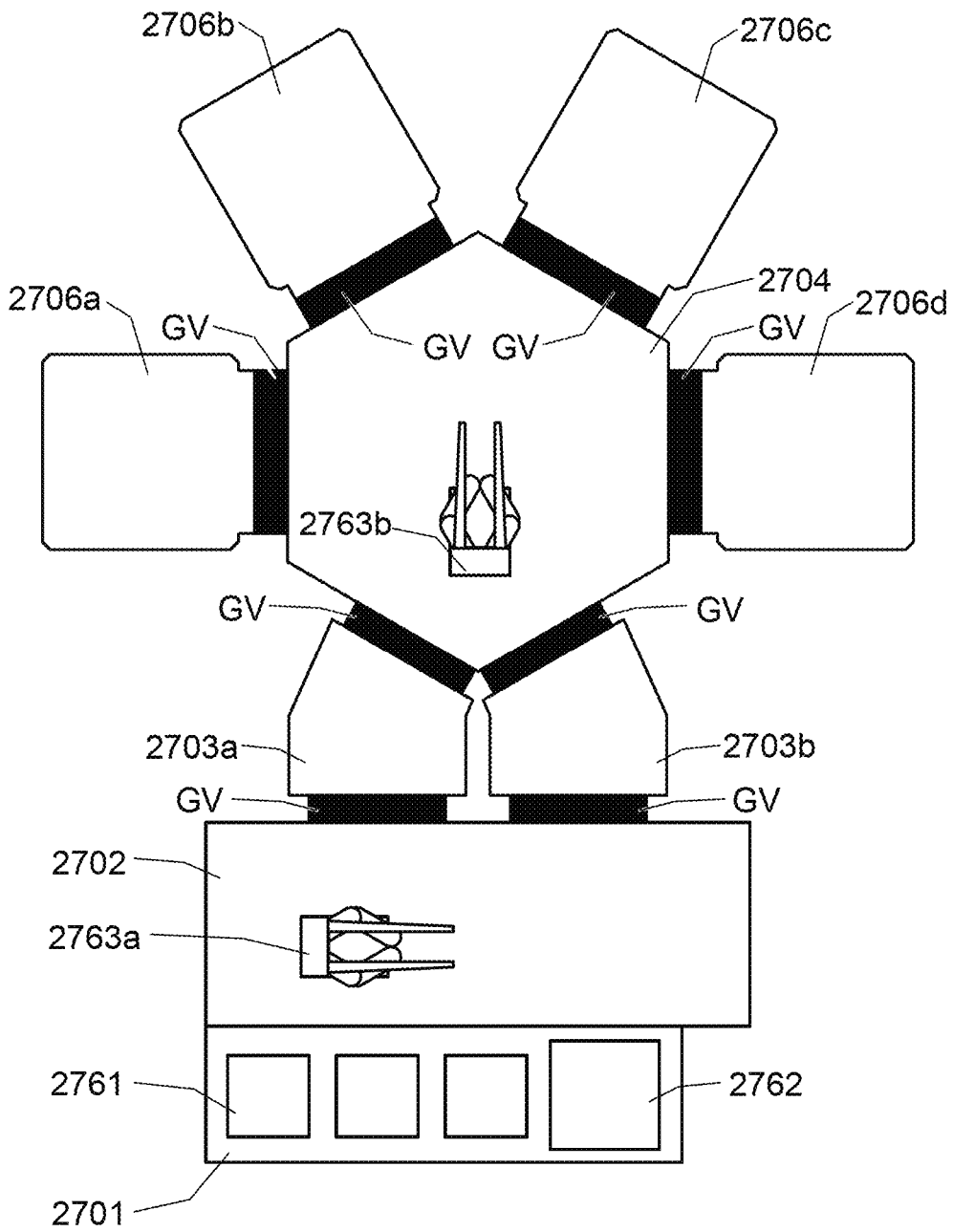
FIG. 20 is a top view illustrating a deposition apparatus of one embodiment of the present invention.

FIG. 20 is a top view schematically illustrating a single wafer multi-chamber manufacturing apparatus 2700. The manufacturing apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, and chambers 2706a, 2706b, 2706c, and 2706d.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chambers 2706a, 2706b, 2706c, and 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. In addition, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

In the transfer chamber 2704 and each of the chambers 2706a to 2706d, the back pressure (total pressure) is, for example, lower than or equal to $1\times10^{-4}$ Pa, preferably lower than or equal to $3\times10^{-5}$ Pa, further preferably lower than or equal to $1\times10^{-4}$ Pa. In the transfer chamber 2704 and each of the chambers 2706a to 2706d, the partial pressure of a gas molecule (atom) having a mass-to-charge ratio (m/z) of 18 is, for example, lower than or equal to $3\times10^{-5}$ Pa, preferably lower than or equal to $1\times10^{-5}$ Pa, further preferably lower than or equal to $3\times10^{-6}$ Pa. Moreover, in the transfer chamber 2704 and each of the chambers 2706a to 2706d, the partial pressure of a gas molecule (atom) having a mass-to-charge ratio (m/z) of 28 is, for example, lower than or equal to $3\times10^{-5}$ Pa, preferably lower than or equal to $1\times10^{-5}$ Pa, further preferably lower than or equal to $3\times10^{-6}$ Pa. Further, in the transfer chamber 2704 and each of the chambers 2706a to 2706d, the partial pressure of a gas molecule (atom) having a mass-to-charge ratio (m/z) of 44 is, for example, lower than or equal to $3\times10^{-5}$ Pa, preferably lower than or equal to $1\times10^{-5}$ Pa, further preferably lower than or equal to $3\times10^{-6}$ Pa.

Note that the total pressure and the partial pressure in the transfer chamber 2704 and each of the chambers 2706a to 2706d can be measured using a mass analyzer. For example, Qulee CGM-051, a quadrupole mass analyzer (also referred to as Q-mass) manufactured by ULVAC, Inc. can be used.

Moreover, the transfer chamber 2704 and each of the chambers 2706a to 2706d preferably have a small amount of external leakage or internal leakage. For example, in the transfer chamber 2704 and each of the chambers 2706a to 2706d, the leakage rate is less than or equal to $3\times10^{-6}$ Pa·m³/s, preferably less than or equal to $1\times10^{-6}$ Pa·m³/s. For example, the leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s. For example, the leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s. For example, the leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above-mentioned value.

For example, open/close portions of the transfer chamber 2704 and the chambers 2706a to 2706d can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the manufacturing apparatus 2700, aluminum, chromium, titanium, zirconium, nickel, or vanadium, which releases a small amount of gas containing impurities, is used. Alternatively, an alloy containing iron, chromium, nickel, or the like covered with the above material may be used. The alloy containing iron, chromium, nickel, or the like is rigid, resistant to heat, and suitable for processing. Here, when surface unevenness of the member is decreased by polishing or the like to reduce the surface area, the release of gas can be reduced.

Alternatively, the above member of the manufacturing apparatus 2700 may be covered with iron fluoride, aluminum oxide, chromium oxide, or the like.

The member of the manufacturing apparatus 2700 is preferably formed using only metal when possible. For example, in the case where a viewing window formed of quartz or the like is provided, it is preferable that the surface of the viewing window be thinly covered with iron fluoride, aluminum oxide, chromium oxide, or the like so as to suppress release of gas.

When an adsorbed substance is present in the transfer chamber 2704 and each of the chambers 2706a to 2706d, although the adsorbed substance does not affect the pressure in the transfer chamber 2704 and each of the chambers 2706a to 2706d because it is adsorbed onto an inner wall or the like, the adsorbed substance causes a release of gas when the inside of the transfer chamber 2704 and each of the chambers 2706a to 2706d is evacuated. Therefore, although there is no correlation between the leakage rate and the exhaust rate, it is important that the adsorbed substance present in the transfer chamber 2704 and each of the chambers 2706a to 2706d be desorbed as much as possible and exhaust be performed in advance with the use of a pump with high exhaust capability. Note that the transfer chamber 2704 and each of the chambers 2706a to 2706d may be subjected to baking to promote desorption of the adsorbed substance. By the baking, the desorption rate of the adsorbed substance can be increased about tenfold. The baking can be performed at a temperature of higher than or equal to 100° C. and lower than or equal to 450° C. At this time, when the adsorbed substance is removed while an inert gas is introduced into the transfer chamber 2704 and each of the chambers 2706a to 2706d, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as the inert gas.

Alternatively, treatment for evacuating the inside of the transfer chamber 2704 and each of the chambers 2706a to 2706d is preferably performed a certain period of time after heated oxygen, a heated inert gas such as a heated rare gas, or the like is introduced to increase the pressure in the transfer chamber 2704 and each of the chambers 2706a to 2706d. The introduction of the heated gas can desorb the adsorbed substance in the transfer chamber 2704 and each of the chambers 2706a to 2706d, and the impurities present in the transfer chamber 2704 and each of the chambers 2706a to 2706d can be reduced. Note that an advantageous effect can be achieved when this treatment is repeated more than or equal to 2 times and less than or equal to 30 times, preferably more than or equal to 5 times and less than or equal to times. Specifically, an inert gas, oxygen, or the like with a temperature higher than or equal to 40° C. and lower than or equal to 400° C., preferably higher than or equal to 50° C. and lower than or equal to 200° C. is introduced to the transfer chamber 2704 and each of the chambers 2706a to 2706d, so that the pressure therein can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the inside of the transfer chamber 2704 and each of the chambers 2706a to 2706d is evacuated in the time range of 5 minutes to 300 minutes, preferably 10 minutes to 120 minutes.

Next, the chambers 2706b and 2706c are described with reference to a schematic cross-sectional view of FIG. 21.

The chambers 2706b and 2706c are chambers capable of performing high-density plasma treatment on an object, for example Because the chambers 2706b and 2706c have a common structure with the exception of the atmosphere used in the high-density plasma treatment, they are collectively described below.

The chambers 2706b and 2706c each include a slot antenna plate 2808, a dielectric plate 2809, a substrate stage 2812, and an exhaust port 2819. A gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chambers 2706b and 2706c.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Further, the gas supply source 2801 is connected to the mode converter 2805 through the valve 2802. Gas is transferred to the chambers 2706b and 2706c through the gas pipe 2806 which runs through the mode converter 2805, the waveguide 2807, and the dielectric plate 2809. The vacuum pump 2817 has a function of exhausting gas or the like from the chambers 2706b and 2706c through the valve 2818 and the exhaust port 2819. The high-frequency power source 2816 is connected to the substrate stage 2812 through the matching box 2815.

The substrate stage 2812 has a function of holding a substrate 2811. For example, the substrate stage 2812 has a function of an electrostatic chuck or a mechanical chuck for holding the substrate 2811. In addition, the substrate stage 2812 has a function of an electrode to which electric power is supplied from the high-frequency power source 2816. The substrate stage 2812 includes a heating mechanism 2813 therein and thus has a function of heating the substrate 2811.

As the vacuum pump 2817, a dry pump, a mechanical booster pump, an ion pump, a titanium sublimation pump, a cryopump, a turbomolecular pump, or the like can be used, for example In addition to the vacuum pump 2817, a cryotrap may be used as well. The combinational use of the cryopump and the cryotrap allows water to be efficiently exhausted and is particularly preferable.

For example, the heating mechanism 2813 may be a heating mechanism which uses a resistance heater or the like for heating. Alternatively, a heating mechanism which utilizes heat conduction or heat radiation from a medium such as a heated gas for heating may be used. For example, rapid thermal annealing (RTA) such as gas rapid thermal annealing (GRTA) or lamp rapid thermal annealing (LRTA) can be used. In GRTA, heat treatment is performed using a high-temperature gas. An inert gas is used as the gas.

The gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (e.g., an argon gas) may be used.

As the dielectric plate 2809, silicon oxide (quartz), aluminum oxide (alumina), yttrium oxide (yttria), or the like may be used, for example A protective layer may be further formed on a surface of the dielectric plate 2809. As the protective layer, magnesium oxide, titanium oxide, chromium oxide, zirconium oxide, hafnium oxide, tantalum oxide, silicon oxide, aluminum oxide, yttrium oxide, or the like may be used. The dielectric plate 2809 is exposed to an especially high density region of high-density plasma 2810 that is to be described later. Therefore, the protective layer can reduce the damage and consequently prevent an increase of particles or the like during the treatment.

The high-frequency generator 2803 has a function of generating a microwave with a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave propagates through the slot holes and the dielectric plate 2809. Then, an electric field is generated below the dielectric plate 2809, and the high-density plasma 2810 can be generated. The high-density plasma 2810 includes ions and radicals depending on the gas species supplied from the gas supply source 2801. For example, oxygen radicals, nitrogen radicals, or the like are included.

At this time, the quality of a film or the like over the substrate 2811 can be modified by the ions and radicals generated in the high-density plasma 2810. Note that it is preferable in some cases to apply a bias to the substrate 2811 using the high-frequency power source 2816. As the high-frequency power source 2816, a radio frequency (RF) power source with a frequency of 13.56 MHz, 27.12 MHz, or the like may be used, for example. The application of a bias to the substrate allows ions in the high-density plasma 2810 to efficiently reach a deep portion of an opening of the film or the like over the substrate 2811.

For example, in the chamber 2706b, oxygen radical treatment using the high-density plasma 2810 can be performed by introducing oxygen from the gas supply source 2801. In the chamber 2706c, nitrogen radical treatment using the high-density plasma 2810 can be performed by introducing nitrogen from the gas supply source 2801.

Next, the chambers 2706a and 2706d are described with reference to a schematic cross-sectional view of FIG. 22.

The chambers 2706a and 2706d are chambers capable of irradiating an object with an electromagnetic wave, for example Because the chambers 2706a and 2706d have a common structure with the exception of the kind of the electromagnetic wave, they are collectively described below.

The chambers 2706a and 2706d each include one or more lamps 2820, a substrate stage 2825, a gas inlet 2823, and an exhaust port 2830. A gas supply source 2821, a valve 2822, a vacuum pump 2828, and a valve 2829 are provided outside the chambers 2706a and 2706d.

The gas supply source 2821 is connected to the gas inlet 2823 through the valve 2822. The vacuum pump 2828 is connected to the exhaust port 2830 through the valve 2829. The lamp 2820 is provided to face the substrate stage 2825. The substrate stage 2825 has a function of holding a substrate 2824. The substrate stage 2825 includes a heating mechanism 2826 therein and thus has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp may be used, for example.

For example, part of or the whole electromagnetic wave emitted from the lamp 2820 is absorbed by the substrate 2824, so that the quality of a film or the like over the substrate 2824 can be modified. For example, defects can be generated or reduced or impurities can be removed. When the substrate 2824 absorbs the electromagnetic wave while being heated, generation or reduction of defects or removal of impurities can be efficiently performed.

Alternatively, for example, the electromagnetic wave emitted from the lamp 2820 may cause heat generation in the substrate stage 2825, by which the substrate 2824 may be heated. In this case, the heating mechanism 2826 inside the substrate stage 2825 may be omitted.

For the vacuum pump 2828, the description of the vacuum pump 2817 is referred to. For the heating mechanism 2826, the description of the heating mechanism 2813 is referred to. For the gas supply source 2821, the description of the gas supply source 2801 is referred to.

With the above-described manufacturing apparatus, the quality of a film can be modified while the entry of impurities into an object suppressed.

The structure and method described in this embodiment can be implemented by being combined as appropriate with any of the other structures and methods described in the other embodiments.

Embodiment 4

Figure 23A:
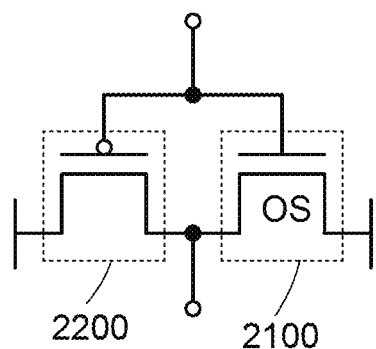
FIGS. 23A and 23B are circuit diagrams illustrating semiconductor devices of embodiments of the present invention.
Figure 24:
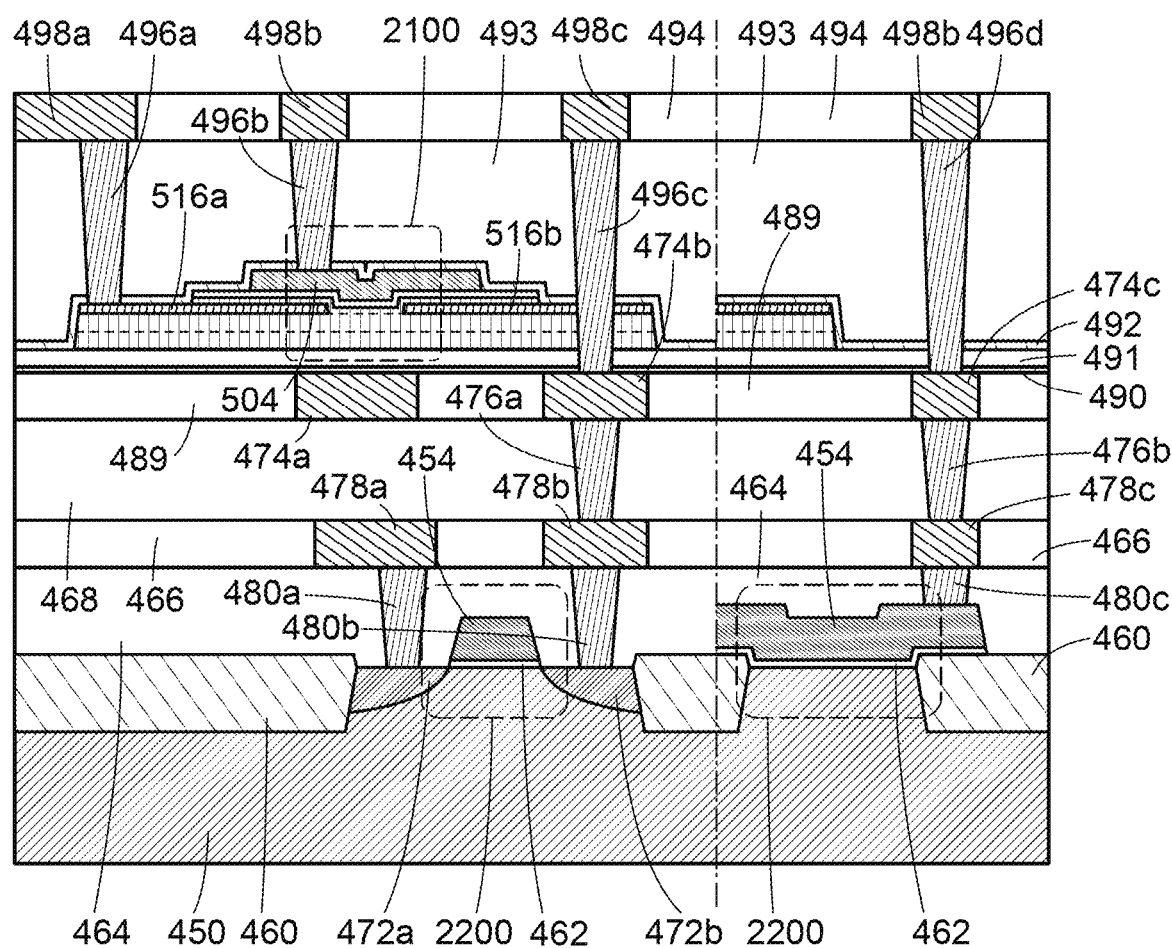
FIG. 24 is a cross-sectional view illustrating a semiconductor device of one embodiment of the present invention.

In this embodiment, an example of a circuit of a semiconductor device including a transistor or the like of one embodiment of the present invention is described.
<Circuit>
An example of a circuit of a semiconductor device including a transistor or the like of one embodiment of the present invention is described below.
<CMOS Inverter>
A circuit diagram in FIG. 23A shows a configuration of what is called a CMOS inverter in which a p-channel transistor 2200 and an n-channel transistor 2100 are connected to each other in series and in which gates of them are connected to each other.
<Structure of Semiconductor Device>
FIG. 24 is a cross-sectional view of the semiconductor device of FIG. 23A. The semiconductor device shown in FIG. 24 includes the transistor 2200 and the transistor 2100. The transistor 2100 is placed above the transistor 2200. Note that an example where the transistor 20 shown in FIGS. 9A and 9B is used as the transistor 2100 is shown, but a semiconductor device of one embodiment of the present invention is not limited thereto. Any of the transistors described in the above embodiments can be used as the transistor 2100. Therefore, the description regarding the above-mentioned transistors is referred to for the transistor 2100 as appropriate.

The transistor 2200 shown in FIG. 24 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 serves as a gate insulator. The conductor 454 serves as a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 24 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 491, an insulator 492, an insulator 493, and an insulator 494.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may serve as a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 102 in the above embodiment and thus, the description of the conductor 102 can be referred to for details about the conductor 474a.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 2100.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

As described in the above embodiment, the amounts of water and hydrogen in the insulator 491 can be reduced, so that defect states can be prevented from bering formed in the oxide semiconductor of the transistor 2100. Accordingly, the electrical characteristics of the transistor 2100 can be stabilized.

Such an insulator in which water and hydrogen are reduced may be used as an insulator other than the insulator 491, such as the insulator 466, the insulator 468, the insulator 489, or the insulator 493.

Although insulators that correspond to the insulators 105 and 101 in the transistor 20 are not illustrated in FIG. 24, these insulators may be provided. For example, an insulator that corresponds to the insulator 101 may be provided between the insulator 468 and the insulator 489, and an insulator that corresponds to the insulator 105 may be provided between the insulator 489 and the insulator 490. In particular, the insulator that has a function of blocking water, hydrogen, and the like and corresponds to the insulator 101 may be provided between the insulator 468 and the insulator 489 and the amounts of water and hydrogen in the insulator 491 are reduced in the above-described manner, whereby defect states can be further prevented from being formed in the oxide semiconductor of the transistor 2100.

The insulator 492 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. Note that the insulator 492 corresponds to the insulator 116 in the above embodiment and thus, the description of the insulator 116 can be referred to for details about the insulator 492.

The insulator 493 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 25:
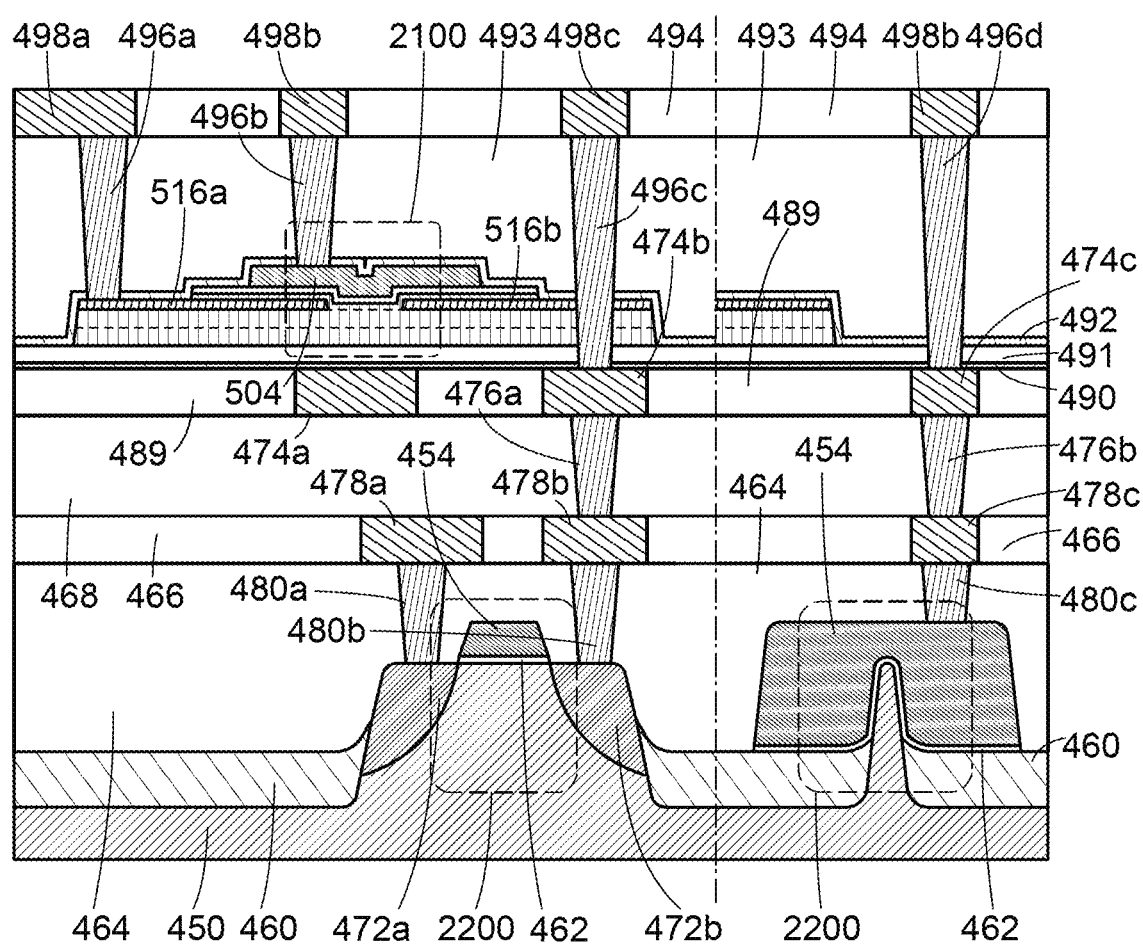
FIG. 25 is a cross-sectional view illustrating a semiconductor device of one embodiment of the present invention.

Note that a semiconductor device in FIG. 25 is the same as the semiconductor device in FIG. 24 except for the structure of the transistor 2200. Therefore, the description of the semiconductor device in FIG. 24 is referred to for the semiconductor device in FIG. 25. In the semiconductor device in FIG. 25, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 26:
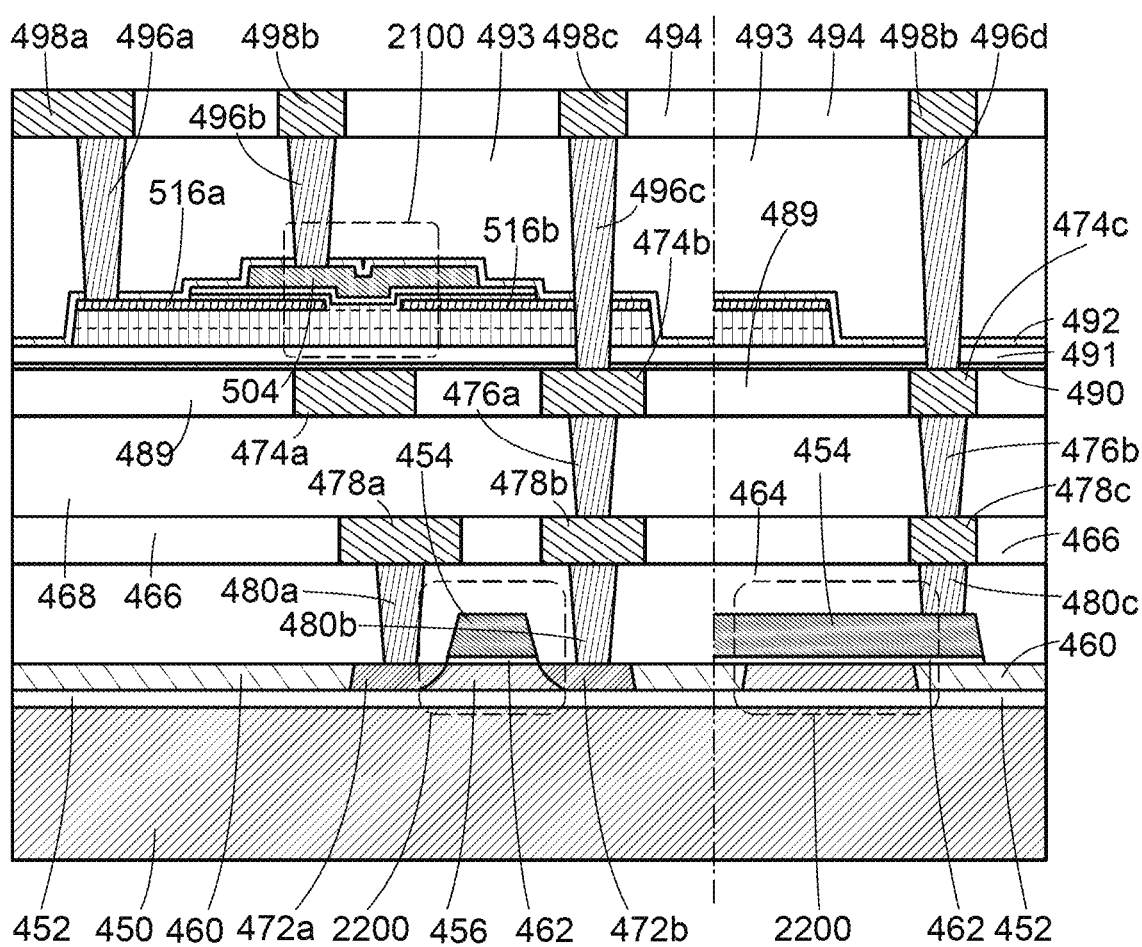
FIG. 26 is a cross-sectional view illustrating a semiconductor device of one embodiment of the present invention.

Note that a semiconductor device in FIG. 26 is the same as the semiconductor device in FIG. 24 except for the structure of the transistor 2200. Therefore, the description of the semiconductor device in FIG. 26 is referred to for the semiconductor device in FIG. 24. Specifically, in the semiconductor device in FIG. 26, the transistor 2200 is formed in the semiconductor substrate 450 that is an SOI substrate. In the structure in FIG. 26, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 24 to FIG. 26, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 23B:
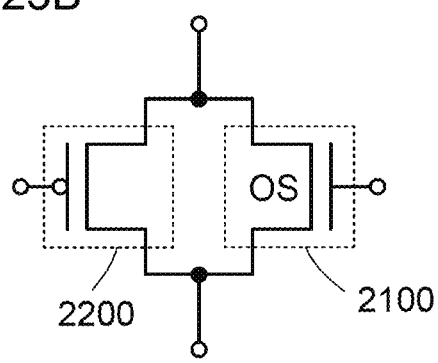

A circuit diagram in FIG. 23B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 27A:
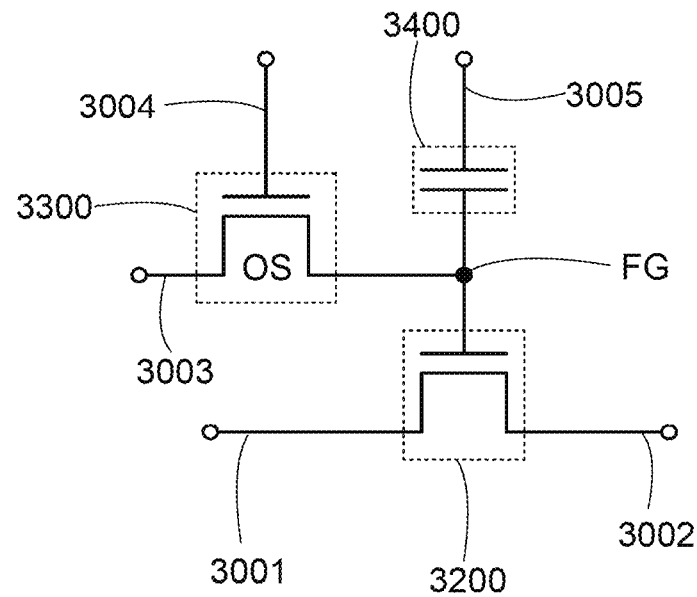
FIGS. 27A to 27C are circuit diagrams illustrating memory devices of embodiments of the present invention.
Figure 27B:
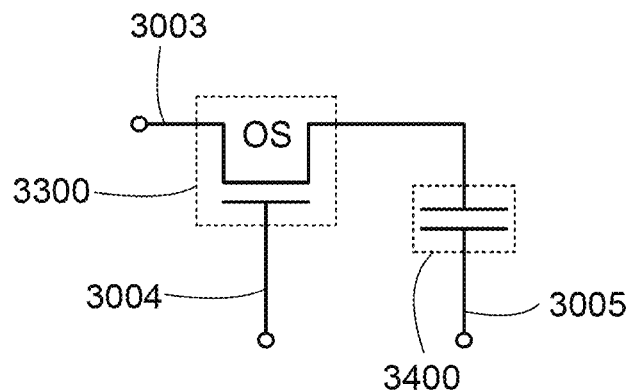
Figure 27C:
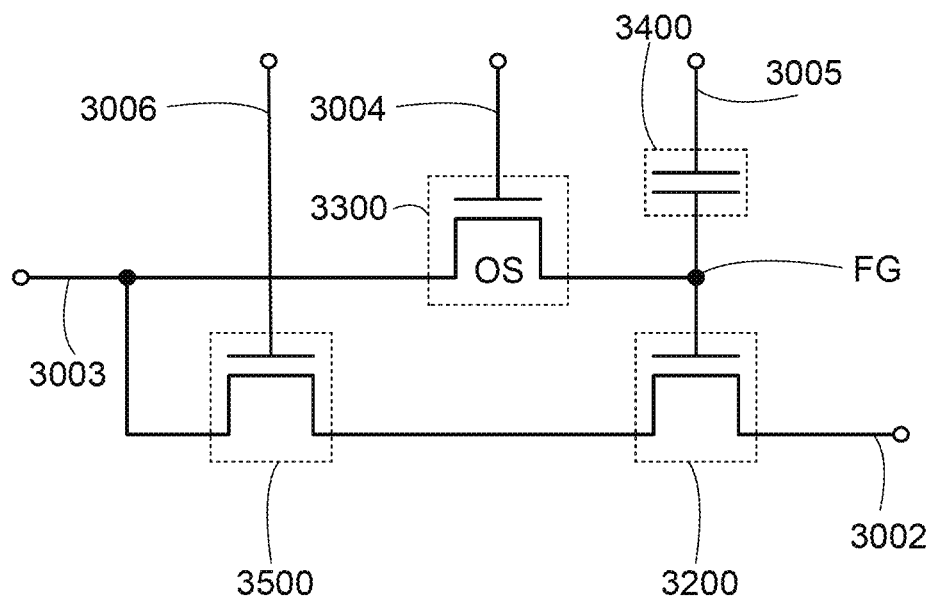

An example of a semiconductor device (memory device) which includes the transistor of one embodiment of the present invention, which can retain stored data even when not powered, and which has an unlimited number of write cycles is shown in FIGS. 27A to 27C.

The semiconductor device illustrated in FIG. 27A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 27A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ (>$V_{th\_H}$), the transistor 3200 is brought into "on state." In the case where the low-level electric charge is supplied to the node FG in writing, even when the potential of the fifth wiring 3005 is $V_0$ (<$V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device 1>

Figure 28:
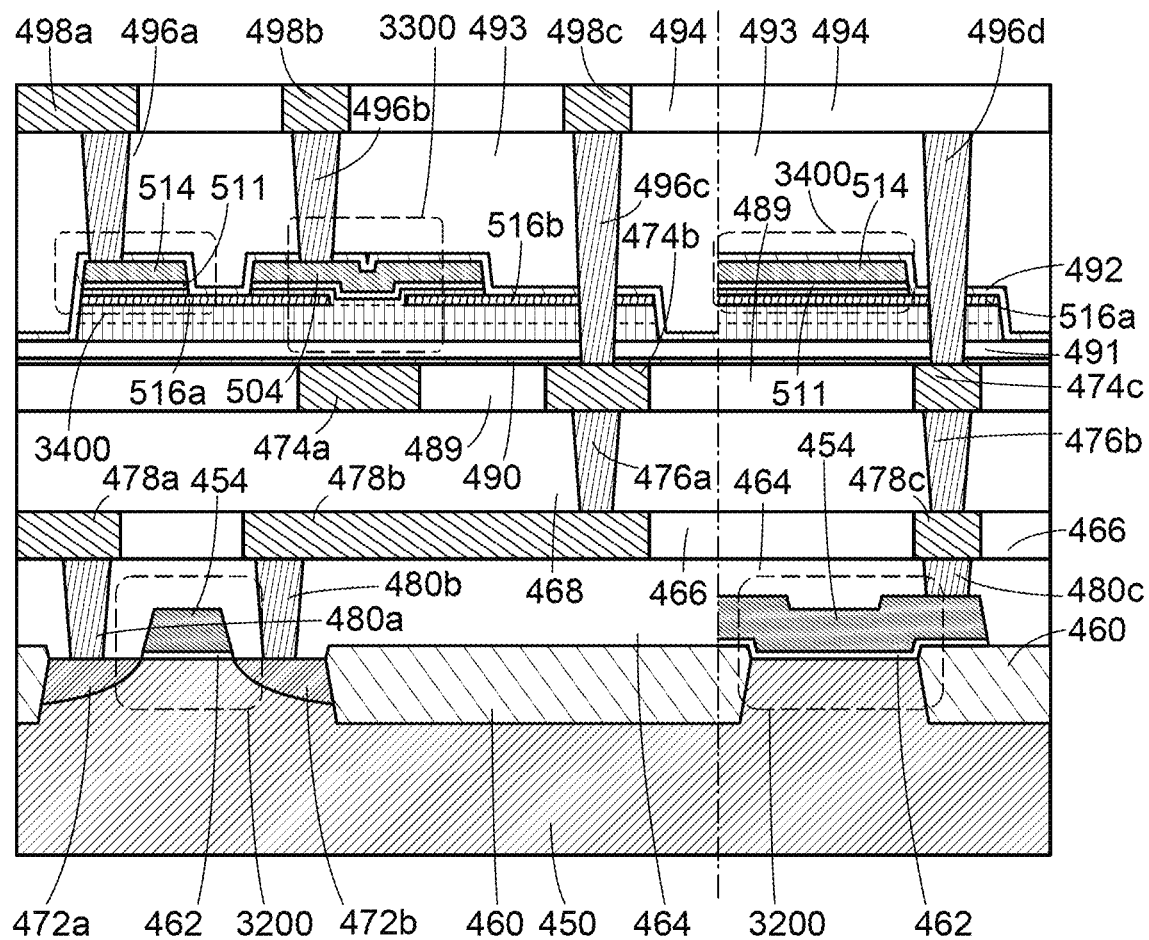
FIG. 28 is a cross-sectional view illustrating a semiconductor device of one embodiment of the present invention.

FIG. 28 is a cross-sectional view of the semiconductor device of FIG. 27A. The semiconductor device shown in FIG. 28 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 24 is referred to. Note that although the transistor 2200 is illustrated as a p-channel transistor in FIG. 24, the transistor 3200 may be an n-channel transistor.

The transistor 3200 illustrated in FIG. 28 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 28 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the insulator 489, the insulator 490, the insulator 491, the insulator 492, the insulator 493, and the insulator 494.

The insulator 464 is provided over the transistor 3200. The insulator 466 is provided over the insulator 464. The insulator 468 is provided over the insulator 466. The insulator 489 is provided over the insulator 468. The transistor 3300 is provided over the insulator 489. The insulator 493 is provided over the transistor 3300. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 3300, an opening reaching the conductor 476a, and an opening reaching the conductor 476b. In the openings, the conductor 474a, the conductor 474b, and the conductor 474c are embedded.

The conductor 474a may serve as a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 504 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 3300.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

As described in the above embodiment, the amounts of water and hydrogen in the insulator 491 can be reduced, so that defect states can be prevented from being formed in the oxide semiconductor of the transistor 2100. Accordingly, the electrical characteristics of the transistor 2100 can be stabilized.

Such an insulator in which water and hydrogen are reduced may be used as an insulator other than the insulator 491, such as the insulator 466, the insulator 468, the insulator 489, or the insulator 493.

Although insulators that correspond to the insulators 105 and 101 in the transistor 20 are not illustrated in FIG. 24, these insulators may be provided. For example, an insulator that corresponds to the insulator 101 may be provided between the insulator 468 and the insulator 489, and an insulator that corresponds to the insulator 105 may be provided between the insulator 489 and the insulator 490. In particular, the insulator that has a function of blocking water, hydrogen, and the like and corresponds to the insulator 101 may be provided between the insulator 468 and the insulator 489 and the amounts of water and hydrogen in the insulator 491 are reduced in the above-described manner, whereby defect states can be further prevented from being formed in the oxide semiconductor of the transistor 3300.

The insulator 492 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. Note that the insulator 492 corresponds to the insulator 116 in the above embodiment and thus, the description of the insulator 116 can be referred to for details about the insulator 492.

The insulator 493 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, an opening provided in a component of the transistor 3300 or the like is positioned between openings provided in other components.

The insulator 494 includes an opening reaching the conductor 496a, an opening reaching the conductor 496b, and an opening reaching the conductor 496c. In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 516b that is one of the source electrode and the drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes the conductor 516a that is the other of the source electrode and the drain electrode of the transistor 3300, the conductor 514, and the insulator 511. The insulator 511 is preferably used in some cases because the insulator 511 can be formed in the same step as the insulator functioning as a gate insulator of the transistor 3300, leading to an increase in productivity. A layer formed in the same step as the conductor 504 functioning as the gate electrode of the transistor 3300 is preferably used as the conductor 514 in some cases, leading to an increase in productivity.

For the structures of other components, the description of FIG. 24 and the like can be referred to as appropriate.

Figure 29:
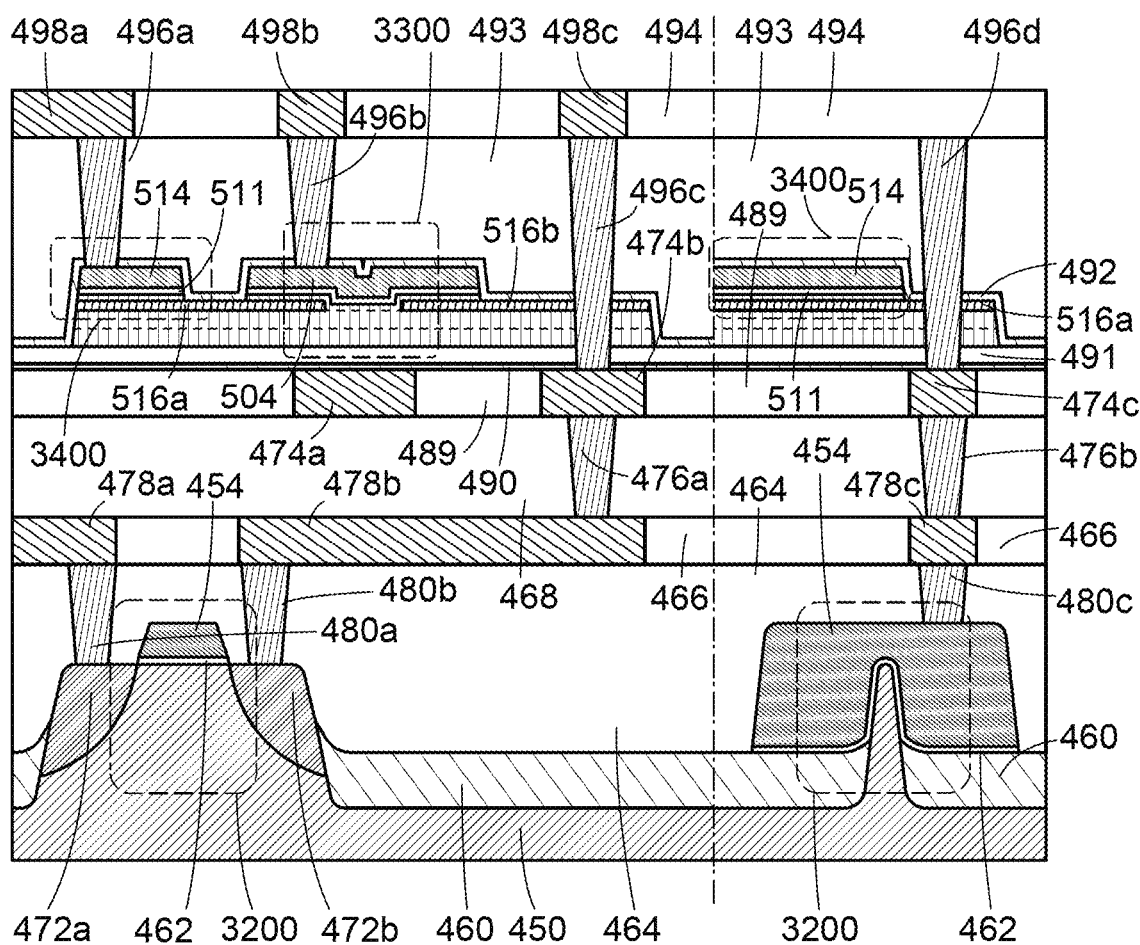
FIG. 29 is a cross-sectional view illustrating a semiconductor device of one embodiment of the present invention.

A semiconductor device in FIG. 29 is the same as the semiconductor device in FIG. 28 except for the structure of the transistor 3200. Therefore, the description of the semiconductor device in FIG. 28 is referred to for the semiconductor device in FIG. 29. Specifically, in the semiconductor device in FIG. 29, the transistor 3200 is a Fin-type transistor. For the Fin-type transistor 3200, the description of the transistor 2200 in FIG. 25 is referred to. Note that although the transistor 2200 is illustrated as a p-channel transistor in FIG. 25, the transistor 3200 may be an n-channel transistor.

Figure 30:
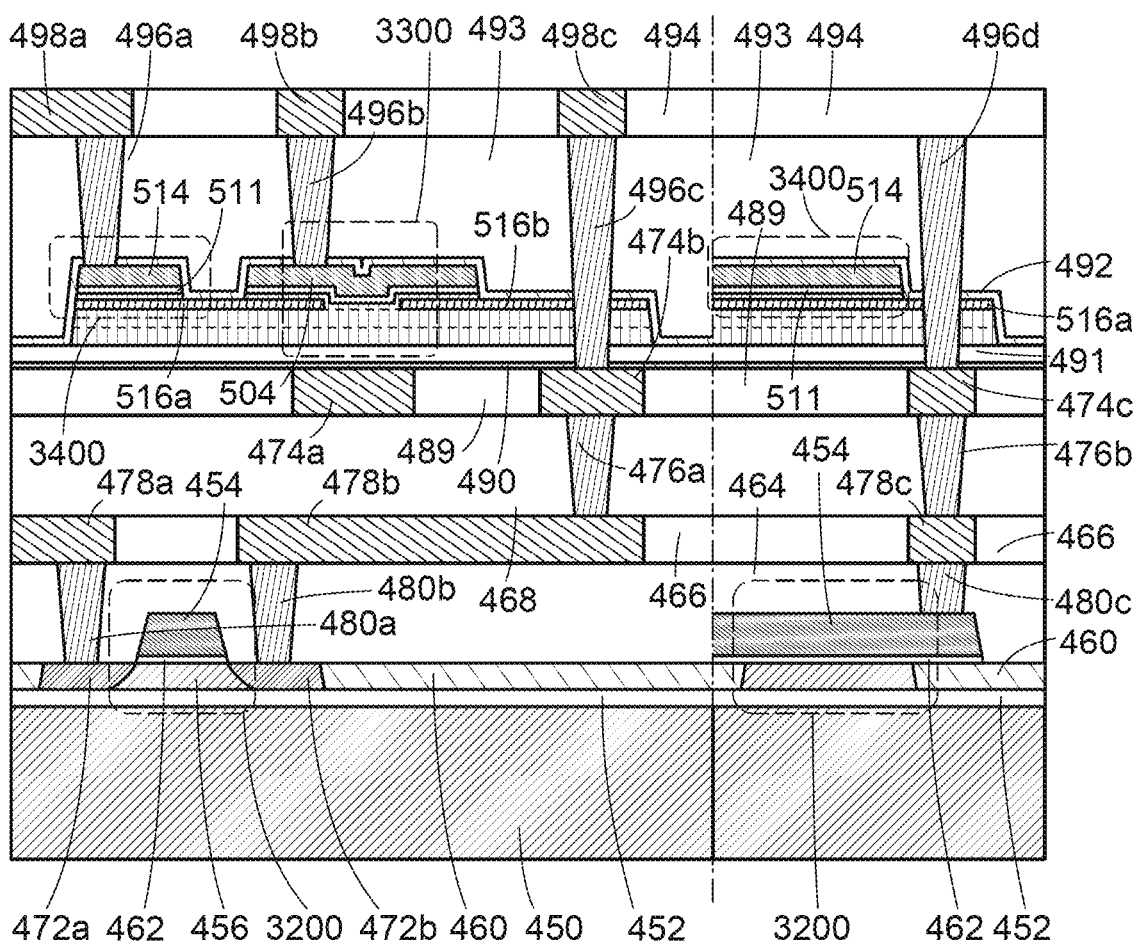
FIG. 30 is a cross-sectional view illustrating a semiconductor device of one embodiment of the present invention.

A semiconductor device in FIG. 30 is the same as the semiconductor device in FIG. 28 except for the structure of the transistor 3200. Therefore, the description of the semiconductor device in FIG. 28 is referred to for the semiconductor device in FIG. 30. Specifically, in the semiconductor device in FIG. 30, the transistor 3200 is provided in the semiconductor substrate 450 that is an SOI substrate. For the transistor 3200, which is provided in the semiconductor substrate 450 (SOI substrate), the description of the transistor 2200 in FIG. 26 is referred to. Note that although the transistor 2200 is illustrated as a p-channel transistor in FIG. 26, the transistor 3200 may be an n-channel transistor.

<Memory Device 2>

The semiconductor device in FIG. 27B is different from the semiconductor device in FIG. 27A in that the transistor 3200 is not provided. Also in this case, data can be written and retained in a manner similar to that of the semiconductor device in FIG. 27A.

Reading of data in the semiconductor device in FIG. 27B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and VD) is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, a high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 27A is described with reference to a circuit diagram in FIG. 31.

Figure 31:
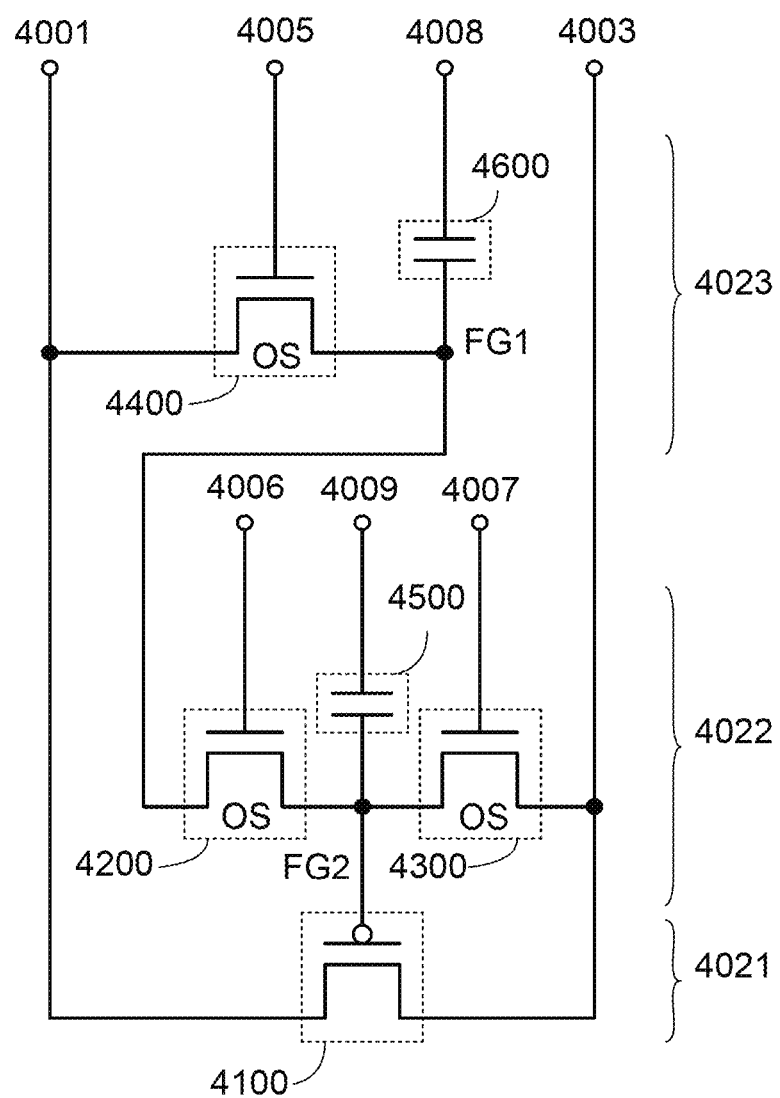
FIG. 31 is a circuit diagram illustrating a semiconductor device of one embodiment of the present invention.

The semiconductor device illustrated in FIG. 31 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 31, a plurality of semiconductor devices in FIG. 31 are provided in a matrix. The semiconductor devices in FIG. 31 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 31, the transistor 4100 may be an n-channel transistor.

The semiconductor device in FIG. 31 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be formed to overlap with a transistor including silicon, for example Although the transistors 4200, 4300, and 4400 are n-channel transistors in FIG. 31, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 31 preferably includes, as illustrated in FIG. 31, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 31 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 31, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 31 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$." The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$," by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$." In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$." Thus, the capacitance of the capacitor 4600 is preferably larger than the capacitance of the capacitor 4500. Alternatively, the potential written to the node FG1, "$V_{D1}-V_{th}$," is preferably larger than the potential corresponding to the same data, "$V_{D2}-V_{th}$." By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$." The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$," by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$." In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 31, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the storage capacity per memory cell can be improved and read data can be close to accurate data; thus, the data reliability becomes excellent.

Figure 32:
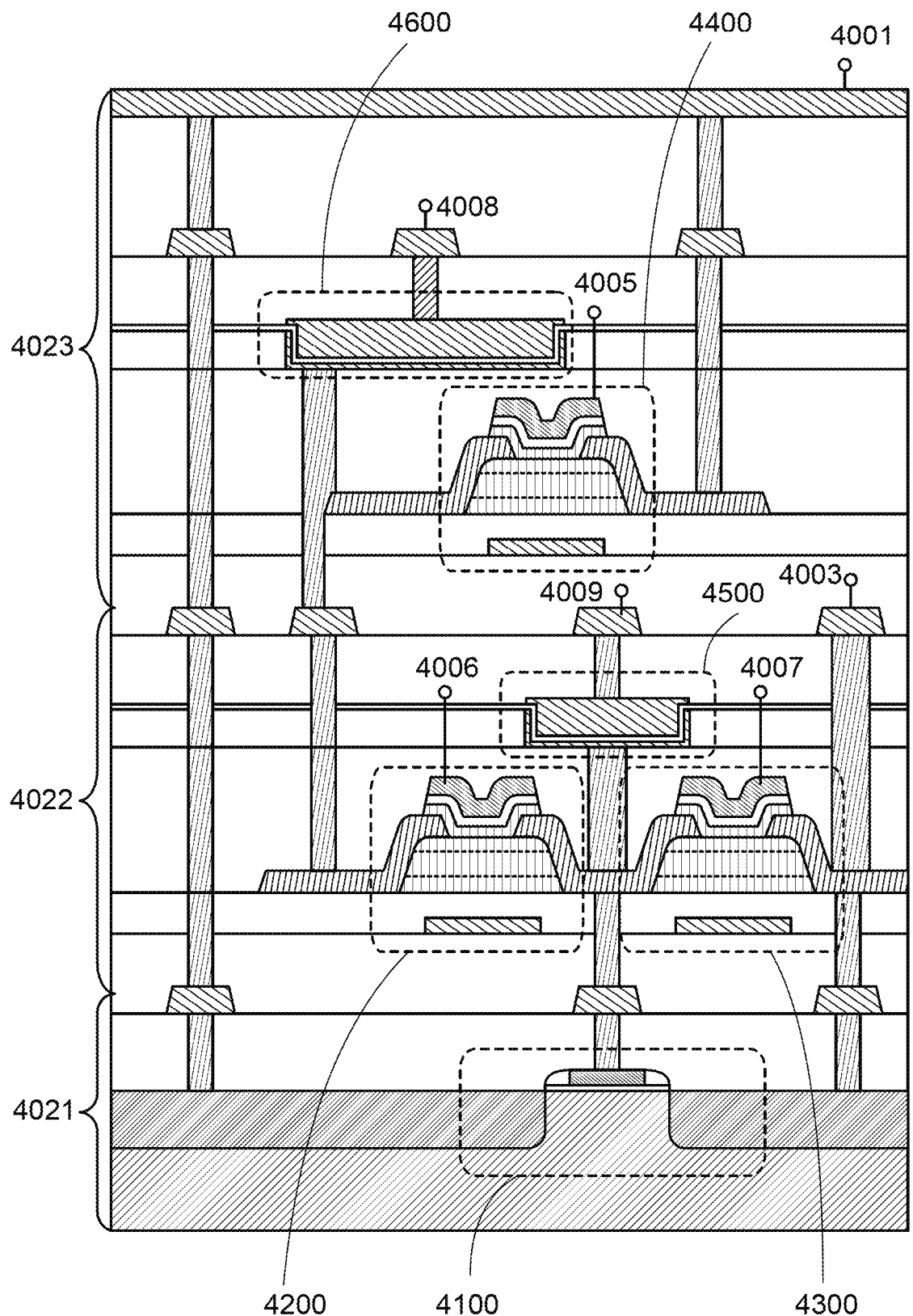
FIG. 32 is a cross-sectional view illustrating a semiconductor device of one embodiment of the present invention.

FIG. 32 is a cross-sectional view of a semiconductor device that corresponds to FIG. 31. The semiconductor device illustrated in FIG. 32 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200, 4300, and 4400, and the description of the transistor 3200 can be referred to for the transistor 4100. The description made with reference to FIG. 28 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 28 is parallel to the substrate. With this structure, a larger capacity can be obtained without increasing the occupation area.

<Memory Device 4>

The semiconductor device in FIG. 27C is different from the semiconductor device in FIG. 27A in that the transistor 3500 and a sixth wiring 3006 are included. Also in this case, data can be written and retained in a manner similar to that of the semiconductor device in FIG. 27A. A transistor similar to the transistor 3200 described above can be used as the transistor 3500.

The sixth wiring 3006 is electrically connected to a gate of the transistor 3500, one of a source and a drain of the transistor 3500 is electrically connected to the drain of the transistor 3200, and the other of the source and the drain of the transistor 3500 is electrically connected to the third wiring 3003.

Figure 33:
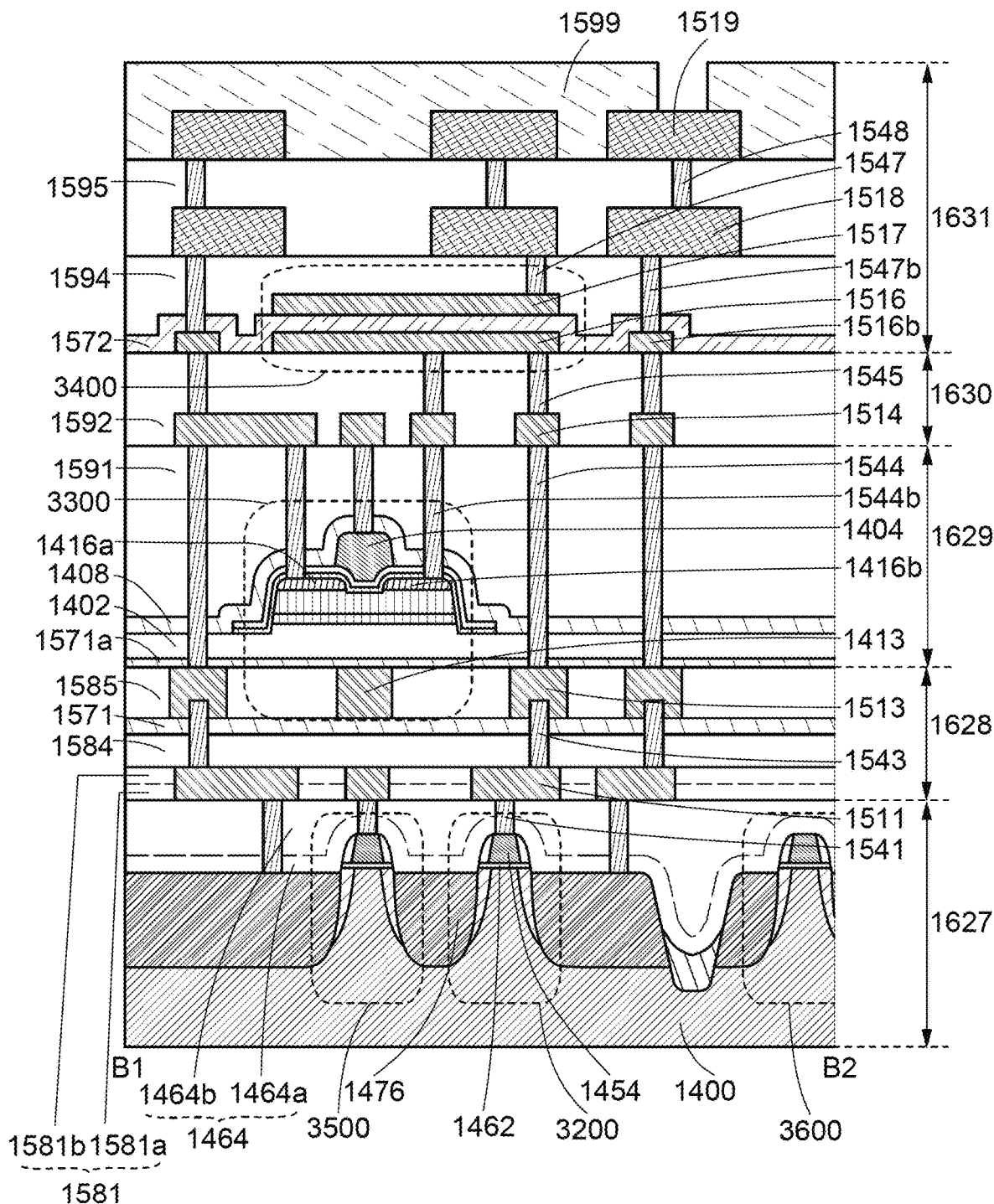
FIG. 33 is a cross-sectional view illustrating a semiconductor device of one embodiment of the present invention.
Figure 34:
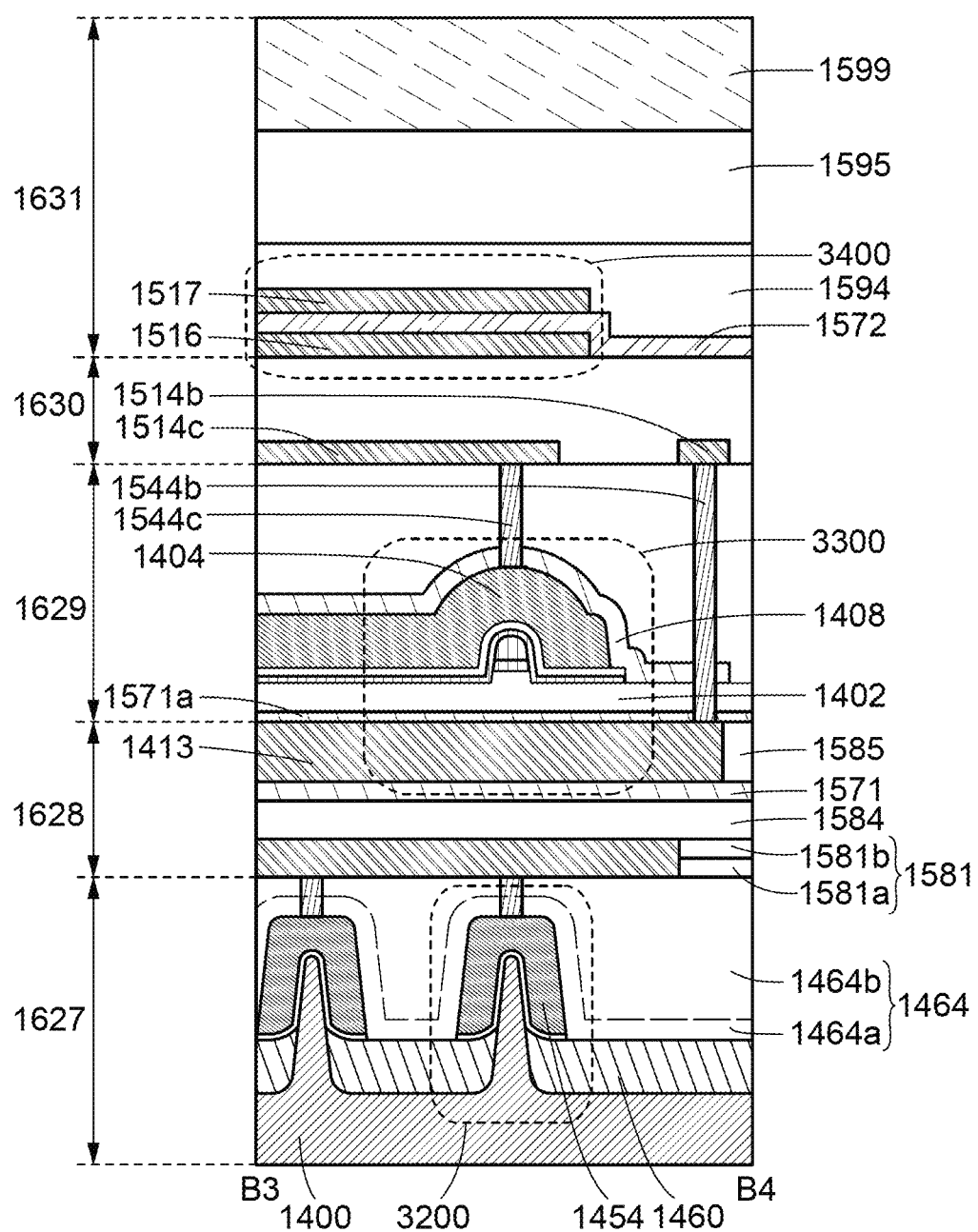
FIG. 34 is a cross-sectional view illustrating a semiconductor device of one embodiment of the present invention.

FIG. 33 illustrates an example of a cross-sectional view of the semiconductor device illustrated in FIG. 27C. FIG. 34 illustrates an example of a cross section in a B3-B4 direction that is substantially perpendicular to a B1-B2 direction in FIG. 33. The semiconductor device illustrated in FIG. 27C, FIG. 33, and FIG. 34 includes five layers 1627 to 1631. The layer 1627 includes the transistor 3200, the transistor 3500, and a transistor 3600. The layer 1628 and the layer 1629 include the transistor 3300.

The layer 1627 includes a substrate 1400, the transistors 3200, 3500, and 3600 over the substrate 1400, an insulator 1464 over the transistor 3200 and the like, and plugs such as a plug 1541. The plug 1541 or the like is connected to, for example, a gate electrode, a source electrode, a drain electrode, or the like of the transistor 3200 or the like. The plug 1541 is preferably formed to be embedded in the insulator 1464.

The description of the transistor 2200 can be referred to for the transistors 3200, 3500, and 3600.

The insulator 1464 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 1464 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

Alternatively, the insulator 1464 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

The insulator 1464 may have a single-layer structure or a stacked-layer structure of a plurality of materials.

In FIG. 33, the insulator 1464 is formed of two layers, i.e., an insulator 1464a and an insulator 1464b over the insulator 1464a.

The insulator 1464a is preferably formed over a region 1476 of the transistor 3200, a conductor 1454 functioning as a gate of the transistor 3200 and the like, and the like with high adhesion or high coverage.

As an example of the insulator 1464a, silicon nitride formed by a CVD method can be used. Here, the insulator 1464a preferably contains hydrogen in some cases. When the insulator 1464a contains hydrogen, a defect or the like in the substrate 1400 is reduced and the characteristics of the transistor 3200 and the like are improved in some cases. For example, in the case where the substrate 1400 is formed using a material containing silicon, a defect such as a dangling bond in the silicon can be terminated by hydrogen.

The parasitic capacitance formed between a conductor under the insulator 1464a, such as the conductor 1454, and a conductor over the insulator 1464b, such as a conductor 1511, is preferably small. Thus, the insulator 1464b preferably has a low dielectric constant. The dielectric constant of the insulator 1464b is preferably lower than that of an insulator 1462 that functions as a gate insulator of the transistor 3200 and the like. The dielectric constant of the insulator 1464b is preferably lower than that of the insulator 1464a. For example, the relative dielectric constant of the insulator 1464b is preferably lower than 4, more preferably lower than 3. For example, the relative dielectric constant of the insulator 1464b is preferably 0.7 times or less that of the insulator 1464a, more preferably 0.6 times or less that of the insulator 1464a.

Here, for example, silicon nitride and USG can be used as the insulator 1464a and the insulator 1464b, respectively.

When the insulator 1464a, an insulator 1581a, and the like are formed using a material with low copper permeability, such as silicon nitride or silicon carbonitride, the diffusion of copper into a layer under the insulator 1464a or the like and a layer over the insulator 1581a or the like can be suppressed when copper is included in the conductor 1511 or the like.

An impurity such as copper released from a top surface of the conductor 1511b not covered with the conductor 1511a might be diffused into a layer over the conductor 1511b through an insulator 1584 or the like, for example. Thus, the insulator 1584 over the conductor 1511b is preferably formed using a material through which an impurity such as copper is hardly allowed to pass. For example, the insulator 1584 may have a stacked structure of the insulator 1581a and an insulator 1581b.

The layer 1628 includes an insulator 1581, the insulator 1584 over the insulator 1581, an insulator 1571 over the insulator 1584, an insulator 1585 over the insulator 1571, the conductor 1511 and the like over the insulator 1464, a plug 1543 and the like connected to the conductor 1511 and the like, and a conductor 1513 over the insulator 1571. The conductor 1511 is preferably formed to be embedded in the insulator 1581. The plug 1543 and the like are preferably formed to be embedded in the insulator 1584 and the insulator 1571. The conductor 1513 is preferably formed to be embedded in the insulator 1585.

The layer 1628 may include a conductor 1413. The conductor 1413 is preferably formed to be embedded in the insulator 1585.

The insulator 1584 and the insulator 1585 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 1584 and the insulator 1585 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. Furthermore, it is preferable to use tetraethoxysilane (TEOS) (chemical formula: $Si(OC_2H_5)_4$) as a deposition gas, and it is more preferable to perform the deposition while heating is performed. The insulators 1584 and 1585 and the like are formed in this manner, whereby the hydrogen concentration in the film can be reduced. Note that in the case where heating is performed, the preferable temperature is within a relatively low temperature range (for example, higher than or equal to 350° C. and lower than or equal to 445° C.). Such an insulator film whose hydrogen concentration is reduced may be used as another interlayer insulating film.

Note that it is preferable to use a thermal CVD method, an MOCVD method, or an ALD method in order to reduce plasma damage.

Alternatively, the insulator 1584 and the insulator 1585 can be formed using silicon carbide, silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Each of the insulators 1584 and 1585 may have a single-layer structure or a stacked-layer structure of a plurality of materials.

The insulator 1581 may have a stacked-layer structure of a plurality of layers. For example, the insulator 1581 has a two-layer structure of the insulator 1581a and the insulator 1581b over the insulator 1581a as shown in FIG. 33.

The plug 1543 has a portion projecting above the insulator 1571.

A conductive material such as a metal material, an alloy material, or a metal oxide material can be used as a material of the conductor 1511, the conductor 1513, the conductor 1413, the plug 1543, and the like. For example, a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component can be used. Alternatively, a metal nitride such as tungsten nitride, molybdenum nitride, or titanium nitride can be used.

The conductors such as the conductor 1511 and the conductor 1513 preferably function as wirings in the semiconductor device illustrated in FIG. 27C. Therefore, these conductors are also referred to as wirings or wiring layers in some cases. These conductors are preferably connected to each other via plugs such as the plug 1543.

For the insulator 1581, the description of the insulator 1464 is referred to. The insulator 1581 may have a single-layer structure or a stacked-layer structure of a plurality of materials. In the example shown in FIG. 33, the insulator 1581 has a two-layer structure of the insulator 1581a and the insulator 1581b over the insulator 1581a. For a material and a formation method that can be used for the insulator 1581a and the insulator 1581b, the description of the material and the formation method that can be used for the insulator 1464a and the insulator 1464b can be referred to.

As an example of the insulator 1581a, silicon nitride formed by a CVD method can be used. In a semiconductor element included in the semiconductor device illustrated in FIG. 27C, such as the transistor 3300, hydrogen is diffused into the semiconductor element, so that the characteristics of the semiconductor element are degraded in some cases. In view of this, a film that releases a small amount of hydrogen is preferably used as the insulator 1581a. The released amount of hydrogen can be measured by thermal desorption spectroscopy (TDS), for example In TDS analysis, the amount of hydrogen released from the insulator 1581a which is converted into hydrogen atoms is, for example, less than or equal to $5\times10^{20}$ atoms/cm$^3$, preferably less than or equal to $2\times10^{20}$ atoms/cm$^3$, more preferably less than or equal to $1\times10^{20}$ atoms/cm$^3$ in the range of 50° C. to 500° C. The amount of hydrogen released from the insulator 1581a per area of the insulating film, which is converted into hydrogen atoms, is less than or equal to $5\times10^{15}$ atoms/cm$^2$, preferably less than or equal to $2\times10^{15}$ atoms/cm$^2$, more preferably less than or equal to $1\times10^{15}$ atoms/cm$^2$, for example.

Silicon nitride from which a small number of hydrogen atoms are released may be used for not only the insulator 1581a but also an insulator in a layer over the insulator 1581a illustrated in FIG. 33. Instead of the silicon nitride, an insulator similar to the insulator 104 described in the above embodiment in which hydrogen and water are reduced may be used.

The dielectric constant of the insulator 1581b is preferably lower than that of the insulator 1581a. For example, the relative dielectric constant of the insulator 1581b is preferably lower than 4, more preferably lower than 3. For example, the relative dielectric constant of the insulator 1581b is preferably 0.7 times or less that of the insulator 1581a, more preferably 0.6 times or less that of the insulator 1581a.

The insulator 1571 is preferably formed using an insulating material through which an impurity hardly passes. Preferably, the insulator 1571 has low oxygen permeability, for example Preferably, the insulator 1571 has low hydrogen permeability, for example Preferably, the insulator 1571 has low water permeability, for example.

The insulator 1571 can be formed using a single-layer structure or a stacked-layer structure using, for example, aluminum oxide, hafnium oxide, tantalum oxide, zirconium oxide, lead zirconate titanate (PZT), strontium titanate (SrTiO$_3$), (Ba,Sr)TiO$_3$ (BST), silicon nitride, or the like. Alternatively, aluminum oxide, bismuth oxide, germanium oxide, niobium oxide, silicon oxide, titanium oxide, tungsten oxide, yttrium oxide, zirconium oxide, or gallium oxide may be added to the insulator, for example. Alternatively, the insulator may be subjected to nitriding treatment to be oxynitride. A layer of silicon oxide, silicon oxynitride, or silicon nitride may be stacked over the insulator. Aluminum oxide is particularly preferable because of its excellent barrier property against water and hydrogen.

The insulator 1571 is formed using, for example, silicon carbide, silicon carbonitride, or silicon oxycarbide.

The insulator 1571 may be a stack including a layer of a material through which water and hydrogen are hardly allowed to pass and a layer containing an insulating material. The insulator 1571 may be, for example, a stack of a layer containing silicon oxide or silicon oxynitride, a layer containing a metal oxide, and the like.

The insulator 1571 included in the semiconductor device illustrated in FIG. 27C can suppress the diffusion of an element included in the conductor 1513, the conductor 1413, and the like into the insulator 1571 and layers under the insulator 1571 (e.g., the insulator 1584, the insulator 1581, and the layer 1627), for example.

In the case where the dielectric constant of the insulator 1571 is higher than that of the insulator 1584, the thickness of the insulator 1571 is preferably smaller than that of the insulator 1584. Here, the relative dielectric constant of the insulator 1584 is 0.7 times or less that of the insulator 1571, more preferably 0.6 times or less that of the insulator 1571, for example. The thickness of the insulator 1571 is preferably greater than or equal to 5 nm and less than or equal to 200 nm, more preferably greater than or equal to 5 nm and less than or equal to 60 nm, and the thickness of the insulator 1584 is preferably greater than or equal to nm and less than or equal to 800 nm, more preferably greater than or equal to 50 nm and less than or equal to 500 nm, for example. The thickness of the insulator 1571 is preferably less than or equal to one-third of the thickness of the insulator 1584, for example.

The layer 1629 includes the transistor 3300 and plugs such as a plug 1544 and a plug 1544b. The plugs such as the plug 1544 and the plug 1544b are connected to the conductor 1513 in the layer 1628 and a gate electrode, a source electrode, and a drain electrode of the transistor 3300. The description of the transistor 20, the transistor 2100, and the like can be referred to for the structure of the transistor 3300.

The transistor 3300 includes the conductor 1413, an insulator 1571a, an insulator 1402, a conductor 1416a, a conductor 1416b, a conductor 1404, an insulator 1408, and an insulator 1591. For the conductor 1413, the insulator 1571a, the insulator 1402, the conductor 1416a, the conductor 1416b, the conductor 1404, the insulator 1408, and the insulator 1591, the description of the conductor 102, the insulator 103, the insulator 104, the conductor 108a, the conductor 108b, the conductor 114, the insulator 116, and the insulator 118, respectively, can be referred to.

Figure 76:
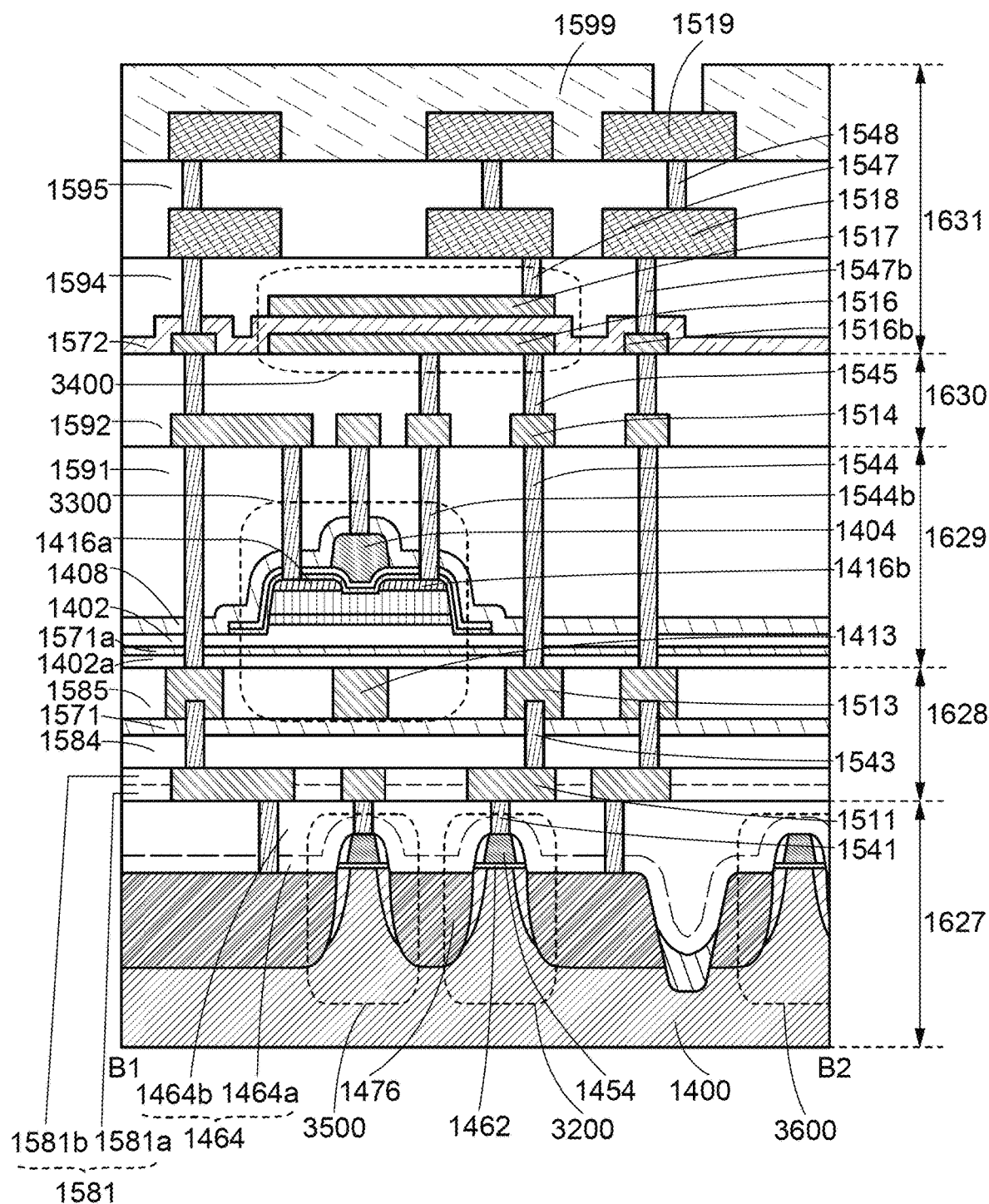
FIG. 76 is a cross-sectional view illustrating a semiconductor device of one embodiment of the present invention.
Figure 77:
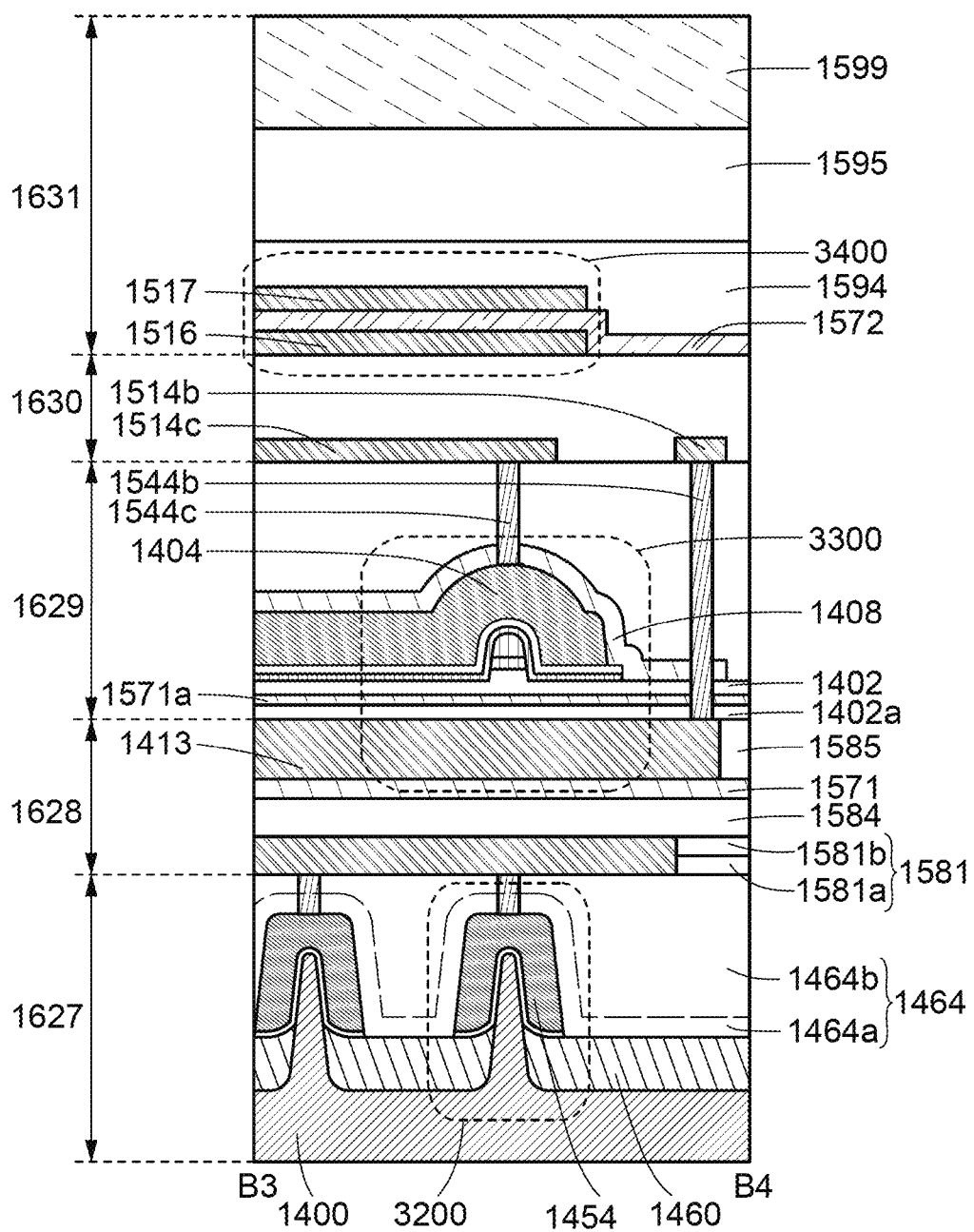
FIG. 77 is a cross-sectional view illustrating a semiconductor device of one embodiment of the present invention.

An insulator 1402a that corresponds to the insulator 105 in the transistor 20 may be provided as illustrated in FIG. 76 and FIG. 77. Note that FIG. 76 and FIG. 77 correspond to FIG. 33 and FIG. 34, and differ from FIG. 33 and FIG. 34 only in that the insulator 1402a is provided. For example, the insulator 1402a may be provided between the insulator 1585 and the insulator 1571a. Of the insulators 1402a, 1571a, and 1402, the insulator 1571a preferably includes an electron trap region. When the insulators 1402a and 1402 have a function of inhibiting release of electrons, the electrons trapped in the insulator 1571a behave as if they are negative fixed charges. Therefore, the threshold voltage of the transistor 3300 can be changed by injection of electrons into the insulator 1571a. The injection of electrons into the insulator 1571a can be performed by applying a positive or negative potential to the conductor 1413.

Since the amount of electron injection can be controlled by the time during which potential is applied to the conductor 1413 and/or the value of applied potential, a desirable threshold voltage of the transistor can be obtained. The potential applied to the conductor 1413 is set such that a tunneling current flows through the insulator 1402a. For example, the applied potential is higher than or equal to 20 V and lower than or equal to 60 V, preferably higher than or equal to 24 V and lower than or equal to 50 V, more preferably higher than or equal to 30 V and lower than or equal to 45 V. The time during which potential is applied is, for example, longer than or equal to 0.1 seconds and shorter than or equal to 20 seconds, preferably longer than or equal to 0.2 seconds and shorter than or equal to 10 seconds.

As in the above embodiment, the amounts of water and hydrogen contained in the insulator in a stacked film of insulators (in this embodiment, a stacked film of the insulator 1585, the insulator 1402a, the insulator 1571a, and the insulator 1402) provided between the insulator 1571 and the insulator corresponding to the insulator 106a of the transistor 20 are preferably small. When the insulator 1571 has a function of blocking water and hydrogen as described above, water and hydrogen supplied to an oxide to be the insulator 106a and the semiconductor 106b of the transistor 20 while the oxide is being deposited are those contained in the insulator 1585, the insulator 1402a, the insulator 1571a, and the insulator 1402. Accordingly, when the amounts of water and hydrogen contained in the stacked film of the insulator 1585, the insulator 1402a, the insulator 1571a, and the insulator 1402 (in particular, the amounts of water and hydrogen contained in the insulator 1402) are sufficiently small at the time of deposition for the oxide, the amounts of water and hydrogen supplied to the oxide can be small.

The conductor 1416a and the conductor 1416b preferably include a material through which an element included in the plug 1544b formed in contact with the top surfaces of the conductor 1416a and the conductor 1416b is unlikely to pass.

Each of the conductor 1416a and the conductor 1416b may be formed of stacked films. For example, each of the conductor 1416a and the conductor 1416b is formed of stacked layers of a first layer and a second layer. Here, the first layer is formed over the oxide semiconductor layer, and the second layer is formed over the first layer. For example, tungsten and tantalum nitride are used as the first layer and the second layer, respectively. Here, copper is used as the plug 1544b or the like, for example. Copper is preferably used as a conductor such as a plug or a wiring because of its low resistance. On the other hand, copper is easily diffused; the diffusion of copper into a semiconductor layer, a gate insulating film, or the like of a transistor degrades the transistor characteristics in some cases. When tantalum nitride is included in the conductor 1416a and the conductor 1416b, the diffusion of copper included in the plug 1544b or the like into the oxide semiconductor layer can be suppressed in some cases.

The semiconductor device illustrated in FIG. 27C of one embodiment of the present invention preferably has a structure in which, in the case where an element and a compound that cause degradation of characteristics of a semiconductor element are included in the plug, the wiring, or the like, the diffusion of the element and the compound into the semiconductor element is suppressed.

The layer 1630 includes an insulator 1592, conductors such as a conductor 1514, and plugs such as a plug 1545. The plug 1545 and the like are connected to the conductors such as the conductor 1514.

The layer 1631 includes a capacitor 3400. The capacitor 3400 includes a conductor 1516, a conductor 1517, and an insulator 1572. The insulator 1572 includes a region positioned between the conductor 1516 and the conductor 1517.

The layer 1631 preferably includes an insulator 1594 and a plug 1547 over the conductor 1517. The plug 1547 is preferably formed to be embedded in the insulator 1594. The layer 1631 preferably includes a conductor 1516*b* connected to the plug included in the layer 1630 and a plug 1547*b* over the conductor 1516*b*.

The layer 1631 may include a wiring layer connected to the plug 1547 and the plug 1547*b*. In the example shown in FIG. 33, the wiring layer includes a conductor 1518 and the like connected to the plug 1547 and the plug 1547*b*, a plug 1548 over the conductor 1518, an insulator 1595, a conductor 1519 over the plug 1548, and an insulator 1599 over the conductor 1519. The plug 1548 is preferably formed to be embedded in the insulator 1595. The insulator 1599 includes an opening over the conductor 1519.

The structure described in this embodiment can be used in appropriate combination with any of the other structures described in the other embodiments.

Embodiment 5

In this embodiment, an example of an imaging device including the transistor or the like of one embodiment of the present invention is described.
<Imaging Device>
An imaging device of one embodiment of the present invention is described below.

Figure 35A:
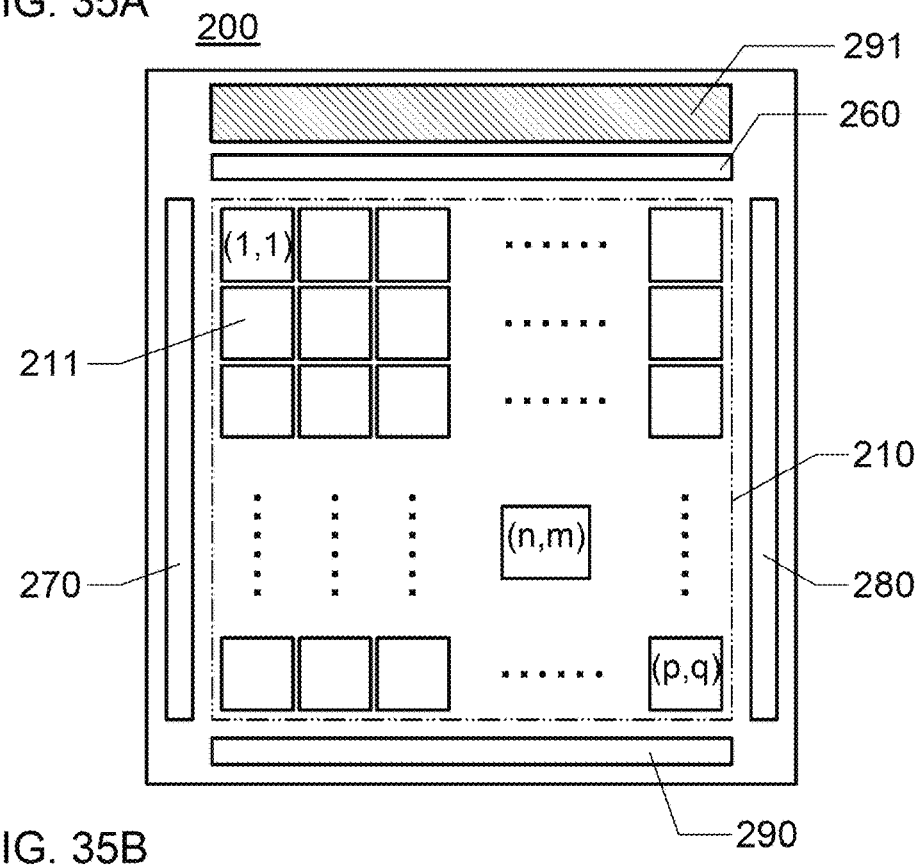
FIGS. 35A and 35B are top views each illustrating a semiconductor device of one embodiment of the present invention.

FIG. 35A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 35B:
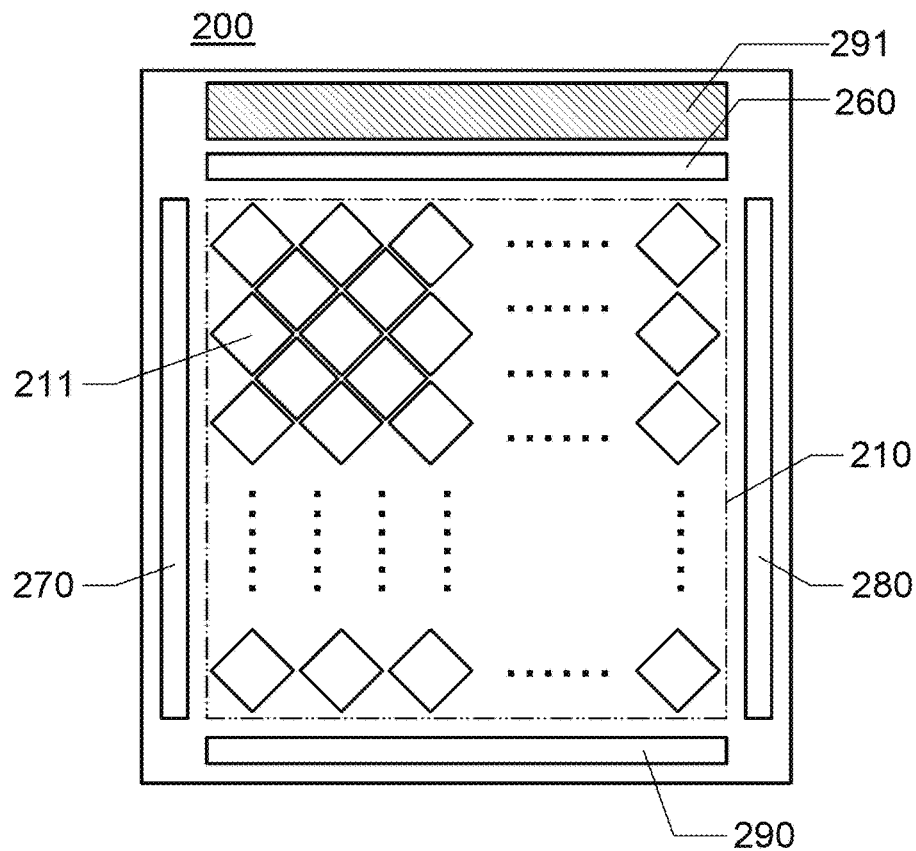

As illustrated in FIG. 35B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.
<Configuration Example 1 of Pixel>
The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 36A:
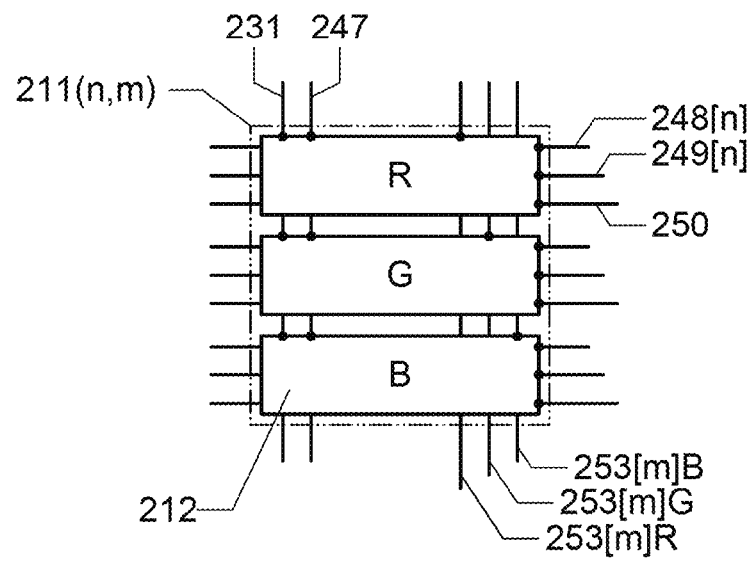
FIGS. 36A and 36B are block diagrams each illustrating a semiconductor device of one embodiment of the present invention.

FIG. 36A is a top view showing an example of the pixel 211 with which a color image is obtained. The pixel 211 illustrated in FIG. 36A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[*n*] and a wiring 249[*n*]. For example, the wiring 253 connected to the pixel 211 in the m-th column is referred to as a wiring 253[*m*]. Note that in FIG. 36A, the wirings 253 connected to the subpixel 212R, the subpixel 212G, and the subpixel 212B in the pixel 211 in the m-th column are referred to as a wiring 253[*m*]R, a wiring 253[*m*]G, and a wiring 253[*m*]B. The subpixels 212 are electrically connected to the peripheral circuit through the above wirings.

Figure 36B:
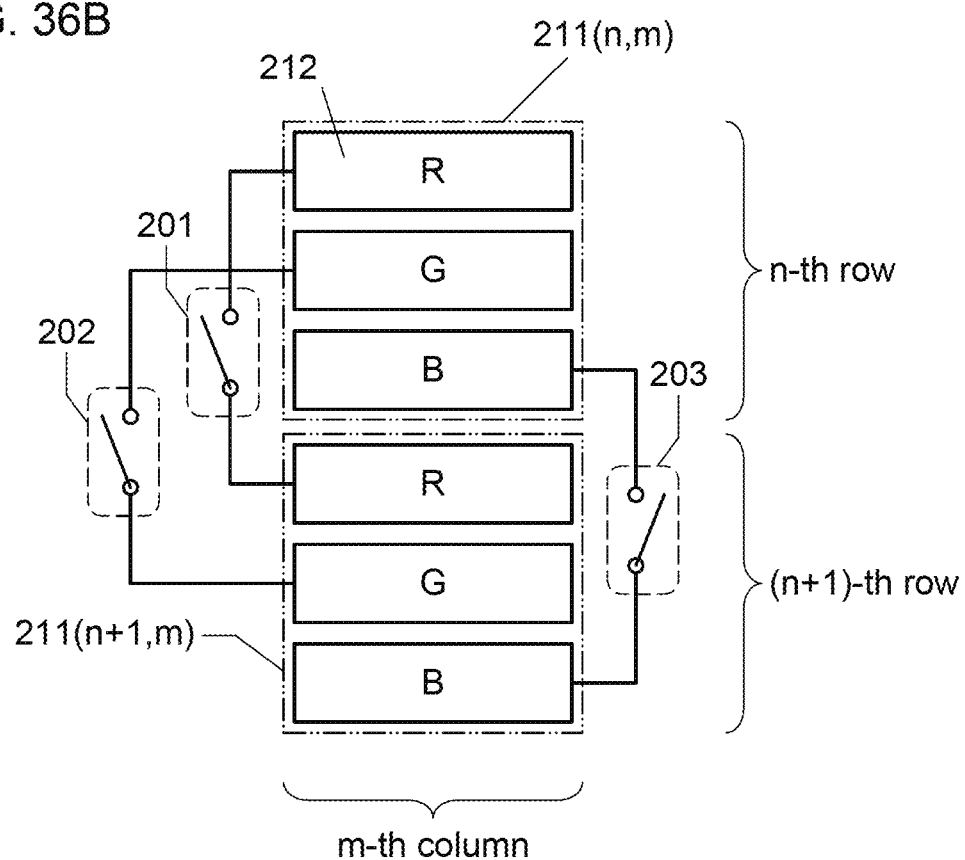

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 36B shows a connection example of the subpixels 212: the subpixel 212 in the pixel 211 arranged in the n-th (n is an integer greater than or equal to 1 and less than or equal to p) row and the m-th (in is an integer greater than or equal to 1 and less than or equal to q) column and the subpixel 212 in the adjacent pixel 211 arranged in an (n+1)-th row and the m-th column In FIG. 36B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 36A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 37A and 37B. With the lens 255, the photoelectric conversion element can receive incident light efficiently. Specifically, as illustrated in FIG. 37A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed lines, however, part of the light 256 indicated by arrows might be blocked by some wirings 257. Thus, a preferable structure is such that the lens 255 and the filter 254 are provided on the photoelectric conversion element 220 side as illustrated in FIG. 37B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 37A:
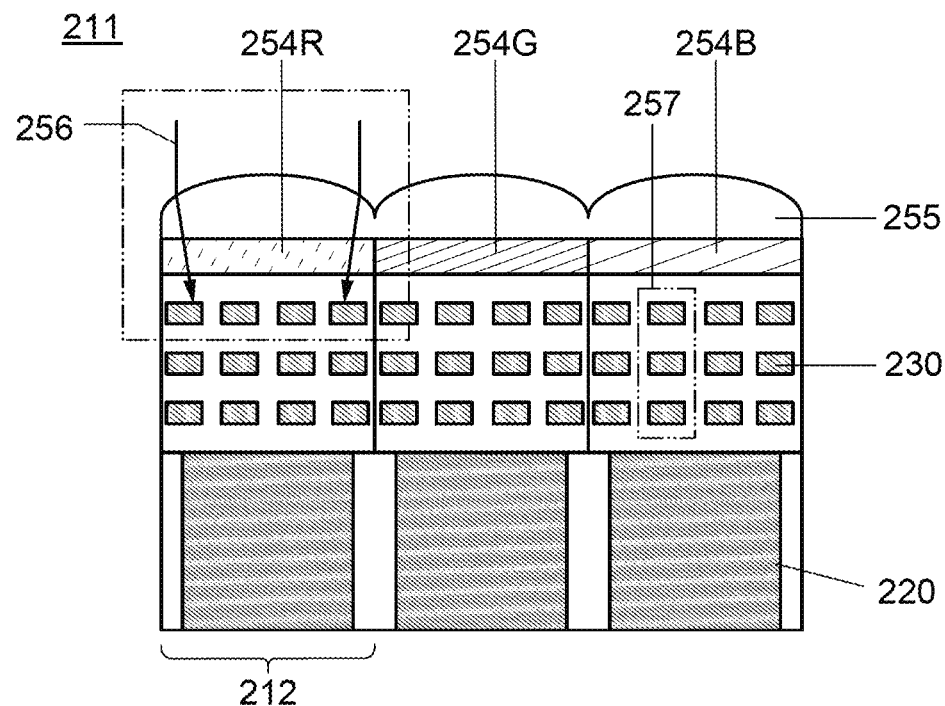
FIGS. 37A and 37B are cross-sectional views each illustrating a semiconductor device of one embodiment of the present invention.
Figure 37B:
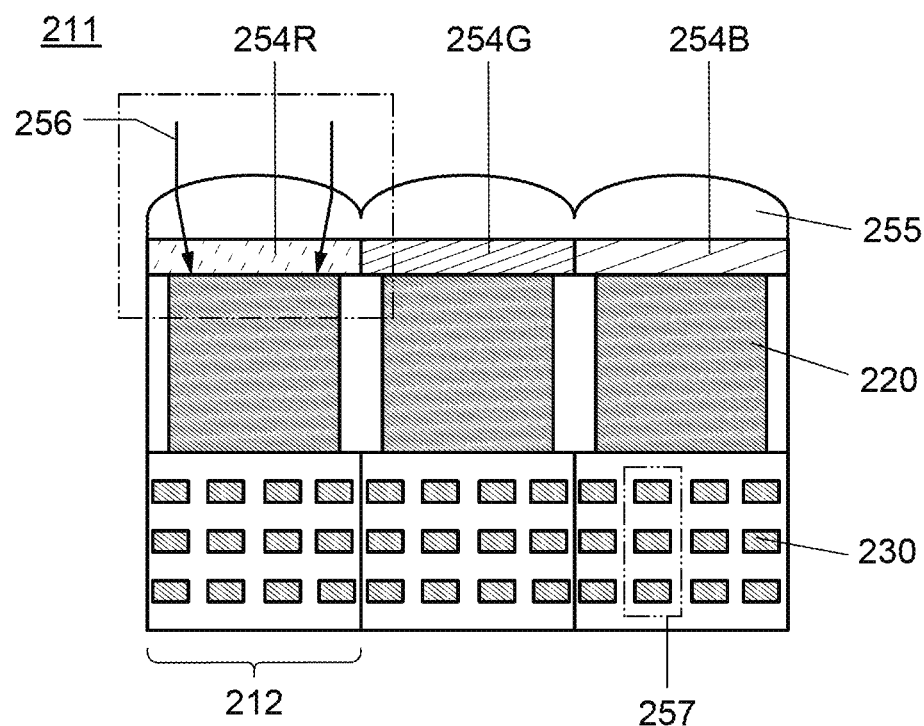

As the photoelectric conversion element 220 illustrated in FIGS. 37A and 37B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 36A and 36B.

<Configuration Example 2 of Pixel>

An example of a pixel including a transistor using silicon and a transistor using an oxide semiconductor is described below.

Figure 38A:
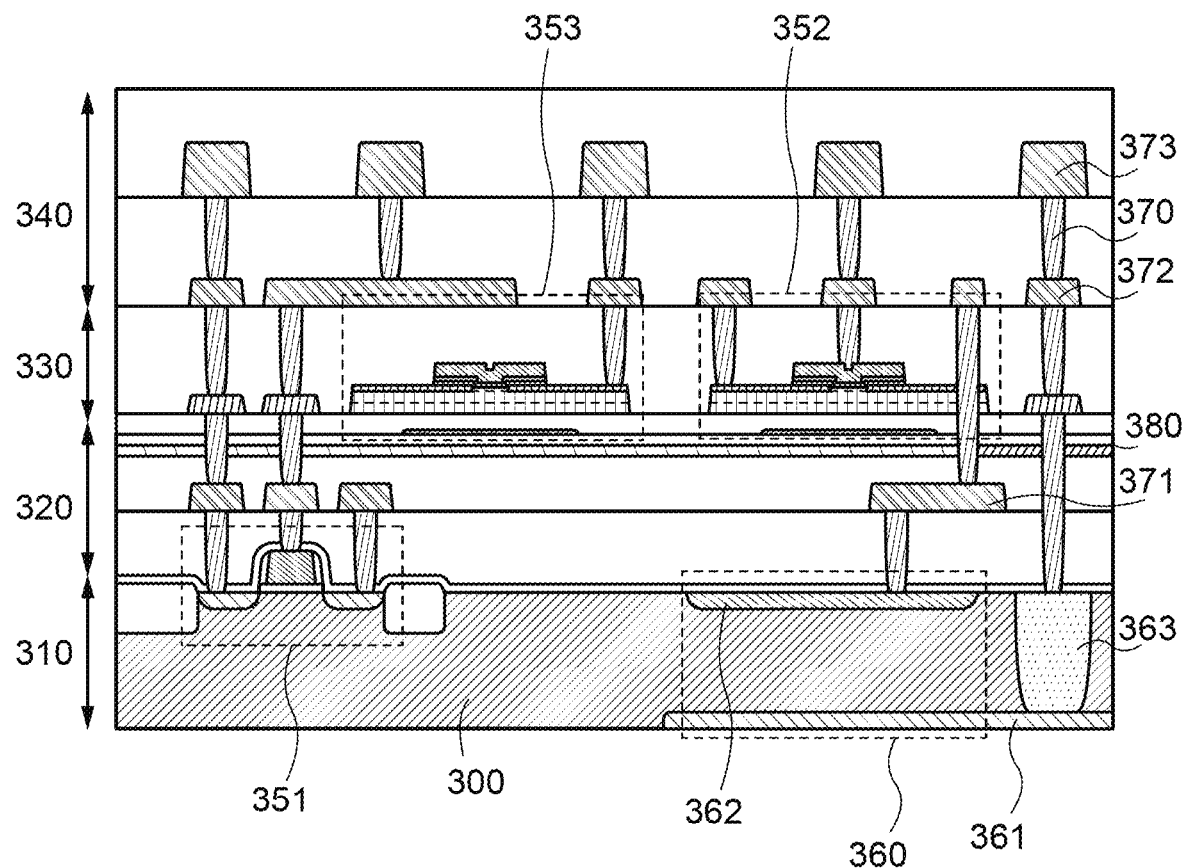
FIGS. 38A and 38B are cross-sectional views each illustrating a semiconductor device of one embodiment of the present invention.
Figure 38B:
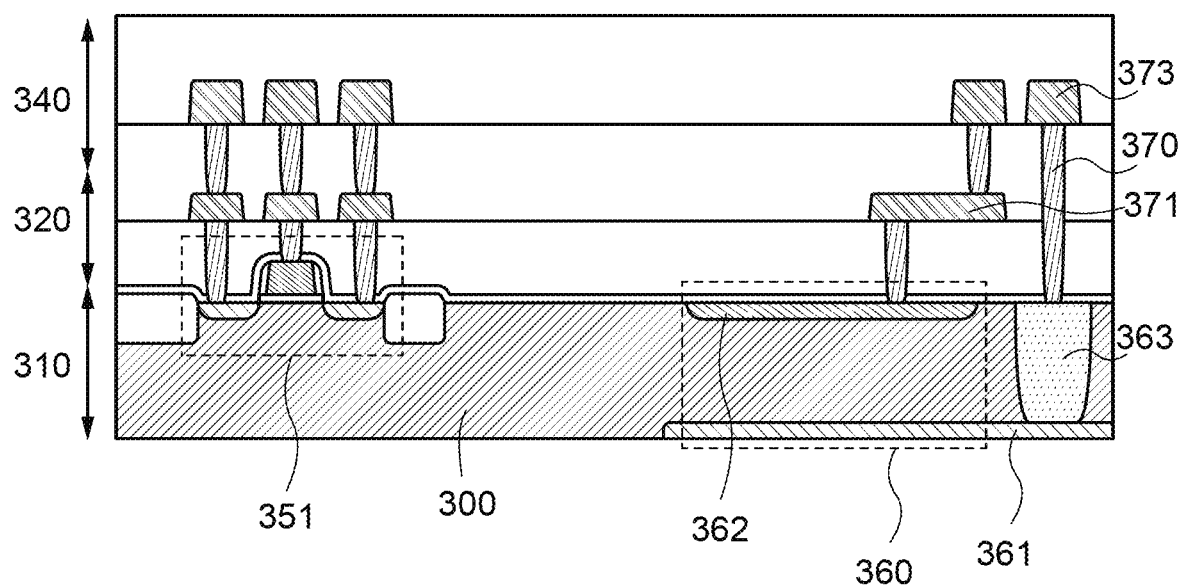

FIGS. 38A and 38B are each a cross-sectional view of an element included in an imaging device. The imaging device illustrated in FIG. 38A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 38A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 38B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example In the cross-sectional view in FIG. 38A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 39A1 and FIG. 39B1, part or the whole of the imaging device can be bent. FIG. 39A1 illustrates a state in which the imaging device is bent in the direction of a dashed-dotted line X1-X2. FIG. 39A2 is a cross-sectional view illustrating a portion indicated by the dashed-dotted line X1-X2 in FIG. 39A1. FIG. 39A3 is a cross-sectional view illustrating a portion indicated by a dashed-dotted line Y1-Y2 in FIG. 39A1.

FIG. 39B1 illustrates a state where the imaging device is bent in the direction of a dashed-dotted line X3-X4 and the direction of a dashed-dotted line Y3-Y4. FIG. 39B2 is a cross-sectional view illustrating a portion indicated by the dashed-dotted line X3-X4 in FIG. 39B1. FIG. 39B3 is a cross-sectional view illustrating a portion indicated by the dashed-dotted line Y3-Y4 in FIG. 39B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 6

In this embodiment, examples of CPUs including semiconductor devices such as the transistor of one embodiment of the present invention and the above-described memory device are described.

<Configuration of CPU>

Figure 40:
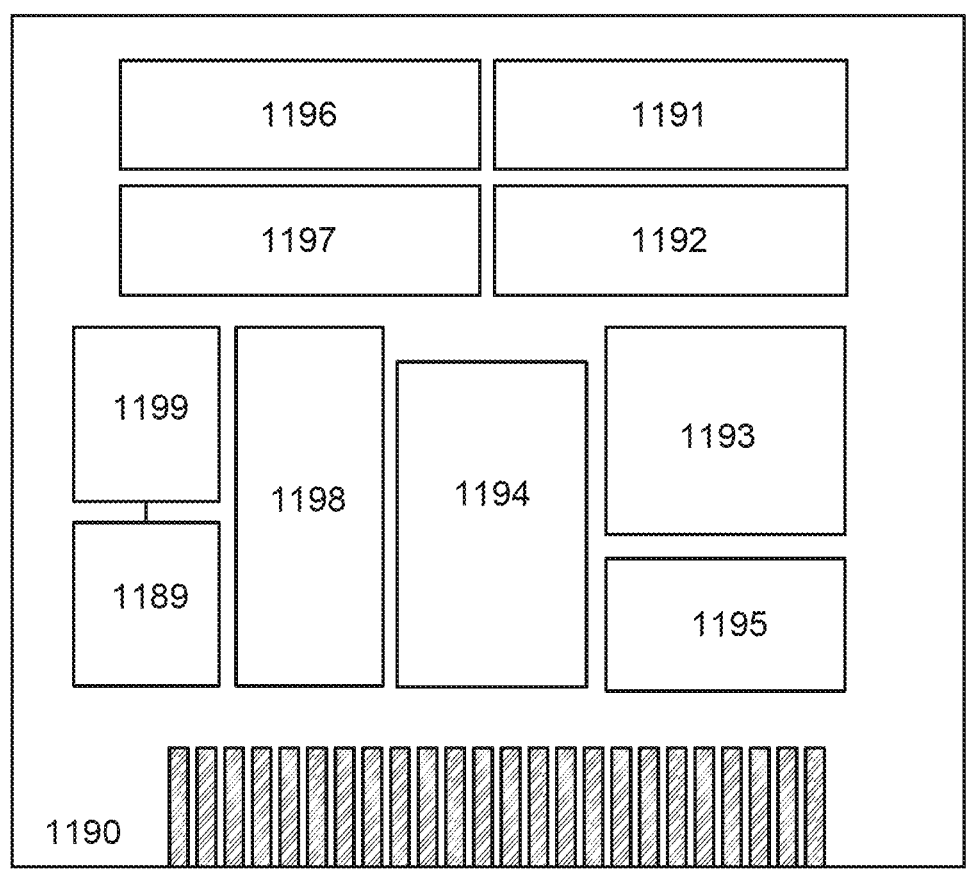
FIG. 40 is a block diagram illustrating a semiconductor device of one embodiment of the present invention.

FIG. 40 is a block diagram illustrating a configuration example of a CPU including any of the above-described transistors as a component.

The CPU illustrated in FIG. 40 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. is just an example in which the configuration has been simplified, and an actual CPU may have a variety of configurations depending on the application. For example, the CPU may have the following configuration: a structure including the CPU illustrated in FIG. 40 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 40, a memory cell is provided in the register 1196. For the memory cell of the register 1196, any of the above-described transistors, the above-described memory device, or the like can be used.

In the CPU illustrated in FIG. 40, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 41:
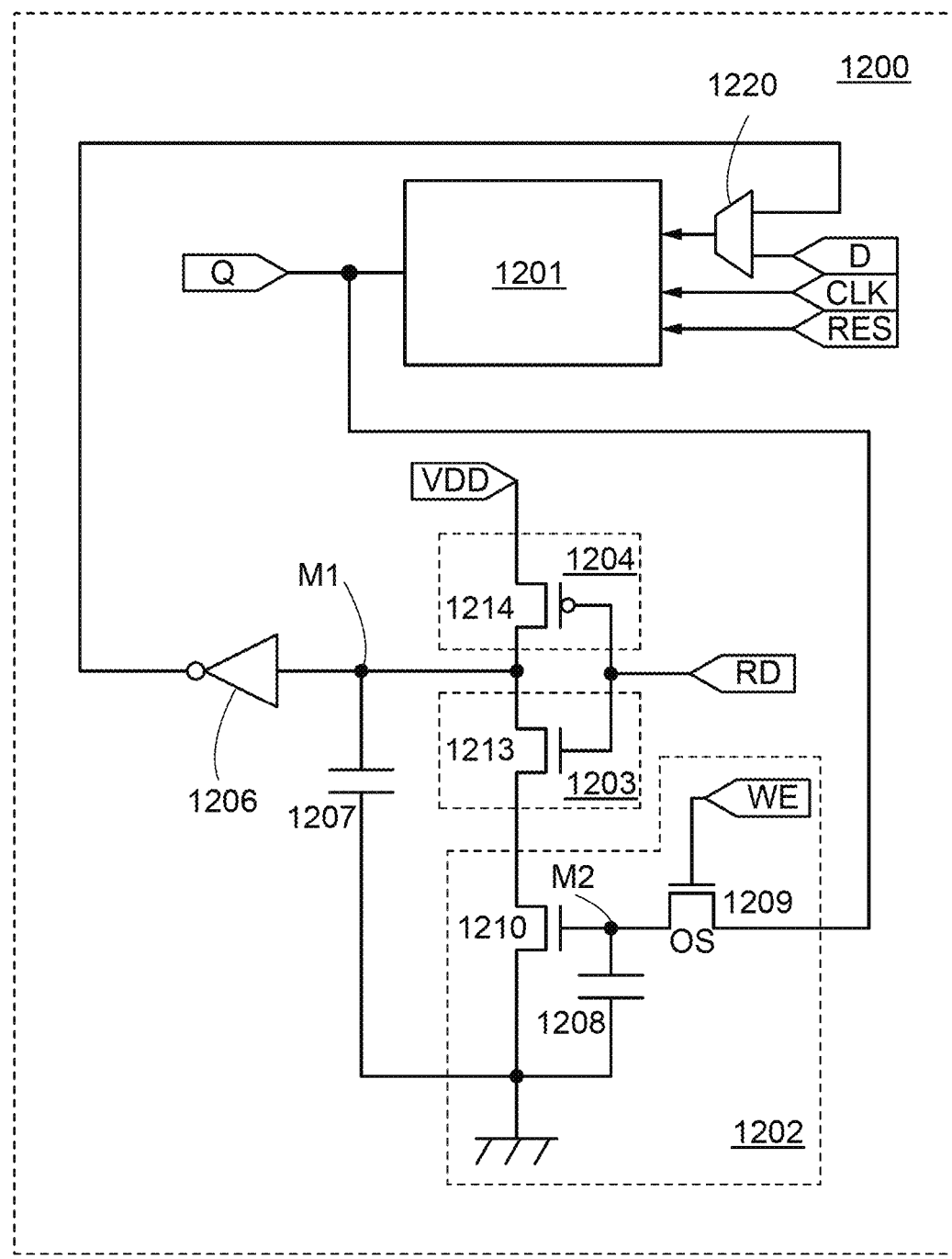
FIG. 41 is a circuit diagram of a semiconductor device of one embodiment of the present invention.

FIG. 41 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 41 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 41, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 41, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 41, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is brought into the on state or the off state depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD) and a radio frequency (RF) device.

The structures described in this embodiment can be used in appropriate combination with any of the structures described in the other embodiments.

Embodiment 7

In this embodiment, a display device including the transistor of one embodiment of the present invention and the like is described with reference to FIGS. 42A to 42C and FIGS. 43A and 43B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 42A:
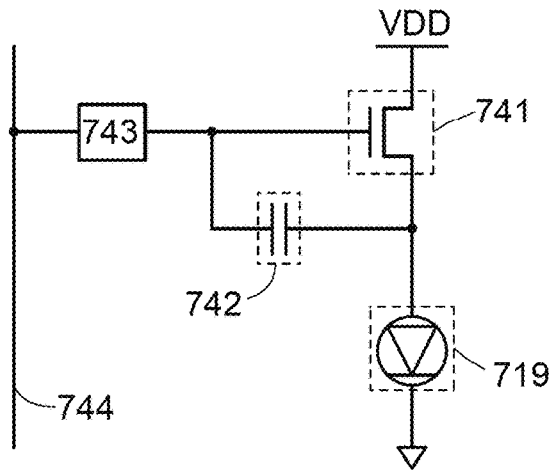
FIGS. 42A to 42C are a circuit diagram, a top view, and a cross-sectional view illustrating a semiconductor device of one embodiment of the present invention.
Figure 42B:
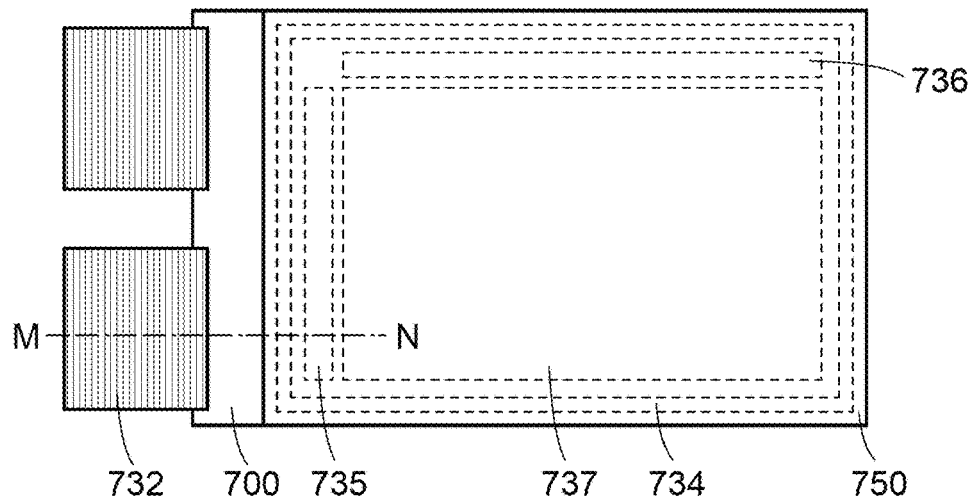
Figure 42C:
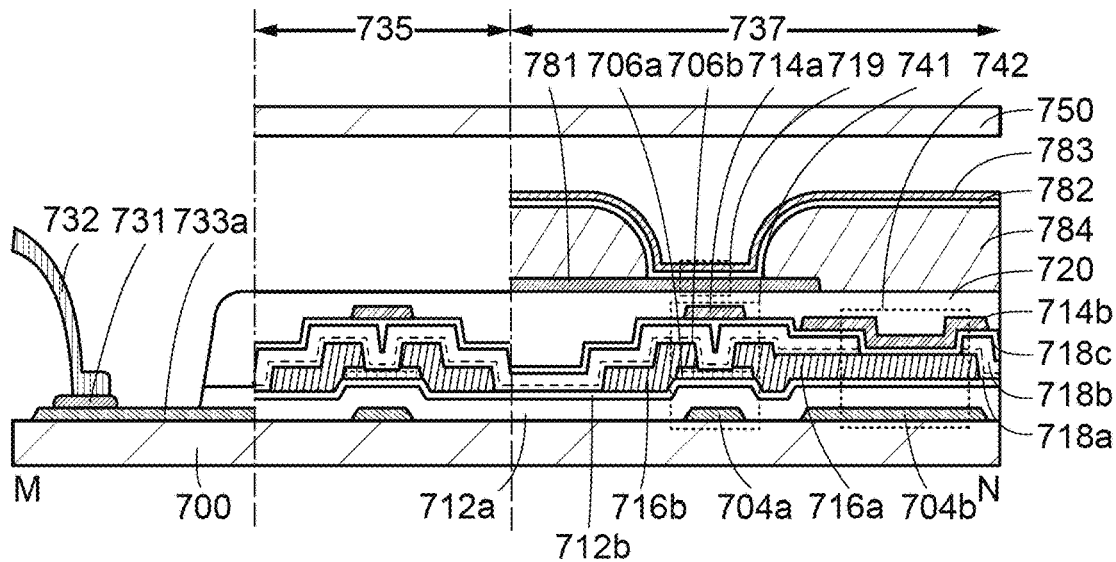

FIGS. 42A to 42C illustrate an example of an EL display device of one embodiment of the present invention. FIG. 42A is a circuit diagram of a pixel in an EL display device. FIG. 42B is a plan view showing the whole of the EL display device. FIG. 42C is a cross-sectional view taken along part of dashed-dotted line M-N in FIG. 42B.

FIG. 42A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 42A includes a switching element 743, a transistor 741, a capacitor 742, and a light-emitting element 719.

Note that FIG. 42A and the like each illustrate an example of a circuit structure; therefore, a transistor can be provided additionally. In contrast, for each node in FIG. 42A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 42B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 42C is a cross-sectional view of the EL display device taken along part of dashed-dotted line M-N in FIG. 42B.

FIG. 42C illustrates a structure of the transistor 741 including a conductor 704a over the substrate 700; an insulator 712a over the conductor 704a; an insulator 712b over the insulator 712a; semiconductors 706a and 706b that are over the insulator 712b and overlap with the conductor 704a; a conductor 716a and a conductor 716b in contact with the semiconductors 706a and 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps with the semiconductor 706b. Note that the structure of the transistor 741 is just an example; the transistor 741 may have a structure different from that illustrated in FIG. 42C.

Thus, in the transistor 741 illustrated in FIG. 42C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductors 706a and 706b change if light enters the semiconductors 706a and 706b. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 42C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other.

In the capacitor 742, each of the conductor 704b and the conductor 714b functions as one electrode, and the conductor 716a functions as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 42C has a large capacitance per area occupied by the capacitor. Therefore, the EL display device illustrated in FIG. 42C has high display quality. Note that although the capacitor 742 illustrated in FIG. 42C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 43A:
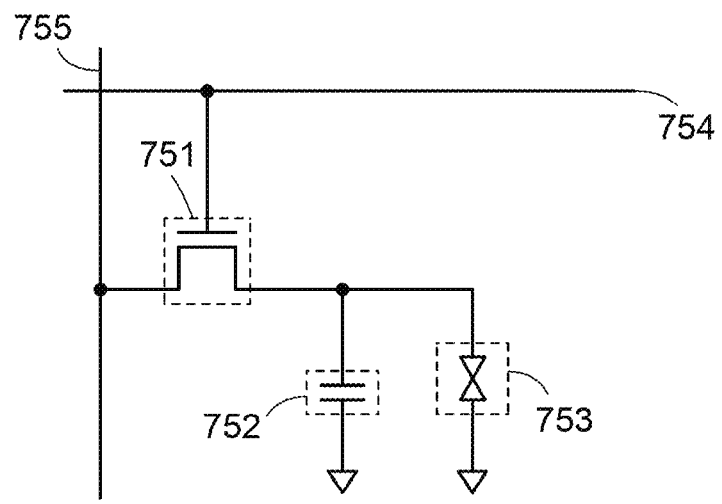
FIGS. 43A and 43B are a circuit diagram and a cross-sectional view illustrating a semiconductor device of one embodiment of the present invention.

FIG. 43A is a circuit diagram illustrating a configuration example of a pixel of a liquid crystal display device. A pixel shown in FIGS. 43A and 43B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 43B:
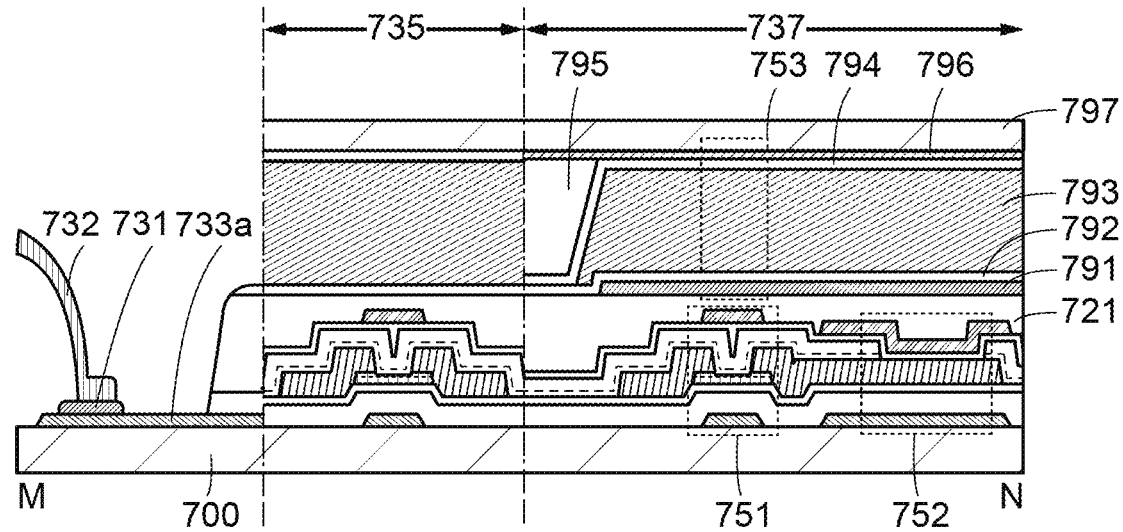

Note that the description of the liquid crystal display device is made on the assumption that the plan view of the liquid crystal display device is similar to that of the EL display device. FIG. 43B is a cross-sectional view of the liquid crystal display device taken along dashed-dotted line M-N in FIG. 42B. In FIG. 43B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 43B corresponds to, but is not limited to, the structure of the capacitor 742 in FIG. 42C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an MN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 8

In this embodiment, electronic devices each including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 44A to 44F illustrate specific examples of these electronic devices.

Figure 44A:
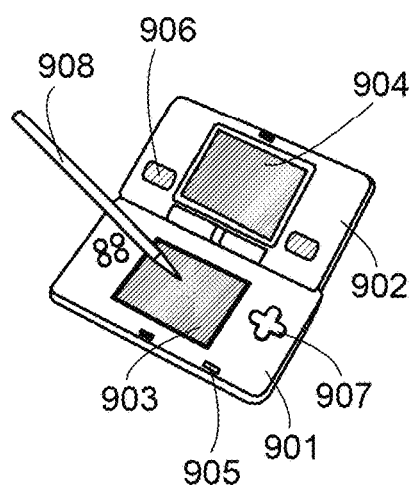
FIGS. 44A to 44F are perspective views each illustrating an electronic device of one embodiment of the present invention.

FIG. 44A illustrates a portable game console including a housing 901, a housing 902, a display portion 903, a display portion 904, a microphone 905, a speaker 906, an operation key 907, a stylus 908, and the like. Although the portable game console in FIG. 44A has the two display portions 903 and 904, the number of display portions included in a portable game console is not limited to this.

Figure 44B:
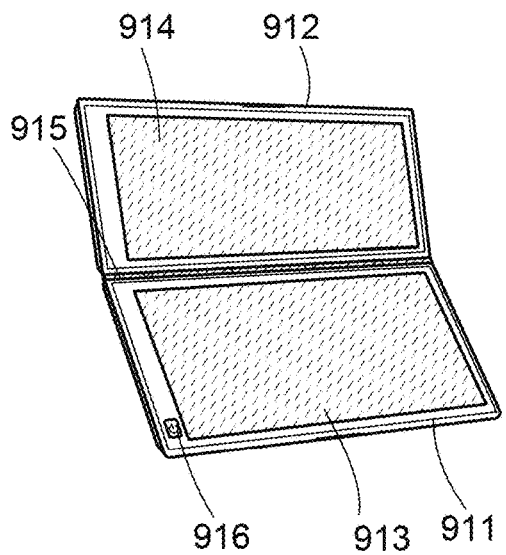

FIG. 44B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 44C:
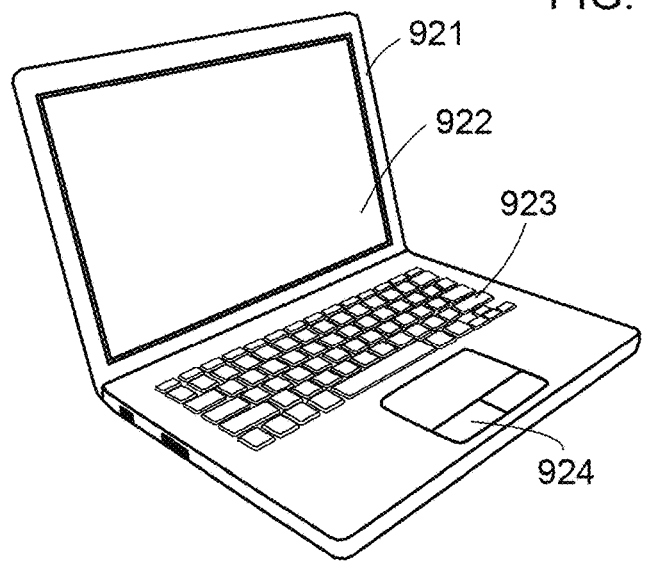

FIG. 44C illustrates a notebook personal computer, which includes a housing 921, a display portion 922, a keyboard 923, a pointing device 924, and the like.

Figure 44D:
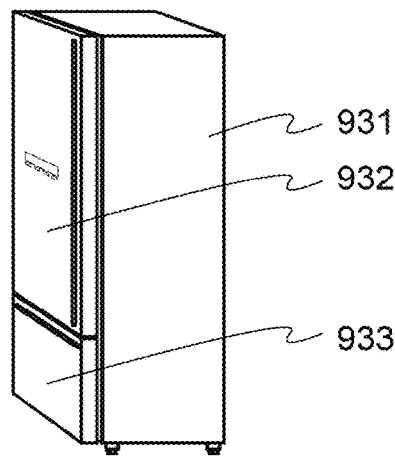

FIG. 44D illustrates an electric refrigerator-freezer, which includes a housing 931, a door for a refrigerator 932, a door for a freezer 933, and the like.

Figure 44E:
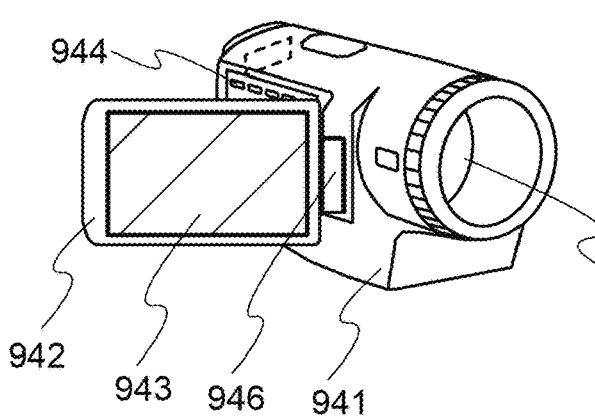

FIG. 44E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 44F:
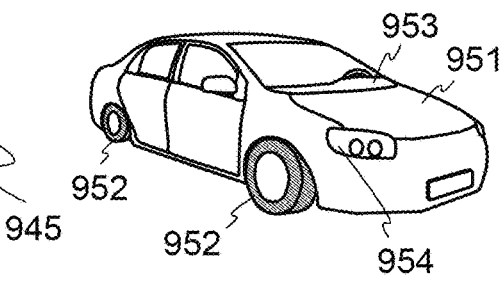

FIG. 44F illustrates a car including a car body 951, wheels 952, a dashboard 953, lights 954, and the like.

This embodiment of the present invention has been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

In this example, samples in each of which a silicon oxide film, a hafnium oxide film, and a silicon oxide film containing fluorine were stacked over a silicon substrate were formed and analyzed by TDS and ESR, and the analysis results will be described. For the TDS analysis, three samples 1A to 1C were formed. The substrate temperatures for forming the silicon oxide films containing fluorine of the samples 1A, 1B, and 1C were 350° C., 400° C., and 445° C., respectively. Furthermore, for the ESR analysis, samples 1A-1 to 1C-1 that correspond to the samples 1A to 1C not further subjected to heat treatment (i.e., the samples 1A-1 to 1C-1 are identical to the samples 1A to 1C); samples 1A-2 to 1C-2 that correspond to the samples 1A to 1C subjected to heat treatment at 410° C.; samples 1A-3 to 1C-3 that correspond to the samples 1A to 1C subjected to heat treatment at 490° C.; and samples 1A-4 to 1C-4 that correspond to the samples 1A to 1C subjected to heat treatment at 550° C. were formed.

A method for forming the samples used in the TDS analysis is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Next, a 20-nm-thick hafnium oxide film was formed over the silicon oxide film by an ALD method. In the film formation by an ALD method, the substrate temperature was 200° C., and a source gas obtained by vaporizing a solid containing tetrakis(dimethylamido)hafnium (TDMAH) and an $O_3$ gas) that was an oxidizer were used.

Then, a 30-nm-thick silicon oxide film containing fluorine was formed over the hafnium oxide film by a PECVD method. Before the deposition of the silicon oxide film containing fluorine, pretreatment for letting 200 sccm of $SiH_4$ flow for 20 seconds was performed. The deposition conditions were as follows: 1.5 sccm of $SiF_4$, 1000 sccm of $N_2O$, and 1000 sccm of Ar were used as deposition gases; RF power source frequency was 60 MHz; RF power was 800 W; and deposition pressure was 133 Pa. The substrate temperatures for the sample 1A, the sample 1B, and the sample 1C were 350° C., 400° C., and 445° C., respectively.

Figure 45A:
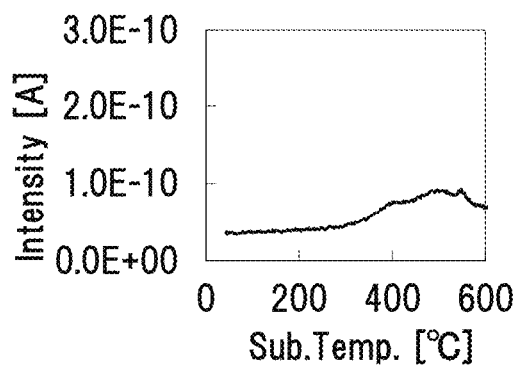
FIGS. 45A to 45D are graphs showing results of TDS analysis in Example.
Figure 45B:
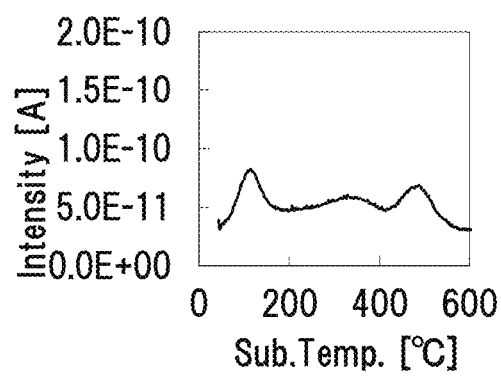
Figure 45C:
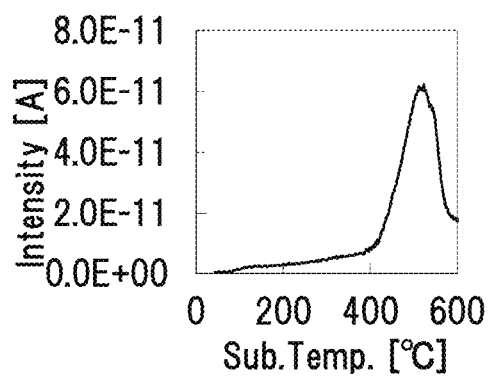
Figure 45D:
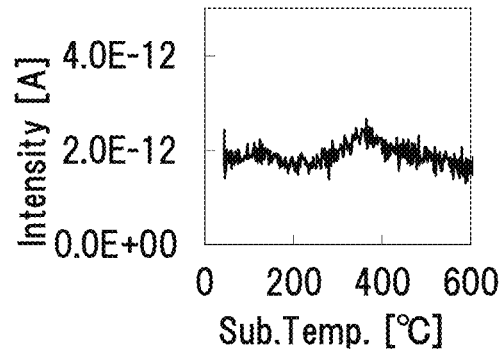
Figure 46A:
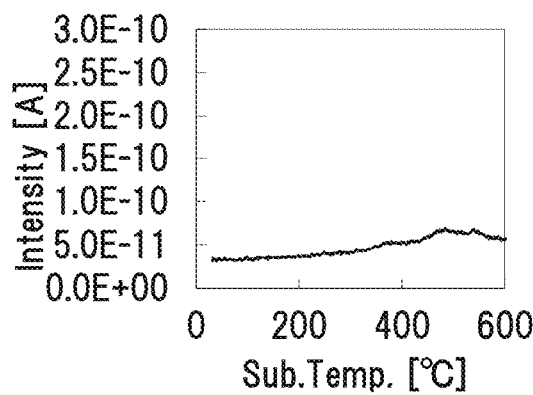
FIGS. 46A to 46D are graphs showing results of TDS analysis in Example.
Figure 46B:
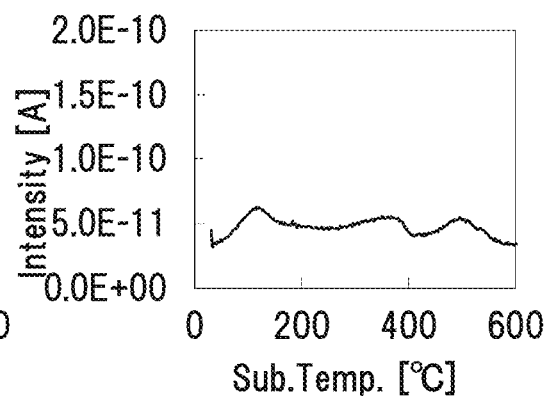
Figure 46C:
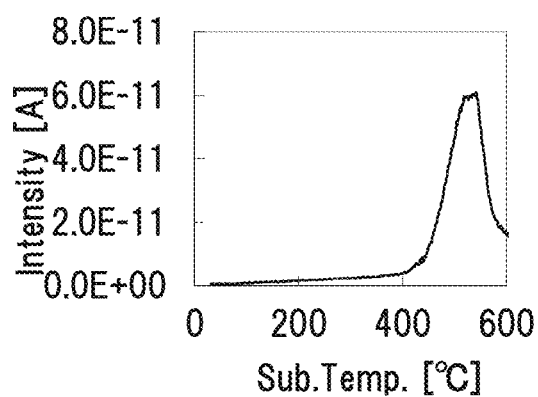
Figure 46D:
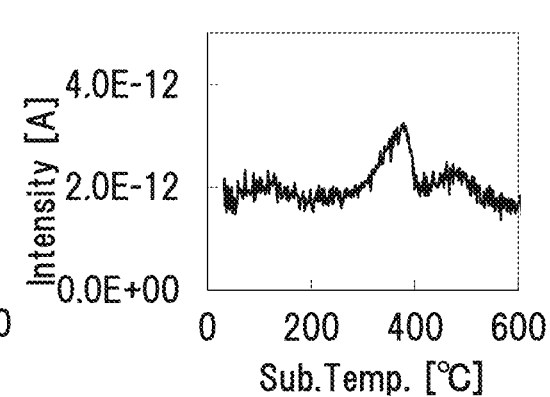
Figure 47A:
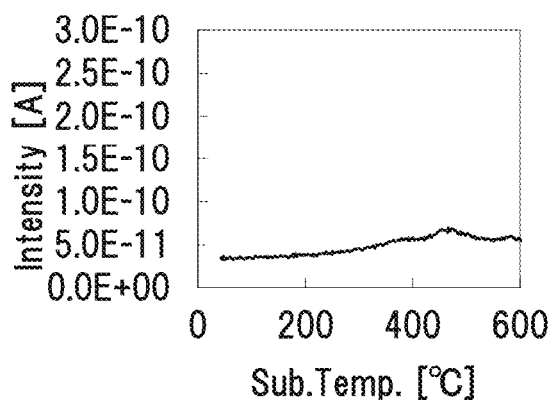
FIGS. 47A to 47D are graphs showing results of TDS analysis in Example.
Figure 47B:
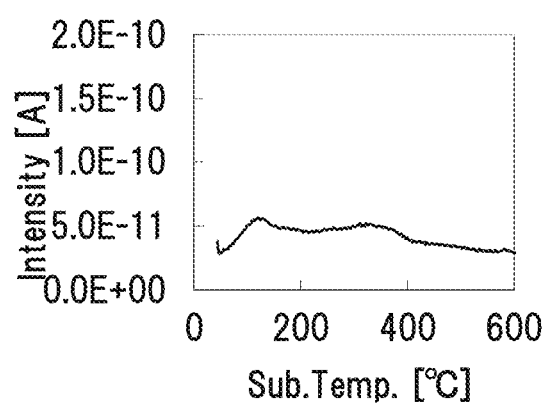
Figure 47C:
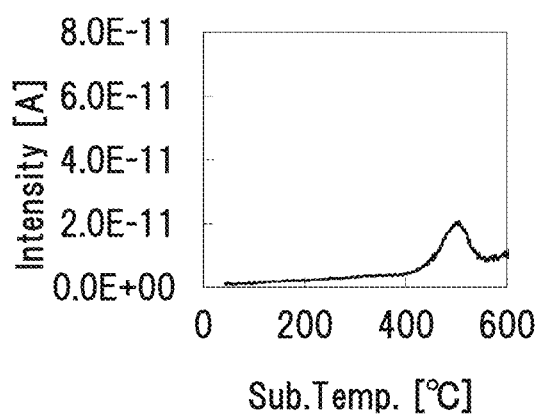
Figure 47D:
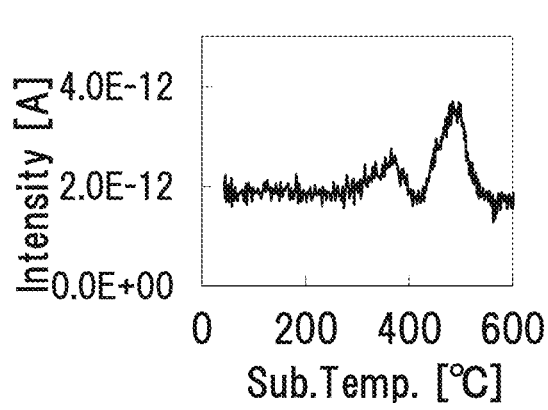

The samples 1A to 1C formed in the above manner were analyzed by TDS and the results are shown in FIGS. 45A to 45D, FIGS. 46A to 46D, and FIGS. 47A to 47D, respectively. Note that in the TDS analysis, the amounts of released gases with a mass-to-charge ratios m/z of 2, 18, 19, and 32 which correspond to a hydrogen molecule, a water molecule, a fluorine atom, and an oxygen molecule, respectively, were measured. FIG. 45A, FIG. 46A, and FIG. 47A show the measurement results of hydrogen; FIG. 45B, FIG. 46B, and FIG. 47B show those of water; FIG. 45C, FIG. 46C, and FIG. 47C show those of fluorine; and FIG. 45D, FIG. 46D, and FIG. 47D show those of oxygen. In each of FIGS. 45A to 45D, FIGS. 46A to 46D, and FIGS. 47A to 47D, the horizontal axis represents substrate heating temperature [° C.] and the vertical axis represents intensity proportional to the amount of a released gas with a mass-to-charge ratio.

The numbers of hydrogen molecules, water molecules, and oxygen molecules released from the samples 1A to 1C, which are calculated from the profiles shown in FIGS. 45A, 45B, and 45D, FIGS. 46A, 46B, and 46D, and FIGS. 47A, 47B, and 47D are shown in Table 1. Note that the numbers of released hydrogen molecules, released water molecules, and released oxygen molecules were calculated on the assumption that the background values of the TDS profiles were the minimum values. Table 1 also shows the number of molecules released from a reference sample 1 in which a silicon oxide film was formed by a PECVD method using $SiH_4$ at a substrate temperature of 400° C. instead of the silicon oxide film containing fluorine and the number of molecules released from a reference sample 2 in which a silicon oxide film was formed by a PECVD method using $SiH_4$ at a substrate temperature of 500° C. instead of the silicon oxide film containing fluorine.

TABLE 1

|  | Sample 1A | Sample 1B | Sample 1C | Reference sample 1 | Reference sample 2 |
|---|---|---|---|---|---|
| Hydrogen [molecule/cm$^2$] | 1.20E+15 | 8.58E+14 | 8.23E+14 | 1.18E+15 | 7.03E+14 |
| Water [molecule/cm$^2$] | 1.78E+15 | 1.23E+15 | 1.08E+15 | 1.42E+16 | 3.19E+15 |
| Oxygen [molecule/cm$^2$] | 8.33E+13 | 7.02E+13 | 8.72E+13 | 1.50E+14 | 5.41E+13 |

As shown in Table 1, the number of hydrogen molecules released from the sample 1A was 1.20×10$^{15}$ molecules/cm$^2$, and the number of water molecules released from the sample 1A was 1.78×10$^{15}$ molecules/cm$^2$. The number of hydrogen molecules released from the sample 1B was 8.58×10$^{14}$ molecules/cm$^2$, and the number of water molecules released from the sample 1B was 1.23×10$^{15}$ molecules/cm$^2$. The number of hydrogen molecules released from the sample 1C was 8.23×10$^{14}$ molecules/cm$^2$, and the number of water molecules released from the sample 1C was 1.08×10$^{15}$ molecules/cm$^2$.

From the reference sample 1 in which the silicon oxide film was formed at a substrate temperature of 400° C., the number of released hydrogen molecules was 1.18×10$^{15}$ molecules/cm$^2$ and the number of released water molecules was 1.42×10$^{16}$ molecules/cm$^2$. From the reference sample 2 in which the silicon oxide film was formed at a substrate temperature of 500° C., the number of released hydrogen molecules was 7.03×10$^{14}$ molecules/cm$^2$ and the number of released water molecules was 3.19×10$^{15}$ molecules/cm$^2$. Therefore, the numbers of hydrogen molecules and water molecules, particularly the number of water molecules, released from the reference sample 2 (substrate temperature: 500° C.) can be significantly reduced as compared with the reference sample 1 (substrate temperature: 400° C.).

Although the substrate temperatures for the samples 1A to 1C were from 350° C. to 445° C., the number of water molecules released from each of the samples 1A to 1C was smaller than that from the reference sample 2 for which the substrate temperature was 500° C. In particular, the number of water molecules released from each of the samples 1A to 1C was suppressed to be approximately smaller than or equal to a tenth of the number of water molecules released from the reference sample 1 (substrate temperature: 400° C.), which was a pronounced effect. The number of hydrogen molecules released from the sample 1A was substantially equal to that from the reference sample 1 (substrate temperature: 400° C.), and the number of hydrogen molecules released from each of the samples 1B and 1C was substantially equal to that from the reference sample 2 (substrate temperature: 500° C.). When the reference sample 1 and the reference sample 2 were compared, a difference in the number of released hydrogen molecules as large as a difference in the number of released water molecules was not found.

Although the samples 1A to 1C described in this example were formed under the relatively low temperature conditions (substrate temperature ranging from 350° C. to 445° C.), impurities such as water and hydrogen in the samples 1A to 1C were able to be reduced to the same level as in the reference sample 2 (substrate temperature: 500° C.).

In TDS analysis, the number of hydrogen molecules released from, for example, the stacked film of the insulator 105, the insulator 103, and the insulator 104 which is provided in contact with a bottom surface of the oxide semiconductor and which functions as the gate insulating film in the transistor described in the above embodiments is preferably less than or equal to 1.2×10$^{15}$ molecules/cm$^2$, and more preferably less than or equal to 9.0×10$^{14}$ molecules/cm$^2$. Similarly, in TDS analysis, the number of water molecules released from the stacked film is preferably less than or equal to 1.4×10$^{16}$ molecules/cm$^2$, more preferably less than or equal to 4.0×10$^{15}$ molecules/cm$^2$, and further more preferably less than or equal to 2.0×10$^{15}$ molecules/cm$^2$.

Note that the stacked film of the insulator 105, the insulator 103, and the insulator 104 is formed as each sample in this example; therefore, the number of water molecules and the number of hydrogen molecules released from each of the samples 1A to 1C correspond to the sum of the number of molecules released from the insulator 104 and the number of molecules that are released from the insulator 105 and the insulator 103 and then pass through the insulator 104. Accordingly, the number of water molecules and the number of hydrogen molecules released from only the insulator 104 are each presumably close to or smaller than the number of water molecules or the number of hydrogen molecules released from the stacked film in this example.

As described above, the stacked films of the samples 1A to 1C can be formed at relatively low substrate temperatures ranging from 350° C. to 445° C. by a PECVD method. Even in the stacked film, water, hydrogen, and the like can be sufficiently reduced as described above.

As shown in Table 1 and the like, release of oxygen molecules from the samples 1A to 1C was observed in TDS analysis. This means that by providing the stacked film of any of the samples 1A to 1C under the oxide semiconductor, oxygen can be supplied to the oxide semiconductor. This is probably because oxygen in the silicon oxide containing fluorine is replaced with fluorine by the heat treatment, so that the oxygen is released (SiO+F→SiF+O).

As shown in FIG. 45C, FIG. 46C, and FIG. 47C, release of fluorine from the stacked film of each of the samples 1A to 1C was observed in TDS analysis.

Next, a method for forming the samples used in the ESR analysis is described. First, the samples 1A-1 to 1A-4 with the same structure as the sample 1A were prepared. Similarly, the samples 1B-1 to 1B-4 with the same structure as the sample 1B were prepared. Moreover, the samples 1C-1 to 1C-4 with the same structure as the sample 1C were prepared.

Then, the samples 1A-2, 1B-2, and 1C-2 were subjected to heat treatment in an oxygen atmosphere at 410° C. for an hour. The samples 1A-3, 1B-3, and 1C-3 were subjected to heat treatment in an oxygen atmosphere at 490° C. for an hour. The samples 1A-4, 1B-4, and 1C-4 were subjected to heat treatment in an oxygen atmosphere at 550° C. for an hour. Note that the samples 1A-1, 1B-1, and 1C-1 were not subjected to heat treatment.

Figure 48:
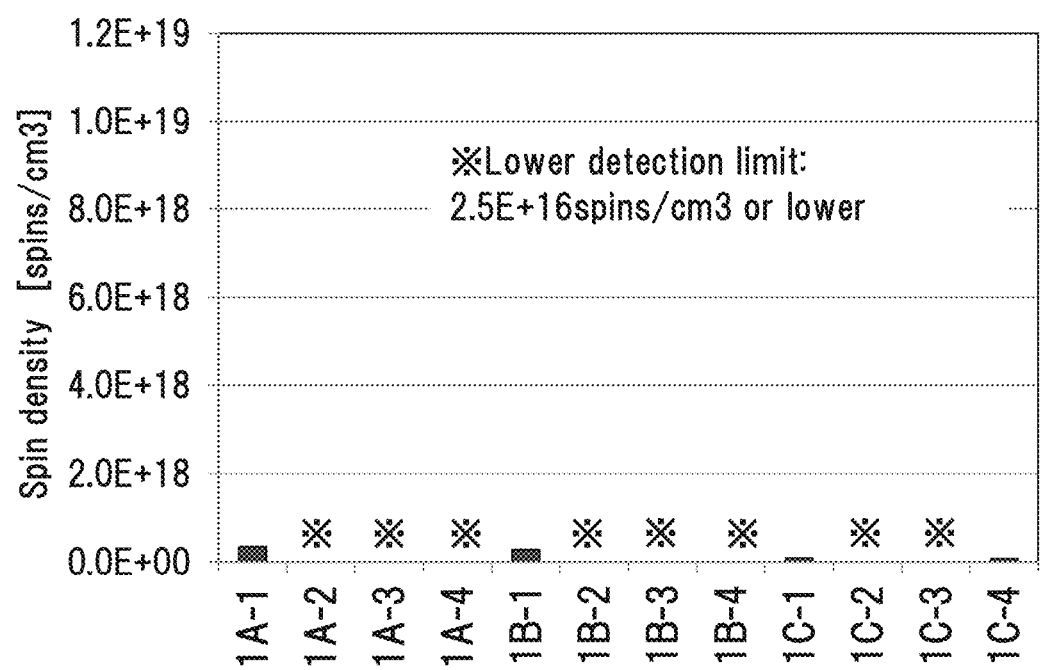
FIG. 48 is a graph showing results of ESR measurement in Example.

The samples formed in the above manner were analyzed by ESR and the results are shown in FIG. 48. The ESR analysis was performed under the following conditions: the measurement temperature was 10 K; the microwave power was 0.1 mW; and the frequency was 9.56 GHz.

In this example, whether the stacked films with the above structures contain NO$_2$ described in the above embodiment was examined by ESR analysis. The spin densities in oxide semiconductor films were evaluated by ESR. When silicon oxide contains NO$_2$, in an ESR spectrum at 100 K or lower, a first absorption line that appears at a g-factor of greater than or equal to 2.037 and less than or equal to 2.039, a second absorption line that appears at a g-factor of greater than or equal to 2.001 and less than or equal to 2.003, and a signal including a third absorption line that appears at a g-factor of greater than or equal to 1.964 and less than or equal to 1.966 are observed in some cases. The distance between the first and second absorption lines and the distance between the second and third absorption lines that are obtained by ESR measurement using an X-band are each approximately 5 mT. Therefore, silicon oxide containing a small amount of nitrogen oxide had a spin density derived from $N_{O2}$ of less than $1 \times 10^{18}$ spins/cm$^3$.

In FIG. 48, the horizontal axis represents the samples and the vertical axis represents the spin density [spins/cm$^3$] of signals corresponding to the first to third absorption lines.

As shown in FIG. 48, in every sample, the spin density of signals corresponding to the first to third absorption lines is significantly low, which implies that $NO_2$ hardly exist. Since the spin densities of the samples other than the samples 1A-1, 1B-1, 1C-1, and 1C-4 were lower than the lower limit of the detection, the heat treatment in an oxygen atmosphere seems to have a tendency to further reduce $NO_2$ in the stacked film.

The stacked film with the structure described in this example is used as, for example, the insulators 105, 103, and 104 of the transistor described in the above embodiment, in which case $NO_2$ in the insulators is reduced; therefore, the transistor can have stable electrical characteristics.

Example 2

In this example, a sample 2A was formed as a transistor of one embodiment of the present invention in such a manner that a stacked film that was in contact with the bottom surface of the oxide semiconductor and that functioned as the gate insulating film was formed and the content of hydrogen in the stacked film was reduced. As a comparative example, a sample 2B in which the content of hydrogen in the stacked film was not reduced was formed. The electrical characteristics and reliability of the transistors of the samples 2A and 2B were examined.

FIGS. 1A to 1D and other drawings can be referred to for the structure of the transistor, and FIGS. 13A to 13H, FIGS. 14A to 14F, and FIGS. 15A and 15B and other drawings can be referred to for the method for fabricating the transistor.

First, a silicon substrate in which a 100-nm-thick silicon oxide film, a 280-nm-thick silicon nitride oxide film, a 300-nm-thick silicon oxide film, and a 300-nm-thick silicon oxide film were stacked in this order was prepared as the substrate 100.

Next, a 150-nm-thick aluminum oxide film was formed as the insulator 101 by a sputtering method.

Next, a 150-nm-thick tungsten film was formed by a sputtering method. A resist was formed over the tungsten film and processing was performed using the resist, whereby the conductor 102 was formed.

Then, a 10-nm-thick silicon oxide film was formed as the insulator 105 by a PECVD method.

Next, a 20-nm-thick hafnium oxide film was formed as the insulator 103 by an ALD method. In the film formation by an ALD method, the substrate temperature was 200° C., and a gas obtained by vaporizing a solid containing tetrakis (dimethylamido)hafnium (TDMAH) was used as a source gas and an $O_3$ gas) was used as an oxidizer.

Then, a 30-nm-thick silicon oxide film was formed as the insulator 104 by a PECVD method. As the insulator 104 of the sample 2A, a silicon oxide film containing fluorine was formed with the use of $SiF_4$ as a deposition gas. As the insulator 104 of the sample 2B, a silicon oxide film was formed with the use of $SiH_4$ as a deposition gas.

For the sample 2A, before the deposition of the silicon oxide film containing fluorine, pretreatment for letting $SiH_4$ flow at 200 sccm for 20 seconds was performed. The deposition conditions for the insulator 104 of the sample 2A were as follows: 1.5 sccm of $SiF_4$, 1000 sccm of $N_2O$, and 1000 sccm of Ar were used as deposition gases; RF power source frequency was 60 MHz; RF power was 800 W; deposition pressure was 133 Pa; and the substrate temperature was 400° C.

The deposition conditions for the insulator 104 of the sample 2B were as follows: 1 sccm of $SiH_4$ and 800 sccm of $N_2O$ were used as deposition gases; RF power source frequency was 60 MHz; RF power was 150 W; deposition pressure was 40 Pa; and the substrate temperature was 400° C.

Next, heat treatment was performed at 410° C. in an oxygen atmosphere for an hour.

Next, a 40-nm-thick In—Ga—Zn oxide film was formed by a DC sputtering method to form an oxide to be the insulator 106a using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm Next, a 20-nm-thick In—Ga—Zn oxide film was formed by a DC sputtering method to form an oxide to be the semiconductor 106b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, heat treatment was performed at 400° C. under a nitrogen atmosphere for an hour. In addition, heat treatment was performed at 400° C. under an oxygen atmosphere for an hour.

Then, a 50-nm-thick tungsten film was formed by a DC sputtering method as a conductor to be the conductors 108a and 108b.

A resist was then formed over the conductor and processing was performed using the resist, whereby the conductors 108a and 108b were formed.

Next, the above oxide was processed using the resist and the conductors 108a and 108b to form the insulator 106a and the semiconductor 106b.

Next, a 5-nm-thick In—Ga—Zn oxide film was formed by a DC sputtering method to form an oxide to be the insulator 106c using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

A 13-nm-thick silicon oxynitride film was formed as an oxynitride to be the insulator 112 by a PECVD method.

Then, as a conductor to be the conductor 114, a 30-nm-thick titanium nitride film and a 135-nm-thick tungsten film were formed in this order by a DC sputtering method. A resist was then formed over the conductor and processing was performed using the resist, whereby the conductor 114 was formed.

Next, the above oxide and oxynitride were processed using the resist into the insulator 106c and the insulator 112.

After that, a 140-nm-thick aluminum oxide film was formed by an RF sputtering method as the insulator 116, using 25 sccm of an argon gas and 25 sccm of an oxygen gas as deposition gases. A deposition pressure was 0.4 Pa. A deposition power was 2500 W. A substrate temperature was 250° C. A distance between the target and the substrate was 60 mm.

Next, heat treatment was performed at 400° C. in an oxygen atmosphere for an hour.

Then, a 300-nm-thick silicon oxynitride film was formed by a PECVD method.

Next, a 50-nm-thick titanium film, a 200-nm-thick aluminum film, and a 50-nm-thick titanium film were formed in this order by a DC sputtering method. The films were processed using a resist to form the conductor 120a and the conductor 120b.

In this manner, the transistor having a channel length L of 0.18 μm and a channel width W of 0.27 μm was fabricated.

The $I_d$-$V_g$ characteristics (drain current-gate voltage characteristics) of the samples 2A and 2B were measured. The measurement of the $I_d$-$V_g$ characteristics was performed at a back gate voltage of 0 V. Other measurement conditions were as follows: the drain voltage was 0.1 V or 1.8 V, and the gate voltage was swept from −3.0 V to 3.0 V in increments of 0.1 V.

Figure 49A:
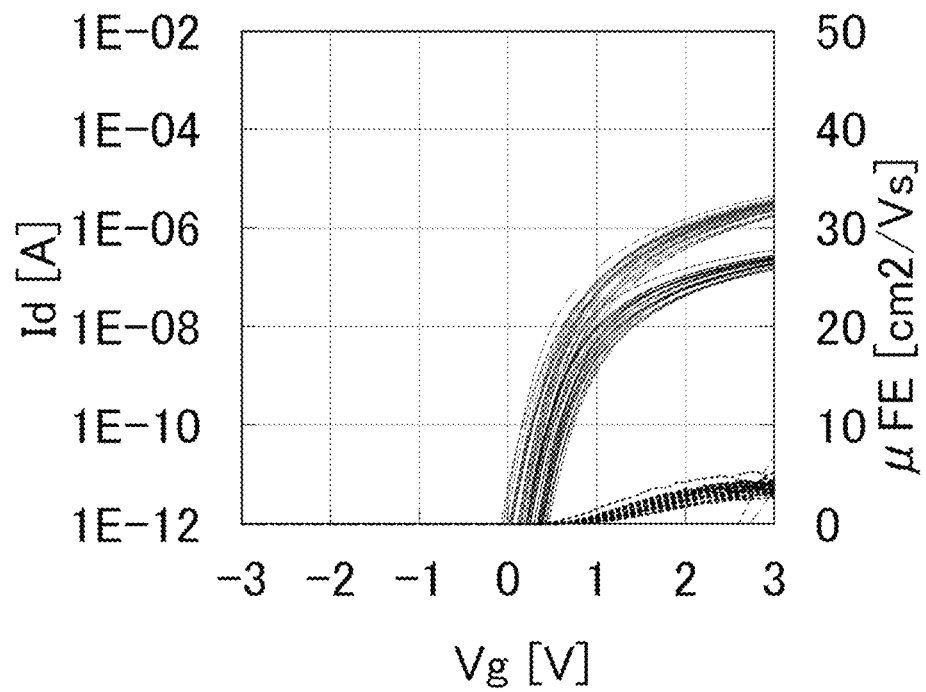
FIGS. 49A and 49B are graphs showing $I_d$-$V_g$ characteristics measured in Example.
Figure 49B:
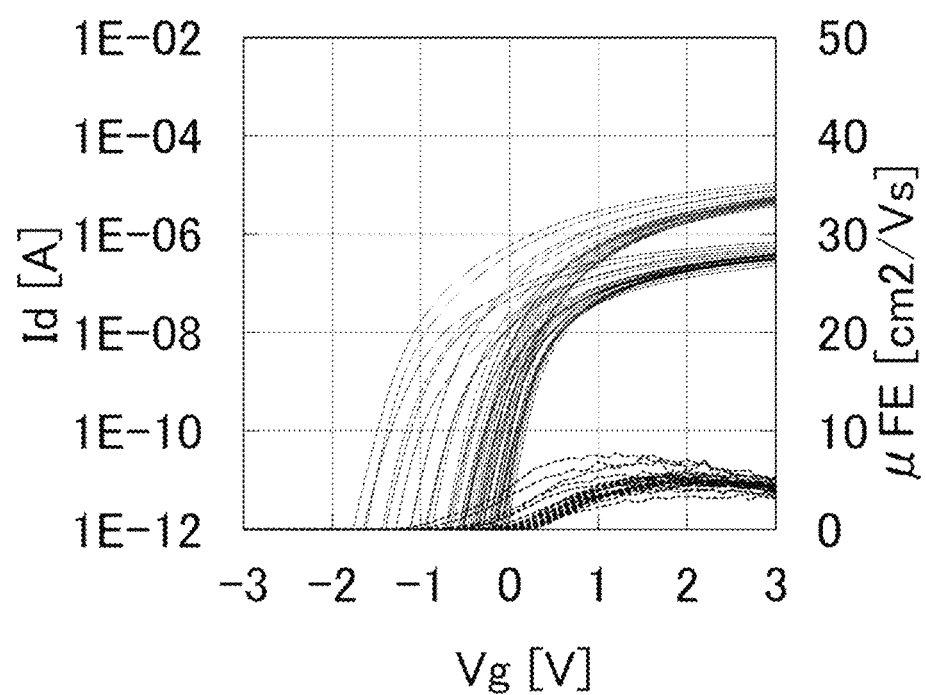

FIGS. 49A and 49B show $I_d$-$V_g$ characteristics of the samples 2A and 2B. In each of FIGS. 49A and 49B, the horizontal axis represents gate voltage $V_g$ [V], the left vertical axis represents drain current $I_d$ [A], and the right vertical axis represents field-effect mobility μFE [cm²/Vs]. In each of FIGS. 49A and 49B, a solid line denotes drain current and a dashed line denotes field-effect mobility.

As shown in FIG. 49B, the sample 2B in which the insulator 104 was formed using $SiH_4$ and a large number of water molecules and hydrogen molecules were contained in the film exhibits variations in transistor characteristics and the gate voltages at the rising of drain current shifted, as a whole, in a negative direction. In contrast, the sample 2A in which the insulator 104 was formed using $SiF_4$ and the number of water molecules and hydrogen molecules in the film was reduced exhibits favorable electrical characteristics as shown in FIG. 49A. In the sample 2A, when the back-gate voltage was 0 V and the drain voltage $V_d$ was 0.1 V, both the field-effect mobility and the subthreshold swing value (S value) were favorable, which were 3.5 cm²/Vs and 124.2 mV/dec, respectively.

Then, the threshold voltage $V_{th}$ and Shift of the transistor of the sample 2A were calculated.

The threshold voltage and Shift in this specification are described. The threshold voltage is defined as, in the $V_g$-$I_d$ curve where the horizontal axis represents gate voltage $V_g$ [V] and the vertical axis represents the square root of drain current $I_d^{1/2}$ [A], a gate voltage at the intersection point of the line of $I_d^{1/2}=0$ ($V_g$ axis) and the tangent to the curve at a point where the slope of the curve is the steepest. Note that here, the threshold voltage is calculated with a drain voltage $V_d$ of 1.8 V.

Note that the gate voltage at the rising of drain current in $I_d$-$V_g$ characteristics is referred to as Shift. Furthermore, Shift in this specification is defined as, in the $V_g$-$I_d$ curve where the horizontal axis represents the gate voltage $V_g$ [V] and the vertical axis represents the logarithm of the drain current $I_d$ [A], a gate voltage at the intersection point of the line of $I_d=1.0\times10^{-12}$ [A] and the tangent to the curve at a point where the slope of the curve is the steepest. Note that here, Shift is calculated with a drain voltage $V_d$ of 1.8 V.

In the sample 2A, when the back gate voltage was 0 V, the threshold voltage and Shift of the transistor were 1.13 V and 0.17 V, respectively, which means that the transistor had normally-off electrical characteristics even when the back gate voltage was 0 V.

Here, the stacked film of the insulators 105, 103, and 104 in the sample 2A corresponds to that in the sample 1A in Example 1; and the stacked film of the insulators 105, 103, and 104 in the sample 2B corresponds to that in the reference sample 1 in Example 1. By setting the number of water molecules or hydrogen molecules (particularly water molecules) released from the stacked film of the insulators 105, 103, and 104 within the range described in Example 1, favorable transistor characteristics were able to be obtained. Moreover, although the heating temperature in the process of forming the transistor was approximately 400° C., favorable transistor characteristics were able to be obtained.

The above results indicate that formation of the insulator 104 in contact with the bottom surface of the oxide semiconductor by a PECVD method using $SiF_4$ in order to make the amount of water, hydrogen, and the like in the insulator 104 small can reduce defect states formed by supply of water, hydrogen, and the like from the insulator 104 to the semiconductor 106b or the like. The use of such an oxide semiconductor with a reduced density of defect states makes it possible to provide a transistor with stable electrical characteristics.

Next, samples 2A-1 to 2A-3, each of which has the same structure as the sample 2A, were formed by varying the temperature of the heat treatment after the formation of the insulator 104 and the temperature of the heat treatment after the formation of the oxide film to be the semiconductor 106b. Variations in Shift were measured at 25 points on a substrate surface of each sample. The temperature of the heat treatment after the formation of the insulator 104 was 550° C. for the sample 2A-1, 490° C. for the sample 2A-2, and 410° C. for the sample 2A-3. The temperature of the heat treatment after the formation of the oxide film to be the semiconductor 106b was 550° C. for the sample 2A-1, 450° C. for the sample 2A-2, and 400° C. for the sample 2A-3. That is, the heat treatment conditions of the sample 2A-3 were the same as those of the sample 2A.

Figure 50:
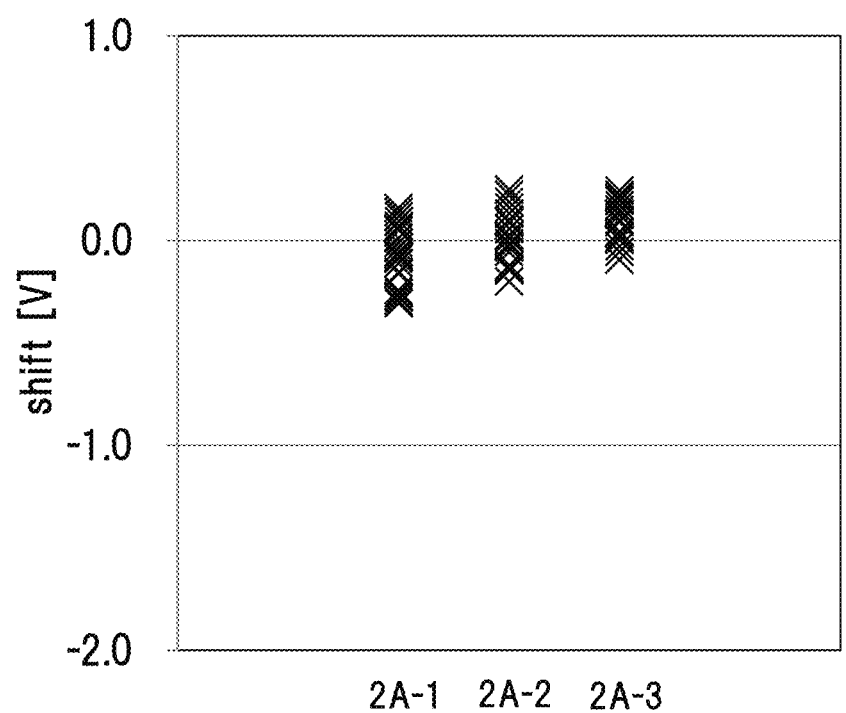
FIG. 50 is a graph showing variations in Shift measured in Example.

The measurement results are shown in FIG. 50. In FIG. 50, the horizontal axis represents the samples 2A-1 to 2A-3 and the vertical axis represents Shift [V].

As shown in FIG. 50, variations in Shift in the substrate surface of each of the samples 2A-1 to 2A-3 were small. In particular, the variations in Shift of the sample 2A-3 subjected to heat treatment at a relatively low temperature like the sample 2A, were similar to the variations in Shift of each of the samples 2A-1 and 2A-2 whose heat treatment temperature was high.

Next, a change in electrical characteristics of the sample 2A by stress tests was measured.

Figure 51A:
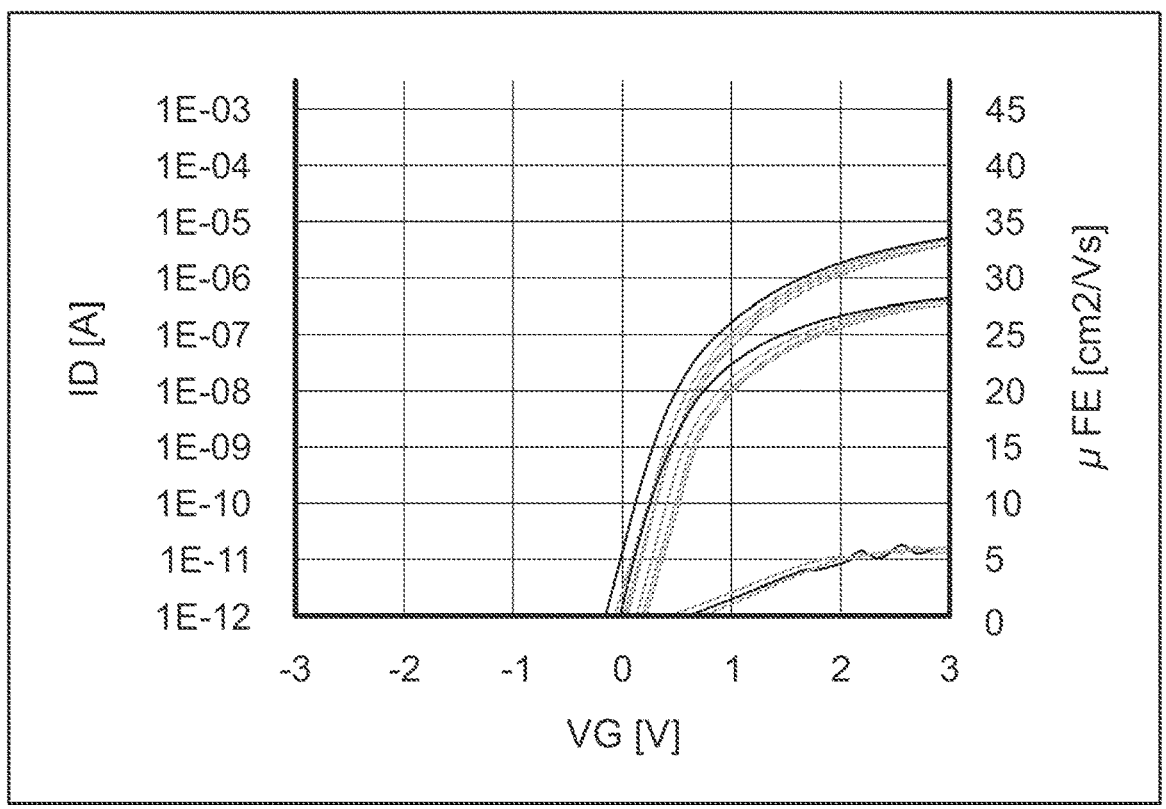
FIGS. 51A to 51D are graphs showing results of stress tests in Example.

FIG. 51A shows results of a positive gate BT (Bias-Temperature) stress test. Note that the stress test described below was performed at a substrate temperature of 150° C. In the positive gate BT stress test, first, $I_d$-$V_g$ characteristics before the stress test were measured. In the measurement, the back gate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the back gate voltage was 0 V, and a gate voltage of 3.3 V was applied for 1 hour. Note that measurement was performed 100 seconds, 300 seconds, 600 seconds, 1000 seconds, 30 minutes, and 1 hour after stress application, and the value after 1 hour after the stress application is described below. As shown in FIG. 51A, a change in Shift (ΔShift) before and after the positive gate BT stress test for 1 hour was as small as 0.19 V.

Figure 78A:
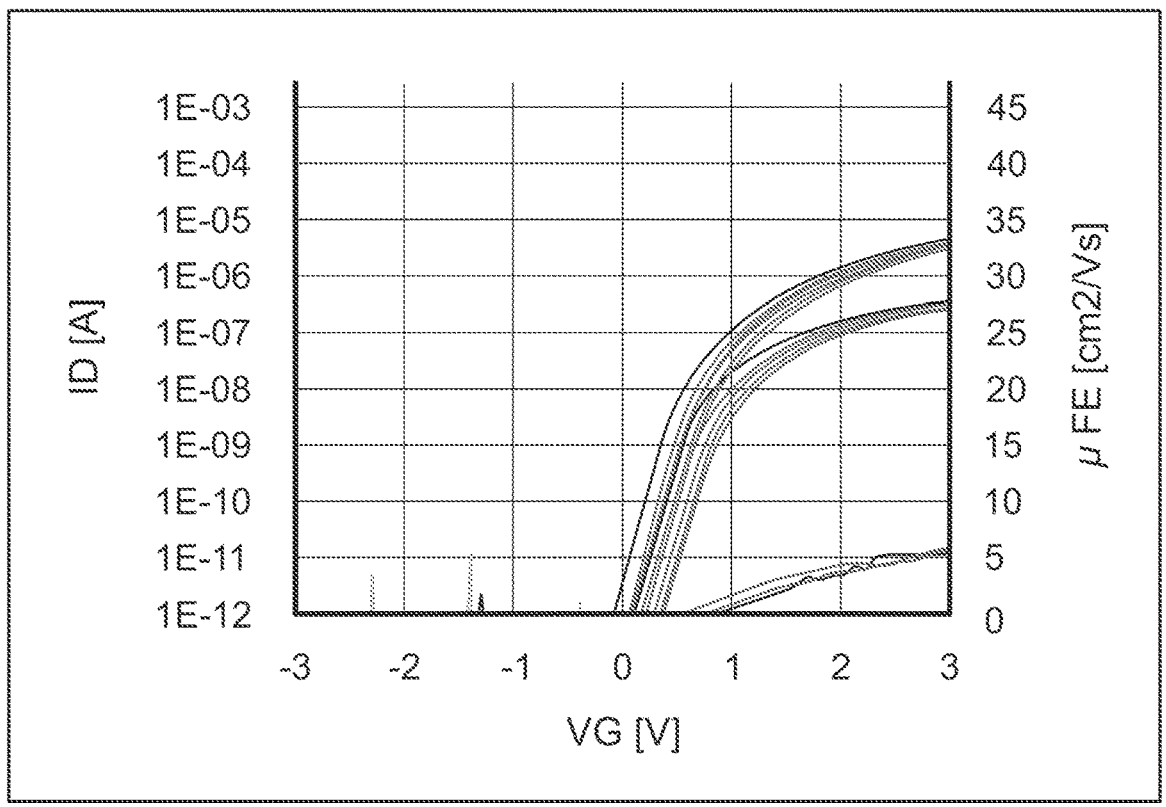
FIGS. 78A to 78D are graphs showing results of stress tests in Example.

Positive gate BT stress tests were performed under the same conditions. The results measured 600 seconds, 1 hour, 5 hours, 12 hours after the stress application are shown in FIG. 78A; ΔShift measured after 12 hours was 0.29 V, which was slightly larger than ΔShift measured after 1 hour.

Figure 51B:
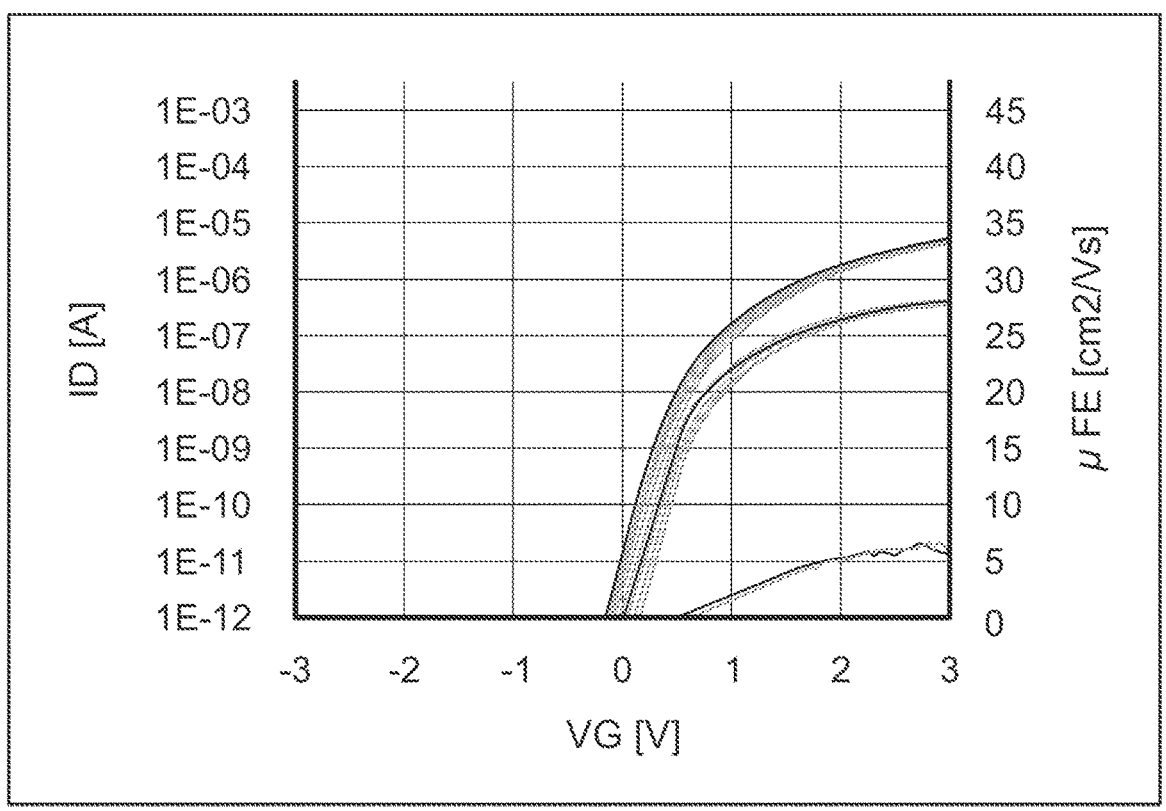

FIG. 51B shows results of a negative gate BT stress test. Note that the stress test described below was performed at a substrate temperature of 150° C. In the negative gate BT stress test, first, $I_d$-$V_g$ characteristics before the stress test were measured. In the measurement, the back gate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the back gate voltage was 0 V, and a gate voltage of −3.3 V was applied for 1 hour. Note that measurement was performed 100 seconds, 300 seconds, 600 seconds, 1000 seconds, 30 minutes, and 1 hour after stress application, and the value after 1 hour after the stress application is described below. As shown in FIG. 51B, a change in ΔShift before and after the negative gate BT stress test for 1 hour was as small as 0.13 V.

Figure 78B:
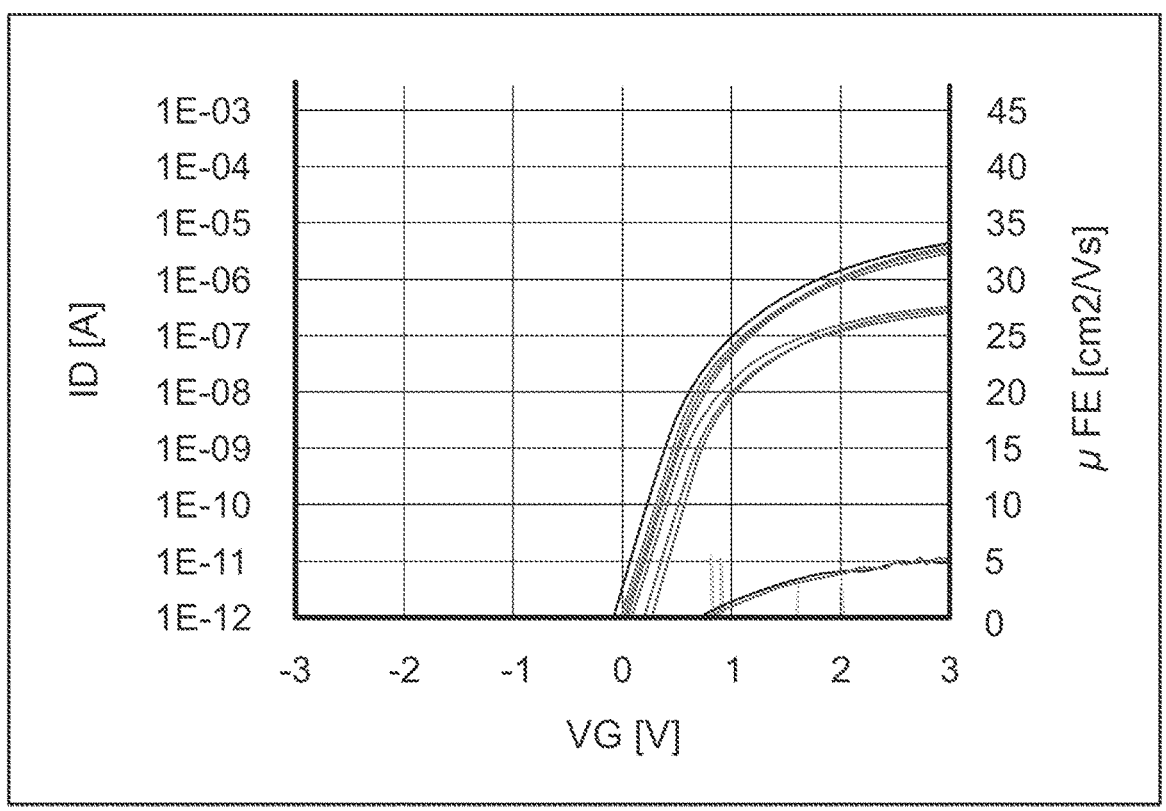

Negative gate BT stress tests were performed under the same conditions, and the results measured 600 seconds, 1 hour, 5 hours, 12 hours after the stress application. The results are shown in FIG. 78B; ΔShift measured after 12 hours was 0.15 V, which was almost the same as ΔShift measured after 1 hour.

Figure 51C:
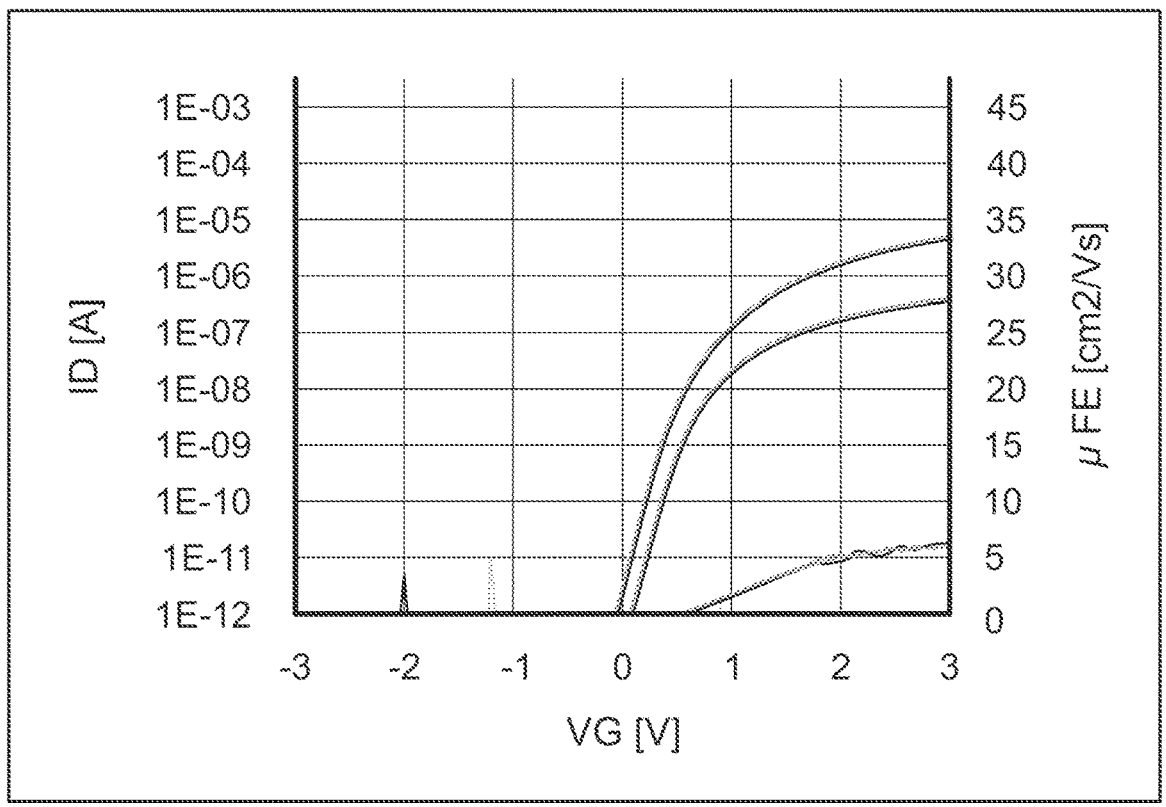

FIG. 51C shows results of a positive drain BT stress test. Note that the stress test described below was performed at a substrate temperature of 150° C. In the positive drain BT stress test, first, $I_d$-$V_g$ characteristics before the stress test were measured. In the measurement, the back gate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the gate voltage was 0 V, the back gate voltage was 0 V, and a drain voltage of 1.8 V was applied for 1 hour. Note that measurement was performed 100 seconds, 300 seconds, 600 seconds, 1000 seconds, 30 minutes, and 1 hour after stress application, and the value after 1 hour after the stress application is described below. As shown in FIG. 51C, a change in ΔShift before and after the positive drain BT stress test for 1 hour was as small as 0.01 V.

Figure 78C:
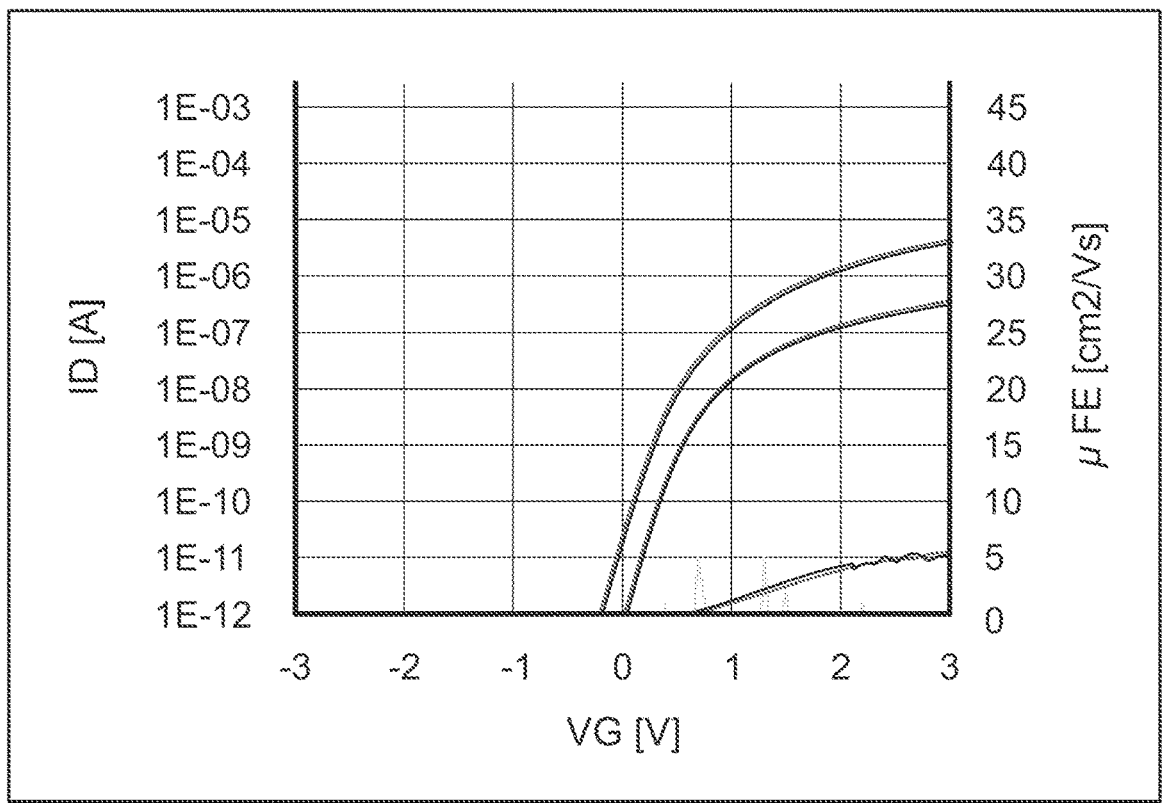

Positive drain BT stress tests were performed under the same conditions. The results measured 600 seconds, 1 hour, 5 hours, 12 hours after the stress application are shown in FIG. 78C; ΔShift measured after 12 hours was −0.01 V, which was hardly changed from ΔShift measured after 1 hour.

Figure 51D:
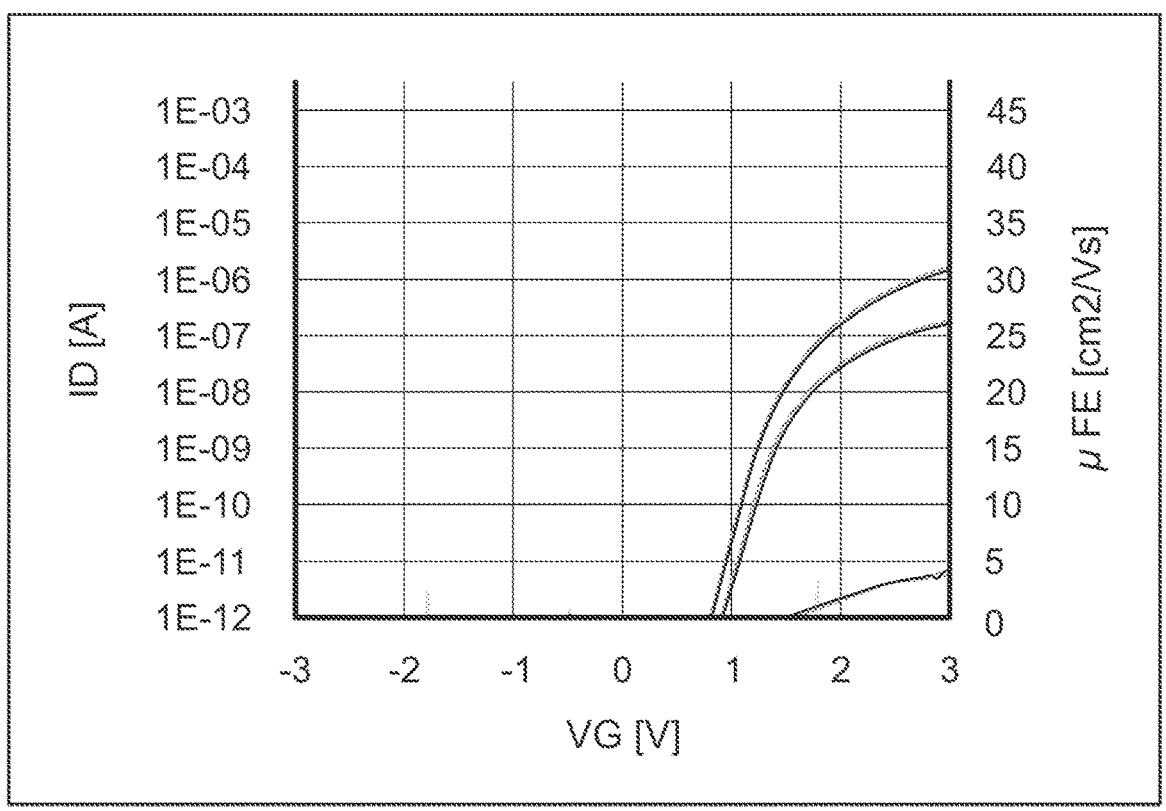

FIG. 51D shows results of a negative back gate BT stress test. Note that the stress test described below was performed at a substrate temperature of 150° C. In the negative back gate BT stress test, first, $I_d$-$V_g$ characteristics before the stress test were measured. In the measurement, the back gate voltage was −5 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the gate voltage was 0 V, and a back gate voltage of −5 V was applied for 1 hour. Note that measurement was performed 100 seconds, 300 seconds, 600 seconds, 1000 seconds, 30 minutes, and 1 hour after stress application, and the value after 1 hour after the stress application is described below. As shown in FIG. 51D, a change in ΔShift before and after the negative back gate BT stress test for 1 hour was as small as 0.02 V.

Figure 78D:
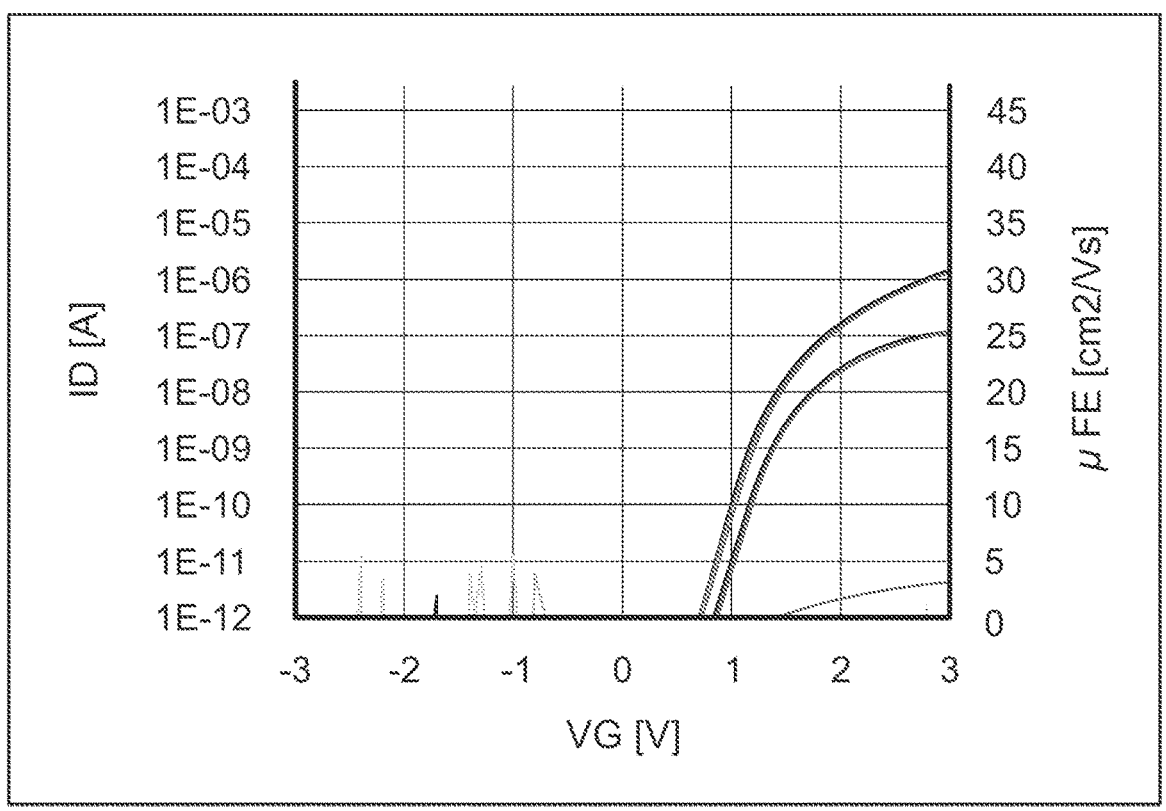

Negative back gate BT stress tests were performed under the same conditions. The results measured 600 seconds, 1 hour, 5 hours, 12 hours after the stress application are shown in FIG. 78D; ΔShift measured after 12 hours was 0.05 V, which was hardly changed from ΔShift measured after 1 hour.

Accordingly, the transistor in which the insulator 104 in contact with the bottom surface of the oxide semiconductor was formed by a PECVD method using $SiF_4$ so that water, hydrogen, and the like in the insulator 104 were reduced showed small changes in electrical characteristics when subjected to stress tests. Thus, by employing the structure described in this example, a highly reliable transistor can be provided.

The stacked film of the insulators 105, 103, and 104 in the sample 2A corresponds to that of the sample 1A in Example 1, and the stacked film of the insulators 105, 103, and 104 in the sample 2B corresponds to that of the reference sample 1 in Example 1. By setting the number of water molecules or hydrogen molecules (in particular, the number of water molecules) released from the stacked film of the insulators 105, 103, and 104 within the range described in Example 1, the high reliability of the transistor can be obtained. Furthermore, although the heating temperature in the process for forming the transistor was approximately 400° C., favorable transistor characteristics were able to be obtained.

Example 3

In this example, samples were formed in such a manner that a silicon oxide film was formed over a silicon substrate, and $SiH_4$ and $SiF_4$ were introduced to form a silicon oxide film containing fluorine thereover. The samples were analyzed by TDS and SIMS and the results will be described. In this example, samples 3A-1 to 3A-8 were formed under the conditions that the flow rate of $SiF_4$ was fixed to 1.5 sccm and the flow rate of $SiH_4$ was changed; and samples 3B-1 to 3B-8 were formed under the conditions that the flow rate of $SiF_4$ was fixed to 10 sccm and the flow rate of $SiH_4$ was changed.

A method for forming the samples 3A-1 to 3A-8 and the samples 3B-1 to 3B-8 is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, a 300-nm-thick silicon oxide film containing fluorine was formed over the silicon oxide film by a PECVD method. The deposition conditions were as follows: 1000 sccm of $N_2O$ and 1000 sccm of Ar were used as deposition gases; RF power source frequency was 60 MHz; RF power was 800 W; deposition pressure was 133 Pa; and the substrate temperature was 400° C. The flow rate of $SiF_4$ was 1.5 sccm for the samples 3A-1 to 3A-8, and was 10 sccm for the samples 3B-1 to 3B-8. The flow rate of $SiH_4$ was 0 sccm for the samples 3A-1 and 3B-1, 0.2 sccm for the samples 3A-2 and 3B-2, 1 sccm for the samples 3A-3 and 3B-3, 2 sccm for the samples 3A-4 and 3B-4, 4 sccm for the samples 3A-5 and 3B-5, 8 sccm for the samples 3A-6 and 3B-6, 10 sccm for the samples 3A-7 and 3B-7, and 20 sccm for the samples 3A-8 and 3B-8.

Figure 52:
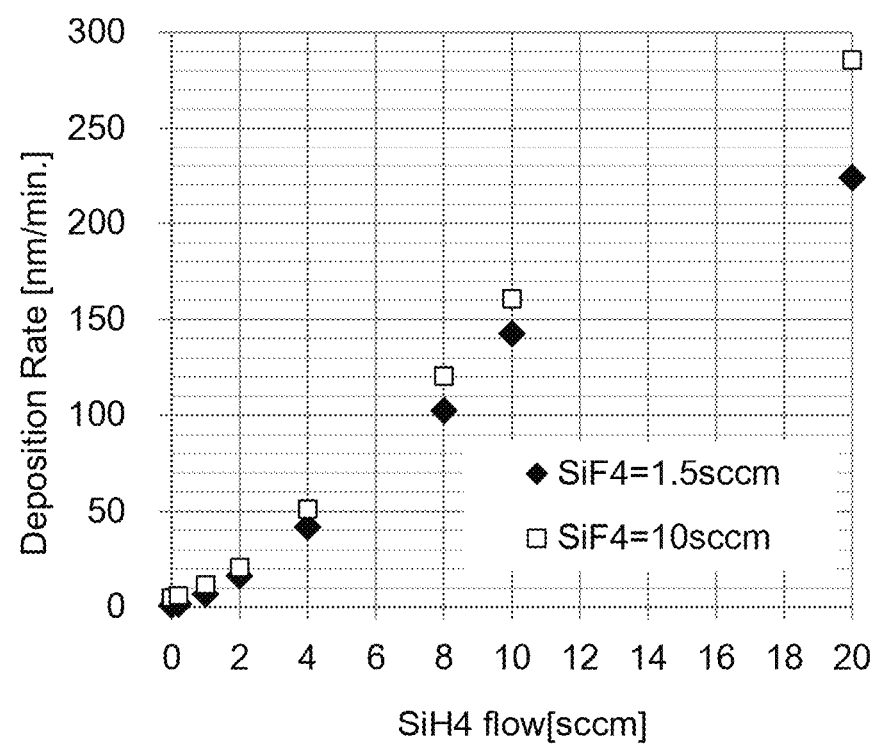
FIG. 52 is a graph showing results of deposition rate measured in Example.

FIG. 52 shows the calculated deposition rates of the silicon oxide films containing fluorine of the samples 3A-1 to 3A-8 and the samples 3B-1 to 3B-8 formed in the above manner. In FIG. 52, the horizontal axis represents the flow rate [sccm] of $SiH_4$ for each sample, and the vertical axis represents the deposition rate [nm/min] of each sample.

As shown in FIG. 52, in the samples 3A-1 to 3A-8 and the samples 3B-1 to 3B-8, the deposition rate tends to be increased with an increase in the flow rate of $SiH_4$. However, when the samples with the same flow rate of $SiH_4$ are compared, the deposition rates of the samples 3B-1 to 3B-8 were slightly higher than those of the samples 3A-1 to 3A-8. The difference in deposition rate becomes larger with an increase in the flow rate of $SiH_4$.

The TDS analysis results of the samples 3A-1 to 3A-8 and the samples 3B-1 to 3B-8 are shown in FIGS. 55A to 55H to FIGS. 58A to 58H. Note that in the TDS analysis, the amount of a released gas with a mass-to-charge ratio m/z=2, which corresponds to a hydrogen molecule and the amount of a released gas with a mass-to-charge ratio m/z=18, which corresponds to a water molecule, were measured. FIGS. 55A to 55H show the TDS measurement results of hydrogen in the samples 3A-1 to 3A-8, and FIGS. 56A to 56H show those of water in the samples 3A-1 to 3A-8. FIGS. 57A to 57H show the TDS measurement results of hydrogen in the samples 3B-1 to 3B-8, and FIGS. 58A to 58H show those of water in the samples 3B-1 to 3B-8. In each of FIGS. 55A to 55H to FIGS. 58A to 58H, the horizontal axis represents substrate heating temperature [° C.] and the vertical axis represents intensity proportional to the amount of a released gas with a mass-to-charge ratio.

Figure 53A:
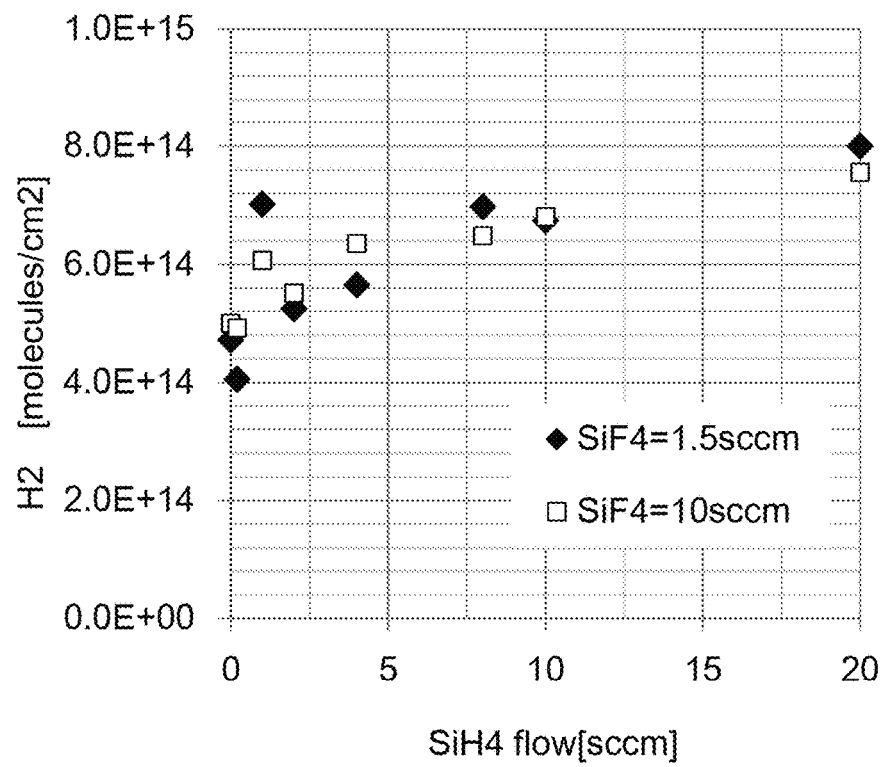
FIGS. 53A and 53B are graphs showing the number of released hydrogen molecules calculated from TDS analysis in Example.
Figure 53B:
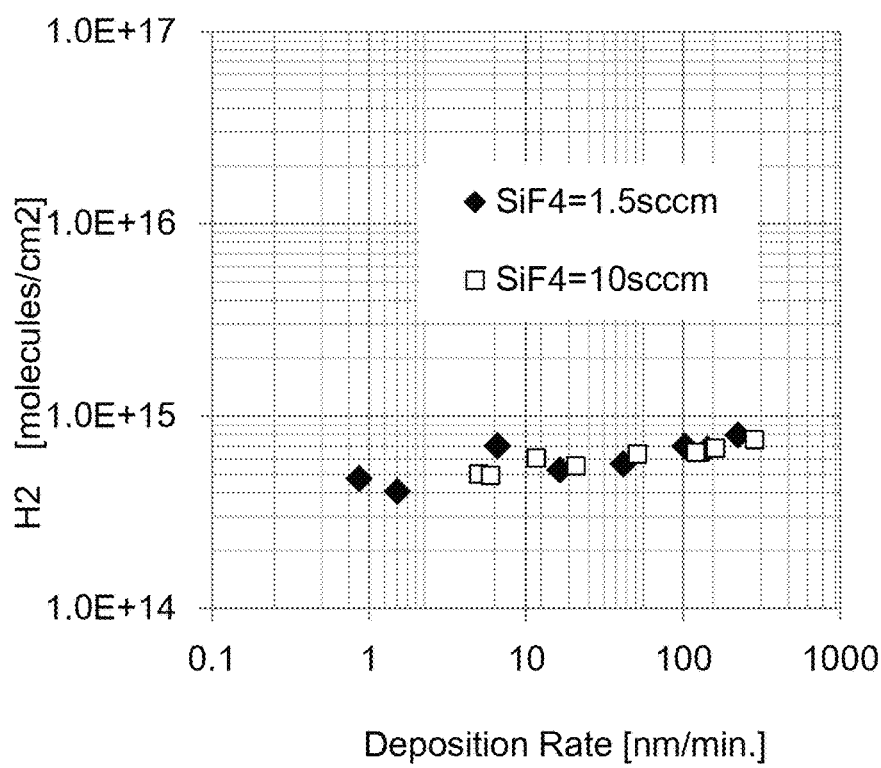

The number of hydrogen molecules released from each of the samples 3A-1 to 3A-8 and the samples 3B-1 to 3B-8 was estimated from the measurement results of hydrogen shown in FIGS. 55A to 55H and 57A to 57H. In FIG. 53A, the horizontal axis represents the flow rate [sccm] of $SiH_4$ for each sample, and the vertical axis represents the number of hydrogen molecules [molecules/cm$^2$] released from each sample. In FIG. 53B, the horizontal axis represents the deposition rate [nm/min] of each sample, and the vertical axis represents the number of hydrogen molecules [molecules/cm$^2$] released from each sample.

Figure 54A:
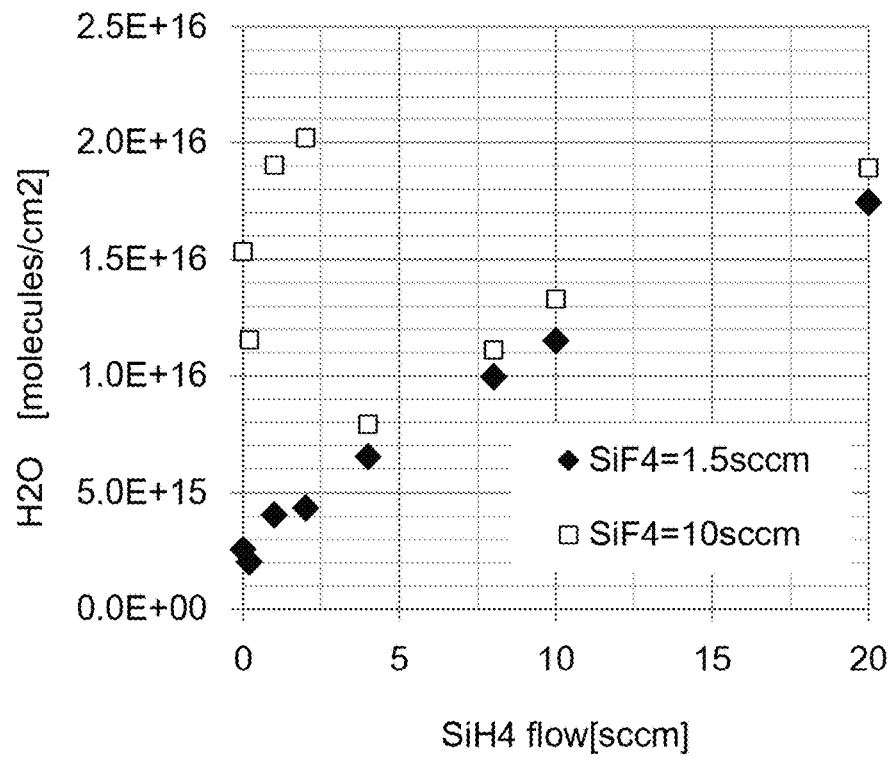
FIGS. 54A and 54B are graphs showing the number of released water molecules calculated from TDS analysis in Example.
Figure 54B:
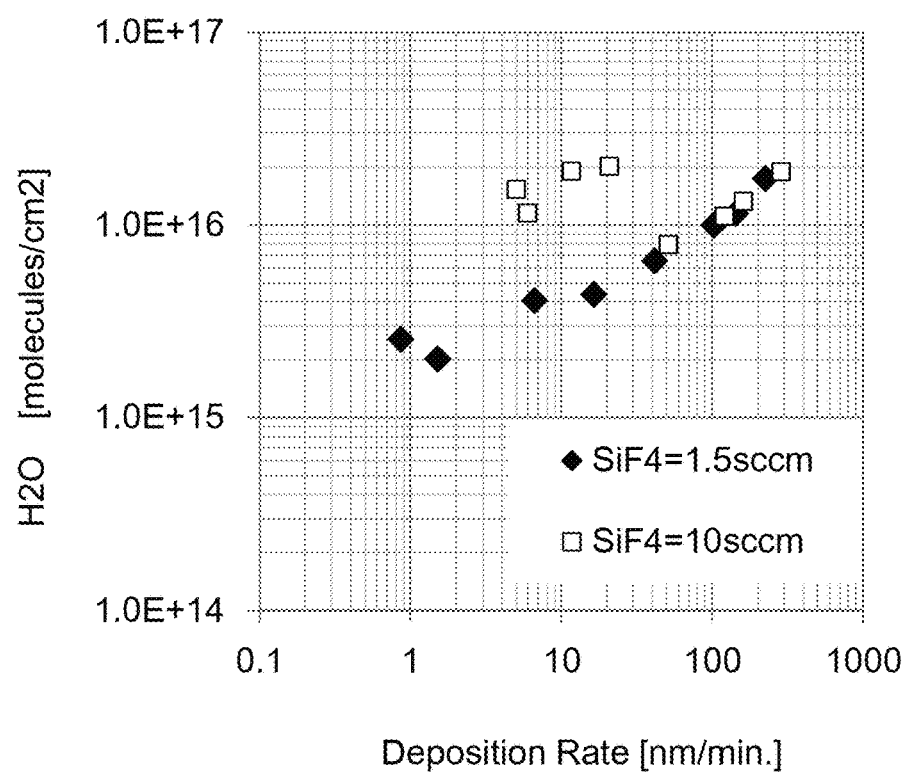
Figure 55A:
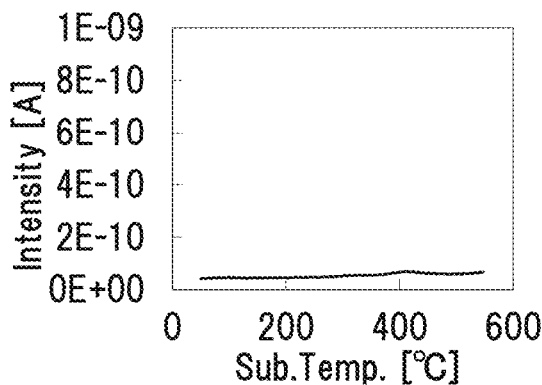
FIGS. 55A to 55H are graphs showing results of TDS analysis in Example.
Figure 55B:
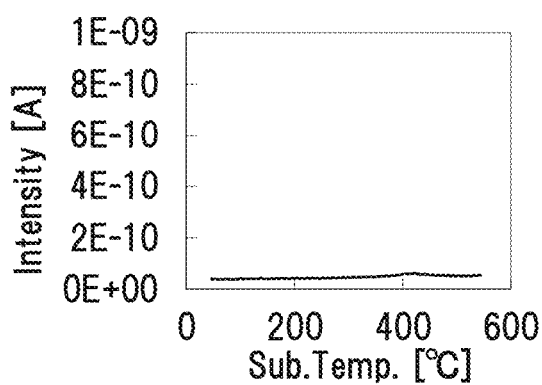
Figure 55C:
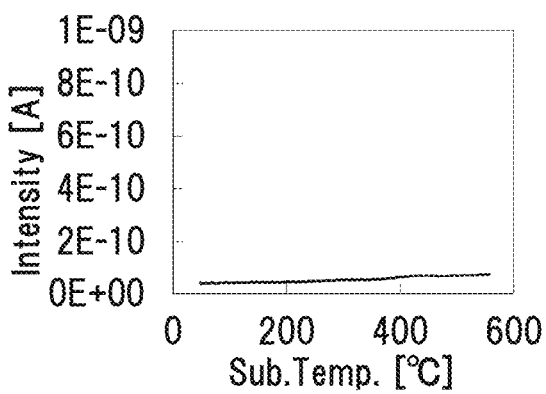
Figure 55D:
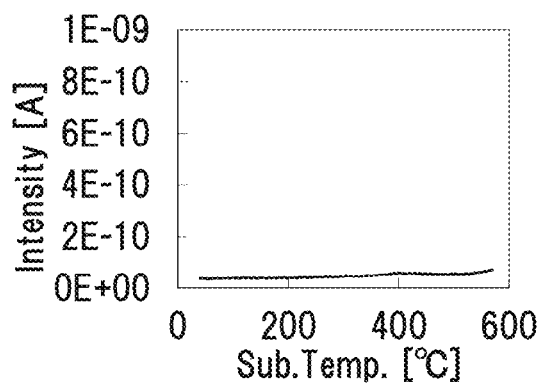
Figure 55E:
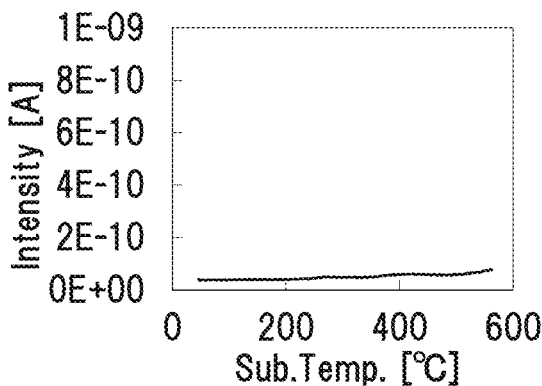
Figure 55F:
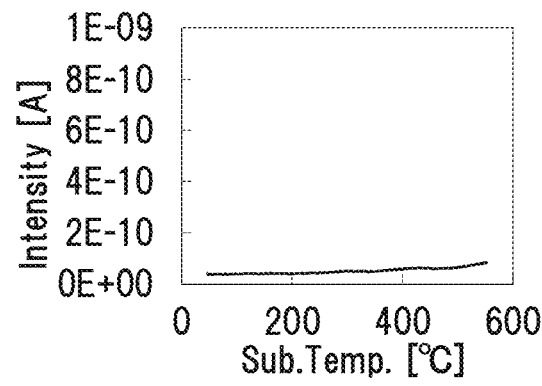
Figure 55G:
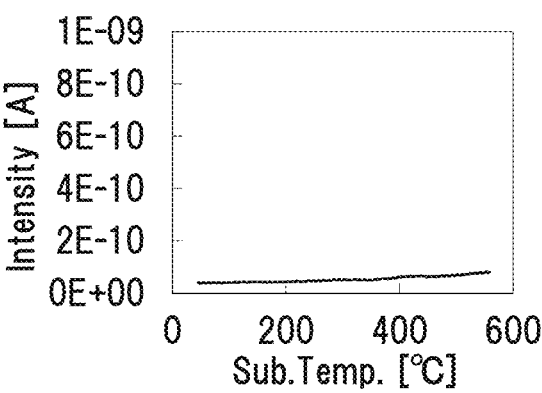
Figure 55H:
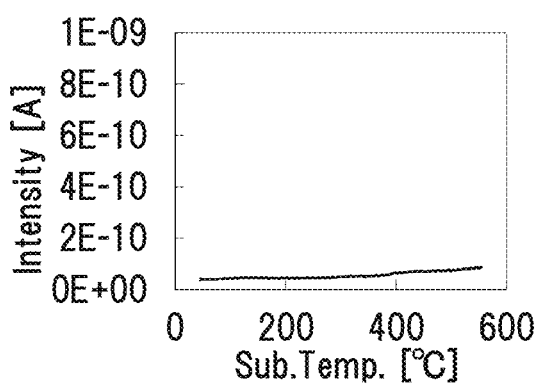
Figure 56A:
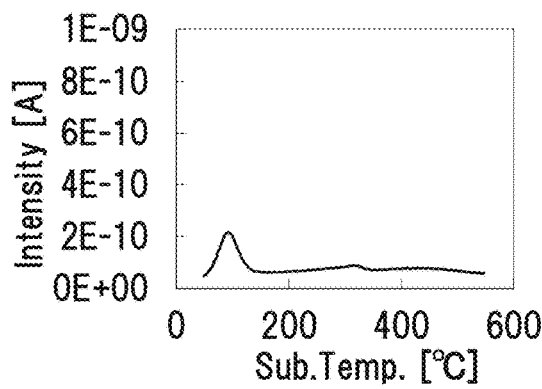
FIGS. 56A to 56H are graphs showing results of TDS analysis in Example.
Figure 56B:
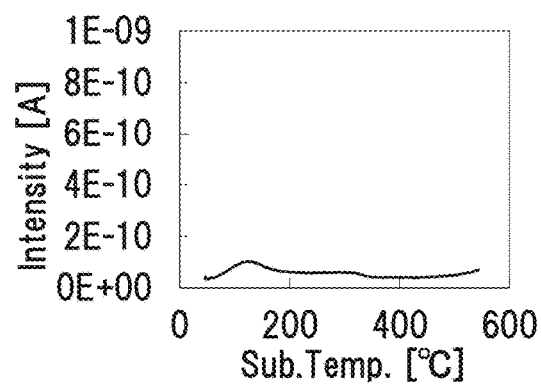
Figure 56C:
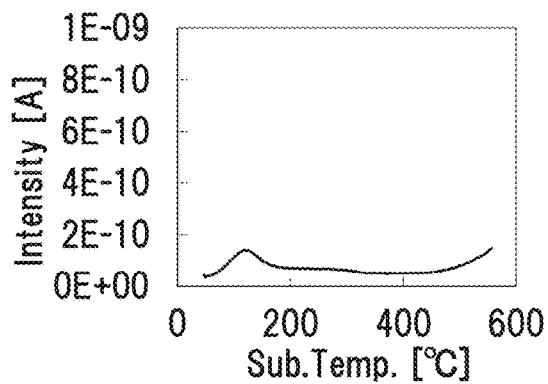
Figure 56D:
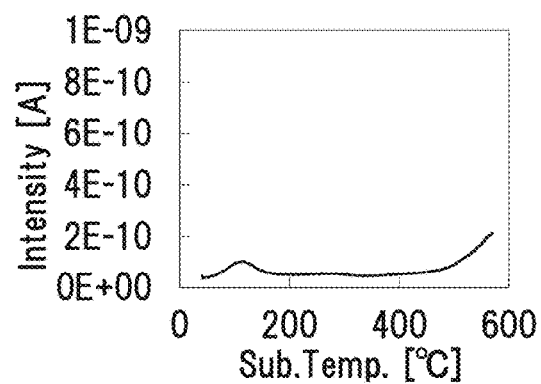
Figure 56E:
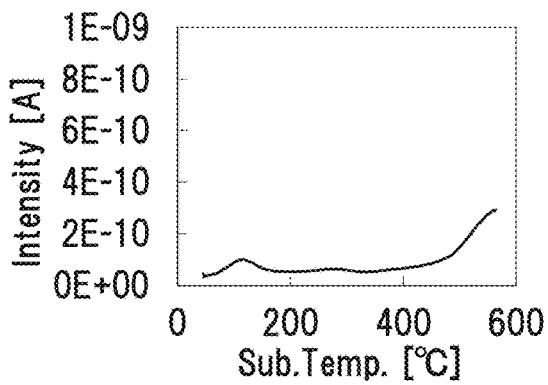
Figure 56F:
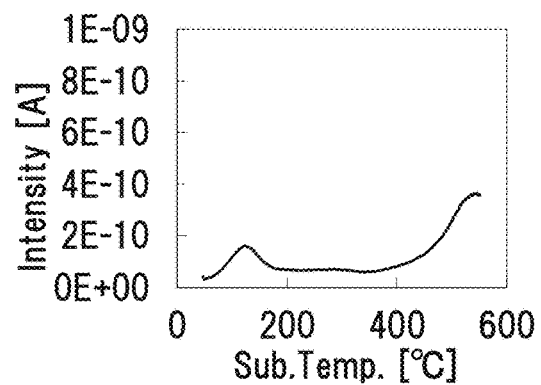
Figure 56G:
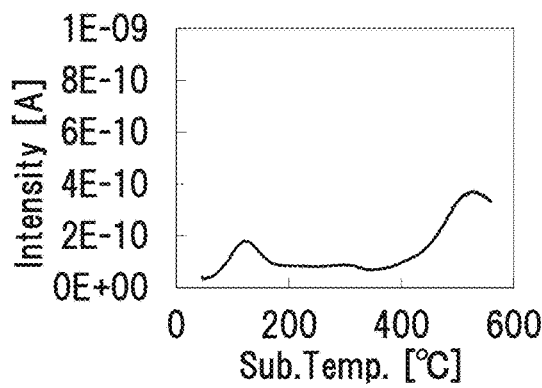
Figure 56H:
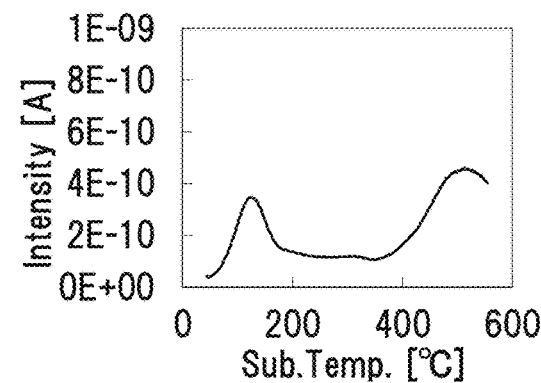
Figure 57A:
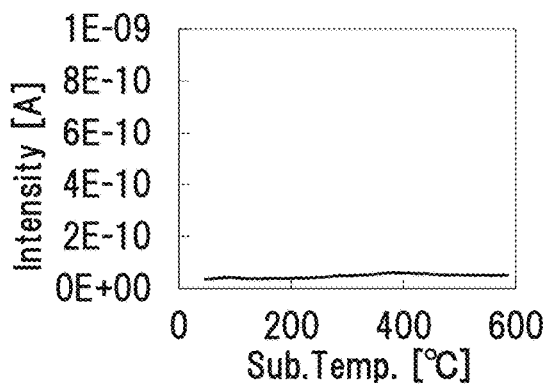
FIGS. 57A to 57H are graphs showing results of TDS analysis in Example.
Figure 57B:
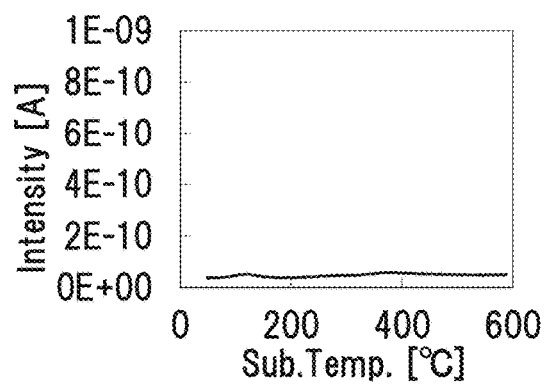
Figure 57C:
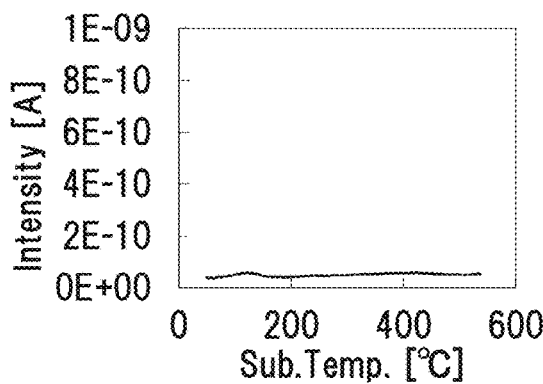
Figure 57D:
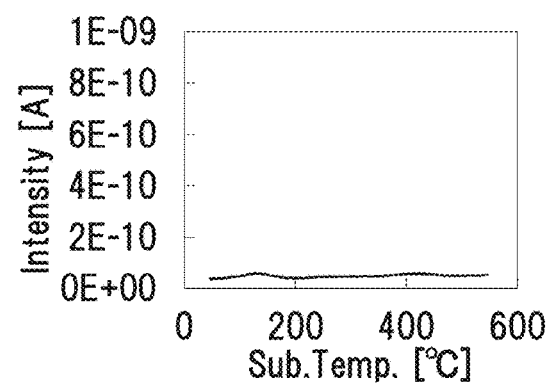
Figure 57E:
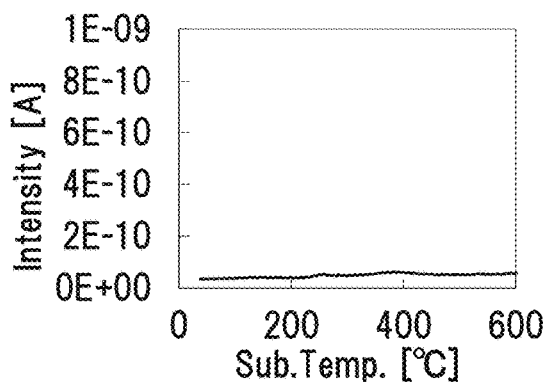
Figure 57F:
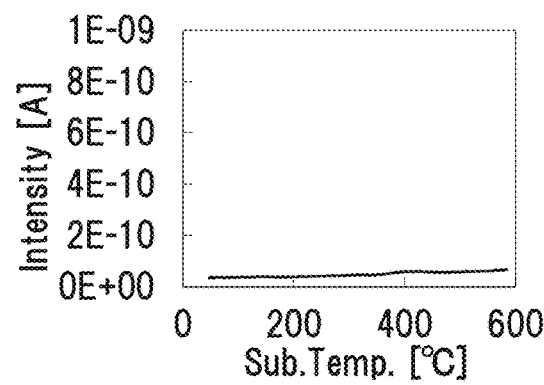
Figure 57G:
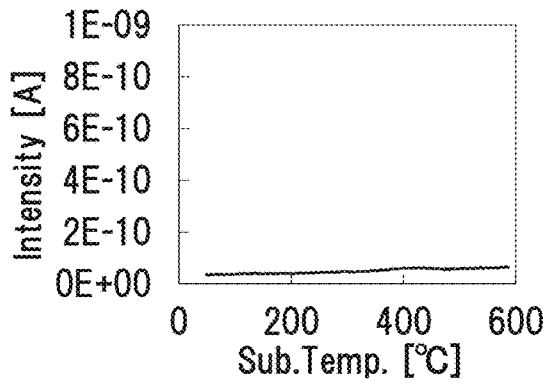
Figure 57H:
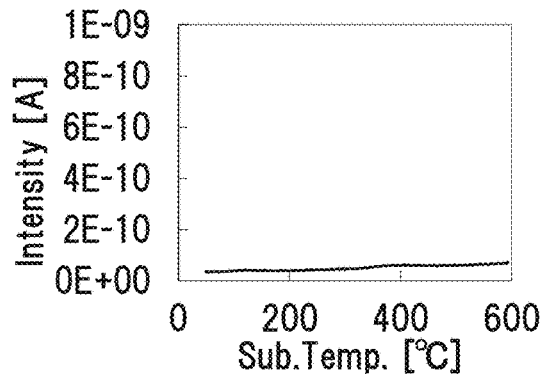
Figure 58A:
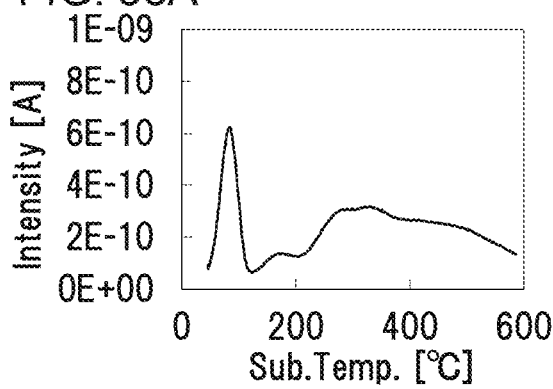
FIGS. 58A to 58H are graphs showing results of TDS analysis in Example.
Figure 58B:
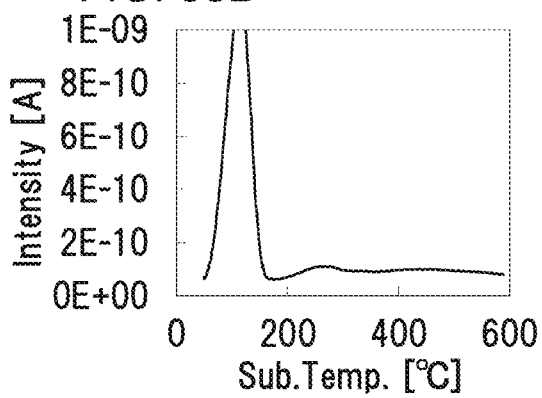
Figure 58C:
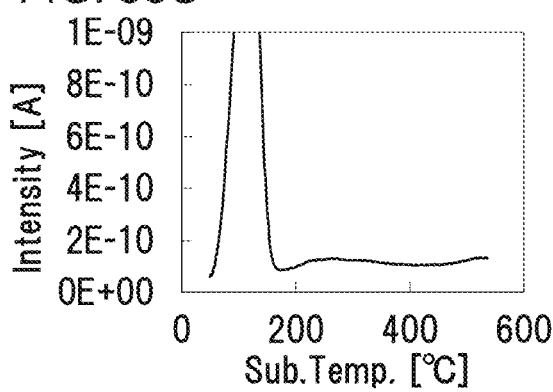
Figure 58D:
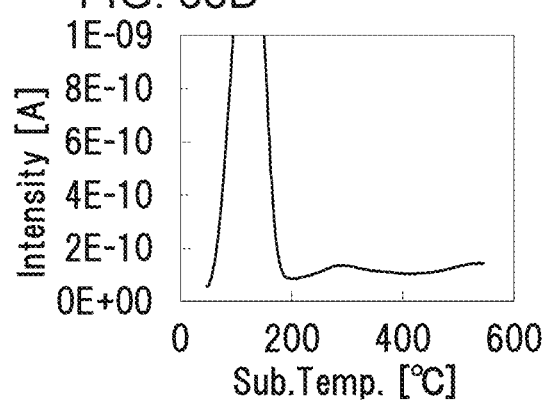
Figure 58E:
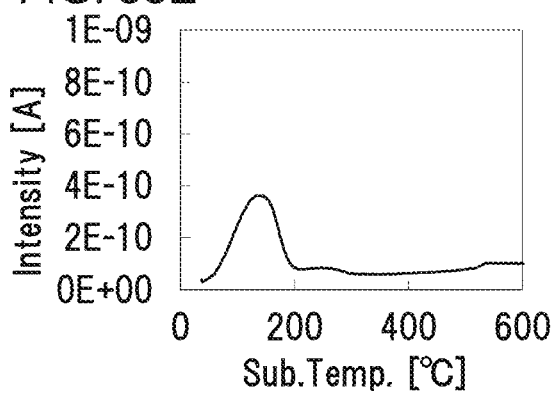
Figure 58F:
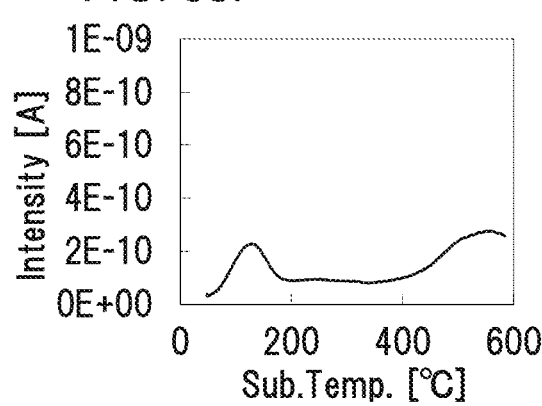
Figure 58G:
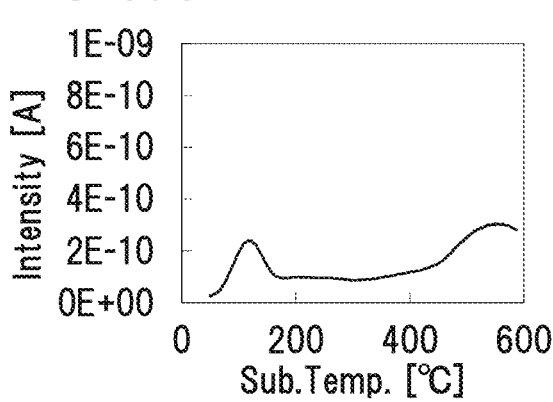
Figure 58H:
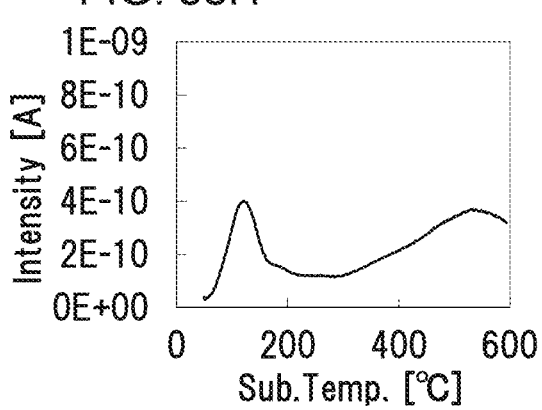

The number of water molecules released from each of the samples 3A-1 to 3A-8 and the samples 3B-1 to 3B-8 was estimated from the measurement results of water shown in FIGS. 56A to 56H and 58A to 58H. In FIG. 54A, the horizontal axis represents the flow rate [sccm] of $SiH_4$ for each sample, and the vertical axis represents the number of water molecules [molecules/cm$^2$] released from each sample. In FIG. 54B, the horizontal axis represents the deposition rate [nm/min] of each sample, and the vertical axis represents the number of water molecules [molecules/cm$^2$] released from each sample.

As shown in FIGS. 53A and 53B and FIGS. 54A and 54B, in the samples 3A-1 to 3A-8 and the samples 3B-1 to 3B-8, the number of released hydrogen molecules and the number of released water molecules tend to be increased by an increase in the flow rate of $SiH_4$ or an increase in deposition rate. A significant difference between the samples 3A-1 to 3A-8 and the samples 3B-1 to 3B-8 is not seen in FIGS. 53A and 53B and FIGS. 54A and 54B; accordingly, it seems that the difference in the flow rate of $SiF_4$ did not cause a significant difference.

As shown in FIGS. 55A to 55H and 57A to 57H, a large profile peak of hydrogen is not seen in each of the samples 3A-1 to 3A-8 and the samples 3B-1 to 3B-8 at any temperature, and the number of hydrogen molecules released therefrom was significantly small.

As shown in FIGS. 56A to 56H and 58A to 58H, a large profile peak of water is seen in each of the samples 3A-1 to 3A-8 and the samples 3B-1 to 3B-8 at a substrate temperature of approximately 100° C.; accordingly, which shows release of water. Furthermore, in the samples 3A-1 to 3A-8 and the samples 3B-1 to 3B-8, as the flow rate of $SiH_4$ increases, a peak in a high temperature region starts to rise at a substrate temperature of approximately 400° C.

As shown in FIG. 54A, the number of water molecules released from each of the samples 3B-1 to 3B-4 with a low flow rate of $SiH_4$ is significantly large. The number of water molecules released from each of the samples 3B-1 to 3B-4 shown in FIGS. 58A to 58D shows a very sharp peak at a substrate temperature of approximately 100° C. In other words, a significant factor of the large number of water molecules released from each of the samples 3B-1 to 3B-4 is probably water molecules corresponding to the peak at approximately 100° C. The water molecules corresponding to this peak can be eliminated by heating the substrate at a substrate temperature of approximately 100° C.; thus, the number of water molecules released from each of the samples 3B-1 to 3B-4 can be greatly reduced by heating the substrate at approximately 100° C.

As described above, there is a trade-off between the deposition rate of the silicon oxide film containing fluorine, which depend on the flow rate of $SiH_4$, and the amounts of hydrogen and water in the film. For example, as shown in FIG. 52 and FIG. 54A, the flow rate of $SiH_4$ is set to greater than 1 sccm and less than 10 sccm, preferably, greater than or equal to 2 sccm and less than or equal to 4 sccm, in which case the amounts of water and hydrogen in the insulator 104 and the deposition rate can be relatively favorable values. Note that it is preferable that the proportion of $SiH_4$ be determined as appropriate in view of the amounts of water and hydrogen in the silicon oxide film containing fluorine and the deposition rate.

Figure 59A:
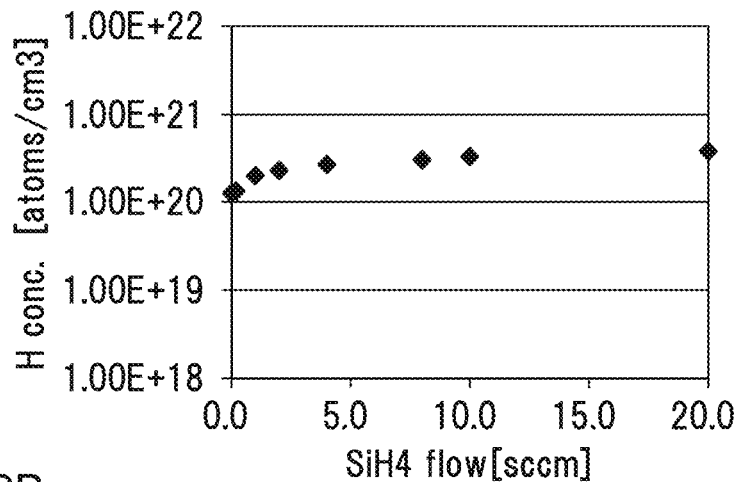
FIGS. 59A to 59C are graphs showing results of SIMS measurement in Example.
Figure 59B:
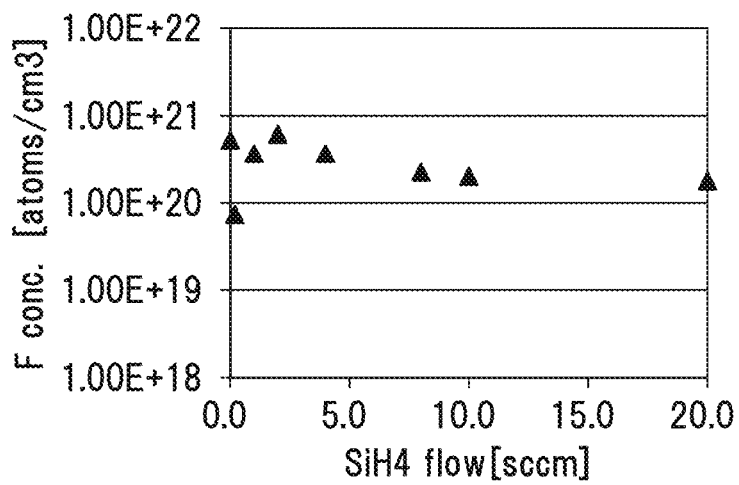
Figure 59C:
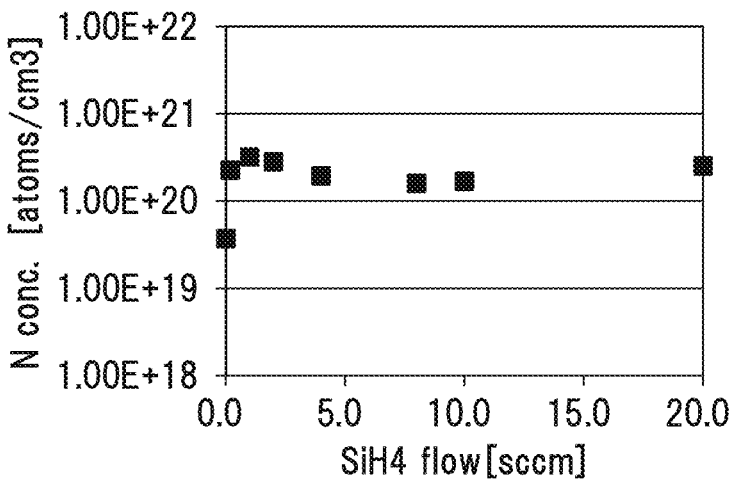
Figure 60A:
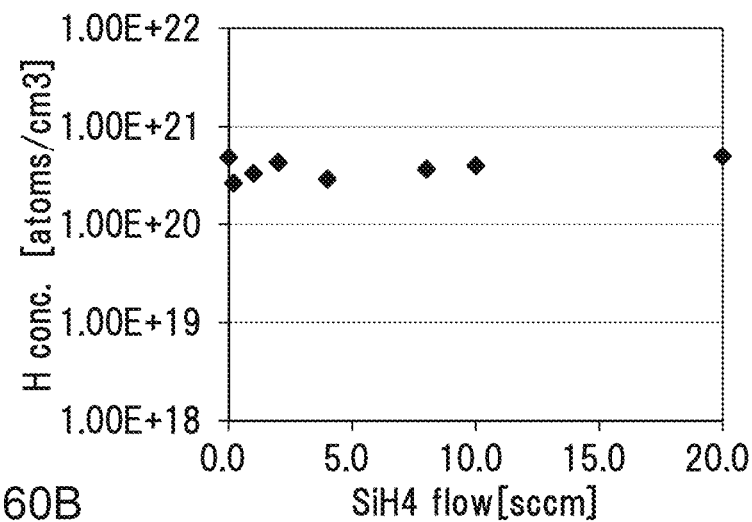
FIGS. 60A to 60C are graphs showing results of SIMS measurement in Example.
Figure 60B:
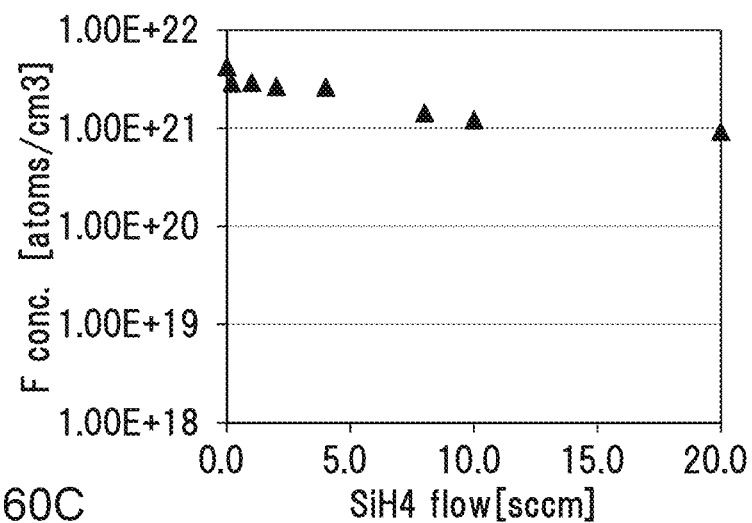
Figure 60C:
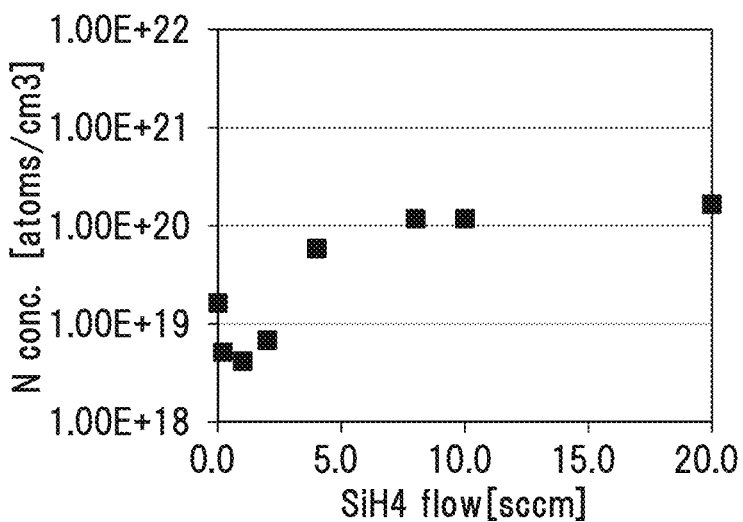

Next, the samples 3A-1 to 3A-8 and the samples 3B-1 to 3B-8 were subjected to SSDP-SIMS analysis to detect H, F, and N, and the results are shown in FIGS. 59A to 59C and FIGS. 60A to 60C. Note that each graph in FIGS. 59A to 59C and FIGS. 60A to 60C shows an average value of the concentration of an element in a sample detected in a region 50 nm to 100 nm above from an interface between the silicon oxide film and the silicon oxide film containing fluorine. FIGS. 59A to 59C show the results of the samples 3A-1 to 3A-8. FIG. 59A shows the detection results of H; FIG. 59B shows the detection results of F; and FIG. 59C shows the detection results of N. FIGS. 60A to 60C show the results of the samples 3B-1 to 3B-8. FIG. 60A shows the detection results of H; FIG. 60B shows the detection results of F; and FIG. 60C shows the detection results of N. In each of FIGS. 59A to 59C and FIGS. 60A to 60C, the horizontal axis represents the flow rate [sccm] of $SiH_4$ for each sample, and the vertical axis represents the average concentration [atoms/cm$^3$] in the sample. Note that SIMS measurement was performed by using an ADEPT-1010 quadrupole mass spectrometry instrument manufactured by ULVAC-PHI, Inc.

As shown in FIG. 59A and FIG. 60A, the SIMS measurement also showes that the hydrogen concentration in each of the samples 3A-1 to 3A-8 and the samples 3B-1 to 3B-8 tends to be increased with an increase in the flow rate of $SiH_4$. The hydrogen concentration in each of the samples 3A-1 to 3A-8 and the samples 3B-1 to 3B-8 was within the range from $1\times10^{20}$ atoms/cm$^3$ to $1\times10^{21}$ atoms/cm$^3$, and a large increase was not observed.

As shown in FIG. 59B and FIG. 60B, the fluorine concentration in each of the samples 3A-1 to 3A-8 and the samples 3B-1 to 3B-8 tends to be decreased with an increase in the flow rate of SiH$_4$. While the fluorine concentration in each of the samples 3A-1 to 3A-8 was within the range from $1\times10^{20}$ atoms/cm$^3$ to $1\times10^{21}$ atoms/cm$^3$, the fluorine concentration in each of the samples 3B-1 to 3B-8 was increased with an increase in the flow rate of SiF$_4$ and within the range from $1\times10^{21}$ atoms/cm$^3$ to $1\times10^{22}$ atoms/cm$^3$.

As shown in FIG. 59C and FIG. 60C, a clear tendency by an increase in the flow rate of SiH$_4$ was not seen for the nitrogen concentration in each of the samples 3A-1 to 3A-8 and the samples 3B-1 to 3B-8. When the flow rate of SiH$_4$ is low, the samples 3A-1 to 3A-8 and the samples 3B-1 to 3B-8 have different tendencies; when the flow rate of SiH$_4$ is high, the concentrations of the samples 3A-1 to 3A-8 were substantially equal to those of the samples 3B-1 to 3B-8.

In this example, samples were formed by stacking a silicon oxide film, a silicon oxynitride film, a hafnium oxide film, a silicon oxide film containing fluorine over a silicon substrate and evaluated by X-ray photoelectron spectroscopy (XPS). For the XPS evaluation, samples 3C-1 to 3C-4 were formed as reference samples. The outermost surface of the sample 3C-1 was silicon oxide deposited by a PECVD method. The outermost surface of the sample 3C-2 was silicon oxide containing fluorine deposited by a PECVD method. The outermost surface of the sample 3C-3 was silicon oxide containing fluorine deposited by a PECVD method using a deposition gas containing 0.2 sccm of SiH$_4$. The outermost surface of the sample 3C-4 was silicon oxide containing fluorine deposited by a PECVD method using a deposition gas containing 4 sccm of SiH$_4$.

A method for forming the samples used in the XPS analysis is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, a 10-nm-thick silicon oxynitride film was formed over the silicon oxide film by a PECVD method at a substrate temperature of 400° C.

Next, a 20-nm-thick hafnium oxide film was formed over the silicon oxynitride film by an ALD method. In the film formation by an ALD method, the substrate temperature was 200° C., and a source gas obtained by vaporizing a solid containing tetrakis(dimethylamido)hafnium (TDMAH) and an O$_3$ gas) that was an oxidizer were used.

Then, a 30-nm-thick silicon oxide film containing fluorine was formed over the hafnium oxide film by a PECVD method. Note that for the sample 3C-1 (comparative example), a silicon oxide film was formed by a PECVD method at a substrate temperature of 500° C.

For the samples 3C-2 to 3C-4, before the deposition of the silicon oxide film containing fluorine, pretreatment for letting SiH$_4$ flow at 200 sccm for 20 seconds was performed. The deposition conditions were as follows: 1.5 sccm of SiF$_4$, 1000 sccm of N$_2$O, and 1000 sccm of Ar were used as deposition gases; RF power source frequency was 60 MHz; RF power was 800 W; deposition pressure was 133 Pa; and the substrate temperature was 400° C. In addition, 0.2 sccm of SiH$_4$ was added to the deposition gases for the sample 3C-3, and 4 sccm of SiH$_4$ was added to the deposition gases for the sample 3C-4.

Figure 61A:
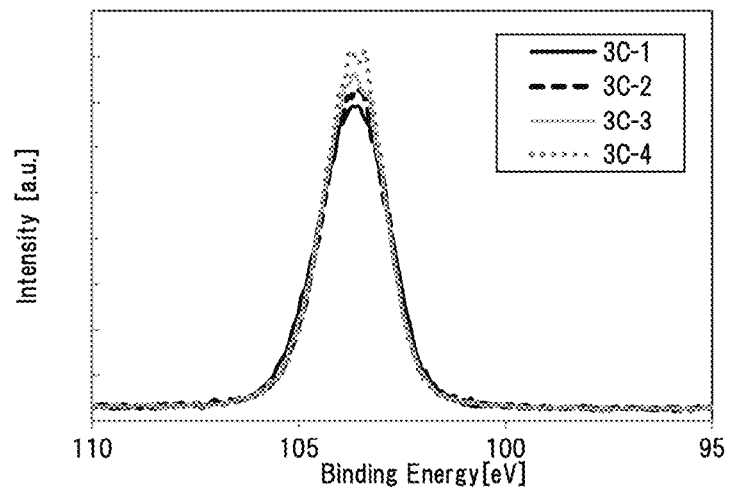
FIGS. 61A to 61C are graphs showing results of XPS measurement in Example.
Figure 61B:
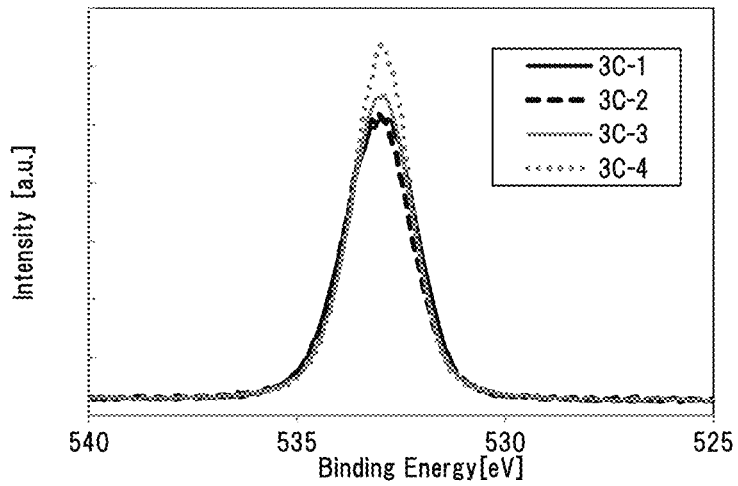
Figure 61C:
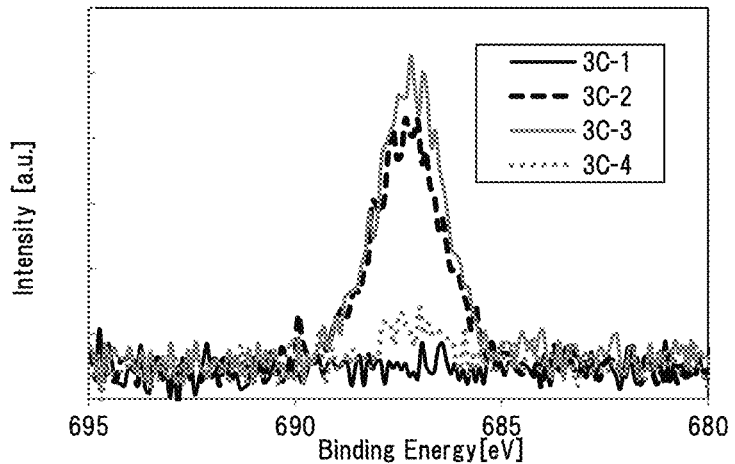

The samples 3C-1 to 3C-4 formed in the above manner were analyzed by XPS and the results are shown in FIGS. 61A to 61C. FIG. 61A shows a spectrum corresponding to the 2$p$ orbital of Si; FIG. 61B shows a spectrum corresponding to the is orbital of O; and FIG. 61C shows a spectrum corresponding to the is orbital of F. In each of FIGS. 61A to 61C, the horizontal axis represents binding energy [eV] and the vertical axis represents the spectrum intensity. Table 2 shows the compositions [atomic %] of Si, O, C, and F in each of the samples 3C-1 to 3C-4.

TABLE 2

|  | Si | O | C | F |
|---|---|---|---|---|
| Sample 3C-1 [atomic %] | 29.0 | 61.9 | 9.0 | — |
| Sample 3C-2 [atomic %] | 29.1 | 59.1 | 8.5 | 3.3 |
| Sample 3C-3 [atomic %] | 29.1 | 59.3 | 8.0 | 3.6 |
| Sample 3C-4 [atomic %] | 29.3 | 62.5 | 7.9 | 0.3 |

As shown in FIGS. 61A and 61B, a significant difference in the amounts of silicon and oxygen was not observed between the samples 3C-1 to 3C-4. However, when focusing on oxygen and fluorine, as the flow rate of SiH$_4$ in the deposition gas is decreased and thus the flow rate of SiF$_4$ is relatively increased, the proportion of fluorine is increased and the proportion of oxygen is decreased, as shown in Table 2.

As shown in FIG. 61C, each of the samples 3C-2 and 3C-3 with relatively high flow rates of SiF$_4$ in the deposition gas shows a large peak of the is orbital of F. This peak appears in the region of a SiF covalent bond (higher than or equal to 685.4 eV and lower than or equal to 687.5 eV, the median value: 686.5 eV), which means that the SiF covalent bond is formed on a surface of each of the samples 3C-2 and 3C-3.

Example 4

In this example, samples in each of which a hafnium oxide film was formed over a silicon substrate by an ALD method or an MOCVD method were formed and analyzed by TDS, and the results will be described. In this example, three samples 4A to 4C were formed. Deposition for the sample 4A was performed by an ALD method using two kinds of gases (O$_3$ and a gas containing TDMAH); deposition for the sample 4B was performed by an ALD method using three kinds of gases (O$_3$, H$_2$O, and a gas containing TDMAH); and deposition for the sample 4C was performed by an MOCVD method.

Methods for forming the samples 4A to 4C are described.

Figure 62A:
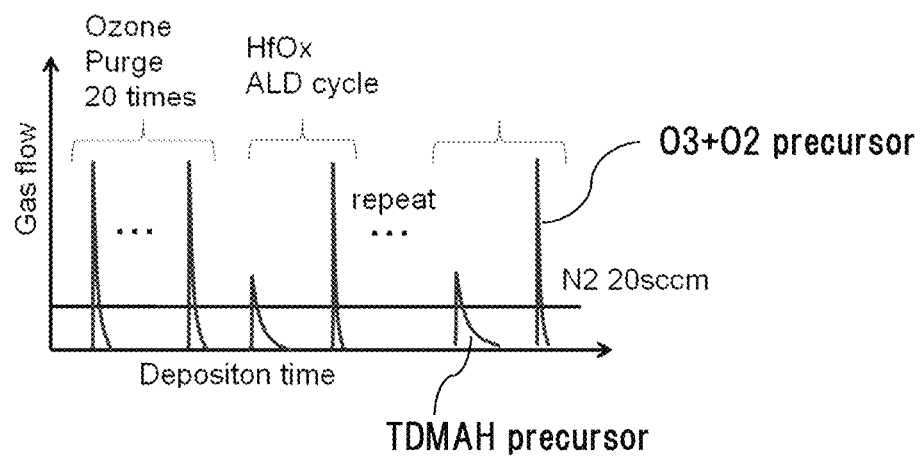
FIGS. 62A and 62B shows recipes for ALD performed in Example.

For the sample 4A, a 20-nm-thick hafnium oxide film was formed over the silicon substrate by an ALD method. In the film formation by an ALD method, the substrate temperature was 200° C., and a source gas obtained by vaporizing a solid containing TDMAH and an O$_3$ gas) that was an oxidizer were used. FIG. 62A is a timing diagram of deposition gases for the sample 4A.

As shown in FIG. 62A, in the deposition for the sample 4A, first, purging of a chamber was performed with O$_3$. As the O$_3$ purging, introduction of O$_3$ for 0.025 seconds was repeated times. Next, a source gas obtained by vaporizing a solid containing TDMAH was introduced for 0.5 seconds, N$_2$ purging was performed for 45 seconds, O$_3$ was introduced for 0.1 seconds, and N$_2$ purging was performed for 25 seconds. Then, the introduction of TDMAH, the N$_2$ purging, the introduction of $O_3$, and the $N_2$ purging were regarded as one cycle, and this cycle was repeated until the thickness reached 20 nm.

Figure 62B:
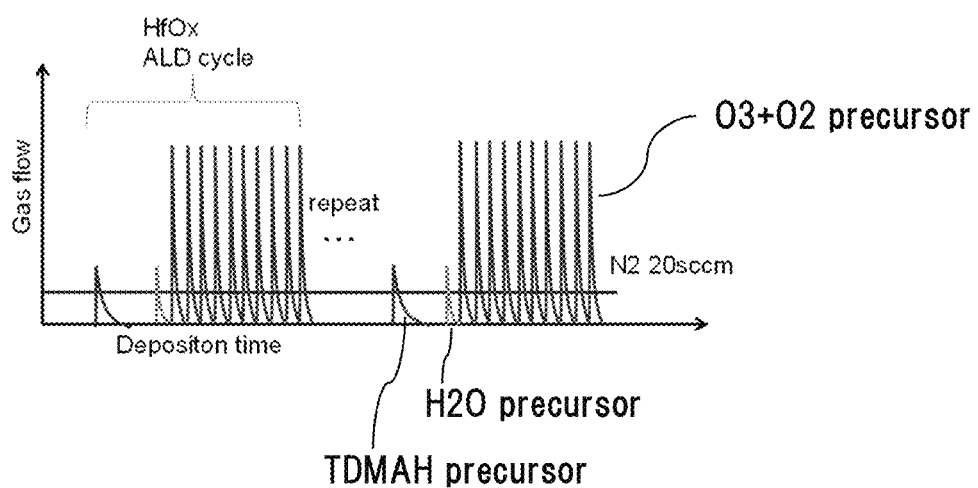

In the deposition for the sample 4B, a 20-nm-thick hafnium oxide film was formed over a silicon substrate by an ALD method. The deposition by an ALD method was performed at a substrate temperature of 200° C. using three kinds of deposition gases: a gas obtained by vaporizing a solid containing TDMAH as a source and $O_3$ and $H_2O$ as oxidizers. FIG. 62B is a timing diagram of deposition gases for the sample 4B.

As shown in FIG. 62B, in the deposition for the sample 4B, the source gas obtained by vaporizing a solid containing TDMAH was introduced for 0.5 seconds, $N_2$ purging was performed for 45 seconds, $H_2O$ was introduced for 0.03 seconds, and $N_2$ purging was performed for 5 seconds. Then, $O_3$ was introduced for 0.1 seconds and $N_2$ purging was performed for 5 seconds. This sequence of the introduction of $O_3$ and the $N_2$ purging was performed 10 times. After that, the introduction of TDMAH, the $N_2$ purging, the introduction of $H_2O$, the $N_2$ purging, and 10 times of the sequence of the introduction of $O_3$ and the $N_2$ purging were regarded as one cycle, and this cycle was repeated until the thickness reached 20 nm.

In the deposition for the sample 4C, a 20-nm-thick hafnium oxide film was formed over a silicon substrate by an MOCVD method. In the deposition for the sample 4C, a solution obtained by dissolving tetrakis(ethylmethylamino) hafnium (TEMAH) in ethylcyclohexane (ECH) at a concentration of 0.1 mol/l was supplied to a vaporizing chamber at a flow rate of 0.1 sccm, and a gas containing TEMAH was introduced from the vaporizing chamber to a chamber. The other deposition conditions were as follows: 1000 sccm of $O_2$, 1800 sccm of Ar, and 1080 sccm of $N_2$ were used as the other deposition gases, the deposition pressure was 1000 Pa, and the substrate temperature was 400° C.

Figure 63A:
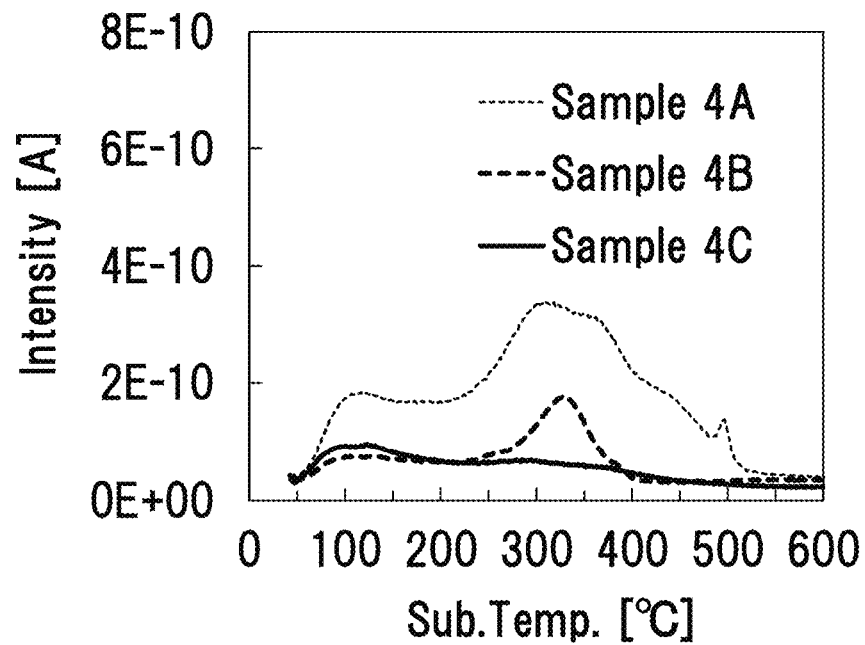
FIG. 63A is a graph showing results of TDS analysis in Example and FIG. 63B is a graph showing the number of released water molecules calculated from the graph.

The samples 4A to 4C formed in the above manner were analyzed by TDS and the results are shown in FIG. 63A. Note that in the TDS analysis, the amount of a released gas with a mass-to-charge ratio water molecule m/z=18, which corresponds to a water molecule, was measured. In FIG. 63A, the horizontal axis represents substrate heating temperature [° C.] and the vertical axis represents intensity proportional to the amount of a released gas with a mass-to-charge ratio.

Figure 63B:
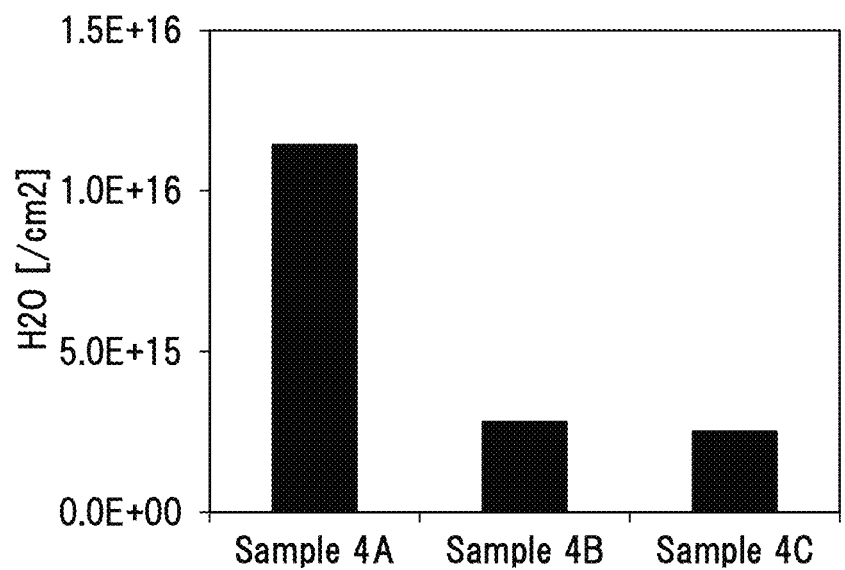

FIG. 63B shows the numbers of water molecules released from the samples 4A to 4C, which were calculated from the profiles shown in FIG. 63A. In FIG. 63B, the horizontal axis represents the samples and the vertical axis represents the numbers of water molecules [molecules/$cm^2$] released from the samples.

FIGS. 63A and 63B indicate that the number of water molecules released from each of the samples 4B and 4C can be approximately a fourth of the number of water molecules released from the sample 4A. The number of water molecules released from the sample 4A was $1.1 \times 10^{16}$ molecules/$cm^2$, that from the sample 4B was $2.8 \times 10^{15}$ molecules/$cm^2$, and that from the sample 4C was $2.5 \times 10^{15}$ molecules/$cm^2$. Thus, as described in the above embodiment, the number of water molecules released from each of the samples 4B and 4C measured by TDS satisfied a range greater than or equal to $1.0 \times 10^{13}$ molecules/$cm^2$ and less than or equal to $1.0 \times 10^{16}$ molecules/$cm^2$, and also satisfied a range greater than or equal to $1.0 \times 10^{13}$ molecules/$cm^2$ and less than or equal to $3.0 \times 10^{15}$ molecules/$cm^2$.

In the formation of the sample 4B, the introduction of $O_3$ serving as an oxidizer and the $N_2$ purging are repeated multiple times in a short time, whereby excess hydrogen atoms and the like can be more certainly removed from TEMAH adsorbed onto the substrate surface and eliminated from the chamber. It is inferable that in the case where two kinds of oxidizers ($O_3$ and $H_2O$) are introduced, more excess hydrogen atoms and the like can be removed from TEMAH adsorbed onto the substrate surface. In this manner, hydrogen atoms are prevented from entering the insulator and the like during the deposition, so that the amounts of water, hydrogen, and the like in the hafnium oxide film can be small.

The deposition for the sample 4C can be performed at a high temperature (e.g., 200° C. or higher) relatively easily as compared with the deposition for the sample 4A performed within the temperature range of the ALD window; therefore, it is inferable that hydrogen and water in the film can be readily reduced in the sample 4C.

As described above, a hafnium oxide film in which hydrogen and water are reduced can be formed by an ALD method or an MOCVD method.

Example 5

In this example, the relationship between conditions for the deposition of the silicon nitride film and the numbers of hydrogen molecules and water molecules released from the silicon nitride film was examined by TDS analysis.

<Flow of Deposition>

A flow of deposition of the silicon nitride film is described. A PECVD method was employed for the deposition.

First, preparation for deposition was performed. The preparation consists of Step S001 and Step S002. Chamber cleaning was performed at Step S001. For example, a film deposited on an inner wall of a chamber can be removed by the cleaning. An $NF_3$ gas was used as a cleaning gas, and an RF power source was used for application of voltage. Then, at Step S002, a 0.89-μm-thick film was formed as precoating.

Next, deposition of samples was performed. The deposition of samples consists of Steps S101 to S106. Steps S101 to S106 will be described later. Deposition of a plurality of samples was sequentially performed (e.g., a first sample was deposited, a second sample was deposited, and then a third sample was deposited), and Step S001 and Step S002 were performed again when the cumulative deposition thickness reached a predetermined value (here, 20 μm).

The deposition of samples is described in details. Steps S101 to S106 were performed for the deposition of samples. The substrate temperature was 400° C. during Steps S101 to S106.

At Step S101, the RF power source was turned off, an auto pressure controller (APC) was turned off, the distance between electrodes was 17 mm, silane was used as a gas, and treatment for letting the gas flow was performed for two minutes. The flow rate of silane was 800 sccm. Step S101 is referred to as silane flush in some cases.

At Step S102, the RF power source was turned off, the pressure, the distance between electrodes, and the flow rate of a gas were set to the same as those at Step S103, and treatment for letting the gas flow was performed for 20 seconds to stabilize the flow rate of a gas and the pressure.

At Step S103, the RF power, the pressure, the distance between electrodes, and the flow rate of a gas were set to the conditions to be described later, and a silicon nitride film was formed. The treatment time for Step S103 can be determined in accordance with a desired thickness.

At Step S104, the RF power source was turned off, the pressure was 133 Pa, the distance between electrodes was 15 mm, nitrogen was used as a gas, and treatment for letting the gas flow was performed for 15 seconds. The flow rate of nitrogen was 2000 sccm.

At Step S105, the RF power source was 10 W, the pressure was 133 Pa, the distance between electrodes was 15 mm, nitrogen was used as a gas, and treatment for letting the gas flow was performed for one minute. The flow rate of nitrogen was 2000 sccm.

At Step S106, the RF power source was turned off, the pressure was 133 Pa, the distance between electrodes was 65 mm, the substrate was moved to a substrate transfer position, argon was used as a gas, and treatment for letting the gas flow was performed for 20 seconds. The flow rate of argon was 250 sccm.

<Formation of Samples>

Next, the relationship between the deposition flow and the numbers of hydrogen molecules and water molecules released from the silicon nitride film formed by a PECVD method was examined.

First, a p-type silicon wafer with a size of 126.6 mm square and a thickness of 0.7 mm was prepared. Next, the silicon wafer was thermally oxidized to form a 100-nm-thick silicon oxide film. Then, the wafer was divided into four samples each having a size of 35 mm square (samples A01 to A04).

Then, a 100-nm-thick silicon nitride film was formed over the silicon oxide film by a PECVD method.

Each of the samples A01 and A02 was subjected to Steps S101 to S106 described above to form a silicon nitride film (with S101/S104/S105).

Each of the samples A03 and A04 was subjected to Steps S102, S103, and S106 in this order to form a silicon nitride film (w/o S101/S104/S105).

At Step S103, the RF power was 900 W, the pressure was 40 Pa, the distance between electrodes was 17 mm, and silane, nitrogen, and ammonia were used as a gas. The flow rates of silane, nitrogen, and ammonia were 20 sccm, 500 sccm, and 10 sccm, respectively.

Note that the cumulative deposition in the chamber just before the formation of the samples A01 and A03 was approximately 0.9 μm. The cumulative deposition in the chamber just before the formation of the samples A02 and A04 was approximately 2.8 μm.

<TDS Analysis>

The samples A01 to A04 were subjected to TDS measurement. Note that each of the samples A01 to A04 was divided into 1 cm squares for the TDS measurement.

Figure 64A:
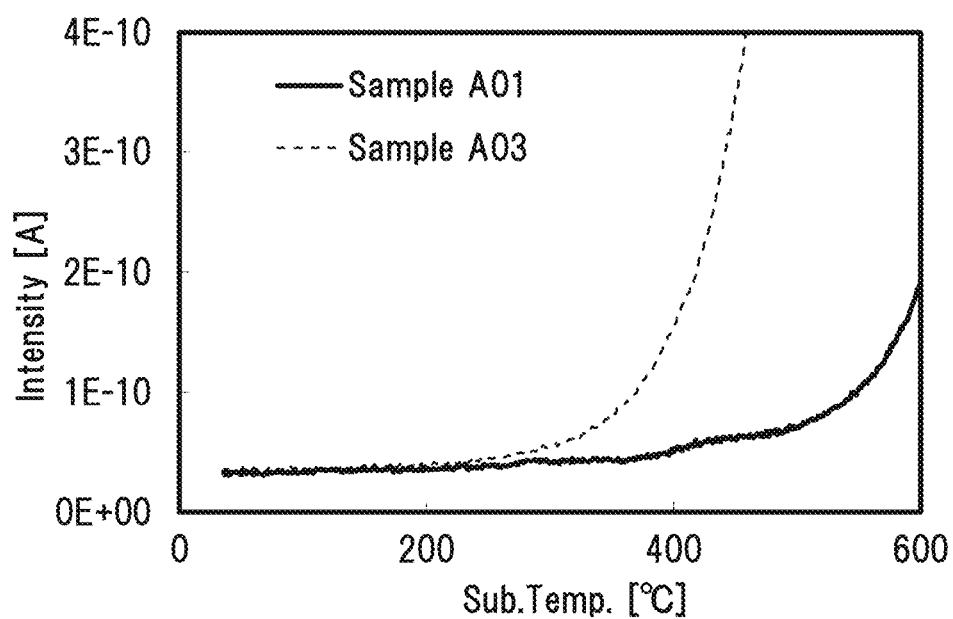
FIGS. 64A and 64B show results of TDS analysis.
Figure 64B:
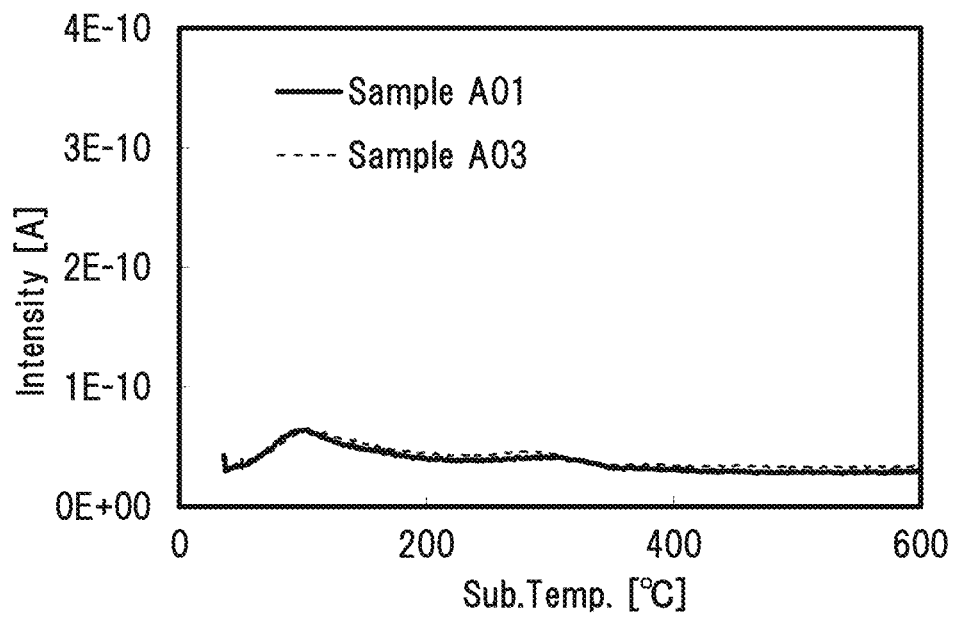
Figure 65A:
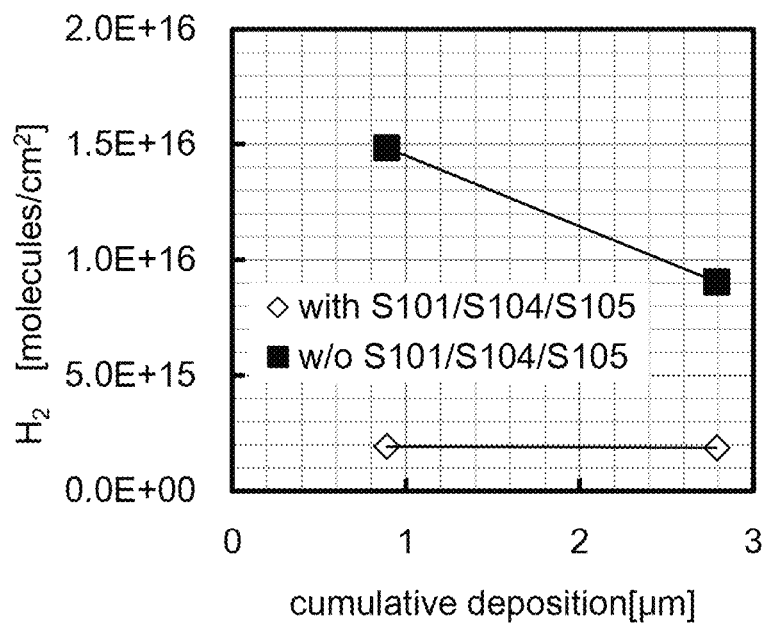
FIGS. 65A and 65B show the total number of released hydrogen molecules and the total number of released water molecules, respectively, calculated from results of TDS analysis.
Figure 65B:
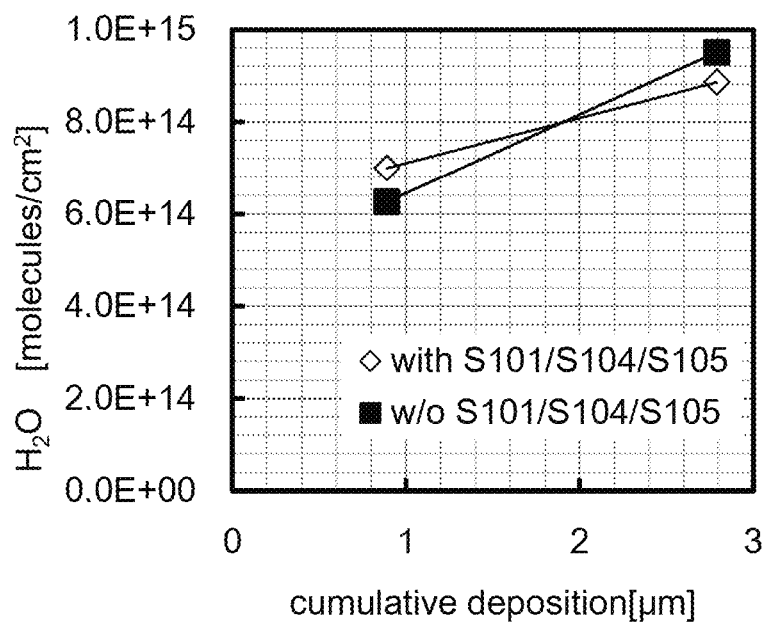

FIGS. 64A and 64B show the TDS analysis results of the samples A01 and A03. FIG. 64A shows the result with a mass-to-charge ratio m/z=2 (e.g., $H_2$). FIG. 64B shows the result with m/z=18 (e.g., $H_2O$). FIGS. 65A and 65B each show the numbers of molecules released from the samples A01 to A04 calculated by summations of TDS analysis results in the all measurement temperature range. In FIGS. 65A and 65B, it is assumed that all the results with m/z=2 are derived from hydrogen and all the results with m/z=18 are derived from water.

The results of FIGS. 64A and 64B and FIGS. 65A and 65B show that the number of hydrogen molecules released from the samples A01 and A02 subjected to Steps S101, S104, and S105 is small. The number of hydrogen molecules released from each of the samples A01 and A02 was less than or equal to $2.0 \times 10^{15}$ molecules/cm². Step S101 (silane flush) probably contributes to suppressed hydrogen release.

The number of released hydrogen molecules even in the samples which were not subjected to Steps S101, S104, and S105 decreases as the cumulative deposition increases, and the number of hydrogen molecules released from the sample A04 was $9.0 \times 10^{15}$ molecules/cm².

Example 6

In this example, the numbers of hydrogen molecules and water molecules released from the silicon nitride film were examined by TDS analysis.

<Formation of Samples>

A method for forming samples is described below. First, two p-type silicon wafers each having a size of 126.6 mm square were prepared. Next, each of the silicon wafers was thermally oxidized to form a 100-nm-thick silicon oxide film. The two silicon wafers each including the oxide film were individually divided, and 17 samples each having a size of 35 nm square were obtained from the two wafers. The obtained 17 samples each having a size of 35 nm square are referred to as samples B01 to B17.

A 100-nm-thick silicon nitride film was formed over the silicon oxide film of each of the samples B01 to B17 by a PECVD method. Steps S101 to S106 described in Example 5 were employed for the deposition.

The conditions of Step S103 performed on the samples B01 to B17 are described below. The substrate temperature was 400° C. The RF power source frequency was 27 MHz. The distance between electrodes was 17 mm. The flow rate of nitrogen was 500 sccm. The flow rate of silane was A [sccm], that of ammonia was B [sccm], the RF power was C [W], the pressure in the deposition was D [Pa]. The values of A to D used for the deposition of the samples B01 to B17 are described below.

The conditions for the sample B01 were as follows: the power C was 900 W; the pressure D was 40 Pa; the flow rate B of ammonia was 10 sccm; and the flow rate A of silane was 20 sccm.

The conditions for the samples B02 to B05 were the same as those for the sample B01 except for the flow rate A of silane. The conditions for the samples B02 to B05 are described. The flow rate A of silane for sample B02 was 12 sccm; for the sample B03, 16 sccm; for the sample B04, 24 sccm; and for the sample B05, 28 sccm. The power C was 900 W; the pressure D was 40 Pa; and the flow rate B of ammonia was 10 sccm.

The conditions for the samples B06 to B09 were the same as those for the sample B01 except for the flow rate B of ammonia. The conditions for the samples B06 to B09 are described. The flow rate B of ammonia for the sample B06 was 0 sccm; for the sample B07, sccm; for the sample B08, 30 sccm; and for the sample B09, 40 sccm. The power C was 900 W; the pressure D was 40 Pa; and the flow rate A of silane was 20 sccm.

The conditions for the samples B10 to B13 were the same as those for the sample B01 except for the power C. The conditions for the samples B10 to B13 are described. The power C for the sample B10 was 600 W; for the sample B11, 700 W; for the sample B12, 800 W; and for the sample B13, 1000 W. The pressure D was 40 Pa; the flow rate A of silane was 20 sccm; and the flow rate B of ammonia was 10 sccm.

The conditions for the samples B14 to B17 were the same as those for the sample B01 except for the pressure D. The conditions for the samples B14 to B17 are described. The pressure D for the sample B14 was 30 Pa; for the sample B15, 50 Pa; for the sample B16, 100 Pa; and for the sample B17, 150 Pa. The power C was 900 W; the flow rate A of silane was sccm; and the flow rate B of ammonia was 10 sccm.

Through the above steps, the samples B01 to B17 each including a silicon nitride film were obtained.

<TDS Analysis>

The samples B01 to B17 were subjected to TDS measurement. Note that each of the samples B01 to B17 was divided into 1 cm squares for the TDS measurement.

Figure 66A:
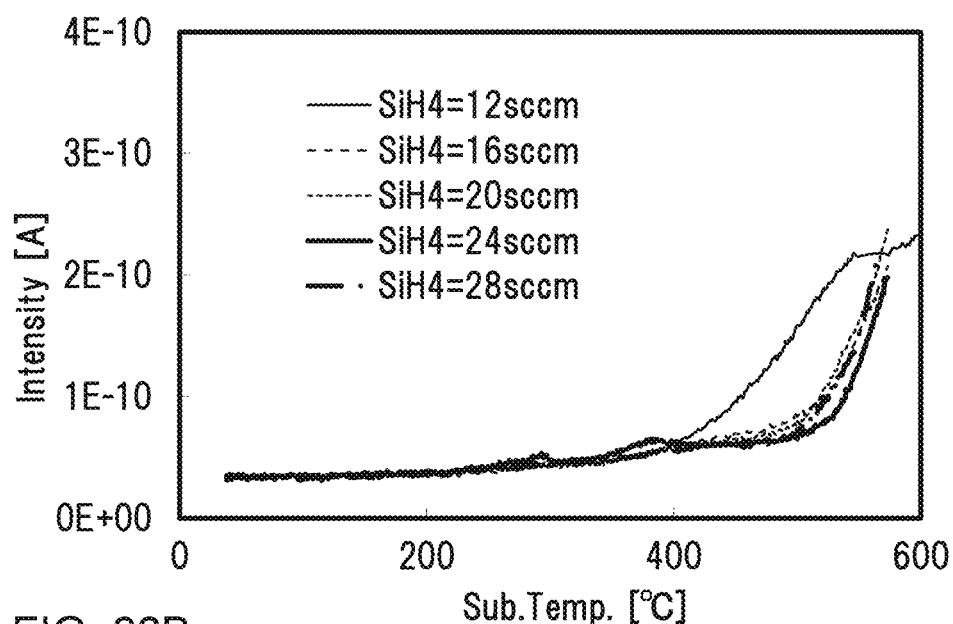
FIGS. 66A and 66B show results of TDS analysis.
Figure 66B:
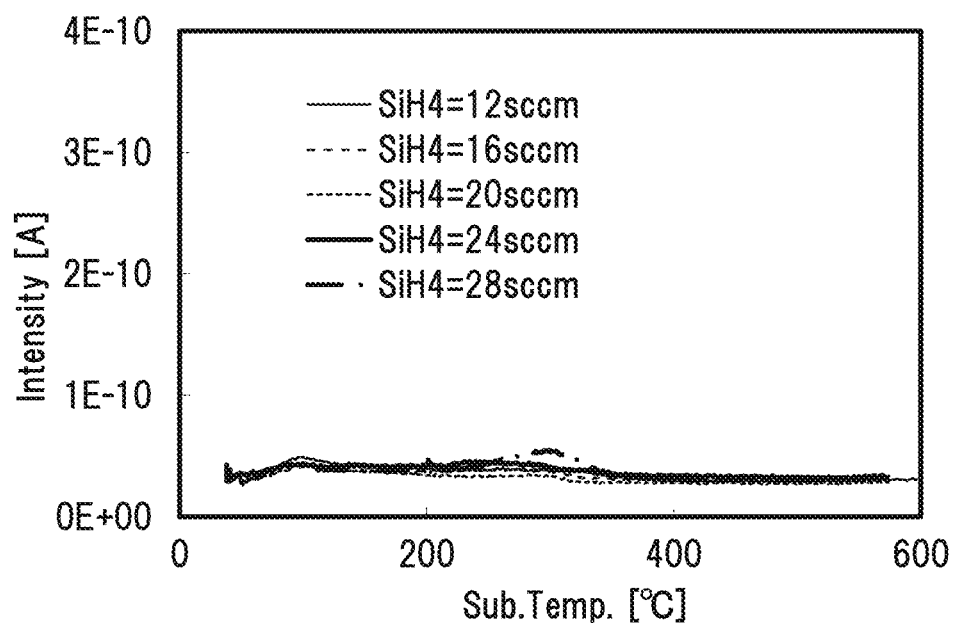

FIGS. 66A and 66B show the TDS analysis results of the samples B01 to B05 with different flow rates of silane. FIG. 66A shows the result with a mass-to-charge ratio m/z=2 (e.g., $H_2$). FIG. 66B shows the result with m/z=18 (e.g., $H_2O$). The numbers in the graphs indicate the flow rates of silane.

Figure 67A:
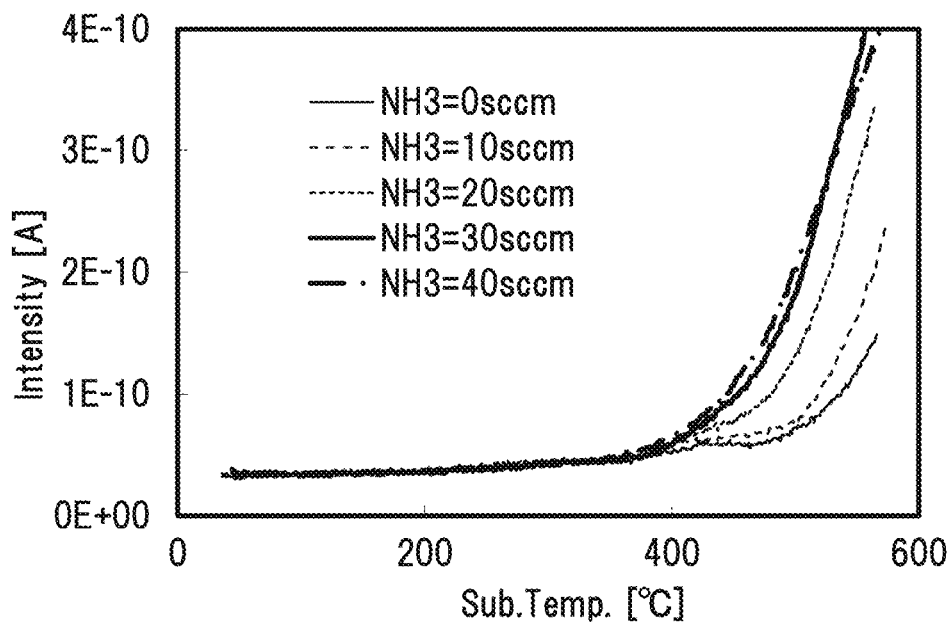
FIGS. 67A and 67B show results of TDS analysis.
Figure 67B:
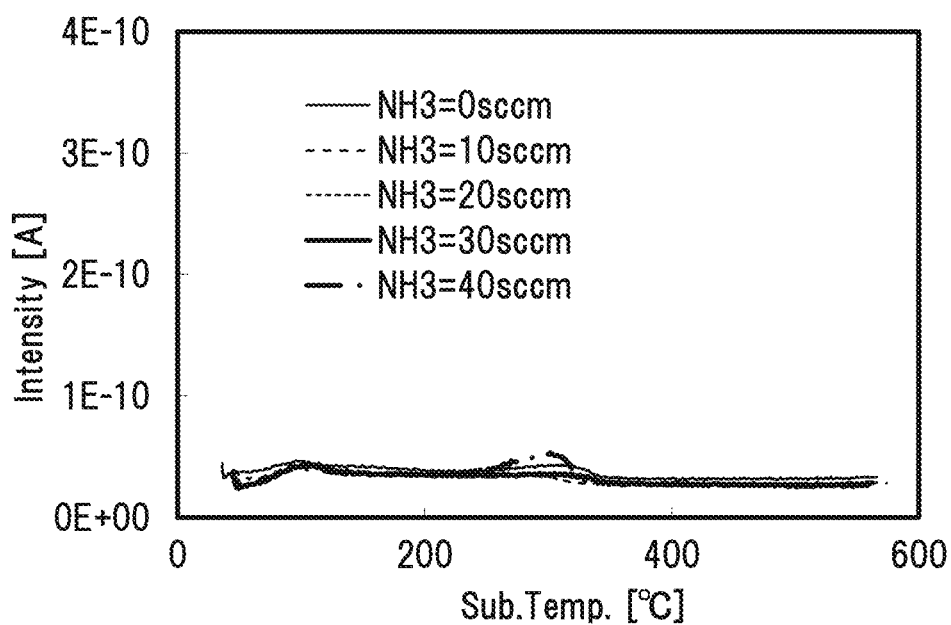

FIGS. 67A and 67B show the TDS analysis results of the samples B01 and B06 to B09 with different flow rates of ammonia. FIG. 67A shows the result with a mass-to-charge ratio m/z=2 (e.g., $H_2$). FIG. 67B shows the result with m/z=18 (e.g., $H_2O$). The numbers in the graphs indicate the flow rates of ammonia.

Figure 68A:
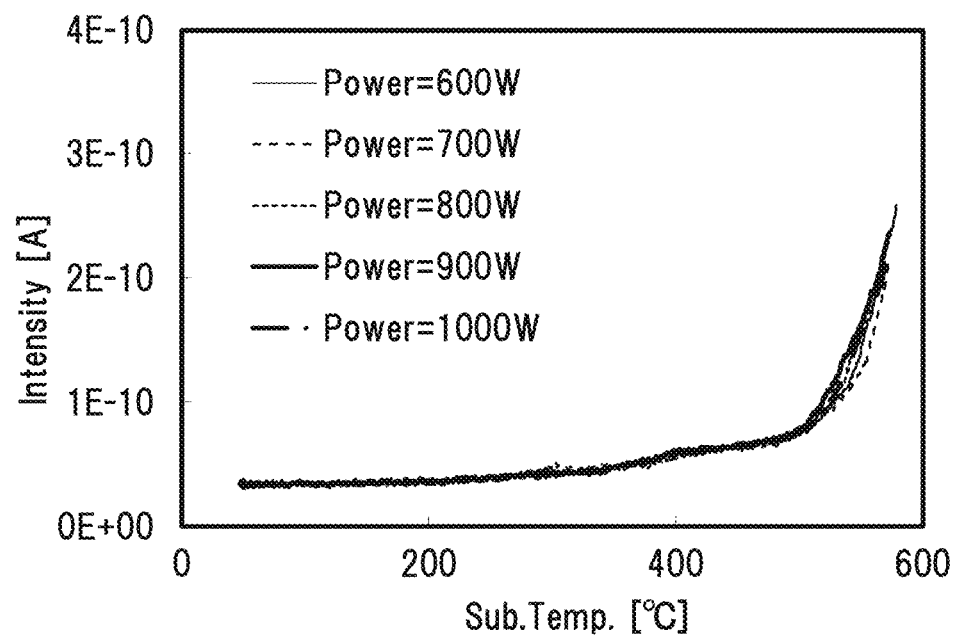
FIGS. 68A and 68B show results of TDS analysis.
Figure 68B:
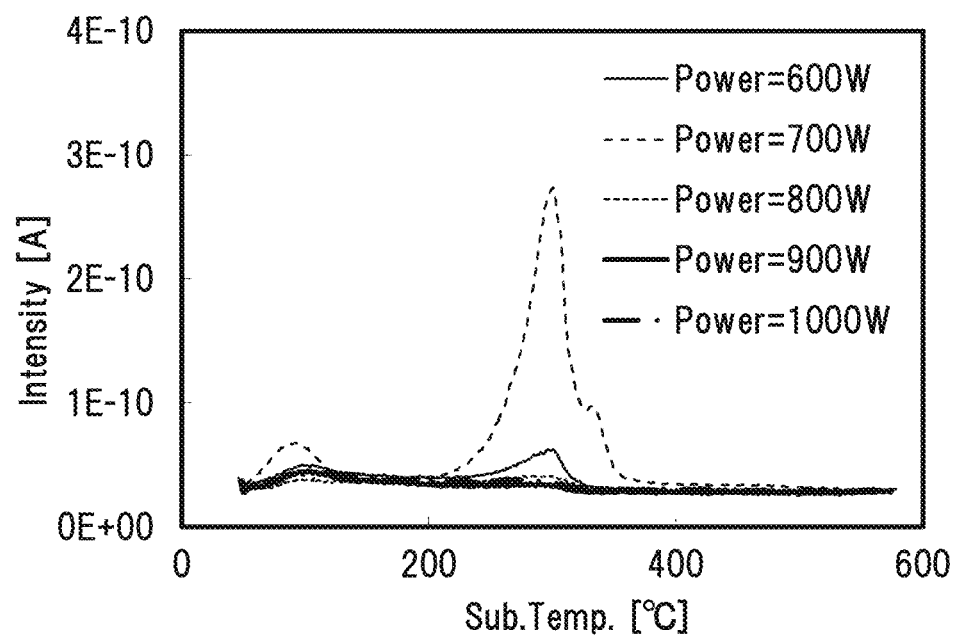

FIGS. 68A and 68B show the TDS analysis results of the samples B01 and B10 to B13 with different RF power source. FIG. 68A shows the result with a mass-to-charge ratio m/z=2 (e.g., $H_2$). FIG. 68B shows the result with m/z=18 (e.g., $H_2O$). The numbers in the graphs indicate the power source values.

Figure 69A:
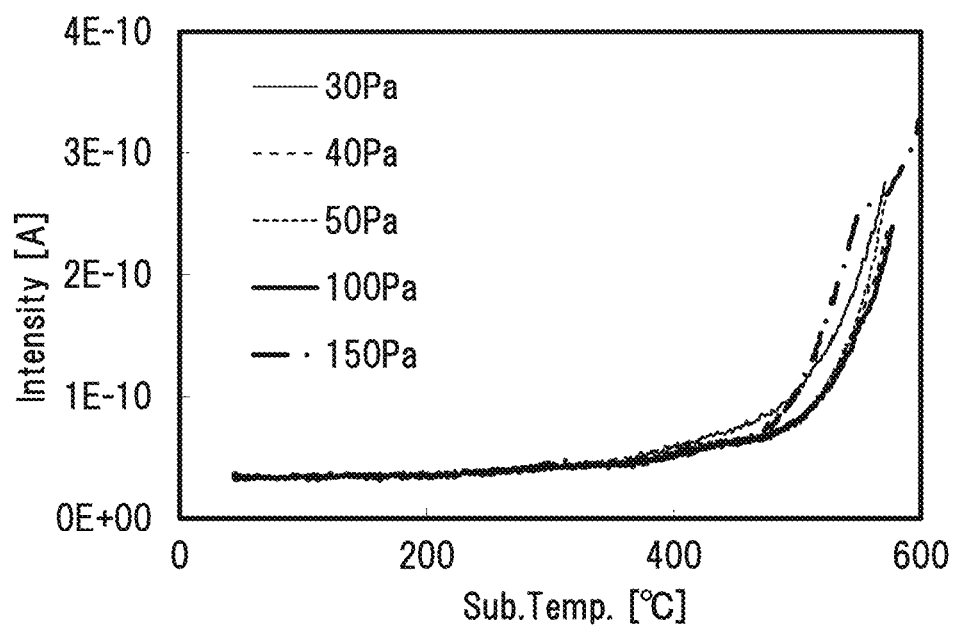
FIGS. 69A and 69B show results of TDS analysis.
Figure 69B:
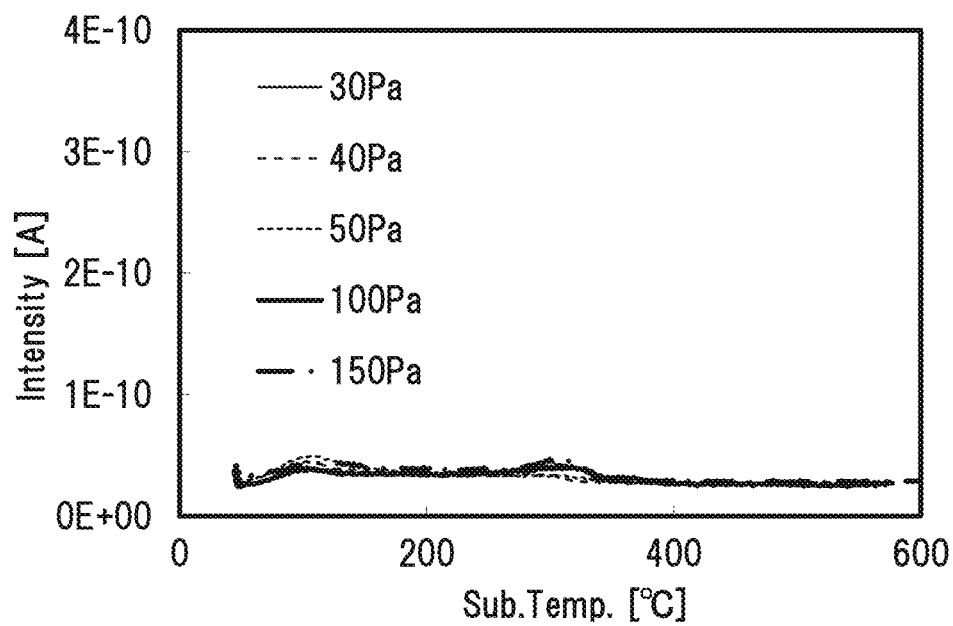
Figure 70A:
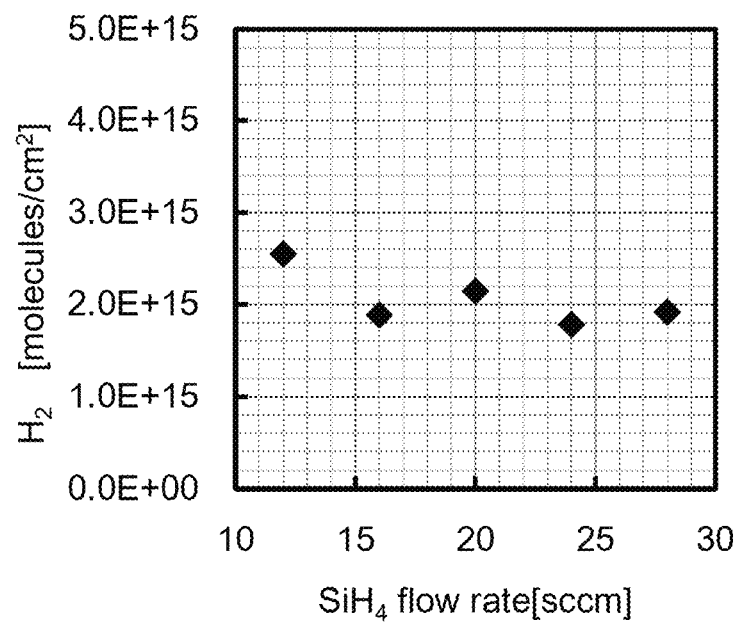
FIGS. 70A and 70B show the total number of released hydrogen molecules and the total number of released water molecules, respectively, calculated from results of TDS analysis.
Figure 70B:
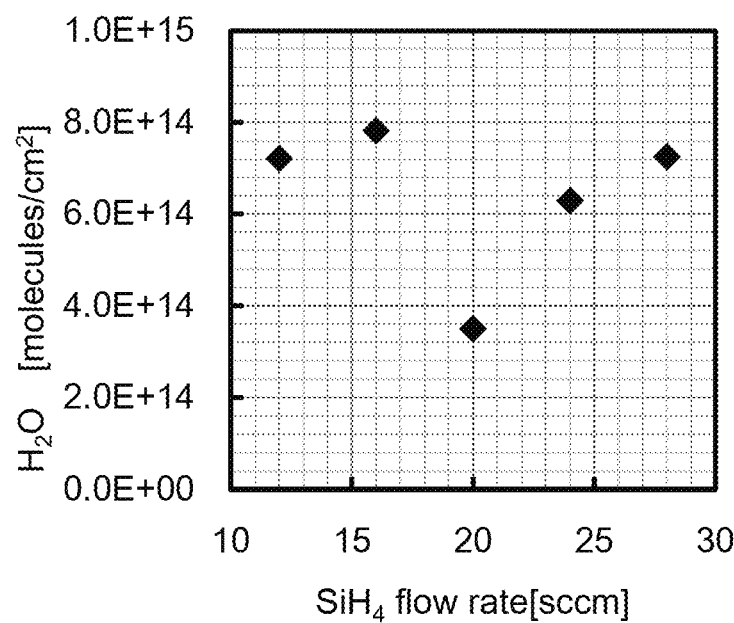
Figure 71A:
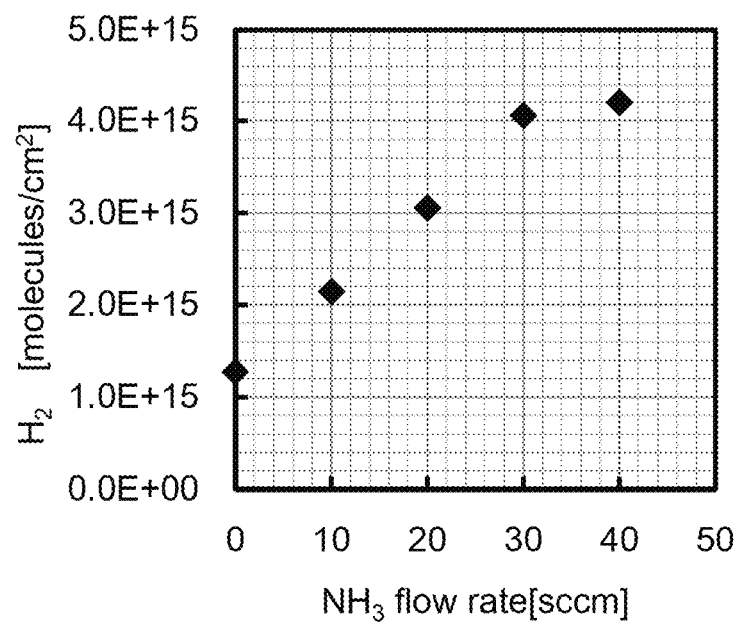
FIGS. 71A and 71B show the total number of released hydrogen molecules and the total number of released water molecules, respectively, calculated from results of TDS analysis.
Figure 71B:
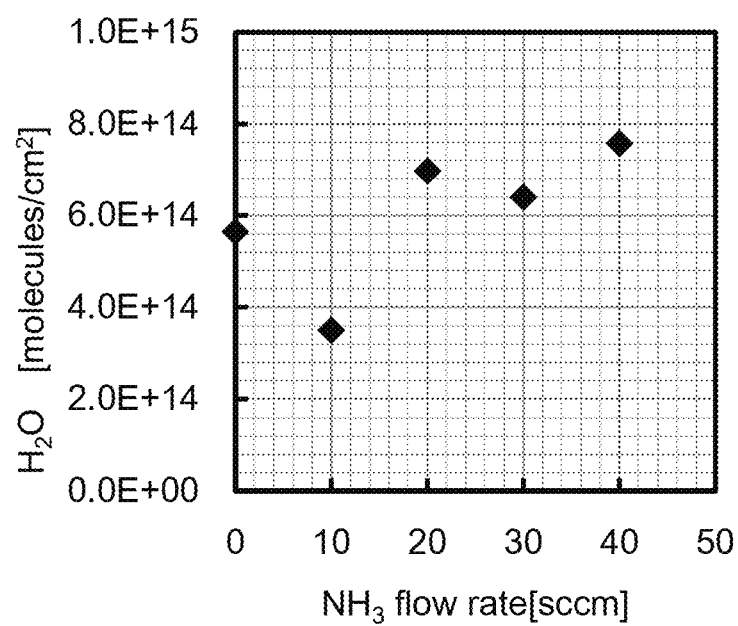
Figure 72A:
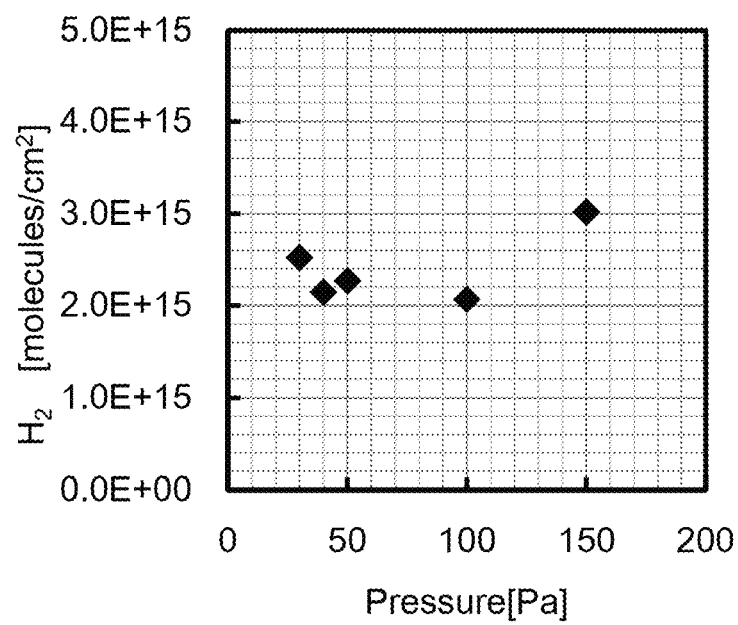
FIGS. 72A and 72B show the total number of released hydrogen molecules and the total number of released water molecules, respectively, calculated from results of TDS analysis.
Figure 72B:
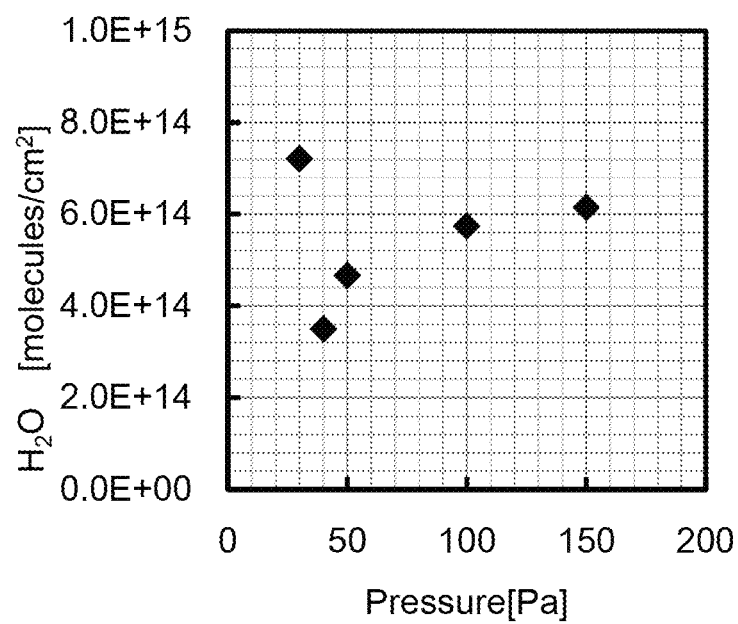
Figure 73A:
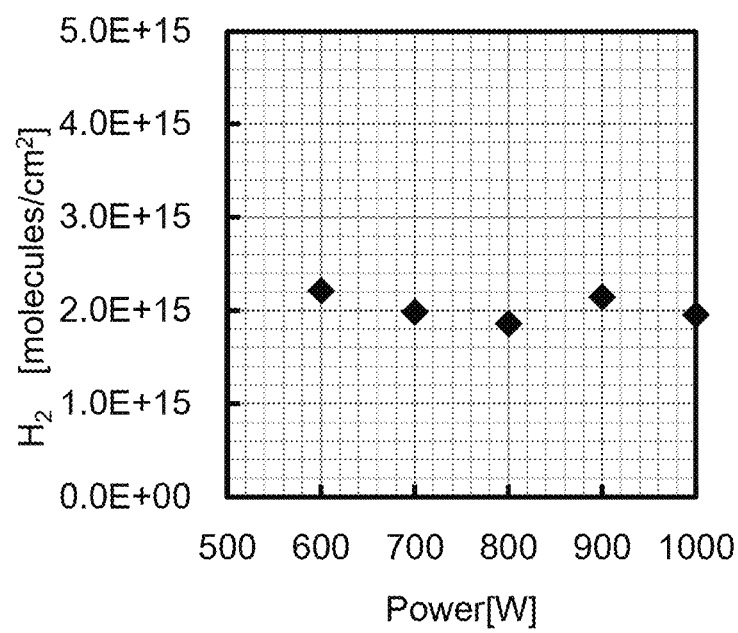
FIGS. 73A and 73B show the total number of released hydrogen molecules and the total number of released water molecules, respectively, calculated from results of TDS analysis.
Figure 73B:
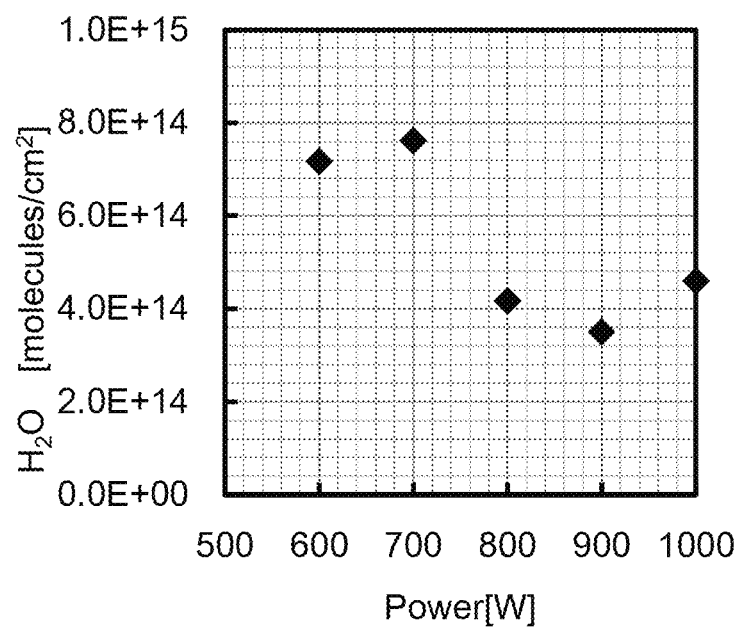

FIGS. 69A and 69B show the TDS analysis results of the samples B01 and B14 to B17 with different deposition pressures. FIG. 69A shows the result with a mass-to-charge ratio m/z=2 (e.g., $H_2$). FIG. 69B shows the result with m/z=18 (e.g., $H_2O$). The numbers in the graphs indicate the pressure values.

FIG. 70A, FIG. 71A, FIG. 72A, and FIG. 73A show the numbers of released molecules calculated by summations of TDS analysis results in the all measurement temperature range of FIG. 66A, FIG. 67A, FIG. 68A, and FIG. 69A. The horizontal axes in FIG. 70A, FIG. 71A, FIG. 72A, and FIG. 73A represent the flow rate of silane, the flow rate of ammonia, the pressure, and the power, respectively. Here, it is assumed that all the results with m/z=2 are derived from hydrogen.

FIG. 70B, FIG. 71B, FIG. 72B, and FIG. 73B show the numbers of released molecules calculated by summations of TDS analysis results in the all measurement temperature range of FIG. 66B, FIG. 67B, FIG. 68B, and FIG. 69B. The horizontal axes in FIG. 70B, FIG. 71B, FIG. 72B, and FIG. 73B represent the flow rate of silane, the flow rate of ammonia, the pressure, and the power, respectively. Here, it is assumed that all the results with m/z=18 are derived from water.

[Results with m/z=2]

First, the results with m/z=2 are described. According to FIG. 66A and FIG. 70A, when the flow rate of silane is higher than or equal to 16 sccm, a temperature at which release of hydrogen molecules starts tends to be higher and the number of released hydrogen molecules tends to be smaller than when the flow rate of silane is 12 sccm. According to FIG. 67A and FIG. 71A, the number of released hydrogen molecules strongly depends on the flow rate of ammonia; the number of released hydrogen molecules is the smallest when the flow rate of ammonia is 0 sccm and tends to be increased with an increase in the flow rate of ammonia. The number of released hydrogen molecules at a flow rate of ammonia of 0 sccm is $1.3 \times 10^{15}$ molecules/cm². According to FIG. 68A, FIG. 69A, FIG. 72A, and FIG. 73A, the dependence of the number of released hydrogen molecules on the RF power and that on the deposition pressure are small. Therefore, the temperature at which hydrogen release starts can be increased by setting the flow rate of silane for the deposition of silicon nitride to be 16 sccm or higher. Moreover, the hydrogen release can be suppressed by setting the flow rate of ammonia to be low.

[Results with m/z=18]

Next, the results with m/z=18 are described. According to FIG. 66B, when the flow rate of silane is 28 sccm, the number of released water molecules is slightly increased at approximately 300° C. According to FIG. 67B, when the flow rate of ammonia is 40 sccm, the number of released water molecules is slightly increased at approximately 300° C. According to FIG. 68B, when the power is 700 W, the number of released water molecules is significantly increased at approximately 300° C.; and when the power is 800 W or higher, the number of released water molecules is reduced. Therefore, when the power is 800 W or higher, the release of water can probably be suppressed. According to FIG. 72B, when the power is 800 W, the total number of released water molecules can be as low as $4.2 \times 10^{14}$ molecules/cm².

Example 7

In this example, a sample 7A in which a silicon nitride film was formed over a silicon substrate and a sample 7B in which a silicon oxide film was formed over a silicon substrate were formed and analyzed by TDS, and the results are described.

A method for forming the samples used in the TDS analysis is described. For the sample 7A, a 50-nm-thick silicon nitride film was formed over a silicon wafer by a PECVD method. The deposition conditions were as follows: 20 sccm of $SiH_4$, 10 sccm of $NH_3$, and 500 sccm of $N_2$ were used as deposition gases; RF power source frequency was 27 MHz; RF power was 900 W; deposition pressure was 40 Pa; and the substrate temperature was 400° C.

For the sample 7B, silicon oxide was deposited to a thickness of 50 nm over the silicon wafer by a PECVD method. The deposition conditions were as follows: 15 sccm of tetraethoxysilane (TEOS) (chemical formula: $Si(OC_2H_5)_4$) and 750 sccm of $O_2$ were used as deposition gases; the RF power source frequency was 27 MHz; the RF power was 300 W; the deposition pressure was 100 Pa; and the substrate temperature was 400° C.

Figure 79A:
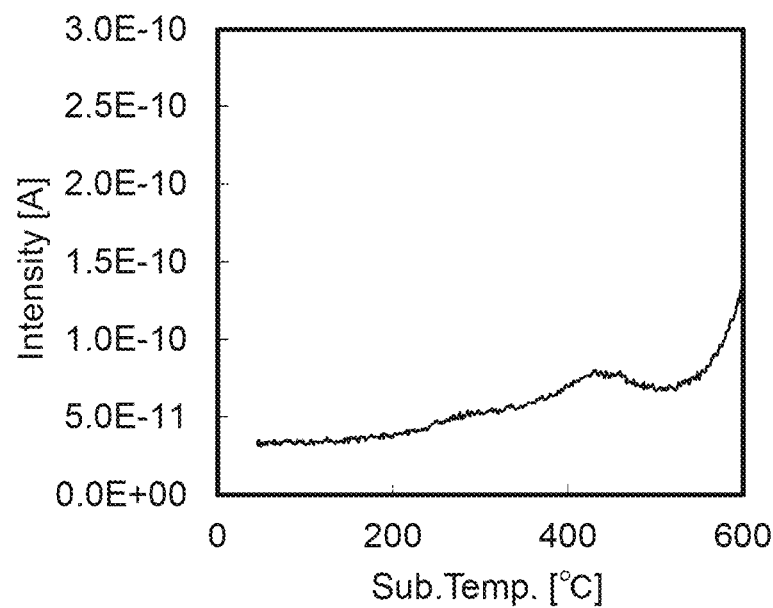
FIGS. 79A and 79B are graphs showing results of TDS analysis in Example.
Figure 79B:
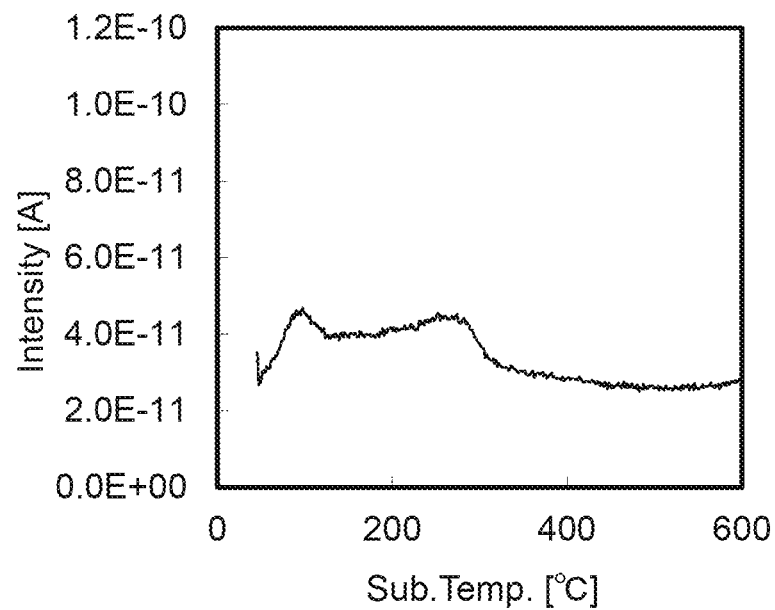
Figure 80A:
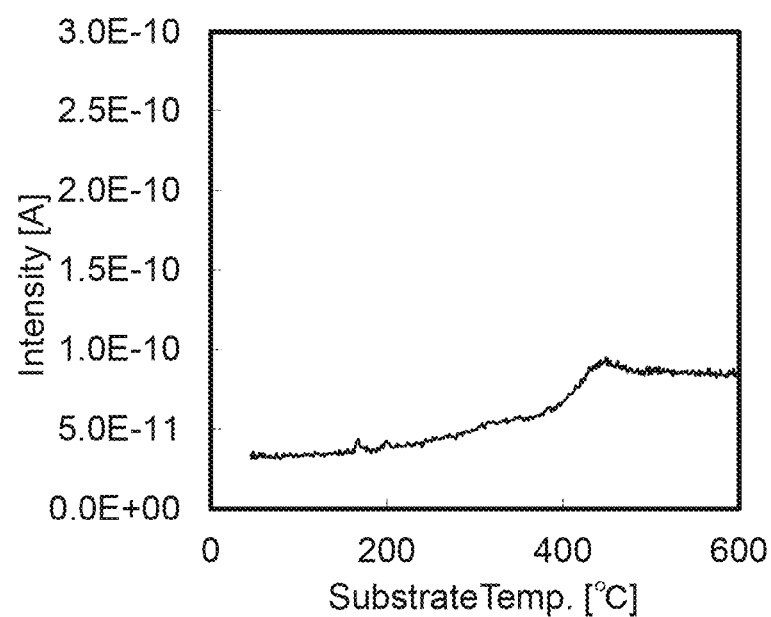
FIGS. 80A and 80B are graphs showing results of TDS analysis in Example.
Figure 80B:
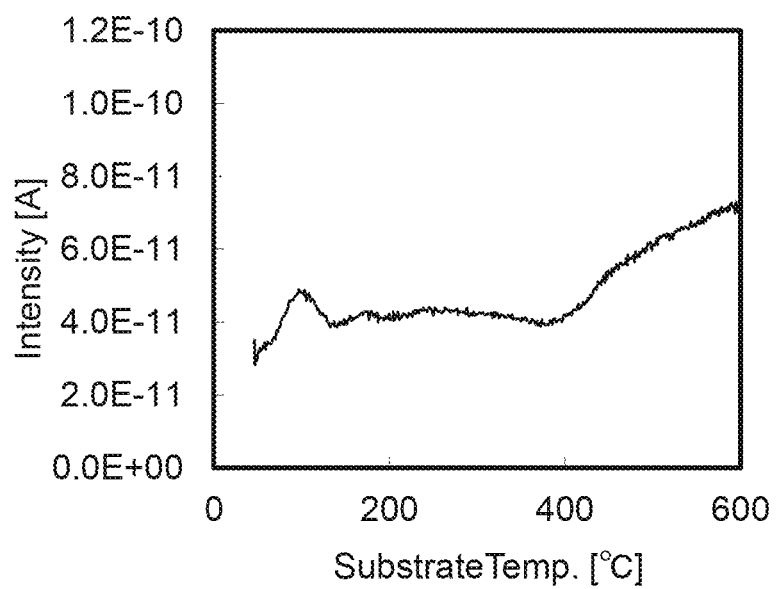

The samples 7A and 7B formed in the above manner were subjected to TDS analysis and the results are shown in FIGS. 79A and 79B and FIGS. 80A and 80B. Note that in the TDS analysis, the amount of a released gas with a mass-to-charge ratio m/z=2, which corresponds to a hydrogen molecule and the amount of a released gas with a mass-to-charge ratio m/z=18, which corresponds to a water molecule, were measured. FIG. 79A and FIG. 80A show the measurement results of hydrogen, and FIG. 79B and FIG. 80B show the measurement results of water. In each of FIGS. 79A and 79B and FIGS. 80A and 80B, the horizontal axis represents substrate heating temperature [° C.] and the vertical axis represents intensity proportional to the amount of a released gas with a mass-to-charge ratio.

The numbers of hydrogen molecules and water molecules released from the sample 7A and sample 7B were calculated from the profiles shown in FIGS. 79A and 79B and FIGS. 80A and 80B. As the results, the number of hydrogen molecules released from the sample 7A was $1.7 \times 10^{15}$ molecules/cm², and the number of water molecules released from the sample 7A was $6.3 \times 10^{14}$ molecules/cm². The number of hydrogen molecules released from the sample 7B was $1.3 \times 10^{15}$ molecules/cm$^2$, and the number of water molecules released from the sample 7B was $2.1 \times 10^{15}$ molecules/cm$^2$. Thus, the number of hydrogen molecules and the number of water molecules contained in the samples 7A and 7B were relatively small.

As shown in FIG. 79A and FIGS. 80A and 80B, a large peak was not observed in the profiles of hydrogen molecules and water molecules in a substrate temperature range of lower than or equal to 400° C. In FIG. 79B, although peaks were observed in the profile of water molecules in a substrate temperature range of lower than or equal to 400° C., the peak intensity was low as a whole. For this reason, the numbers of hydrogen molecules and water molecules released from the silicon nitride film and the silicon oxide film described in this example are probably small when the substrate heating temperature for the formation of the insulator 104 described in the above embodiment (for example, higher than or equal to 350° C. and lower than or equal to 445° C.) is employed. Consequently, even when the silicon nitride film and the silicon oxide film described in this example are provided below the insulator 104 described in the above embodiment, the silicon nitride film and the silicon oxide film hardly supply impurities such as hydrogen or water to the oxide semiconductor at the time of heat treatment in or after the formation of the insulator 104.

Accordingly, for example, the silicon nitride film of the sample 7A can be provided in the insulator 1581a and the like illustrated in FIG. 33 and FIG. 34 in the above embodiment as a film for preventing hydrogen diffusion. Furthermore, for example, the silicon oxide film of the sample 7B can be provided in the insulator 1584 and the like illustrated in FIG. 33 and FIG. 34 in the above embodiment as an interlayer insulating film Example 8

In this example, samples in each of which In—Ga—Zn oxide was deposited over a silicon substrate, the oxide was partly etched, and then heat treatment was performed were formed and analyzed by SIMS and hard X-ray photoelectron spectroscopy (HX-PES), and the results are described.

First, a method for forming the samples used for the SIMS analysis is described. For the SIMS analysis, eight samples 8A to 8H were formed.

First, In—Ga—Zn oxide was deposited over a silicon wafer to a thickness of 100 nm by a DC sputtering method. Note that the In—Ga—Zn oxide was deposited using a target in which In:Ga:Zn=1:1:1 [atomic ratio], and this oxide is referred to as an In—Ga—Zn oxide (111) in some cases. As deposition gases, an argon gas at 30 sccm and an oxygen gas at 15 sccm were used. A As deposition gases, 30 sccm of an argon gas and 15 sccm of an oxygen gas were used. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, the samples 8B to 8H were subjected to heat treatment at 450° C. in a nitrogen atmosphere for an hour and further subjected to heat treatment at 450° C. in an oxygen atmosphere for an hour.

Next, in each of the samples 8B to 8H, the thickness of In—Ga—Zn oxide (111) was reduced by an ICP dry etching method by approximately 20 nm. The ICP dry etching of the In—Ga—Zn oxide (111) consists of three steps. The treatment conditions for the first step were as follows: the pressure was 1.2 Pa; the RF power was 1000 W on the upper side and 400 W on the lower side; etching gases were 20 sccm of methane and 80 sccm of argon; and the treatment time was 53 seconds. The treatment conditions for the second step were as follows: the pressure was 5.2 Pa; the RF power was 500 W on the upper side and 50 W on the lower side; the etching gas was 200 sccm of oxygen; and the treatment time was 3 seconds. The treatment conditions for the third step were as follows: the pressure was 2.6 Pa; the RF power was 500 W on the upper side and 50 W on the lower side; the etching gas was 200 sccm of oxygen; and the treatment time was 60 seconds.

Next, the samples 8C to 8E were subjected to heat treatment in a nitrogen atmosphere for an hour, and the samples 8F to 8H were subjected to heat treatment in an oxygen atmosphere for an hour. The heat treatment temperature for the samples 8C and 8F was 300° C., that for the samples 8D and 8G was 350° C., and that for the samples 8E and 8H was 400° C.

That is, the sample 8A is a sample in which the process up to the deposition of the In—Ga—Zn oxide (111) is finished; the sample 8B is a sample in which the process up to the etching of the In—Ga—Zn oxide (111) is finished; the samples 8C to 8E are samples subjected to the heat treatment in a nitrogen atmosphere after the etching; and the samples 8F to 8H are samples subjected to the heat treatment in an oxygen atmosphere after the etching.

Figure 81A:
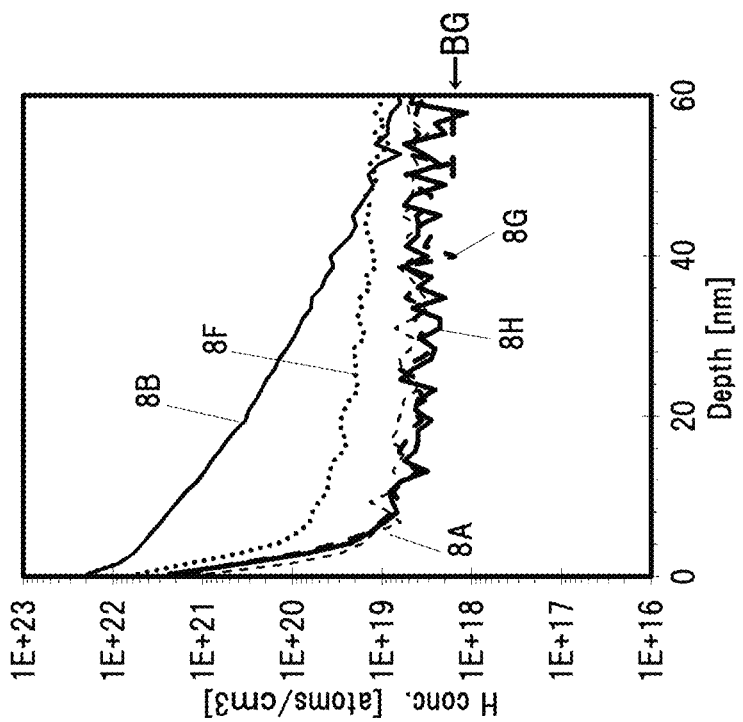
FIGS. 81A and 81B are graphs showing results of SIMS analysis in Example.
Figure 81B:
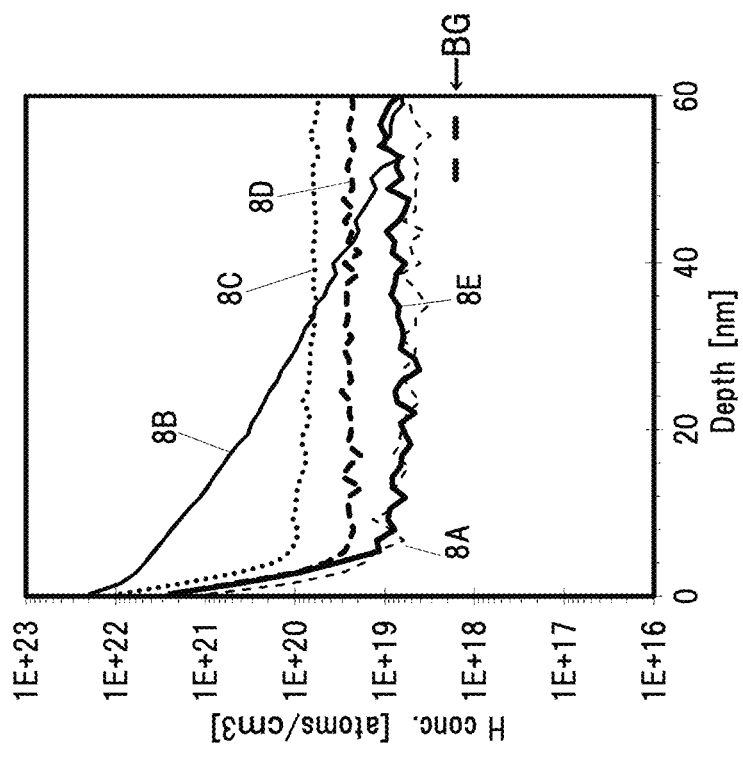

The SIMS analysis results of the samples 8A to 8H formed in this manner are shown in FIGS. 81A and 81B. FIG. 81A is a graph showing the results of the samples 8A to 8E, and FIG. 81B is a graph showing the results of the samples 8A, 8B, and 8F to 8H. In each of FIGS. 81A and 81B, the horizontal axis represents the depth [nm] (a depth from a surface of the In—Ga—Zn oxide (111)), and the vertical axis represents the hydrogen concentration [atoms/cm$^3$]. Note that the SIMS analysis was performed from the surface of the In—Ga—Zn oxide (111) (the depth: 0 nm) toward the silicon wafer, and the quantitative range was from the surface of the In—Ga—Zn oxide (111) to a depth of 60 nm. Note that SIMS measurement was performed by using an ADEPT-1010 quadrupole mass spectrometry instrument manufactured by ULVAC-PHI, Inc.

As shown in FIGS. 81A and 81B, the hydrogen concentration in the sample 8A is very close to the background value. In contrast, the hydrogen concentration in the sample 8B is approximately $1 \times 10^{22}$ atoms/cm$^3$ in the vicinity of the surface of the In—Ga—Zn oxide (111), and is similar to that of the sample 8A in a region 50 nm deep or more from the surface. Thus, in the sample 8B, hydrogen is diffused to a region from the surface to a depth of 50 nm. The hydrogen is probably derived from methane in an etching gas used for forming the sample 8B.

As shown in FIG. 81A, as compared with the hydrogen concentration in the sample 8B, the hydrogen concentration in each of the samples 8C to 8E is low at least in a region from the surface of the In—Ga—Zn oxide (111) to a depth of approximately 30 nm. This indicates that hydrogen diffused in the In—Ga—Zn oxide (111) by the etching is released by the heat treatment in a nitrogen atmosphere.

The hydrogen concentration in the sample 8C subjected to heat treatment at 300° C. is approximately $1 \times 10^{20}$ atoms/cm$^3$, and the hydrogen concentration in the sample 8D subjected to heat treatment at 350° C. is approximately $1.2 \times 10^{19}$ atoms/cm$^3$. In contrast, the hydrogen concentration in the sample 8E subjected to heat treatment at 400° C. is similar to that in the sample 8A. This is probably because the heating temperatures for the samples 8C and 8D are low, so that trap of hydrogen and release of hydrogen occur in balance in oxygen vacancy sites in the In—Ga—Zn oxide (111) and thus, the hydrogen concentration therein is in equilibrium. Furthermore, during the heat treatment in a nitrogen atmosphere, oxygen is released, that is, oxygen vacancies are increased, which increases the number of hydrogen atoms trapped in oxygen vacancy sites.

As shown in FIG. 81B, as compared with the hydrogen concentration in the sample 8B, the hydrogen concentration in each of the samples 8F to 8H is low at least in a region from the surface of the In—Ga—Zn oxide (111) to a depth of approximately 40 nm. This indicates that hydrogen diffused in the In—Ga—Zn oxide (111) by the etching is released by the heat treatment in an oxygen atmosphere.

The hydrogen concentration in the sample 8F subjected to heat treatment at 300° C. is approximately $1.1 \times 10^{19}$ atoms/cm$^3$. In contrast, the hydrogen concentration in each of the sample 8G subjected to heat treatment at 350° C. and the sample 8H subjected to heat treatment at 400° C. is similar to that in the sample 8A. This is probably because the heating temperature for the sample 8F is low, so that trap of hydrogen and release of hydrogen occur in balance in oxygen vacancy sites in the In—Ga—Zn oxide (111) and thus, the hydrogen concentration therein is in equilibrium.

The hydrogen concentration in each of the samples 8F to 8H heated in an oxygen atmosphere can be reduced at a low heat treatment temperature as compared with the samples 8C to 8E heated in a nitrogen atmosphere. This is probably because in each of the samples 8F to 8H, oxygen vacancies can be reduced by being filled with oxygen supplied by the heat treatment in an oxygen atmosphere, which can reduce the number of hydrogen atoms trapped in oxygen vacancy sites.

Next, the results of HX-PES analysis are described. For the HX-PES analysis, three samples were used: a sample 81 formed in a manner similar to that of the sample 8A; a sample 8J formed in a manner similar to that of the sample 8B; and a sample 8K formed in a manner similar to that of the sample 8G.

Figure 82:
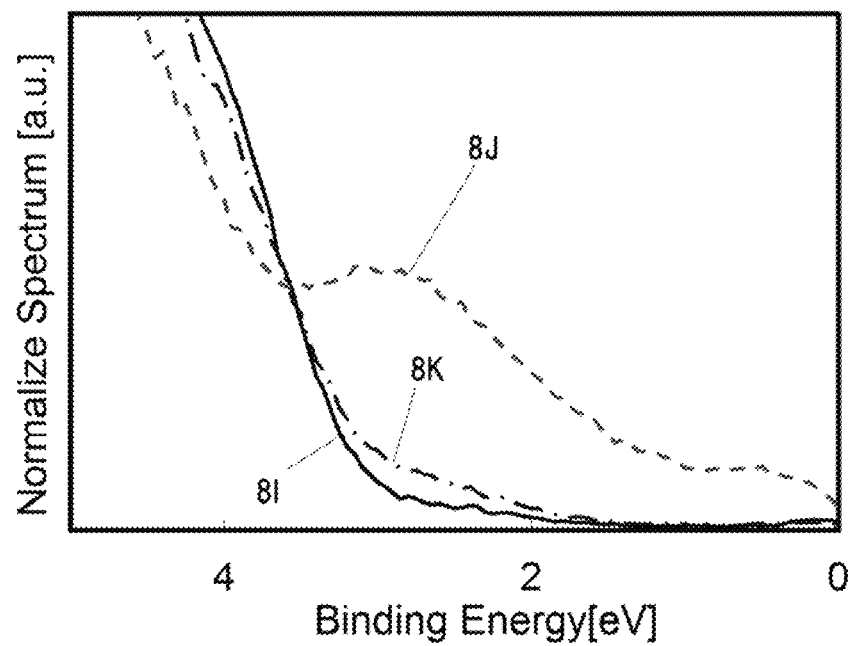
FIG. 82 is a graph showing results of HX-PES analysis in Example.

FIG. 82 shows the HX-PES analysis results of the samples 81 to 8K. In FIG. 82, the horizontal axis represents binding energy [eV] and the vertical axis represents the intensity of a signal (arbitrary unit). Note that the data in FIG. 82 is quantified on the basis of the Fermi level of Au, and 0 eV on the horizontal axis is energy close to the Fermi level of the In—Ga-Zn oxide (111). In addition, a region from 0 eV to 3.2 eV on the horizontal axis corresponds to an energy gap of the In—Ga—Zn oxide (111).

According to FIG. 82, the signal intensity of the sample 8J is higher than that of the sample 81 in the region from 0 eV to 3.2 eV. The spectrum of the sample 8J has a peak at around 2.8 eV and a peak in a region from 0 eV to 0.5 eV. Since the region from 0 eV to 3.2 eV corresponds to the energy gap of the In—Ga—Zn oxide (111) as described above, it can be found that the sample 8J having a peak at around 2.8 eV and a peak in the region from 0 eV to 0.5 eV includes defect states within the energy gap. Note that the peak position might be changed depending on the method for analyzing the graph, for example.

The peak at around 2.8 eV of the sample 8J is positioned at a deep level of the energy gap, and presumably derived from defect states corresponding to oxygen vacancies in the In—Ga—Zn oxide (111). The peak in the region from 0 eV to 0.5 eV of the sample 8J is positioned at a shallow level of the energy gap, and presumably derived from defect states corresponding to hydrogen trapped in oxygen vacancies in the In—Ga—Zn oxide (111). Therefore, it is found that the In—Ga—Zn oxide (111) subjected to the aforementioned etching includes oxygen vacancies and hydrogen atoms trapped in the oxygen vacancies.

In contrast, the sample 8K subjected to the etching and then heat treatment in an oxygen atmosphere has a spectrum substantially the same in shape as that of the sample 81, and unlike the sample 8J, the signal intensity of the sample 8K at around 2.8 eV and in the region from 0 eV to 0.5 eV is significantly low. However, a small peak appears at around 2.8 eV also in the spectrum of the sample 8K, and the signal intensity at around 2.8 eV is slightly higher than that of the sample 81. This shows that oxygen vacancies formed in the In—Ga—Zn oxide (111) by the etching and hydrogen trapped in oxygen vacancies can be reduced by heat treatment.

Consequently, in the above embodiment, hydrogen diffused in the semiconductor 106b can be released by heat treatment performed after the formation of the semiconductor 106b having a pattern. Therefore, defect states caused by diffusion of hydrogen and the like into the semiconductor 106b can be reduced. The use of such an oxide semiconductor with a reduced density of defect states makes it possible to provide a transistor with stable electrical characteristics.

Example 9

In this example, a sample 9A and a sample 9B were formed as transistors each having an electron trap region in the insulator 103. The threshold voltages of the transistors, which were changed by injection of electrons into the insulator 103, were measured.

FIGS. 9A and 9B and other drawings can be referred to for the structure of the transistor, and FIGS. 13A to 13H, FIGS. 14A to 14F, and FIGS. 15A to 15D and other drawings can be referred to for the method for fabricating the transistor.

First, a silicon substrate in which a 100-nm-thick silicon oxide film, a 280-nm-thick silicon nitride oxide film, a 300-nm-thick silicon oxide film, and a 300-nm-thick silicon oxide film were stacked in this order was prepared as the substrate 100.

Next, a 35-nm-thick aluminum oxide film was formed as the insulator 101 by a sputtering method.

Then, a 150-nm-thick silicon oxide film was formed by a PECVD method. A resist was formed over the silicon oxide film and processing was performed using the resist, whereby the insulator 107 was formed.

Next, titanium nitride was deposited to a thickness of 5 nm and tungsten was deposited thereover to a thickness of 250 nm by a CVD method. Then, CMP treatment was performed to form the conductor 102 embedded in the insulator 107.

Then, a 10-nm-thick silicon oxide film was formed as the insulator 105 by a PECVD method. The deposition conditions were as follows: 1 sccm of $SiH_4$ and 800 sccm of $N_2O$ were used as deposition gases; RF power source frequency was 60 MHz; RF power was 150 W; deposition pressure was 40 Pa; and the substrate temperature was 500° C.

Next, a 20-nm-thick hafnium oxide film was formed as the insulator 103 by an ALD method. In the film formation by an ALD method, the substrate temperature was 200° C., and a gas obtained by vaporizing a solid containing tetrakis (dimethylamido)hafnium (TDMAH) was used as a source gas and an $O_3$ gas) was used as an oxidizer.

Then, a 30-nm-thick silicon oxide film was formed as the insulator 104 by a PECVD method. The deposition conditions were as follows: 1 sccm of $SiH_4$ and 800 sccm of $N_2O$ were used as deposition gases; RF power source frequency was 60 MHz; RF power was 150 W; deposition pressure was 40 Pa; and the substrate temperature was 500° C.

Next, heat treatment was performed at 490° C. in an oxygen atmosphere for an hour.

Next, a 20-nm-thick In—Ga—Zn oxide film was formed by a DC sputtering method to form an oxide to be the insulator 106a using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Next, a 15-nm-thick In—Ga—Zn oxide film was formed by a DC sputtering method to form an oxide to be the semiconductor 106b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, heat treatment was performed at 450° C. under a nitrogen atmosphere for an hour. In addition, heat treatment was performed at 450° C. under an oxygen atmosphere for an hour.

Then, a 20-nm-thick tungsten film was formed by a DC sputtering method as a conductor to be the conductors 108a and 108b.

Next, a resist was formed over the conductor and the processing was performed using the resist, whereby the insulator 106a, the semiconductor 106b, and island-shaped conductors were formed.

A resist was then formed over the island-shaped conductors, and processing was performed using the resist, whereby the conductors 108a and 108b were formed.

Next, a 5-nm-thick In—Ga—Zn oxide film was formed by a DC sputtering method to form an oxide to be the insulator 106c using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

A 10-nm-thick silicon oxynitride film was formed as an oxynitride to be the insulator 112 by a PECVD method.

Then, as a conductor to be the conductor 114, a 10-nm-thick titanium nitride film and a 30-nm-thick tungsten film were formed in this order by a DC sputtering method. A resist was then formed over the conductor and processing was performed using the resist, whereby the conductor 114 was formed.

Next, the above oxide and oxynitride were processed using the resist into the insulator 106c and the insulator 112.

After that, a 40-nm-thick aluminum oxide film was formed by an RF sputtering method as the insulator 116, using deposition gases of an argon gas at 25 sccm and an oxygen gas at 25 sccm. A deposition pressure was 0.4 Pa. A deposition power was 2500 W. A substrate temperature was 250° C. A distance between the target and the substrate was 60 mm.

Next, heat treatment was performed at 400° C. in an oxygen atmosphere for an hour.

A 150-nm-thick silicon oxynitride film was formed by a PECVD method.

Next, a 50-nm-thick titanium film, a 200-nm-thick aluminum film, and a 50-nm-thick titanium film were formed in this order by a DC sputtering method. The films were processed using a resist to form the conductor 120a and the conductor 120b.

Through the above steps, a transistor with a channel length L of 64 nm and a channel width W of 51 nm was fabricated as the sample 9A. By the similar method, a transistor with a channel length L of 43 nm and a channel width W of 44 nm was fabricated as the sample 9B.

Figure 83A:
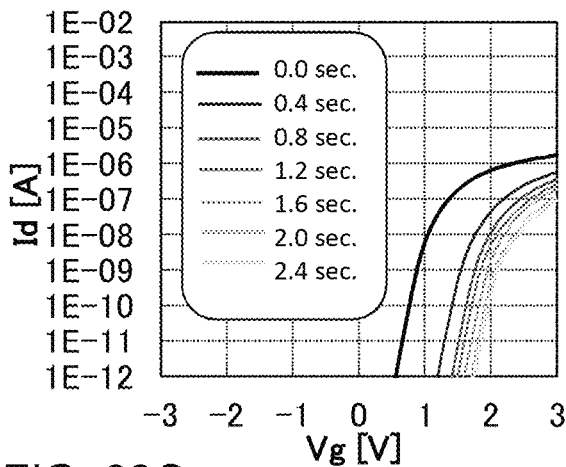
FIGS. 83A and 83C are graphs showing $I_d$-$V_g$ characteristics.
Figure 83B:
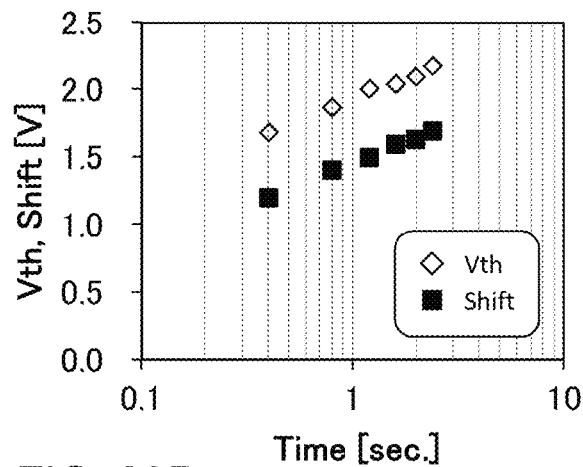
FIGS. 83B and 83D are graphs showing threshold voltage and Shift.
Figure 83C:
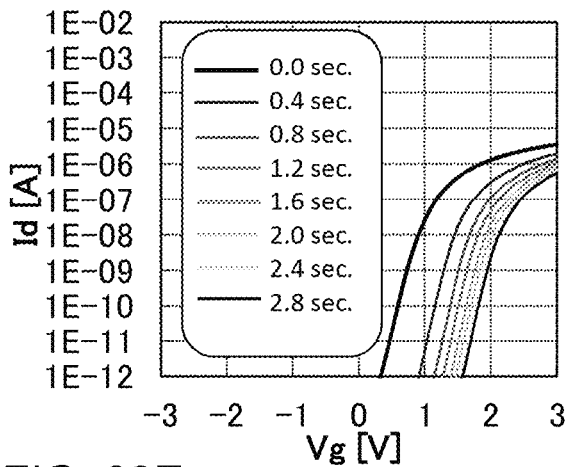
Figure 83D:
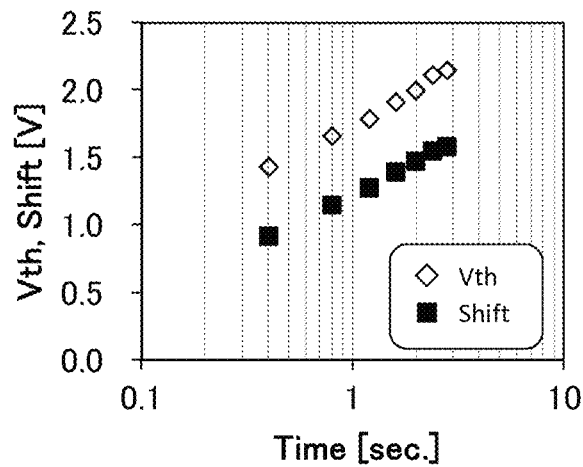
Figure 83E:
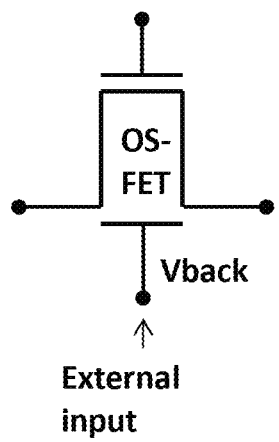
FIG. 83E illustrates a model of a transistor used in Example.

In this example, potential was applied to a back gate (the conductor 102) of each of the samples 9A and 9B in order to inject electrons into the insulator 103, so that the threshold voltage of the transistor was changed, as shown in FIG. 83E. The injection of electrons into the insulator 103 was performed under the following conditions: a back-gate voltage Vbg=40 V; a drain voltage $V_d$=0 V; a source voltage=0 V; and a top gate (the conductor 114) voltage $V_g$=0 V. Note that the back-gate voltage was applied for 0 seconds, 0.4 seconds, 0.8 seconds, 1.2 seconds, 1.6 seconds, 2.0 seconds, and 2.4 seconds, and the $I_d$-$V_g$ characteristics under each electron-injection condition were measured. The $I_d$-$V_g$ characteristics of the transistors were measured under the following conditions: the back gate voltage was 0 V, the drain voltage was 1.8 V, and the gate voltage was swept from −3.0 V to 3.0 V in increments of 0.1 V.

FIGS. 83A and 83C show $I_d$-$V_g$ characteristics of the samples 9A and 9B. In each of FIGS. 83A and 83C, the horizontal axis represents gate voltage $V_g$ [V] and the vertical axis represents drain current $I_d$ [A]. FIG. 83B shows the threshold voltage $V_{th}$ and Shift of the sample 9A calculated from the graph of FIG. 83A. Similarly, FIG. 83D shows the threshold voltage $V_{th}$ and Shift of the sample 9B calculated from the graph of FIG. 83C.

FIGS. 83A to 83D show that in each of the samples 9A and 9B, the threshold voltage was changed by injection of electrons into the insulator 103 by applying potential to the back gate. It was also found that the threshold voltage can be controlled by changing the time for applying voltage to the back gate.

This application is based on Japanese Patent Application serial No. 2015-083163 filed with Japan Patent Office on Apr. 15, 2015 and Japanese Patent Application serial No. 2015-110541 filed with Japan Patent Office on May 29, 2015, the entire contents of which are hereby incorporated by reference.

What is claimed is:

1. A semiconductor device comprising a first transistor, a second transistor, and a capacitor, the semiconductor device comprising:
   a first insulating film over a substrate;
   a first semiconductor layer including silicon over the first insulating film;
   a second insulating film over the first semiconductor layer;
   a first conductive layer over the second insulating film;
   a third insulating film over the first conductive layer;
   a second semiconductor layer including an oxide semiconductor over the third insulating film;
   a fourth insulating film over the second semiconductor layer;
   a second conductive layer over the fourth insulating film; and
   a third conductive layer below the second semiconductor layer,
   wherein the first conductive layer is configured to be a gate electrode of the first transistor, wherein the second conductive layer is configured to be a first gate electrode of the second transistor,
wherein the third conductive layer is configured to be a second gate electrode of the second transistor,
wherein the first semiconductor layer is in electrical contact with the second semiconductor layer through a fourth conductive layer,
wherein the fourth conductive layer is in contact with one of a source and a drain of the second semiconductor layer,
wherein the fourth conductive layer has a region provided over the second conductive layer,
wherein a fifth conductive layer is in contact with the other of the source and the drain of the second semiconductor layer,
wherein the fifth conductive layer is configured to be one electrode of the capacitor, and
wherein the second semiconductor layer overlaps the first semiconductor layer in a region where the first conductive layer and the third conductive layer do not overlap each other.

2. The semiconductor device according to claim 1, wherein the second semiconductor layer includes indium, gallium and zinc.

3. A semiconductor device comprising a first transistor, a second transistor, and a capacitor, the semiconductor device comprising:
   a first insulating film over a substrate;
   a first semiconductor layer including silicon over the first insulating film;
   a second insulating film over the first semiconductor layer;
   a first conductive layer over the second insulating film;
   a third insulating film over the first conductive layer;
   a second semiconductor layer including an oxide semiconductor over the third insulating film;
   a fourth insulating film over the second semiconductor layer;
   a second conductive layer over the fourth insulating film;
   a fifth insulating film over the second conductive layer; and
   a third conductive layer below the second semiconductor layer,
   wherein the first conductive layer is configured to be a gate electrode of the first transistor,
   wherein the second conductive layer is configured to be a first gate electrode of the second transistor,
   wherein the third conductive layer is configured to be a second gate electrode of the second transistor,
   wherein the first semiconductor layer is in electrical contact with the second semiconductor layer through a fourth conductive layer,
   wherein the fourth conductive layer is in contact with one of a source and a drain of the second semiconductor layer,
   wherein the fourth conductive layer has a region provided in an opening provided in the fifth insulating film,
   wherein a fifth conductive layer is in contact with the other of the source and the drain of the second semiconductor layer,
   wherein the fifth conductive layer is configured to be one electrode of the capacitor, and
   wherein the second semiconductor layer overlaps the first semiconductor layer in a region where the first conductive layer and the third conductive layer do not overlap each other.

4. The semiconductor device according to claim 3, wherein the second semiconductor layer includes indium, gallium and zinc.

* * * * *